(12) United States Patent
Eroz et al.

(10) Patent No.: US 8,887,024 B2
(45) Date of Patent: Nov. 11, 2014

(54) APPARATUS AND METHOD FOR IMPROVED MODULATION AND CODING SCHEMES FOR BROADBAND SATELLITE COMMUNICATIONS SYSTEMS

(71) Applicant: Hughes Network Systems, LLC, Germantown, MD (US)

(72) Inventors: Mustafa Eroz, Germantown, MD (US); Lin-Nan Lee, Potomac, MD (US)

(73) Assignee: Hughes Network Systems, LLC, Germantown, MD (US)

( * ) Notice: Subject to any disclaimer, the term of this patent is extended or adjusted under 35 U.S.C. 154(b) by 124 days.

(21) Appl. No.: 13/763,723

(22) Filed: Feb. 10, 2013

(65) Prior Publication Data

US 2014/0229800 A1    Aug. 14, 2014

(51) Int. Cl.
   *H03M 13/00*   (2006.01)
   *H03M 13/13*   (2006.01)
   *H04L 27/20*   (2006.01)

(52) U.S. Cl.
   CPC ............... *H04L 27/20* (2013.01); *H03M 13/13* (2013.01)
   USPC ............................ 714/758; 714/805; 714/782

(58) Field of Classification Search
   CPC .......... H03M 13/1137; H03M 13/036; H03M 13/1122; H03M 13/1165; H03M 13/152
   USPC ........... 370/312, 310; 714/752, 758, 805, 782
   See application file for complete search history.

(56) References Cited

U.S. PATENT DOCUMENTS

| | | |
|---|---|---|
| 5,805,642 A | 9/1998 | Wei et al. |
| 5,838,728 A | 11/1998 | Alamouti et al. |
| 5,844,943 A | 12/1998 | Kazecki et al. |
| 5,903,609 A | 5/1999 | Kool et al. |
| 6,023,783 A | 2/2000 | Divsalar et al. |
| 6,097,764 A | 8/2000 | McCallister et al. |
| 6,104,761 A | 8/2000 | McCallister et al. |
| 6,157,621 A * | 12/2000 | Brown et al. ................. 370/310 |
| 6,430,722 B1 | 8/2002 | Eroz et al. |
| 6,529,495 B1 | 3/2003 | Aazhang et al. |
| 6,674,811 B1 | 1/2004 | Desrosiers et al. |
| 6,724,813 B1 | 4/2004 | Jamal et al. |
| 6,829,308 B2 | 12/2004 | Eroz et al. |
| 6,940,827 B2 | 9/2005 | Li et al. |

(Continued)

FOREIGN PATENT DOCUMENTS

| | | |
|---|---|---|
| EP | 1387496 A2 | 2/2004 |
| EP | 2365639 A2 | 9/2011 |
| WO | WO 2004/006442 A1 | 1/2004 |

OTHER PUBLICATIONS

Eroz, Mustafa et al., "An Innovative Low-Density Parity-Check Code Design With Near-Shannon-Limit Performance and Simple Implementation", IEEE Transactions on Communications, vol. 54, No. 1, Jan. 1, 2006, XPOQ7902266, Jan. 1, 2006, 13-17.

(Continued)

*Primary Examiner* — David Ton
(74) *Attorney, Agent, or Firm* — Potomac Technology Law, LLC

(57) ABSTRACT

Modulation and coding schemes are provided for improved performance of wireless communications systems to support services and applications for terminals with operational requirements at relatively low $E_s/N_0$ ratios and terminals at relatively high $E_s/N_0$ ratios. The new modulation and coding schemes provide new BCH codes, low density parity check (LDPC) codes and interleaving methods. The modulation and coding schemes also provide new modulation signal constellations.

22 Claims, 17 Drawing Sheets

(56) References Cited

U.S. PATENT DOCUMENTS

| | | | |
|---|---|---|---|
| 6,963,622 | B2 | 11/2005 | Eroz et al. |
| 7,020,829 | B2 | 3/2006 | Eroz et al. |
| 7,039,126 | B2 | 5/2006 | Galins |
| 7,173,978 | B2 | 2/2007 | Zhang et al. |
| 7,187,728 | B2 | 3/2007 | Seier et al. |
| 7,191,378 | B2 | 3/2007 | Eroz et al. |
| 7,203,887 | B2 | 4/2007 | Eroz et al. |
| 7,234,098 | B2 | 6/2007 | Eroz et al. |
| 7,237,174 | B2 | 6/2007 | Eroz et al. |
| 7,296,208 | B2 | 11/2007 | Sun et al. |
| 7,324,613 | B2 | 1/2008 | Fang et al. |
| 7,334,181 | B2 | 2/2008 | Eroz et al. |
| 7,376,883 | B2 | 5/2008 | Eroz et al. |
| 7,398,455 | B2 | 7/2008 | Eroz et al. |
| 7,424,662 | B2 | 9/2008 | Eroz et al. |
| 7,430,396 | B2 | 9/2008 | Sun et al. |
| 7,447,984 | B2 | 11/2008 | Cameron et al. |
| 7,461,325 | B2 | 12/2008 | Eroz et al. |
| 7,483,496 | B2 | 1/2009 | Eroz et al. |
| 7,577,207 | B2 | 8/2009 | Eroz et al. |
| 7,673,226 | B2 | 3/2010 | Eroz et al. |
| 7,725,802 | B2 | 5/2010 | Eroz et al. |
| 7,746,758 | B2 | 6/2010 | Stolpman |
| 7,770,089 | B2 | 8/2010 | Eroz et al. |
| 7,856,586 | B2 | 12/2010 | Eroz et al. |
| 7,864,869 | B2 | 1/2011 | Eroz et al. |
| 7,954,036 | B2 | 5/2011 | Eroz et al. |
| 7,962,830 | B2 | 6/2011 | Eroz et al. |
| 8,028,224 | B2 | 9/2011 | Eroz et al. |
| 8,069,393 | B2 | 11/2011 | Eroz et al. |
| 8,095,854 | B2 | 1/2012 | Eroz et al. |
| 8,102,947 | B2 | 1/2012 | Eroz et al. |
| 8,126,076 | B2 | 2/2012 | Sartori et al. |
| 8,140,931 | B2 | 3/2012 | Eroz et al. |
| 8,144,801 | B2 | 3/2012 | Eroz et al. |
| 8,145,980 | B2 | 3/2012 | Eroz et al. |
| 8,156,400 | B1 * | 4/2012 | Yeo et al. .................. 714/758 |
| 8,181,085 | B2 | 5/2012 | Eroz et al. |
| 8,291,293 | B2 | 10/2012 | Eroz et al. |
| 8,369,448 | B2 | 2/2013 | Zhang et al. |
| 8,392,786 | B2 * | 3/2013 | Trachewsky et al. ......... 714/752 |
| 8,402,341 | B2 | 3/2013 | Eroz et al. |
| 8,782,499 | B2 * | 7/2014 | Jeong et al. .................. 714/782 |
| 2003/0021358 | A1 | 1/2003 | Galins |
| 2003/0037298 | A1 | 2/2003 | Eleftheriou et al. |
| 2004/0019845 | A1 | 1/2004 | Eroz et al. |
| 2004/0054960 | A1 | 3/2004 | Eroz et al. |
| 2004/0258177 | A1 | 12/2004 | Shen et al. |
| 2006/0218459 | A1 | 9/2006 | Hedberg |
| 2006/0224935 | A1 | 10/2006 | Cameron et al. |
| 2008/0019263 | A1 | 1/2008 | Stolpman |
| 2008/0313523 | A1 | 12/2008 | Sun et al. |
| 2009/0158129 | A1 | 6/2009 | Myung et al. |
| 2009/0187804 | A1 | 7/2009 | Shen et al. |
| 2009/0219849 | A1 * | 9/2009 | Alpert et al. .................. 370/312 |
| 2010/0100789 | A1 | 4/2010 | Yu et al. |
| 2010/0122143 | A1 | 5/2010 | Lee et al. |
| 2010/0211841 | A1 | 8/2010 | Cao et al. |
| 2011/0051825 | A1 | 3/2011 | Tao et al. |
| 2011/0202820 | A1 | 8/2011 | Eroz et al. |
| 2011/0239086 | A1 | 9/2011 | Eroz et al. |
| 2013/0198581 | A1 | 8/2013 | Lee et al. |
| 2013/0283131 | A1 | 10/2013 | Tsatsaragkos et al. |
| 2014/0068375 | A1 | 3/2014 | Eroz et al. |

OTHER PUBLICATIONS

Eroz, Mustafa et al., "Structured Low-Density Parity-Check Code Design for Next Generation Digital Video Broadcast", Military Communications Conference, 2005, Oct. 17, 2005, XP010901536, Oct. 17, 2005, 1-6.

ESR P1064EP00, , "European Search Report", EP 2365639 A3, Aug. 1, 2012.

ETSI EN 302 307 V1.3.1, "Digital Video Broadcasting (DVB); Second generation framing structure, channel coding and modulation systems for Broadcasting, Interactive Services, News Gathering and other broadband satellite applications (DVB-S2)", Nov. 2012.

* cited by examiner

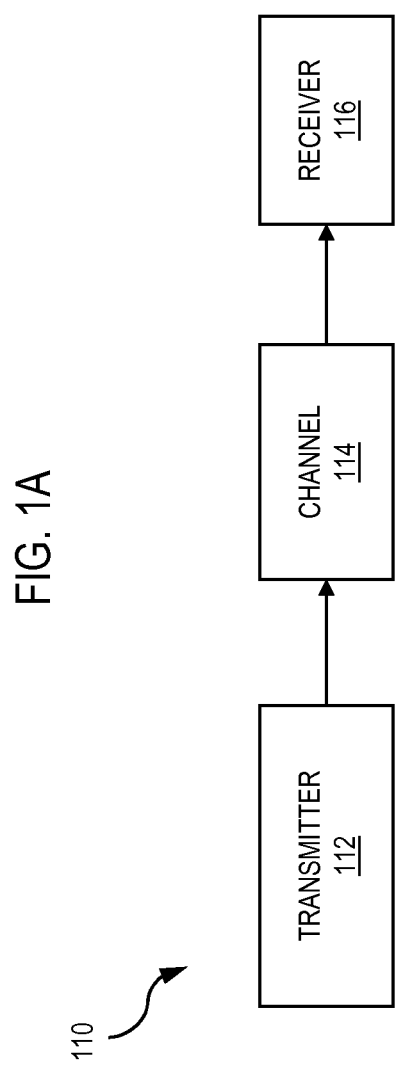

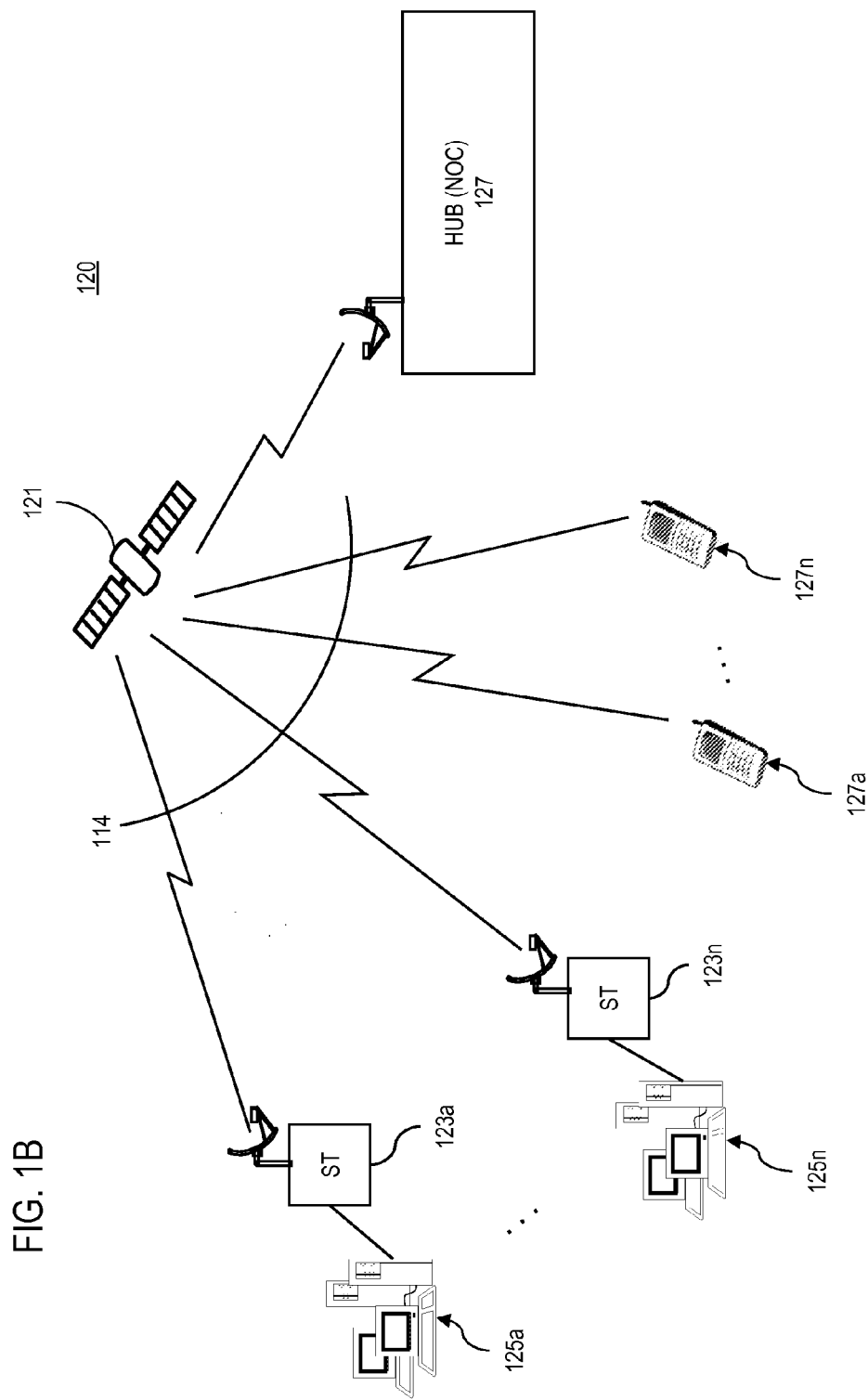

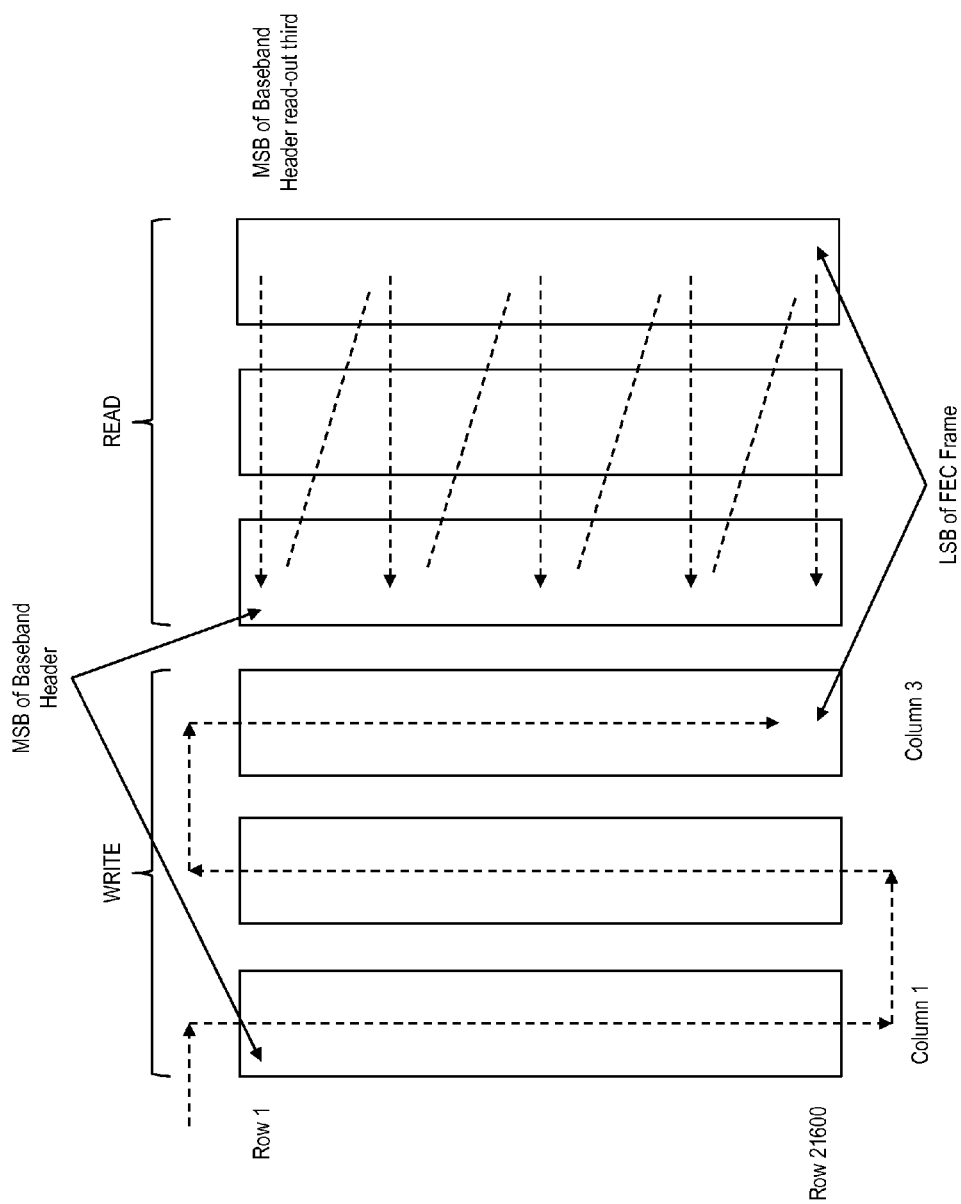

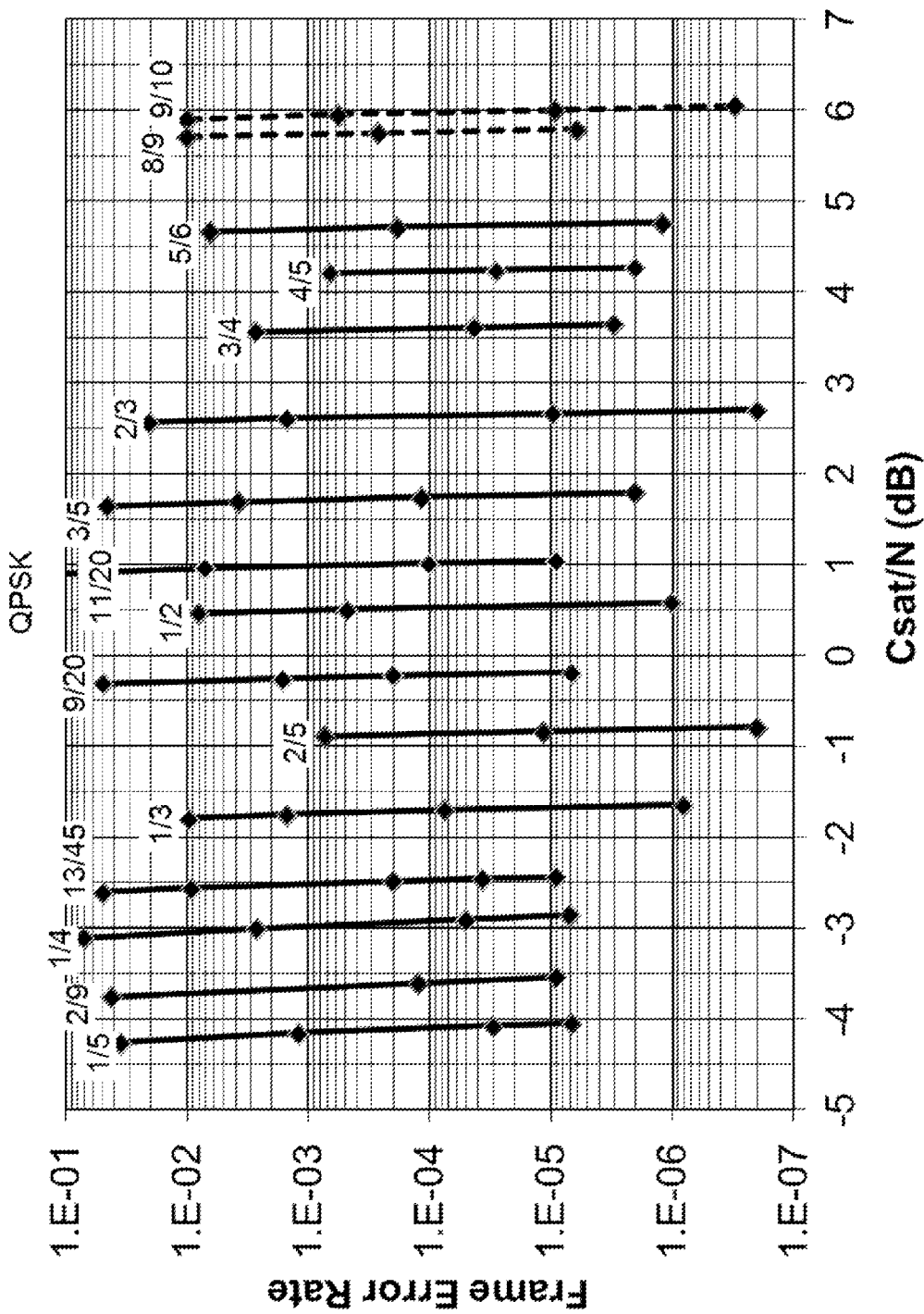

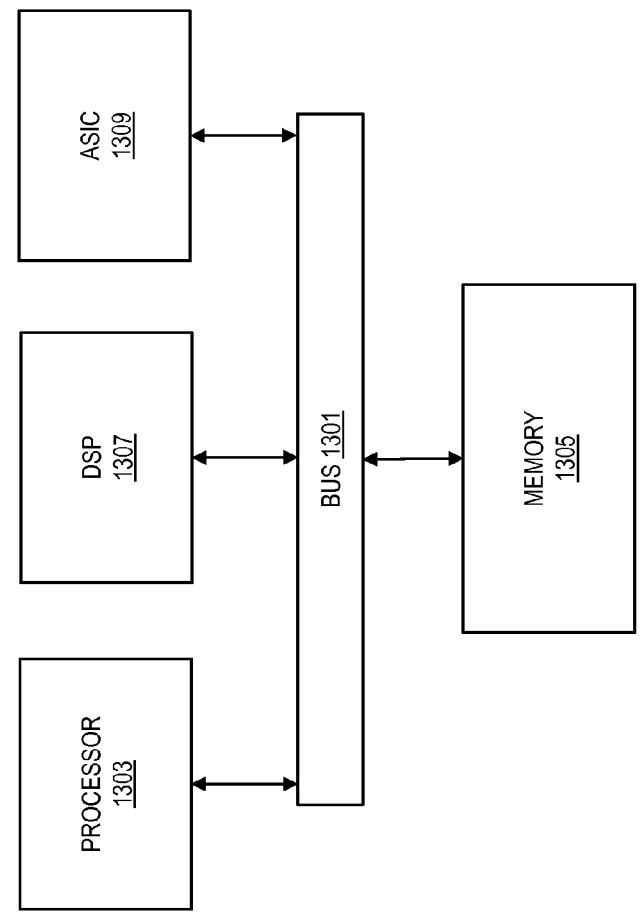

APPARATUS AND METHOD FOR IMPROVED MODULATION AND CODING SCHEMES FOR BROADBAND SATELLITE COMMUNICATIONS SYSTEMS

BACKGROUND

Over recent decades, developments in data communications technologies have continued to provide enhanced multimedia services (e.g., voice, data, video, etc.) to end-users. Such communications technologies encompass various delivery platforms, including terrestrial wire-line, fiber and wireless communications and networking technologies, and satellite communications and networking technologies. Further, in recent years, the proliferation of mobile communications has spurred an exponential growth in the provision of such enhanced multimedia services over mobile communications networks (both terrestrial and satellite based). As part of the continued evolution of such communications platforms and supporting technologies, the Digital Video Broadcasting (DVB) organization was formed (as an industry-led, global consortium of broadcasters, manufacturers, network operators, software developers, regulatory bodies and others) to advance the design of open interoperable standards for the global delivery of digital media and broadcast services.

As part of the standardization process for digital media and broadcast services, the DVB organization managed the adoption and publication of the DVB-S2 standard via recognized standards setting organizations (e.g., ETSI and TIA). DVB-S2 is a digital satellite transmission system standard covering framing structure, channel coding and modulation systems, designed for broadcast services (for standard and high definition television), interactive services (e.g., Internet access for consumer applications), and other broadband satellite applications. DVB-S2 represents a flexible standard, covering a variety of data and multimedia services delivered over satellite communications systems. The DVB-S2 standard covers various technological features, such as a flexible input stream adapter (suitable for operation with single and multiple input streams of various formats), a robust forward error correction coding (FEC) system based on low-density parity check (LDPC) codes concatenated with Bose Chaudhuri Hocquenghem (BCH) codes, a wide range of code rates (from 1/4 up to 9/10), four signal constellations (ranging in spectrum efficiency from 2 bit/s/Hz to 5 bit/s/Hz), and adaptive coding and modulation (ACM) functionality (optimizing channel coding and modulation on a frame-by-frame basis).

Since its inception, the DVB-S2 standard has been adopted globally as a predominant standard for broadcast, interactive and other broadband applications and services over satellite communications networks. Currently, there are applications and services for terminals, particularly in the field of mobile communications, that require operation at lower signal-to-noise ratios ($E_s/N_0$), down to approximately −9 dB to −10 dB. The current modulation and coding schemes (e.g., the modulation and coding schemes of the DVB-S2 standard), however, support operation down to $E_s/N_0$ ratios of only about −3 dB, and thus are unable to support the operational requirements for such current mobile and other low signal-to-noise ratio (SNR) terminals (e.g., below −3 dB). Further, such current modulation and coding schemes support operation at the upper end to $E_s/N_0$ ratios of about 15.5 dB, and thus are unable to support the operational requirements for higher end terminals (e.g., above 15.5 dB). Additionally, the modulation and coding schemes of the current DVB-S2 standard ($E_s/N_0$ ratios within the range of approximately −3 dB to 15.5 dB) lack sufficient granularity to meet the requirements of terminals in the growing field of broadcast, interactive and other broadband applications and services over satellite communications networks.

What is needed, therefore, are systems and methods for providing modulation and coding schemes that support current and future communications services and applications for terminals with operational requirements at relatively low SNR and terminals with operational requirements at relatively high SNR, and to provide modulation and coding schemes that offer finer granularity (among existing modulation and coding schemes) within an intermediate operational range.

SOME EXEMPLARY EMBODIMENTS

The present invention advantageously addresses the foregoing requirements and needs, as well as others, by providing a system and methods for providing modulation and coding schemes that support current and future communications services and applications for terminals with operational requirements at relatively low $E_s/N_0$ ratios (e.g., within the operational range of approximately −3 dB to −10 dB) and terminals with operational requirements at relatively high $E_s/N_0$ ratios (e.g., within the operational range of approximately 15.5 dB to 24 dB), and to provide modulation and coding schemes that offer finer granularity within an intermediate operational range of $E_s/N_0$ ratios (e.g., approximately −3 dB to 15.5 dB).

According to an exemplary embodiment, a method comprises encoding, by a processor of a device, a source data sequence of information bits based on a predetermined structured parity check matrix of a Low Density Parity Check (LDPC) code, wherein the encoding is performed based on frames of the source data sequence, each frame being of a length of $k_{ldpc}$ information bits $(i_0, i_1, \ldots, i_{k_{ldpc}-1})$, and the output of the encoding comprises coded LDPC frames each being $n_{ldpc}$ coded bits in length. The structured parity check matrix is represented by tabular information (a code table) of a format wherein each row represents occurrences of one values within a respective column of the parity check matrix, and the columns of the parity check matrix are derived according to a predetermined operation based on the respective rows of the tabular information, and wherein the code table comprises one of a selection of new LDPC code designs (each represented by a respective code table). According to the method, the encoding wherein the encoding comprises generating $n_{ldpc}-k_{ldpc}$ parity bits $(p_0, p_1, \ldots, p_{n_{ldpc}-k_{ldpc}-1})$ for each frame of the source data sequence, wherein the generation of the parity bits comprises: initializing parity bit accumulators for $p_0, p_1, \ldots, p_{n_{ldpc}-k_{ldpc}-1}$ to zero; accumulating information bit $i_0$ at parity bit accumulator addresses specified in the first row of the table; for the next group of m−1 information bits, $i_y$ (y=1, 2, . . . , m−1), accumulating each information bit at parity bit accumulator addresses {x+(y mod m)*q} mod($n_{ldpc}-k_{ldpc}$), wherein x denotes an address of a parity bit accumulator corresponding to the information bit $i_0$, and q is a code-rate dependent constant (q=($n_{ldpc}$−k)/m), and wherein m is a code-dependent constant and k=R*n (where R is the code rate); accumulating $i_m$ at parity bit accumulator addresses specified in the second row of the table, and, in a similar manner as for the group of m−1 information bits (above), accumulating each information bit of the next group of m−1 information bits $i_z$, z=(m+1, m+2, . . . , 2m) at {x+(z mod m)*q} mod ($n_{ldpc}-k_{ldpc}$), wherein x denotes the address of the parity bit accumulator corresponding to the information bit $i_m$ (the entries of the second row of the table); in a similar manner, for each subsequent group of m information bits, accumulating the information bits at parity bit addresses based on a next row of the table; and after all of the information bits of the frame are accumulated, performing operations according to $p_i=p_i \oplus p_{i-1}$, wherein for $i=1, 2, \ldots, (n_{ldpc}-k_{ldpc}-1)$, each $p_i$ resulting from the operation for a given i is equal to the parity bit $p_i$.

According to a further exemplary embodiment, the method further comprises interleaving each coded LDPC frame using a block interleaver, wherein the coded bits are written into an interleaver array on a column-by-column basis and read out on a row-by-row basis, and the output of the interleaving comprises coded FEC frames. The interleaver array comprises a number of rows and a number of columns, and the coded bits are read out of each row in a predetermined order, wherein the number of columns in the interleaver array is based on a selected modulation scheme, and the coded bits are read out of each row of the interleaver array in a predetermined order based on the selected modulation scheme and a selected code rate.

According to yet a further exemplary embodiment, the method further comprises modulating the coded FEC frames according to a selected modulation scheme, wherein the selected modulation scheme comprises one of the following modulation types: BPSK (Binary Phase Shift Keying), π/2 BPSK, OQPSK (Offset Quadrature Phase Shift Keying), QPSK (Quadrature Phase Shift Keying), 8-PSK (Phase Shift Keying), 16-APSK (Amplitude Phase Shift Keying), 32-APSK, 64-APSK and 256-APSK, wherein, in the case of BPSK, π/2 BPSK or QPSK, the coded FEC frames are not interleaved. Additionally, according to a further exemplary embodiment, the selected modulation scheme is a 256-APSK modulation based on a signal constellation of a 32+32+64+64+64 ring format, having a novel design for the bit labeling and [x, y] bit coordinate positions.

Still other aspects, features, and advantages of the present invention are readily apparent from the following detailed description, simply by illustrating a number of particular embodiments and implementations, including the best mode contemplated for carrying out the present invention. The present invention is also capable of other and different embodiments, and its several details can be modified in various obvious respects, all without departing from the spirit and scope of the present invention. Accordingly, the drawing and description are to be regarded as illustrative in nature, and not as restrictive.

BRIEF DESCRIPTION OF THE DRAWINGS

The present invention is illustrated by way of example, and not by way of limitation, in the figures of the accompanying drawings and in which like reference numerals refer to similar elements and in which:

FIG. 1A illustrates a communications system capable of employing modulation and coding protocols, in accordance with exemplary embodiments of the present invention;

FIG. 1B illustrates a satellite communications system capable of employing modulation and coding protocols, in accordance with exemplary embodiments of the present invention;

FIG. 3B illustrates the bit interleaving scheme for the 8PSK modulation formats (for rate 3/5 only) of the DVB-S2 standard for the normal FEC Frame length;

FIG. 5 illustrates simulated performance curves for various FEC codes with QPSK modulation over an AWGN channel, in accordance with exemplary embodiments of the present invention;

FIG. 13 illustrates a block diagram of a chip set that can be utilized in implementing communications system protocols, according to exemplary embodiments of the present invention.

DETAILED DESCRIPTION

Figure 2A:
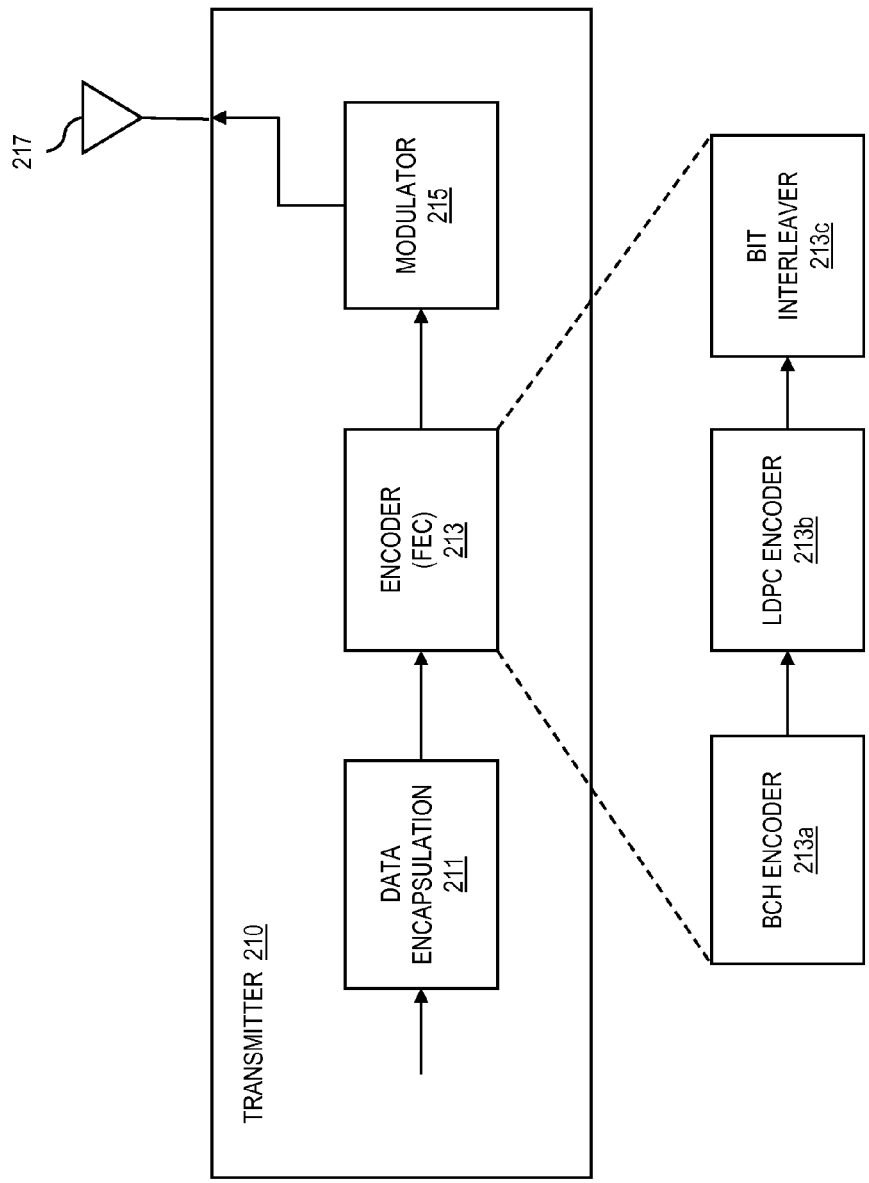
FIG. 2A illustrates a block diagram of an exemplary transmitter configured to operate in the systems of FIGS. 1A and 1B, in accordance with exemplary embodiments of the present invention.

A system and methods for communications system protocols to support communications services and applications over relatively low signal-to-noise ratio ($E_s/N_0$) links, is described. In the following description, for the purposes of explanation, numerous specific details are set forth in order to provide a thorough understanding of the invention. It is apparent, however, that the invention may be practiced without these specific details or with an equivalent arrangement. In other instances, well known structures and devices are shown in block diagram form in order to avoid unnecessarily obscuring the invention.

FIG. 1A illustrates a communications system capable of employing modulation and coding protocols, in accordance with exemplary embodiments of the present invention. With reference to FIG. 1A, a broadband communications system 110 includes one or more transmitters 112 (of which one is shown) that generate signal waveforms for transmission to one or more receivers 116 (of which one is shown). The signal waveforms are transmitted across a communications channel 114, which (for example) may comprise a channel of a terrestrial, wireless terrestrial or satellite communications system. In this discrete communications system 110, the transmitter 112 has a signal source that produces a discrete set of data signals, where each of the data signals is transmitted over a corresponding signal waveform. The discrete set of data signals may first be encoded (e.g., via a forward error correction (FEC) code) to combat noise and other issues associated with the channel 114. Once encoded, the encoded signals may then be modulated onto a carrier for transmission over the channel 114. The signal waveforms are attenuated, or otherwise altered, by communications channel 114.

FEC is required in terrestrial and satellite systems to provide high quality communication over a radio frequency (RF) propagation channel, which induces signal waveform and spectrum distortions, including signal attenuation (freespace propagation loss), multi-path induced fading and adjacent channel interference. These impairments drive the design of the radio transmission and receiver equipment; exemplary design objectives include selecting modulation formats, error control schemes, demodulation and decoding techniques and hardware components that together provide an efficient balance between system performance and implementation complexity. Differences in propagation channel characteristics, such as between terrestrial and satellite communication channels, naturally result in significantly different system designs. Likewise, existing communications systems continue to evolve in order to satisfy increased system requirements for new higher rate or higher fidelity communication services.

FIG. 1B illustrates a satellite communications system capable of employing modulation and coding protocols, in accordance with exemplary embodiments of the present invention. With reference to FIG. 1B, satellite communications system 120 includes a satellite 121 that supports communication among multiple satellite terminals (STs) 123a-123n, user terminals (UTs) 127a-127n, and a hub 127. The HUB 127 may assume the role of a Network Operations Center (NOC), which controls the access of the STs 123a-123n and UTs 127a-127n to the system 120, and also provides element management functions and control of the address resolution and resource management functionality. The Satellite communications system 120 may operate as a traditional bent-pipe system, where the satellite essentially operates as a repeater. Alternatively, the system 120 may employ a switching or processing satellite supporting mesh communications (point-to-point communications directly between a pair of the STs 123a-123n and UTs 127a-127n).

In a traditional bent-pipe system of an exemplary embodiment, for example, the satellite operates as a repeater or bent pipe, and communications between the STs 123a-123n and UTs 127a-127n are transmitted over a double-hop path. For example, in a communication from ST 123a to ST 123n, over the first hop, the communication is transmitted, via the satellite, from the ST 123a to the HUB 127. The HUB 127 decodes the communication and determines the destination as ST 123n. The HUB 127 then appropriately addresses and repackages the communication, encodes and modulates it, and transmits the communication over the second hop, via the satellite, to the destination ST 123n. Accordingly, the satellite of such a system acts as a bent pipe or repeater, transmitting communications between the HUB 127 and the STs/UTs.

In an alternate embodiment, with a communications system 120 that employs a processing satellite (e.g., including a packet switch operating, for example, at a data link layer), the system may support direct unicast (point-to-point) communications and multicast communications among the STs 123a-123n and UTs 127a-127n. In the case of a processing satellite, the satellite 121 decodes the received signal and determines the destination ST(s)/UT(s) (as the hub 127 would in a bent-pipe system). The satellite 121 then addresses the data accordingly, encodes and modulates it, and transmits the modulated signal, over the channel 114, to the destination ST(s)/UT(s). Further, the STs 123a-123n may each provide connectivity to one or more respective hosts (e.g., hosts 125a-125n, respectively).

Further, based on recent trends in the advancement of current applications and services and in the development of new applications and services, it is envisioned that systems employing a multiplexing of data signals on the same channel 114 (e.g., time multiplexed), where (on a frame-by-frame basis) such data signals may be destined for different receive terminals of different capabilities (e.g., any combination of STs 125a-125n and UTs 127a-127n. For example, data signals destined for high S/N terminals (e.g., any of the STs 125a-125n) may be multiplexed with data signals destined for lower S/N terminals (e.g., any of the UTs 127a-127n), on the same channel 114 (on a frame-by-frame basis).

FIG. 2A illustrates a block diagram of an exemplary transmitter configured to operate in the systems of FIGS. 1A and 1B, in accordance with exemplary embodiments of the present invention. With reference to FIG. 2A, the transmitter 210 is equipped with a data encapsulation module 211 that accepts the original application layer source data and performs the upper layer encapsulation to from the baseband frames. The encoder (e.g., an FEC encoder) 213 receives the baseband frames from the data encapsulation module 211, and outputs a coded stream of higher redundancy suitable for error correction processing at the receiver (shown in FIG. 6). The encoded signal is fed to the modulator 215, which maps the encoded messages to signal waveforms, based in part on modulation signal constellations. For example, the data encapsulation module 211 performs the upper layer encapsulation to generate the baseband frames based on the source data bits, and then the encoder 213 and modulator 215 collectively perform the modulation and coding of the baseband frames and the generation of the physical layer frames, in accordance with the exemplary embodiments of the present invention. The physical layer frames are then transmitted (as signal waveforms), via the transmit antenna 217, over the communication channel 114 to the satellite 121.

Figure 2B:
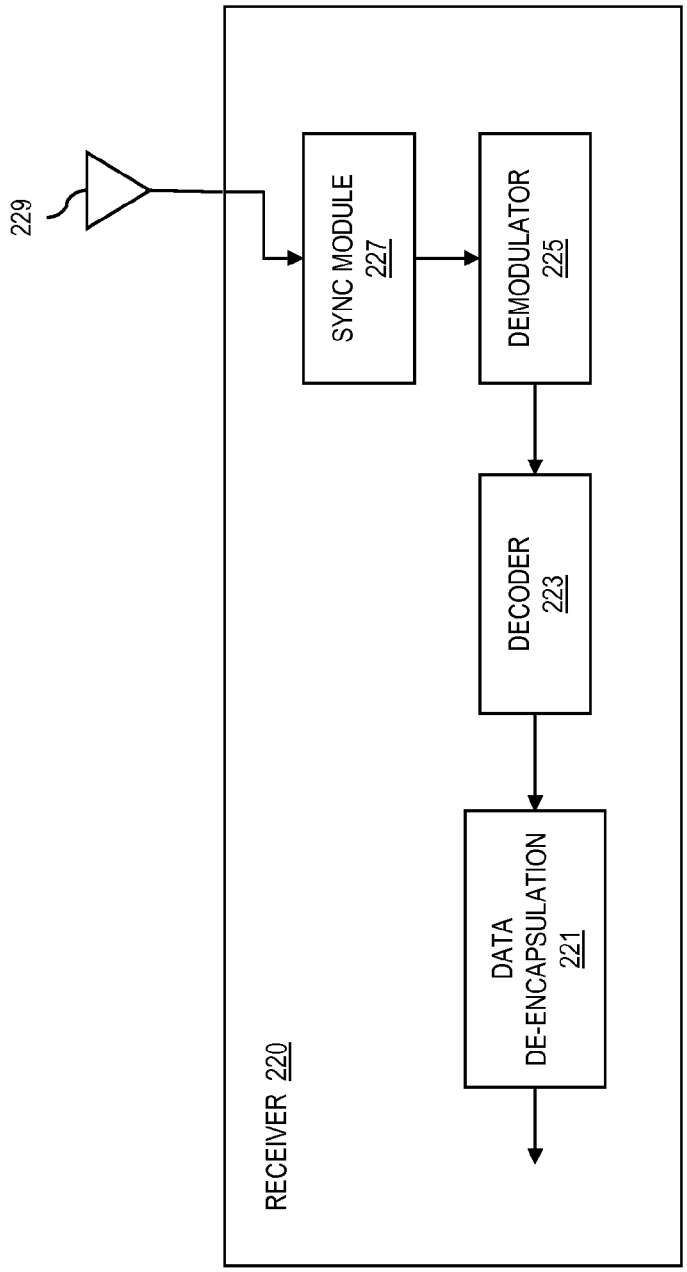
FIG. 2B illustrates a block diagram of an exemplary receiver configured to operate in the systems of FIGS. 1A and 1B, in accordance with exemplary embodiments of the present invention.

FIG. 2B illustrates a block diagram of an exemplary receiver configured to operate in the systems of FIGS. 1A and 1B, in accordance with exemplary embodiments of the present invention. With reference to FIG. 2B, the receiver 220 comprises receive antenna 229, sync module 227 demodulator 225, decoder 223 and de-encapsulation module 221. The receive antenna 229 receives the signal waveform transmitted over the channel 114 from the satellite 121. The sync module 227 detects the unique word, performs synchronization and determines the modcod and other PLS signaling of the PL Header. The demodulator 225 demodulates the received signal waveforms, based in part on the signal constellation employed for the modulation, to obtain the encoded signals. The decoder 223 then decodes the demodulated bit sequence to generate the encapsulated message data, and the de-encapsulation module 221 de-encapsulates the message data to regenerate the original source data.

As mentioned above, as one exemplary embodiment for broadcast and broadband communications services over satellite networks, the DVB-S2 standard has been adopted globally as a predominant standard for broadcast, interactive and other broadband services and applications. The framing structure, channel coding and modulation systems of the DVB-S2 standard are described in the European Telecommunications Standards Institute (ETSI) publication, ETSI EN 302 307 V1.3.1, which is incorporated herein by reference in its entirety. DVB-S2 represents a flexible standard, covering a variety of data and multimedia services delivered over satellite communications systems. Generic Stream Encapsulation (GSE) protocols may be employed to provide a data link layer protocol that facilitates the transmission of user or application data from packet oriented protocols (e.g., Internet protocol or IP) on top of a unidirectional physical layer protocol (e.g., DVB-S2). According to the GSE protocol, application data in the form of packet data units (PDUs) are first encapsulated within the baseband frames of the communications network (e.g., DVB-S2 baseband packets in a satellite communications system).

The DVB-S2 standard, for example, was designed to facilitate robust synchronization and signaling at the physical layer, and synchronization and detection of the modulation and coding parameters by a receiver before demodulation and FEC decoding. At the physical layer, baseband frames are encoded to form an output stream of FEC Frames. For example, the baseband frames are encoded by the FEC encoder 213, which comprises a t-error BCH outer coding via the BCH encoder 213a, an LDPC inner coding via the LDPC encoder 213b, and bit interleaving via the bit interleaver 213c. The interleaver 213c reorders the encoded sequence of symbols or bits from the LDPC encoder 213b in a predetermined manner. More specifically, the FEC coding subsystem of DVB-S2 comprises a BCH outer coding, LDPC inner coding and bit interleaving. The input to the FEC subsystem consists of a data stream of baseband frames, where each baseband frame of $K_{bch}$ bits is processed by the coding system to produce an FEC Frame of $n_{ldpc}$ bits, where $n_{ldpc}$=64,800 for a normal FEC Frame and $n_{ldpc}$=16,200 for a short FEC Frame.

Physical Layer framing is then performed, by slicing the XFEC Frames into a number of fixed length slots (of length M=90 symbols each), to generate the physical layer frames, as specified in Section 5.5 of the above-incorporated DVB-S2 publication, ETSI EN 302 307.

For the outer BCH coding, the BCH coding parameters are specified in the following tables:

TABLE 1a

Coding Parameters (normal FEC Frame – LDPC Coded Block $n_{ldpc}$ = 64800)

| LDPC Code Rate | BCH Uncoded Block $K_{bch}$ | BCH Coded Block $N_{bch}$ LDPC Uncoded Block $k_{ldpc}$ | BCH t-Error Correction (bits) |
|---|---|---|---|
| 1/4 | 16008 | 16200 | 12 |
| 1/3 | 21408 | 21600 | 12 |
| 2/5 | 25728 | 25920 | 12 |
| 1/2 | 32208 | 32400 | 12 |
| 3/5 | 36688 | 38880 | 12 |
| 2/3 | 43040 | 43200 | 10 |
| 3/4 | 48408 | 48600 | 12 |
| 4/5 | 51648 | 51840 | 12 |
| 5/6 | 53840 | 54000 | 10 |
| 8/9 | 57472 | 57600 | 8 |
| 9/10 | 58192 | 58320 | 8 |

TABLE 1b

Coding Parameters (short FEC Frame – LDPC Coded Block $n_{ldpc}$ = 16200)

| LDPC Code Rate | BCH Uncoded Block $K_{bch}$ | BCH Coded Block $N_{bch}$ LDPC Uncoded Block $k_{ldpc}$ | BCH t-Error Correction (bits) | Effective LDPC Rate ($k_{ldpc}$/16200) |
|---|---|---|---|---|
| 1/4 | 3072 | 3240 | 12 | 1/5 |
| 1/3 | 5232 | 5400 | 12 | 1/3 |
| 2/5 | 6312 | 6480 | 12 | 2/5 |
| 1/2 | 7032 | 7200 | 12 | 4/9 |
| 3/5 | 9552 | 9720 | 12 | 3/5 |
| 2/3 | 10632 | 10800 | 12 | 2/3 |
| 3/4 | 11712 | 11880 | 12 | 11/15 |
| 4/5 | 12432 | 12600 | 12 | 7/9 |
| 5/6 | 13152 | 13320 | 12 | 37/45 |
| 8/9 | 14232 | 14400 | 12 | 8/9 |
| 9/10 | N/A | N/A | N/A | N/A |

The generator polynomial of the BCH encoder is obtained by multiplying the first t polynomials specified in the following tables:

TABLE 2a

BCH Polynomials (normal FEC Frame – LDPC Coded Block $n_{ldpc}$ = 64800)

| | |
|---|---|
| $g_1(x)$ | $1 + x^2 + x^3 + x^5 + x^{16}$ |
| $g_2(x)$ | $1 + x + x^4 + x^5 + x^6 + x^8 + x^{16}$ |
| $g_3(x)$ | $1 + x^2 + x^3 + x^4 + x^5 + x^7 + x^8 + x^9 + x^{10} + x^{11} + x^{16}$ |
| $g_4(x)$ | $1 + x^2 + x^4 + x^6 + x^9 + x^{11} + x^{12} + x^{14} + x^{16}$ |
| $g_5(x)$ | $1 + x + x^2 + x^3 + x^5 + x^8 + x^9 + x^{10} + x^{11} + x^{12} + x^{16}$ |
| $g_6(x)$ | $1 + x^2 + x^4 + x^5 + x^7 + x^8 + x^9 + x^{10} + x^{12} + x^{13} + x^{14} + x^{15} + x^{16}$ |
| $g_7(x)$ | $1 + x^2 + x^5 + x^6 + x^8 + x^9 + x^{10} + x^{11} + x^{13} + x^{15} + x^{16}$ |
| $g_8(x)$ | $1 + x + x^2 + x^5 + x^6 + x^8 + x^9 + x^{12} + x^{13} + x^{14} + x^{16}$ |
| $g_9(x)$ | $1 + x^5 + x^7 + x^9 + x^{10} + x^{11} + x^{16}$ |
| $g_{10}(x)$ | $1 + x + x^2 + x^5 + x^7 + x^8 + x^9 + x^{10} + x^{12} + x^{13} + x^{14} + x^{16}$ |
| $g_{11}(x)$ | $1 + x^2 + x^3 + x^5 + x^9 + x^{11} + x^{12} + x^{13} + x^{16}$ |
| $g_{12}(x)$ | $1 + x + x^5 + x^6 + x^7 + x^9 + x^{11} + x^{12} + x^{16}$ |

TABLE 2b

BCH Polynomials (short FEC Frame – LDPC Coded Block $n_{ldpc}$ = 16200)

| | |
|---|---|
| $g_1(x)$ | $1 + x + x^3 + x^5 + x^{14}$ |
| $g_2(x)$ | $1 + x^6 + x^8 + x^{11} + x^{14}$ |
| $g_3(x)$ | $1 + x + x^2 + x^6 + x^9 + x^{10} + x^{14}$ |
| $g_4(x)$ | $1 + x^4 + x^7 + x^8 + x^{10} + x^{12} + x^{14}$ |
| $g_5(x)$ | $1 + x^2 + x^4 + x^6 + x^8 + x^9 + x^{11} + x^{13} + x^{14}$ |
| $g_6(x)$ | $1 + x^3 + x^7 + x^8 + x^9 + x^{13} + x^{14}$ |
| $g_7(x)$ | $1 + x^2 + x^5 + x^6 + x^7 + x^{10} + x^{11} + x^{13} + x^{14}$ |
| $g_8(x)$ | $1 + x^5 + x^8 + x^9 + x^{10} + x^{11} + x^{14}$ |
| $g_9(x)$ | $1 + x + x^2 + x^3 + x^9 + x^{10} + x^{14}$ |
| $g_{10}(x)$ | $1 + x^3 + x^6 + x^9 + x^{11} + x^{12} + x^{14}$ |
| $g_{11}(x)$ | $1 + x^4 + x^{11} + x^{12} + x^{14}$ |
| $g_{12}(x)$ | $1 + x + x^2 + x^3 + x^5 + x^6 + x^7 + x^8 + x^{10} + x^{13} + x^{14}$ |

The BCH encoding of information bits $m=(m_{k_{bch}-1}, m_{k_{bch}-2}, \ldots m_1, m_0)$ onto a codeword $c=(m_{k_{bch}-1}, m_{k_{bch}-2}, \ldots m_1, m_0, d_{n_{bch}-k_{bch}-1}, d_{n_{bch}-k_{bch}-2}, \ldots d_1, d_0)$ is achieved as follows: (1) multiply the message polynomial $m(x)=(m_{k_{bch}-1}x^{k_{bch}-1}+m_{k_{bch}-2}x^{k_{bch}-2}+\ldots+m_1x+m_0)$ by $x^{n_{bch}-k_{bch}}$; (2) divide $x^{n_{bch}-k_{bch}}m(x)$ by the generator polynomial $g(x)$, where $d(x)=(d_{n_{bch}-k_{bch}-1}x^{n_{bch}-k_{bch}-1}+\ldots+d_1x+d_0)$ is the remainder; and (3) set the codeword polynomial $c(x)=x^{n_{bch}-k_{bch}}m(x)+d(x)$.

Next, for the LDPC inner coding, the LDPC encoder systematically encodes an information block of size $k_{ldpc}$, $i=(i_0, i_1, \ldots, i_{k_{ldpc}-1}$ onto a codeword of size $n_{ldpc}$, $c=(i_0, i_1, \ldots i_{k_{ldpc}-1}, p_0, p_1, \ldots, p_{n_{ldpc}-k_{ldpc}-1})$. The transmission of the codeword starts in the given order from $i_0$ and ends with $p_{n_{ldpc}-k_{ldpc}-1}$. The LDPC code parameters ($k_{ldpc}$, $n_{ldpc}$) are specified in the above tables 1a and 1b. For backwards compatible modes, the output of the inner code is processed according to Annex F of the above-incorporated DVB-S2 publication, ETSI EN 302 307.

The task of the LDPC encoder is to determine $n_{ldpc}-k_{ldpc}$ parity bits ($p_0, p_1, \ldots p_{n_{ldpc}-k_{ldpc}-1}$) for every block of $k_{ldpc}$ information bits ($i_0, i_1, \ldots, i_{k_{ldpc}-1}$). The procedure is as follows: (1) initialize $p_0=p_1=\ldots=p_{n_{ldpc}-k_{ldpc}-1}=0$; (2) for the first information bit $i_0$, accumulate $i_0$ at the parity bit addresses specified in the first row of the table for the respective code rate and FEC Frame size—The tables are specified in Annexes B and C of the above-incorporated DVB-S2 publication, ETSI EN 302 307. For example, for the rate 2/3 code for $n_{ldpc}=64800$ (Table B.6 of Annex B), where all additions are in GF(2):

$p_0 = p_0 \oplus i_0$
$p_{2767} = p_{2767} \oplus i_0$
$p_{10491} = p_{10491} \oplus i_0$
$p_{240} = p_{240} \oplus i_0$
$p_{16043} = p_{16043} \oplus i_0$
$p_{18673} = p_{18673} \oplus i_0$
$p_{506} = p_{506} \oplus i_0$
$p_{9279} = p_{9279} \oplus i_0$
$p_{12826} = p_{12826} \oplus i_0$
$p_{10579} = p_{10579} \oplus i_0$
$p_{8065} = p_{8065} \oplus i_0$
$p_{20928} = p_{20928} \oplus i_0$
$p_{8226} = p_{8226} \oplus i_0$ (3) for the next 359 information bits $i_m$, m=1, 2, ..., 359, accumulate $i_m$ at parity bit addresses {x+m mod 360*q} mod ($n_{ldpc}-k_{ldpc}$), where x denotes the address of the parity bit accumulator corresponding to the first bit $i_0$, and q is a code rate dependent constant (specified in Tables 3a and 3b, below). Continuing with the example for the rate 2/3 code for $n_{ldpc}=64800$, q=60—so, for example, for information bit $i_1$, the following operations are performed:

$p_{60} = p_{60} \oplus i_1$
$p_{2827} = p_{2827} \oplus i_1$
$p_{10551} = p_{10551} \oplus i_1$
$p_{300} = p_{300} \oplus i_1$
$p_{16103} = p_{16103} \oplus i_1$
$p_{18733} = p_{18733} \oplus i_1$
$p_{566} = p_{566} \oplus i_1$
$p_{9339} = p_{9339} \oplus i_1$
$p_{12886} = p_{12886} \oplus i_1$
$p_{10639} = p_{10639} \oplus i_1$
$p_{8125} = p_{8125} \oplus i_1$
$p_{20988} = p_{20988} \oplus i_1$
$p_{8286} = p_{8286} \oplus i_1$ (4) for the $361^{st}$ information bit $i_{360}$, accumulate $i_{360}$ at the parity bit addresses specified in the second row of the appropriate table (in Annexes B and C of ETSI EN 302 307) table for the respective code rate and FEC Frame size. Then, in a similar manner the addresses of the parity bit accumulators for the following 359 information bits $i_m$, m=361, 362, ..., 719 are obtained using the formula {x+m mod 360*q} mod ($n_{ldpc}-k_{ldpc}$), where x denotes the address of the parity bit accumulator corresponding to the first bit $i_{360}$, (the entries of the second row of the respective table); and (5) in a similar manner, for every group of 360 new information bits, a new row from the respective table is used to find the addresses of the parity bit accumulators.

Then, once all the information bits are exhausted, the final parity bits are obtained by sequentially performing the following operations, starting with i=1, $p_i = p_i \oplus p_{i-1}$, where i=1, 2, ..., $n_{ldpc}-k_{ldpc}-1$, and then the final content of $p_i$, i=0, 1, ..., $n_{ldpc}-k_{ldpc}-1$ is equal to the parity bit $p_i$.

TABLE 3a q Values (normal FEC Frame – LDPC Coded Block $n_{ldpc}$ = 64800)

| LDPC Code Rate | q |
|---|---|
| 1/4 | 135 |
| 1/3 | 120 |
| 2/5 | 108 |
| 1/2 | 90 |
| 3/5 | 72 |
| 2/3 | 60 |
| 3/4 | 45 |
| 4/5 | 36 |
| 5/6 | 30 |
| 8/9 | 20 |
| 9/10 | 18 |

TABLE 3b q Values (short FEC Frame – LDPC Coded Block $n_{ldpc}$ = 16200)

| LDPC Code Rate | q |
|---|---|
| 1/4 | 36 |
| 1/3 | 30 |
| 2/5 | 27 |
| 1/2 | 25 |
| 3/5 | 18 |
| 2/3 | 15 |
| 3/4 | 12 |
| 4/5 | 10 |
| 5/6 | 8 |
| 8/9 | 5 |

Figure 3A:
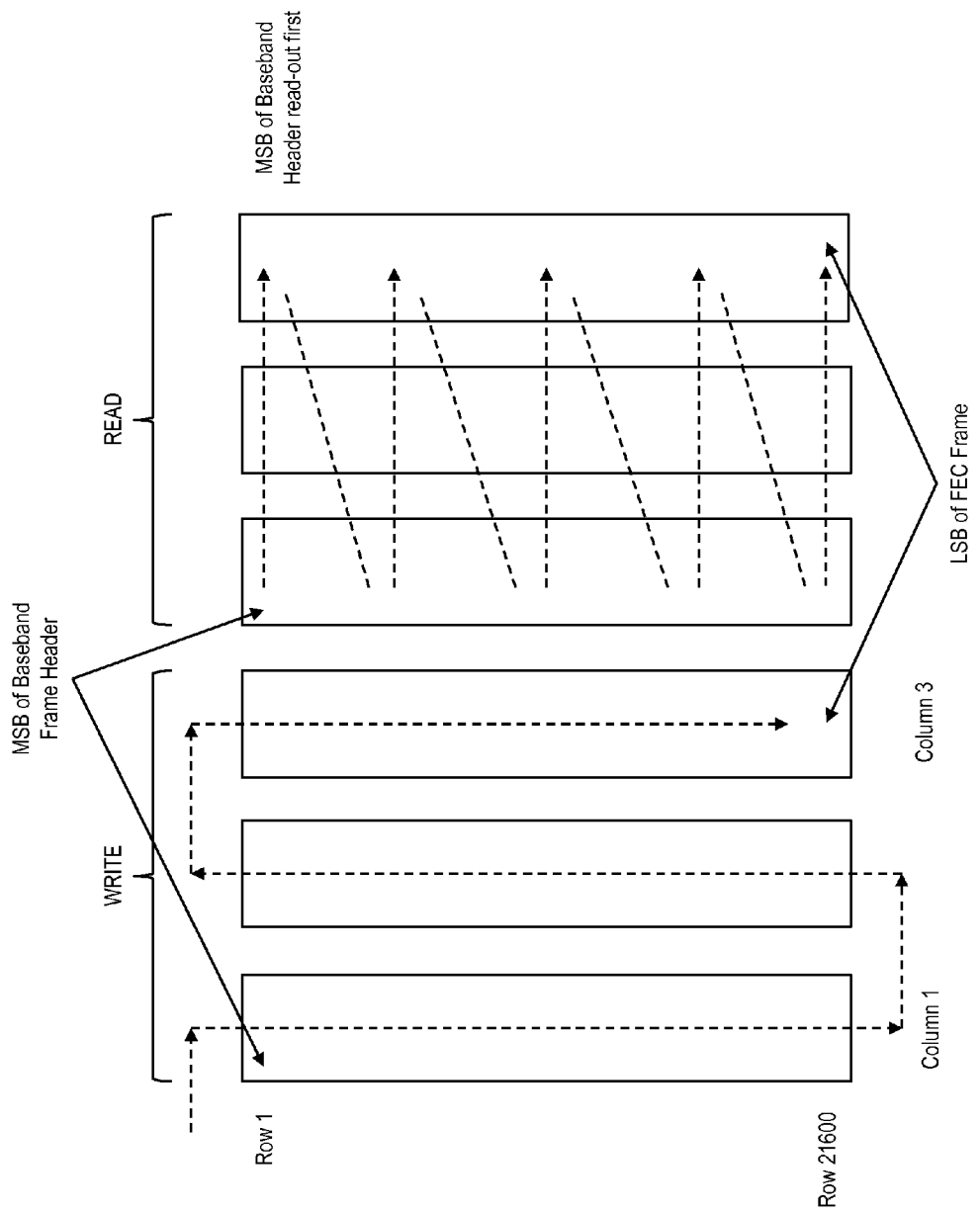
FIG. 3A illustrates the bit interleaving scheme for the 8PSK modulation formats (for all rates except rate 3/5) of the DVB-S2 standard for the normal FEC Frame length.

With reference to FIGS. 3A and 3B, for the 8PSK, 16APSK and 32APSK modulation schemes of the DVB-S2 standard, the bit interleaver 213c comprises a block interleaver that interleaves the output of the LDPC encoder 213b. Data is serially written into the interleaver column-wise, and serially read out row-wise (the MSB of baseband frame header is read out first, except in the case of the 8PSK rate 3/5 modulation where MSB of the baseband frame header is read out third), as illustrated in FIGS. 3A and 3B, respectively. The configuration of the block interleaver for each modulation format is specified in the following table:

TABLE 4

Block Interleaver Configurations

| Modulation | Rows ($n_{ldpc}$ = 64800) | Rows ($n_{ldpc}$ = 16200) | Columns |
|---|---|---|---|
| 8PSK | 21600 | 5400 | 3 |
| 16APSK | 16200 | 4050 | 4 |
| 32APSK | 12960 | 3240 | 5 |

For the DVB-S2 modulation, each FEC Frame (comprising a sequence of 64,800 bits for a normal FEC Frame, or 16,200 bits for a short FEC Frame) is then modulated based on one of various options specified in the standard for modulation of the data payload (e.g., QPSK, 8PSK, 16APSK, or 32APSK). For example, each FEC Frame is serial-to-parallel converted with the following parallelism levels: $\eta_{MOD}$ 2 for QPSK; $\eta_{MOD}$ 3 for 8PSK; $\eta_{MOD}$ 4 for 16APSK; $\eta_{MOD}$ 5 for 32APSK. Then, each resulting parallel sequence is mapped based on a signal constellation, generating an (I, Q) sequence of variable length depending on the selected modulation efficiency ($\eta_{MOD}$ bits/Hz). The DVB-S2 signal constellations for the QPSK, 8PSK, 16APSK, and 32APSK modulation schemes are illustrated in FIGS. 9-12 (respectively) of the above-incorporated DVB-S2 publication, ETSI EN 302 307. The resulting output sequence is referred to as a complex FEC Frame or XFEC Frame, composed of $64,800/\eta_{MOD}$ (normal XFEC Frame) modulation symbols, or $16,200/\eta_{MOD}$ (short XFEC Frame) modulation symbols. Each modulation symbol thereby comprises a complex vector in the format (I, Q) (I being the in-phase component and Q the quadrature component), or in the equivalent format $\rho$ exp $j\phi$ ($\rho$ being the modulus of the vector and $\phi$ being its phase).

Figure 4A:
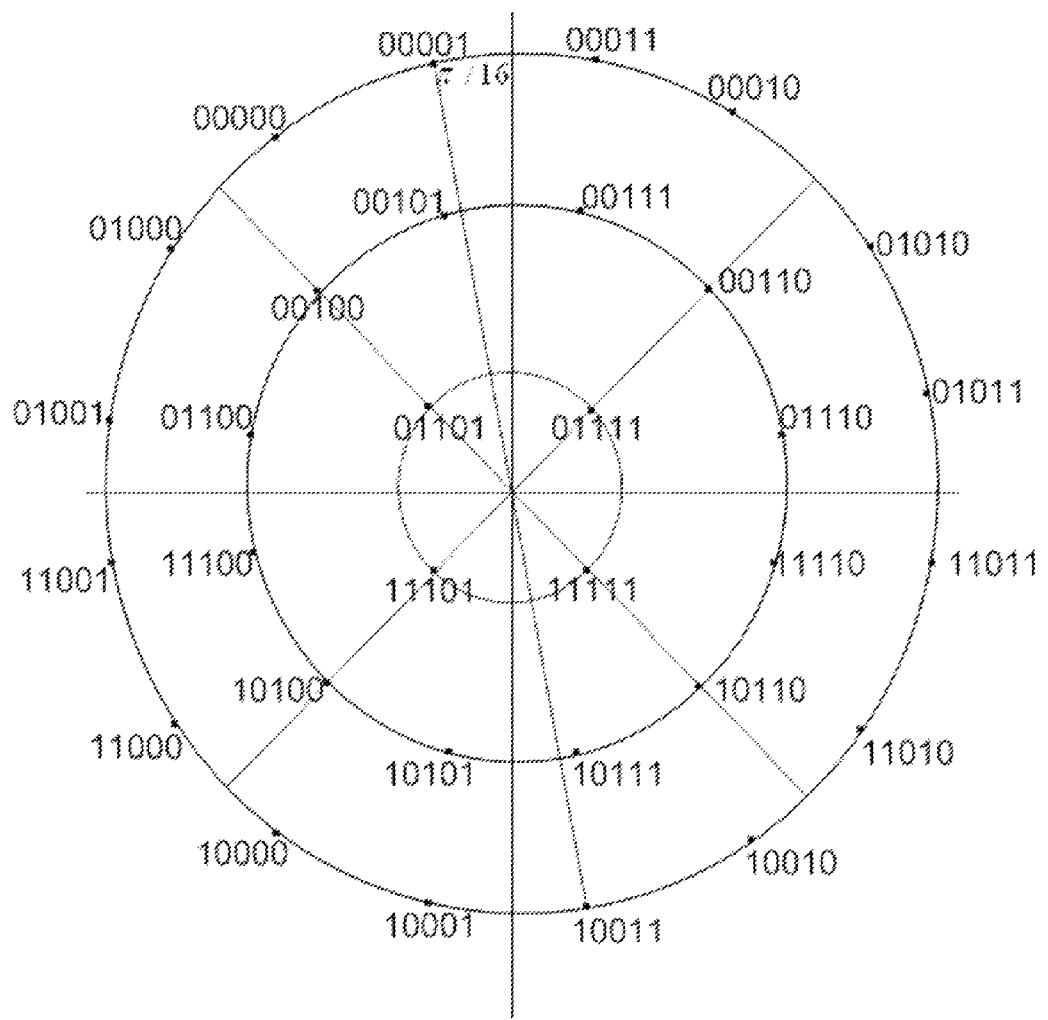
FIG. 4A illustrates a prior art 32APSK (4+12+16) signal constellation.

With respect to other current modulation schemes, copending U.S. patent application Ser. No. 13/327,316, which is incorporated herein in its entirety, provides a 32APSK constellation and a 64APSK constellation. The 32APSK signal constellation is provided with a ring format of 4+12+16 (4 constellation points on the inner-most ring, 12 constellation points on the next outer ring, and 16 constellation points on the outer-most ring). The bit labeling and [x, y] signal point coordinates (where the outer ring is rotated by $\pi/16$ as compared to the DVB-S2 32APSK constellation) of this 32APSK constellation are as follows (where $\epsilon_x$ represents average energy per symbol, $4*R1^2+12*R2^2+16*R3^2=32$, and R1 represents the radius of the inner-most ring, R2 represents the radius of the middle ring and R3 represents the radius of the outer ring), as further illustrated in FIG. 4A:

| Bit Label | [x, y] Coordinates |
|---|---|
| 00000 | [−R3 * $\sqrt{\epsilon_x}$ * cos(5.0 * π/16.0), R3 * $\sqrt{\epsilon_x}$ * cos(3.0 * π/16.0)] |
| 00001 | [−R3 * $\sqrt{\epsilon_x}$ * cos(7.0 * π/16.0), R3 * $\sqrt{\epsilon_x}$ * cos(π/16.0)] |
| 00010 | [R3 * $\sqrt{\epsilon_x}$ * cos(5.0 * π/16.0), R3 * $\sqrt{\epsilon_x}$ * cos(3.0 * π/16.0)] |
| 00011 | [R3 * $\sqrt{\epsilon_x}$ * cos(7.0 * π/16.0), R3 * $\sqrt{\epsilon_x}$ * cos(π/16.0)] |
| 00100 | [−R2 * $\sqrt{\epsilon_x}$ * sin(π/4.0), R2 * $\sqrt{\epsilon_x}$ * sin(π/4.0)] |
| 00101 | [−R2 * $\sqrt{\epsilon_x}$ * sin(π/12.0), R2 * $\sqrt{\epsilon_x}$ * sin(5.0 * π/12.0)] |
| 00110 | [R2 * $\sqrt{\epsilon_x}$ * sin(π/4.0), R2 * $\sqrt{\epsilon_x}$ * sin(π/4.0)] |
| 00111 | [R2 * $\sqrt{\epsilon_x}$ * sin(π/12.0), R2 * $\sqrt{\epsilon_x}$ * sin(5.0 * π/12.0)] |
| 01000 | [−R3 * $\sqrt{\epsilon_x}$ * cos(3.0 * π/16.0), R3 * $\sqrt{\epsilon_x}$ * cos(5.0 * π/16.0)] |
| 01001 | [−R3 * $\sqrt{\epsilon_x}$ * cos(π/16.0), R3 * $\sqrt{\epsilon_x}$ * cos(7.0 * π/16.0)] |
| 01010 | [R3 * $\sqrt{\epsilon_x}$ * cos(3.0 * π/16.0), R3 * $\sqrt{\epsilon_x}$ * cos(5.0 * π/16.0)] |
| 01011 | [R3 * $\sqrt{\epsilon_x}$ * cos(π/16.0), R3 * $\sqrt{\epsilon_x}$ * cos(7.0 * π/16.0)] |
| 01100 | [−R2 * $\sqrt{\epsilon_x}$ * sin(5.0 * π/12.0), R2 * $\sqrt{\epsilon_x}$ * sin(π/12.0)] |
| 01101 | [−R1 * $\sqrt{\epsilon_x}$ * sin(π/4.0), R1 * $\sqrt{\epsilon_x}$ * sin(π/4.0)] |
| 01110 | [R2 * $\sqrt{\epsilon_x}$ * sin(5.0 * π/12.0), R2 * $\sqrt{\epsilon_x}$ * sin(π/12.0)] |
| 01111 | [R1 * $\sqrt{\epsilon_x}$ * sin(π/4.0), R1 * $\sqrt{\epsilon_x}$ * sin(π/4.0)] |
| 10000 | [−R3 * $\sqrt{\epsilon_x}$ * cos(5.0 * π/16.0), −R3 * $\sqrt{\epsilon_x}$ * cos(3.0 * π/16.0)] |
| 10001 | [−R3 * $\sqrt{\epsilon_x}$ * cos(7.0 * π/16.0), −R3 * $\sqrt{\epsilon_x}$ * cos(π/16.0)] |
| 10010 | [R3 * $\sqrt{\epsilon_x}$ * cos(5.0 * π/16.0), −R3 * $\sqrt{\epsilon_x}$ * cos(3.0 * π/16.0)] |
| 10011 | [R3 * $\sqrt{\epsilon_x}$ * cos(7.0 * π/16.0), −R3 * $\sqrt{\epsilon_x}$ * cos(π/16.0)] |
| 10100 | [−R2 * $\sqrt{\epsilon_x}$ * sin(π/4.0), −R2 * $\sqrt{\epsilon_x}$ * sin(π/4.0)] |
| 10101 | [−R2 * $\sqrt{\epsilon_x}$ * sin(π/12.0), −R2 * $\sqrt{\epsilon_x}$ * sin(5.0 * π/12.0)] |
| 10110 | [R2 * $\sqrt{\epsilon_x}$ * sin(π/4.0), −R2 * $\sqrt{\epsilon_x}$ * sin(π/4.0)] |
| 10111 | [R2 * $\sqrt{\epsilon_x}$ * sin(π/12.0), −R2 * $\sqrt{\epsilon_x}$ * sin(5.0 * π/12.0)] |
| 11000 | [−R3 * $\sqrt{\epsilon_x}$ * cos(3.0 * π/16.0), −R3 * $\sqrt{\epsilon_x}$ * cos(5.0 * π/16.0)] |
| 11001 | [−R3 * $\sqrt{\epsilon_x}$ * cos(π/16.0), −R3 * $\sqrt{\epsilon_x}$ * cos(7.0 * π/16.0)] |
| 11010 | [R3 * $\sqrt{\epsilon_x}$ * cos(3.0 * π/16.0), −R3 * $\sqrt{\epsilon_x}$ * cos(5.0 * π/16.0)] |
| 11011 | [R3 * $\sqrt{\epsilon_x}$ * cos(π/16.0), −R3 * $\sqrt{\epsilon_x}$ * cos(7.0 * π/16.0)] |
| 11100 | [−R2 * $\sqrt{\epsilon_x}$ * sin(5.0 * π/12.0), −R2 * $\sqrt{\epsilon_x}$ * sin(π/12.0)] |
| 11101 | [−R1 * $\sqrt{\epsilon_x}$ * sin(π/4.0), −R1 * $\sqrt{\epsilon_x}$ * sin(π/4.0)] |
| 11110 | [R2 * $\sqrt{\epsilon_x}$ * sin(5.0 * π/12.0), −R2 * $\sqrt{\epsilon_x}$ * sin(π/12.0)] |
| 11111 | [R1 * $\sqrt{\epsilon_x}$ * sin(π/4.0), −R1 * $\sqrt{\epsilon_x}$ * sin(π/4.0)] |

This 32APSK constellation achieves improved performance over other current 32APSK modulation constellations (e.g., approximately 0.2 dB better performance over the 32APSK constellation of the DVB-S2 standard). Despite the better performance of this constellation, however, to maintain compatibility with the DVB-S2 standard (and preserve the 32APSK modcods thereof), the 32APSK constellation may be applied with only those new codes (and respective code rates), provided pursuant to the exemplary embodiments of the present invention, disclosed herein. As is evident, though, this 32APSK constellation could be applied with other codes (and respective code rates), such as those provided in the DVB-S2 standard.

Figure 4B:
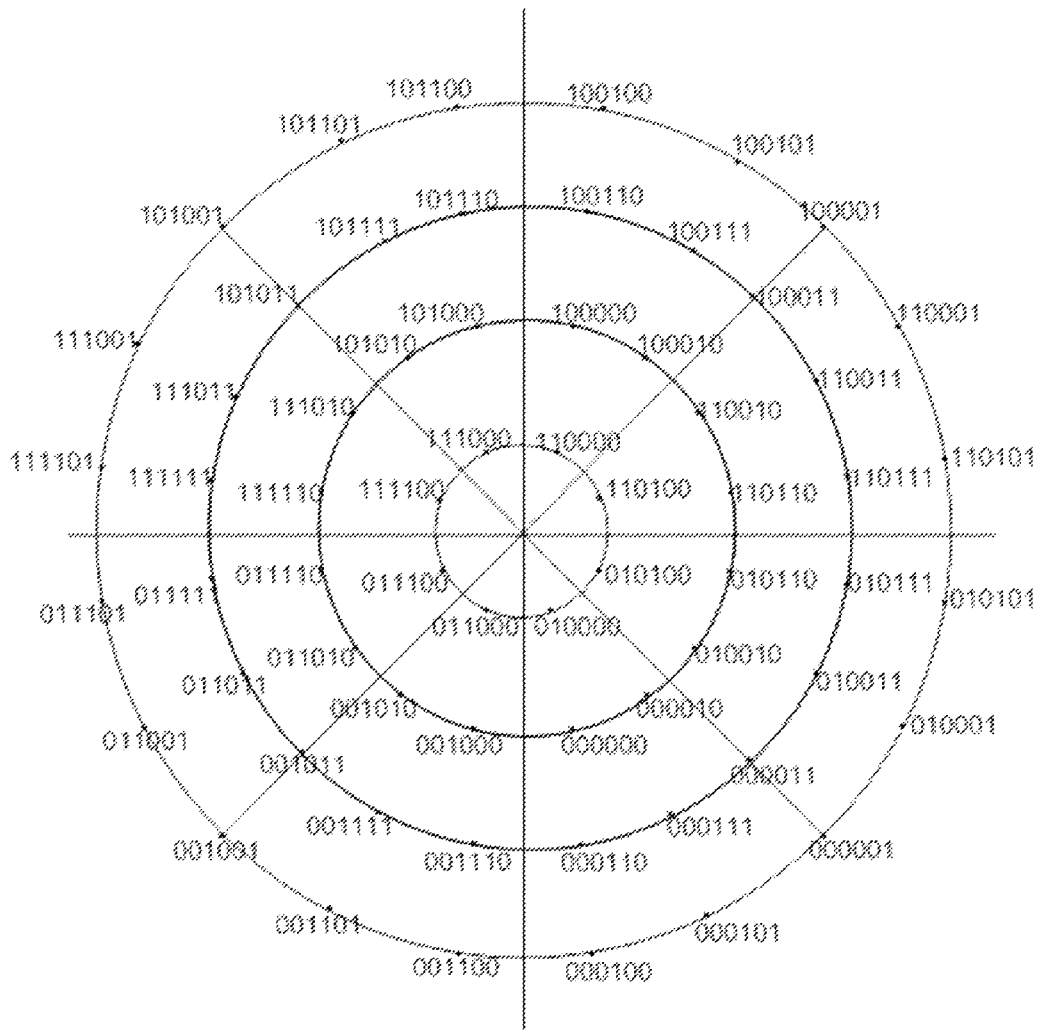
FIG. 4B illustrates a prior art 64APSK (8+16+20+20) signal constellation.

The 64APSK signal constellation is provided for higher $E_s/N_0$ with a ring format of 8+16+20+20 (8 constellation points on the inner-most ring, 16 constellation points on the next outer ring, 20 constellation points on the next outer ring, and 20 constellation points on the outer-most ring). The bit labeling and [x, y] signal point coordinates of this 64APSK constellation are as follows (where $\epsilon_x$ represents average energy per symbol, $8*R1^2+16*R2^2+20*R3^2+20*R4^2=64$, and R1 represents the radius of the inner-most ring, R2 represents the radius of the next outer ring (the first middle ring), R3 represents the radius of the next outer ring (the second middle ring) and R4 represents the radius of the outer-most ring), as further illustrated in FIG. 4B:

| Bit Label | [x, y] Coordinates |
|---|---|
| 000000 | [R2 * $\sqrt{\epsilon_x}$ * cos(25.0 * π/16.0), R2 * $\sqrt{\epsilon_x}$ * sin(25.0 * π/16.0)], |
| 000001 | [R4 * $\sqrt{\epsilon_x}$ * cos(35.0 * π/20.0), R4 * $\sqrt{\epsilon_x}$ * sin(35.0 * π/20.0)], |
| 000010 | [R2 * $\sqrt{\epsilon_x}$ * cos(27.0 * π/16.0), R2 * $\sqrt{\epsilon_x}$ * sin(27.0 * π/16.0)], |
| 000011 | [R3 * $\sqrt{\epsilon_x}$ * cos(35.0 * π/20.0), R3 * $\sqrt{\epsilon_x}$ * sin(35.0 * π/20.0)], |
| 000100 | [R4 * $\sqrt{\epsilon_x}$ * cos(31.0 * π/20.0), R4 * $\sqrt{\epsilon_x}$ * sin(31.0 * π/20.0)], |
| 000101 | [R4 * $\sqrt{\epsilon_x}$ * cos(33.0 * π/20.0), R4 * $\sqrt{\epsilon_x}$ * sin(33.0 * π/20.0)], |
| 000110 | [R3 * $\sqrt{\epsilon_x}$ * cos(31.0 * π/20.0), R3 * $\sqrt{\epsilon_x}$ * sin(31.0 * π/20.0)], |
| 000111 | [R3 * $\sqrt{\epsilon_x}$ * cos(33.0 * π/20.0), R3 * $\sqrt{\epsilon_x}$ * sin(33.0 * π/20.0)], |
| 001000 | [R2 * $\sqrt{\epsilon_x}$ * cos(23.0 * π/16.0), R2 * $\sqrt{\epsilon_x}$ * sin(23.0 * π/16.0)], |
| 001001 | [R4 * $\sqrt{\epsilon_x}$ * cos(25.0 * π/20.0), R4 * $\sqrt{\epsilon_x}$ * sin(25.0 * π/20.0)], |
| 001010 | [R2 * $\sqrt{\epsilon_x}$ * cos(21.0 * π/16.0), R2 * $\sqrt{\epsilon_x}$ * sin(21.0 * π/16.0)], |
| 001011 | [R3 * $\sqrt{\epsilon_x}$ * cos(25.0 * π/20.0), R3 * $\sqrt{\epsilon_x}$ * sin(25.0 * π/20.0)], |
| 001100 | [R4 * $\sqrt{\epsilon_x}$ * cos(29.0 * π/20.0), R4 * $\sqrt{\epsilon_x}$ * sin(29.0 * π/20.0)], |
| 001101 | [R4 * $\sqrt{\epsilon_x}$ * cos(27.0 * π/20.0), R4 * $\sqrt{\epsilon_x}$ * sin(27.0 * π/20.0)], |
| 001110 | [R3 * $\sqrt{\epsilon_x}$ * cos(29.0 * π/20.0), R3 * $\sqrt{\epsilon_x}$ * sin(29.0 * π/20.0)], |
| 001111 | [R3 * $\sqrt{\epsilon_x}$ * cos(27.0 * π/20.0), R3 * $\sqrt{\epsilon_x}$ * sin(27.0 * π/20.0)], |
| 010000 | [R1 * $\sqrt{\epsilon_x}$ * cos(13.0 * π/8.0), R1 * $\sqrt{\epsilon_x}$ * sin(13.0 * π/8.0)], |
| 010001 | [R4 * $\sqrt{\epsilon_x}$ * cos(37.0 * π/20.0), R4 * $\sqrt{\epsilon_x}$ * sin(37.0 * π/20.0)], |
| 010010 | [R2 * $\sqrt{\epsilon_x}$ * cos(29.0 * π/16.0), R2 * $\sqrt{\epsilon_x}$ * sin(29.0 * π/16.0)], |
| 010011 | [R3 * $\sqrt{\epsilon_x}$ * cos(37.0 * π/20.0), R3 * $\sqrt{\epsilon_x}$ * sin(37.0 * π/20.0)], |
| 010100 | [R1 * $\sqrt{\epsilon_x}$ * cos(15.0 * π/8.0), R1 * $\sqrt{\epsilon_x}$ * sin(15.0 * π/8.0)], |
| 010101 | [R4 * $\sqrt{\epsilon_x}$ * cos(39.0 * π/20.0), R4 * $\sqrt{\epsilon_x}$ * sin(39.0 * π/20.0)], |
| 010110 | [R2 * $\sqrt{\epsilon_x}$ * cos(31.0 * π/16.0), R2 * $\sqrt{\epsilon_x}$ * sin(31.0 * π/16.0)], |
| 010111 | [R3 * $\sqrt{\epsilon_x}$ * cos(39.0 * π/20.0), R3 * $\sqrt{\epsilon_x}$ * sin(39.0 * π/20.0)], |
| 011000 | [R1 * $\sqrt{\epsilon_x}$ * cos(11.0 * π/8.0), R1 * $\sqrt{\epsilon_x}$ * sin(11.0 * π/8.0)], |
| 011001 | [R4 * $\sqrt{\epsilon_x}$ * cos(23.0 * π/20.0), R4 * $\sqrt{\epsilon_x}$ * sin(23.0 * π/20.0)], |
| 011010 | [R2 * $\sqrt{\epsilon_x}$ * cos(19.0 * π/16.0), R2 * $\sqrt{\epsilon_x}$ * sin(19.0 * π/16.0)], |
| 011011 | [R3 * $\sqrt{\epsilon_x}$ * cos(23.0 * π/20.0), R3 * $\sqrt{\epsilon_x}$ * sin(23.0 * π/20.0)], |
| 011100 | [R1 * $\sqrt{\epsilon_x}$ * cos(9.0 * π/8.0), R1 * $\sqrt{\epsilon_x}$ * sin(9.0 * π/8.0)], |
| 011101 | [R4 * $\sqrt{\epsilon_x}$ * cos(21.0 * π/20.0), R4 * $\sqrt{\epsilon_x}$ * sin(21.0 * π/20.0)], |
| 011110 | [R2 * $\sqrt{\epsilon_x}$ * cos(17.0 * π/16.0), R2 * $\sqrt{\epsilon_x}$ * sin(17.0 * π/16.0)], |
| 011111 | [R3 * $\sqrt{\epsilon_x}$ * cos(21.0 * π/20.0), R3 * $\sqrt{\epsilon_x}$ * sin(21.0 * π/20.0)], |
| 100000 | [R2 * $\sqrt{\epsilon_x}$ * cos(7.0 * π/16.0), R2 * $\sqrt{\epsilon_x}$ * sin(7.0 * π/16.0)], |
| 100001 | [R4 * $\sqrt{\epsilon_x}$ * cos(5.0 * π/20.0), R4 * $\sqrt{\epsilon_x}$ * sin(5.0 * π/20.0)], |
| 100010 | [R2 * $\sqrt{\epsilon_x}$ * cos(5.0 * π/16.0), R2 * $\sqrt{\epsilon_x}$ * sin(5.0 * π/16.0)], |
| 100011 | [R3 * $\sqrt{\epsilon_x}$ * cos(5.0 * π/20.0), R3 * $\sqrt{\epsilon_x}$ * sin(5.0 * π/20.0)], |
| 100100 | [R4 * $\sqrt{\epsilon_x}$ * cos(9.0 * π/20.0), R4 * $\sqrt{\epsilon_x}$ * sin(9.0 * π/20.0)], |
| 100101 | [R4 * $\sqrt{\epsilon_x}$ * cos(7.0 * π/20.0), R4 * $\sqrt{\epsilon_x}$ * sin(7.0 * π/20.0)], |
| 100110 | [R3 * $\sqrt{\epsilon_x}$ * cos(9.0 * π/20.0), R3 * $\sqrt{\epsilon_x}$ * sin(9.0 * π/20.0)], |
| 100111 | [R3 * $\sqrt{\epsilon_x}$ * cos(7.0 * π/20.0), R3 * $\sqrt{\epsilon_x}$ * sin(7.0 * π/20.0)], |
| 101000 | [R2 * $\sqrt{\epsilon_x}$ * cos(9.0 * π/16.0), R2 * $\sqrt{\epsilon_x}$ * sin(9.0 * π/16.0)], |
| 101001 | [R4 * $\sqrt{\epsilon_x}$ * cos(15.0 * π/20.0), R4 * $\sqrt{\epsilon_x}$ * sin(15.0 * π/20.0)], |
| 101010 | [R2 * $\sqrt{\epsilon_x}$ * cos(11.0 * π/16.0), R2 * $\sqrt{\epsilon_x}$ * sin(11.0 * π/16.0)], |
| 101011 | [R3 * $\sqrt{\epsilon_x}$ * cos(15.0 * π/20.0), R3 * $\sqrt{\epsilon_x}$ * sin(15.0 * π/20.0)], |
| 101100 | [R4 * $\sqrt{\epsilon_x}$ * cos(11.0 * π/20.0), R4 * $\sqrt{\epsilon_x}$ * sin(11.0 * π/20.0)], |
| 101101 | [R4 * $\sqrt{\epsilon_x}$ * cos(13.0 * π/20.0), R4 * $\sqrt{\epsilon_x}$ * sin(13.0 * π/20.0)], |
| 101110 | [R3 * $\sqrt{\epsilon_x}$ * cos(11.0 * π/20.0), R3 * $\sqrt{\epsilon_x}$ * sin(11.0 * π/20.0)], |
| 101111 | [R3 * $\sqrt{\epsilon_x}$ * cos(13.0 * π/20.0), R3 * $\sqrt{\epsilon_x}$ * sin(13.0 * π/20.0)], |
| 110000 | [R1 * $\sqrt{\epsilon_x}$ * cos(3.0 * π/8.0), R1 * $\sqrt{\epsilon_x}$ * sin(3.0 * π/8.0)], |
| 110001 | [R4 * $\sqrt{\epsilon_x}$ * cos(3.0 * π/20.0), R4 * $\sqrt{\epsilon_x}$ * sin(3.0 * π/20.0)], |
| 110010 | [R2 * $\sqrt{\epsilon_x}$ * cos(3.0 * π/16.0), R2 * $\sqrt{\epsilon_x}$ * sin(3.0 * π/16.0)], |
| 110011 | [R3 * $\sqrt{\epsilon_x}$ * cos(3.0 * π/20.0), R3 * $\sqrt{\epsilon_x}$ * sin(3.0 * π/20.0)], |
| 110100 | [R1 * $\sqrt{\epsilon_x}$ * cos(π/8.0), R1 * $\sqrt{\epsilon_x}$ * sin(π/8.0)], |
| 110101 | [R4 * $\sqrt{\epsilon_x}$ * cos(π/20.0), R4 * $\sqrt{\epsilon_x}$ * sin(π/20.0)], |
| 110110 | [R2 * $\sqrt{\epsilon_x}$ * cos(π/16.0), R2 * $\sqrt{\epsilon_x}$ * sin(π/16.0)], |

-continued

| Bit Label | [x, y] Coordinates |
|---|---|
| 110111 | [R3 * $\sqrt{\epsilon_x}$ * cos(π/20.0), R3 * $\sqrt{\epsilon_x}$ * sin(π/20.0)], |
| 111000 | [R1 * $\sqrt{\epsilon_x}$ * cos(5.0 * π/8.0), R1 * $\sqrt{\epsilon_x}$ * sin(5.0 * π/8.0)], |
| 111001 | [R4 * $\sqrt{\epsilon_x}$ * cos(17.0 * π/20.0), R4 * $\sqrt{\epsilon_x}$ * sin(17.0 * π/20.0)], |
| 111010 | [R2 * $\sqrt{\epsilon_x}$ * cos(13.0 * π/16.0), R2 * $\sqrt{\epsilon_x}$ * sin(13.0 * π/16.0)], |
| 111011 | [R3 * $\sqrt{\epsilon_x}$ * cos(17.0 * π/20.0), R3 * $\sqrt{\epsilon_x}$ * sin(17.0 * π/20.0)], |
| 111100 | [R1 * $\sqrt{\epsilon_x}$ * cos(7.0 * π/8.0), R1 * $\sqrt{\epsilon_x}$ * sin(7.0 * π/8.0)], |
| 111101 | [R4 * $\sqrt{\epsilon_x}$ * cos(19.0 * π/20.0), R4 * $\sqrt{\epsilon_x}$ * sin(19.0 * π/20.0)], |
| 111110 | [R2 * $\sqrt{\epsilon_x}$ * cos(15.0 * π/16.0), R2 * $\sqrt{\epsilon_x}$ * sin(15.0 * π/16.0)], |
| 111111 | [R3 * $\sqrt{\epsilon_x}$ * cos(19.0 * π/20.0), R3 * $\sqrt{\epsilon_x}$ * sin(19.0 * π/20.0)]. |

As specified above, however, current modulation and coding schemes (e.g., the modulation and coding schemes of the DVB-S2 standard) lack support for the operational requirements of terminals at relatively low $E_s/N_0$ ratios (e.g., below approximately −3 dB), and lack support for the operational requirements of terminals at relatively high $E_s/N_0$ ratios (e.g., above approximately 15.5 dB). Additionally, such current modulation and coding schemes also lack sufficient granularity for terminals within an intermediate $E_s/N_0$ operational range (e.g., from approximately −3 dB to 15.5 dB). For example, current modulation and coding schemes (e.g., those of the DVB-S2 standard) provide the following respective $E_s/N_0$ operation levels:

TABLE 5a

ModCod Operation QPSK

| Modulation: Code Rate | $E_s/N_0$ AWGN Operation (dB) |
|---|---|
| QPSK: 1/4 | −2.86 |
| QPSK: 1/3 | −1.68 |
| QPSK: 2/5 | −0.84 |
| QPSK: 1/2 | 0.55 |
| QPSK: 3/5 | 1.77 |
| QPSK: 2/3 | 2.66 |
| QPSK: 3/4 | 3.63 |
| QPSK: 4/5 | 4.25 |
| QPSK: 5/6 | 4.74 |
| QPSK: 8/9 | 5.79 |
| QPSK: 9/10 | 6.0 |

TABLE 5b

ModCod Operation 8PSK

| Modulation: Code Rate | $E_s/N_0$ AWGN Operation (dB) |
|---|---|
| 8PSK: 3/5 | 5.05 |
| 8PSK: 2/3 | 6.12 |
| 8PSK: 3/4 | 7.45 |
| 8PSK: 5/6 | 8.87 |
| 8PSK: 8/9 | 10.23 |
| 8PSK: 9/10 | 10.52 |

TABLE 5c

ModCod Operation 16APSK, 32APSK

| Modulation: Code Rate | $E_s/N_0$ AWGN Operation (dB) |
|---|---|
| 16APSK: 2/3 | 8.51 |
| 16APSK: 3/4 | 9.75 |
| 16APSK: 4/5 | 10.57 |

TABLE 5c-continued

ModCod Operation 16APSK, 32APSK

| Modulation: Code Rate | $E_s/N_0$ AWGN Operation (dB) |
|---|---|
| 16APSK: 5/6 | 11.16 |
| 16APSK: 8/9 | 12.43 |
| 16APSK: 9/10 | 12.68 |
| 32APSK: 3/4 | 12.28 |
| 32APSK: 4/5 | 13.19 |
| 32APSK: 5/6 | 13.78 |
| 32APSK: 8/9 | 15.19 |
| 32APSK: 9/10 | 15.47 |

In accordance with exemplary embodiments of the present invention, therefore, modulation and coding schemes are provided that support terminals with operational requirements at relatively low $E_s/N_0$ ratios (e.g., within the range of approximately −3 dB to −10 dB) and at relatively high ($E_s/N_0$) ratios (e.g., within the range of approximately 15.5 dB to 24 dB), and that provide finer granularity for terminals with operational requirements within an intermediate operational range (e.g., approximately −3 dB to 15.5 dB). For example, exemplary embodiments provide the following new improved modulation and coding schemes with the respective $E_s/N_0$ operation levels:

TABLE 6a

ModCod Operation (Low $E_s/N_0$)

| Long/Short FEC Frame | Modulation: Code Rate | $E_s/N_0$ AWGN Operation (dB) |
|---|---|---|
| Long | π/2 BPSK: 1/5 (repeat 2x) | −10.07 |
| Long | π/2 BPSK: 1/4 (repeat 2x) | −8.88 |
| Long | BPSK: 1/5 | −7.06 |
| Long | BPSK: 1/4 | −5.87 |
| Long | BPSK: 1/3 | −4.70 |
| Long | QPSK: 2/9 | −3.54 |
| Short | QPSK: 2/9 | −3.32 |

TABLE 6b

ModCod Operation (Intermediate $E_s/N_0$) (within range of DVB-S2)

| Long/Short FEC Frame | Modulation: Code Rate | $E_s/N_0$ AWGN Operation (dB) |
|---|---|---|
| Long | QPSK: 13/45 | −2.44 |
| Short | QPSK: 13/45 | −2.15 |
| Long | QPSK: 9/20 | −0.19 |
| Long | QPSK: 11/20 | 1.04 |
| Short | QPSK: 11/20 | 1.30 |
| Long | 8PSK: 23/36 | 5.71 |
| Short | 8PSK: 23/36 | 6.01 |
| Long | 8PSK: 25/36 | 6.61 |
| Long | 16APSK: 19/36 | 6.22 |
| Long | 16APSK: 11/20 | 6.59 |
| Short | 16APSK: 19/36 | 6.65 |
| Short | 8PSK: 25/36 | 6.88 |
| Short | 16APSK: 11/20 | 6.89 |
| Long | 8PSK: 13/18 | 7.08 |
| Long | 16APSK: 26/45 | 7.10 |
| Short | 8PSK: 13/18 | 7.35 |
| Short | 16APSK: 26/45 | 7.35 |
| Long | 16APSK: 3/5 | 7.39 |
| Long | 16APSK: 28/45 | 7.69 |
| Short | 16APSK: 28/45 | 7.95 |
| Long | 16APSK: 23/36 | 7.97 |

TABLE 6b-continued

ModCod Operation (Intermediate $E_s/N_0$) (within range of DVB-S2)

| Long/Short FEC Frame | Modulation: Code Rate | $E_s/N_0$ AWGN Operation (dB) |
|---|---|---|
| Short | 16APSK: 23/36 | 8.22 |
| Long | 16APSK: 25/36 | 8.86 |
| Short | 16APSK: 25/36 | 9.15 |
| Long | 16APSK: 13/18 | 9.30 |
| Short | 16APSK: 13/18 | 9.59 |
| Long | 16APSK: 7/9 | 10.19 |
| Long | 32APSK: 2/3 | 10.70 |
| Long | 16APSK: 31/36 | 11.67 |
| Long | 32APSK: 13/18 | 11.65 |
| Short | 32APSK: 13/18 | 11.95 |
| Long | 32APSK: 7/9 | 12.63 |
| Long | 64APSK: 13/18 | 14.01 |
| Short | 64APSK: 13/18 | 14.35 |
| Long | 64APSK: 3/4 | 14.47 |
| Long | 64APSK: 7/9 | 15.06 |
| Long | 64APSK: 4/5 | 15.46 |

TABLE 6c

ModCod Operation (High $E_s/N_0$)

| Long/Short FEC Frame | Modulation: Code Rate | $E_s/N_0$ AWGN Operation (dB) |
|---|---|---|
| Long | 64APSK: 5/6 | 16.14 |
| Long | 64APSK: 31/36 | 16.82 |
| Short | 64APSK: 31/36 | 17.11 |
| Long | 256APSK: 2/3 | 17.51 |
| Long | 256APSK: 25/36 | 18.31 |
| Short | 256APSK: 25/36 | 18.75 |
| Long | 256APSK: 13/18 | 19.06 |
| Short | 256APSK: 13/18 | 19.45 |
| Long | 256APSK: 3/4 | 19.79 |
| Long | 256APSK: 7/9 | 20.62 |
| Long | 256APSK: 4/5 | 21.38 |
| Long | 256APSK: 5/6 | 22.45 |
| Long | 256APSK: 31/36 | 23.39 |

With respect to modulation, exemplary embodiments of the present invention provide certain new signal constellations. According to one embodiment, for relatively high $E_s/N_0$ regions, a new 256APSK constellation is provided with a ring format of 32+32+64+64+64 (32 constellation points on the inner-most ring, 32 constellation points on the next outer ring, 64 constellation points on the next outer ring, 64 constellation points on the next outer ring, and 64 constellation points on the outer-most ring). The bit labeling and [x, y] signal point coordinates of this 256APSK constellation are as follows (where $\epsilon_s$ represents average energy per symbol, $32*R1^2+32*R2^2+64*R3^2+64*R4^2+64*R5^2=256$, and R1 represents the radius of the inner-most ring, R2 represents the radius of the next outer ring, R3 represents the radius of the next outer ring, R4 represents the radius of the next outer ring, and R5 represents the radius of the outer-most ring):

| Bit Label | [x, y] Coordinates |
|---|---|
| 00000000 | $[R2 * \sqrt{\epsilon_s} * \cos(\pi/32.0), R2 * \sqrt{\epsilon_s} * \sin(\pi/32.0)]$ |
| 00000001 | $[R1 * \sqrt{\epsilon_s} * \cos(\pi/32.0), R1 * \sqrt{\epsilon_s} * \sin(\pi/32.0)]$ |
| 00000010 | $[R2 * \sqrt{\epsilon_s} * \cos(3 * \pi/32.0), R2 * \sqrt{\epsilon_s} * \sin(3 * \pi/32.0)]$ |
| 00000011 | $[R1 * \sqrt{\epsilon_s} * \cos(3 * \pi/32.0), R1 * \sqrt{\epsilon_s} * \sin(3 * \pi/32.0)]$ |
| 00000100 | $[R2 * \sqrt{\epsilon_s} * \cos(7 * \pi/32.0), R2 * \sqrt{\epsilon_s} * \sin(7 * \pi/32.0)]$ |
| 00000101 | $[R1 * \sqrt{\epsilon_s} * \cos(7 * \pi/32.0), R1 * \sqrt{\epsilon_s} * \sin(7 * \pi/32.0)]$ |
| 00000110 | $[R2 * \sqrt{\epsilon_s} * \cos(5 * \pi/32.0), R2 * \sqrt{\epsilon_s} * \sin(5 * \pi/32.0)]$ |
| 00000111 | $[R1 * \sqrt{\epsilon_s} * \cos(5 * \pi/32.0), R1 * \sqrt{\epsilon_s} * \sin(5 * \pi/32.0)]$ |
| 00001000 | $[R2 * \sqrt{\epsilon_s} * \cos(15 * \pi/32.0), R2 * \sqrt{\epsilon_s} * \sin(15 * \pi/32.0)]$ |
| 00001001 | $[R1 * \sqrt{\epsilon_s} * \cos(15 * \pi/32.0), R1 * \sqrt{\epsilon_s} * \sin(15 * \pi/32.0)]$ |
| 00001010 | $[R2 * \sqrt{\epsilon_s} * \cos(13 * \pi/32.0), R2 * \sqrt{\epsilon_s} * \sin(13 * \pi/32.0)]$ |
| 00001011 | $[R1 * \sqrt{\epsilon_s} * \cos(13 * \pi/32.0), R1 * \sqrt{\epsilon_s} * \sin(13 * \pi/32.0)]$ |
| 00001100 | $[R2 * \sqrt{\epsilon_s} * \cos(9 * \pi/32.0), R2 * \sqrt{\epsilon_s} * \sin(9 * \pi/32.0)]$ |
| 00001101 | $[R1 * \sqrt{\epsilon_s} * \cos(9 * \pi/32.0), R1 * \sqrt{\epsilon_s} * \sin(9 * \pi/32.0)]$ |
| 00001110 | $[R2 * \sqrt{\epsilon_s} * \cos(11 * \pi/32.0), R2 * \sqrt{\epsilon_s} * \sin(11 * \pi/32.0)]$ |
| 00001111 | $[R1 * \sqrt{\epsilon_s} * \cos(11 * \pi/32.0), R1 * \sqrt{\epsilon_s} * \sin(11 * \pi/32.0)]$ |
| 00010000 | $[R3 * \sqrt{\epsilon_s} * \cos(\pi/64.0), R3 * \sqrt{\epsilon_s} * \sin(\pi/64.0)]$ |
| 00010001 | $[R3 * \sqrt{\epsilon_s} * \cos(3 * \pi/64.0), R3 * \sqrt{\epsilon_s} * \sin(3 * \pi/64.0)]$ |
| 00010010 | $[R3 * \sqrt{\epsilon_s} * \cos(7 * \pi/64.0), R3 * \sqrt{\epsilon_s} * \sin(7 * \pi/64.0)]$ |
| 00010011 | $[R3 * \sqrt{\epsilon_s} * \cos(5 * \pi/64.0), R3 * \sqrt{\epsilon_s} * \sin(5 * \pi/64.0)]$ |
| 00010100 | $[R3 * \sqrt{\epsilon_s} * \cos(15 * \pi/64.0), R3 * \sqrt{\epsilon_s} * \sin(15 * \pi/64.0)]$ |
| 00010101 | $[R3 * \sqrt{\epsilon_s} * \cos(13 * \pi/64.0), R3 * \sqrt{\epsilon_s} * \sin(13 * \pi/64.0)]$ |
| 00010110 | $[R3 * \sqrt{\epsilon_s} * \cos(9 * \pi/64.0), R3 * \sqrt{\epsilon_s} * \sin(9 * \pi/64.0)]$ |
| 00010111 | $[R3 * \sqrt{\epsilon_s} * \cos(11 * \pi/64.0), R3 * \sqrt{\epsilon_s} * \sin(11 * \pi/64.0)]$ |
| 00011000 | $[R3 * \sqrt{\epsilon_s} * \cos(31 * \pi/64.0), R3 * \sqrt{\epsilon_s} * \sin(31 * \pi/64.0)]$ |
| 00011001 | $[R3 * \sqrt{\epsilon_s} * \cos(29 * \pi/64.0), R3 * \sqrt{\epsilon_s} * \sin(29 * \pi/64.0)]$ |
| 00011010 | $[R3 * \sqrt{\epsilon_s} * \cos(25 * \pi/64.0), R3 * \sqrt{\epsilon_s} * \sin(25 * \pi/64.0)]$ |
| 00011011 | $[R3 * \sqrt{\epsilon_s} * \cos(27 * \pi/64.0), R3 * \sqrt{\epsilon_s} * \sin(27 * \pi/64.0)]$ |
| 00011100 | $[R3 * \sqrt{\epsilon_s} * \cos(17 * \pi/64.0), R3 * \sqrt{\epsilon_s} * \sin(17 * \pi/64.0)]$ |
| 00011101 | $[R3 * \sqrt{\epsilon_s} * \cos(19 * \pi/64.0), R3 * \sqrt{\epsilon_s} * \sin(19 * \pi/64.0)]$ |
| 00011110 | $[R3 * \sqrt{\epsilon_s} * \cos(23 * \pi/64.0), R3 * \sqrt{\epsilon_s} * \sin(23 * \pi/64.0)]$ |
| 00011111 | $[R3 * \sqrt{\epsilon_s} * \cos(21 * \pi/64.0), R3 * \sqrt{\epsilon_s} * \sin(21 * \pi/64.0)]$ |
| 00100000 | $[R5 * \sqrt{\epsilon_s} * \cos(\pi/64.0), R5 * \sqrt{\epsilon_s} * \sin(\pi/64.0)]$ |
| 00100001 | $[R5 * \sqrt{\epsilon_s} * \cos(3 * \pi/64.0), R5 * \sqrt{\epsilon_s} * \sin(3 * \pi/64.0)]$ |
| 00100010 | $[R5 * \sqrt{\epsilon_s} * \cos(7 * \pi/64.0), R5 * \sqrt{\epsilon_s} * \sin(7 * \pi/64.0)]$ |
| 00100011 | $[R5 * \sqrt{\epsilon_s} * \cos(5 * \pi/64.0), R5 * \sqrt{\epsilon_s} * \sin(5 * \pi/64.0)]$ |
| 00100100 | $[R5 * \sqrt{\epsilon_s} * \cos(15 * \pi/64.0), R5 * \sqrt{\epsilon_s} * \sin(15 * \pi/64.0)]$ |
| 00100101 | $[R5 * \sqrt{\epsilon_s} * \cos(13 * \pi/64.0), R5 * \sqrt{\epsilon_s} * \sin(13 * \pi/64.0)]$ |
| 00100110 | $[R5 * \sqrt{\epsilon_s} * \cos(9 * \pi/64.0), R5 * \sqrt{\epsilon_s} * \sin(9 * \pi/64.0)]$ |
| 00100111 | $[R5 * \sqrt{\epsilon_s} * \cos(11 * \pi/64.0), R5 * \sqrt{\epsilon_s} * \sin(11 * \pi/64.0)]$ |
| 00101000 | $[R5 * \sqrt{\epsilon_s} * \cos(31 * \pi/64.0), R5 * \sqrt{\epsilon_s} * \sin(31 * \pi/64.0)]$ |
| 00101001 | $[R5 * \sqrt{\epsilon_s} * \cos(29 * \pi/64.0), R5 * \sqrt{\epsilon_s} * \sin(29 * \pi/64.0)]$ |
| 00101010 | $[R5 * \sqrt{\epsilon_s} * \cos(25 * \pi/64.0), R5 * \sqrt{\epsilon_s} * \sin(25 * \pi/64.0)]$ |
| 00101011 | $[R5 * \sqrt{\epsilon_s} * \cos(27 * \pi/64.0), R5 * \sqrt{\epsilon_s} * \sin(27 * \pi/64.0)]$ |
| 00101100 | $[R5 * \sqrt{\epsilon_s} * \cos(17 * \pi/64.0), R5 * \sqrt{\epsilon_s} * \sin(17 * \pi/64.0)]$ |
| 00101101 | $[R5 * \sqrt{\epsilon_s} * \cos(19 * \pi/64.0), R5 * \sqrt{\epsilon_s} * \sin(19 * \pi/64.0)]$ |
| 00101110 | $[R5 * \sqrt{\epsilon_s} * \cos(23 * \pi/64.0), R5 * \sqrt{\epsilon_s} * \sin(23 * \pi/64.0)]$ |
| 00101111 | $[R5 * \sqrt{\epsilon_s} * \cos(21 * \pi/64.0), R5 * \sqrt{\epsilon_s} * \sin(21 * \pi/64.0)]$ |
| 00110000 | $[R4 * \sqrt{\epsilon_s} * \cos(\pi/64.0), R4 * \sqrt{\epsilon_s} * \sin(\pi/64.0)]$ |
| 00110001 | $[R4 * \sqrt{\epsilon_s} * \cos(3 * \pi/64.0), R4 * \sqrt{\epsilon_s} * \sin(3 * \pi/64.0)]$ |
| 00110010 | $[R4 * \sqrt{\epsilon_s} * \cos(7 * \pi/64.0), R4 * \sqrt{\epsilon_s} * \sin(7 * \pi/64.0)]$ |
| 00110011 | $[R4 * \sqrt{\epsilon_s} * \cos(5 * \pi/64.0), R4 * \sqrt{\epsilon_s} * \sin(5 * \pi/64.0)]$ |
| 00110100 | $[R4 * \sqrt{\epsilon_s} * \cos(15 * \pi/64.0), R4 * \sqrt{\epsilon_s} * \sin(15 * \pi/64.0)]$ |
| 00110101 | $[R4 * \sqrt{\epsilon_s} * \cos(13 * \pi/64.0), R4 * \sqrt{\epsilon_s} * \sin(13 * \pi/64.0)]$ |
| 00110110 | $[R4 * \sqrt{\epsilon_s} * \cos(9 * \pi/64.0), R4 * \sqrt{\epsilon_s} * \sin(9 * \pi/64.0)]$ |
| 00110111 | $[R4 * \sqrt{\epsilon_s} * \cos(11 * \pi/64.0), R4 * \sqrt{\epsilon_s} * \sin(11 * \pi/64.0)]$ |
| 00111000 | $[R4 * \sqrt{\epsilon_s} * \cos(31 * \pi/64.0), R4 * \sqrt{\epsilon_s} * \sin(31 * \pi/64.0)]$ |
| 00111001 | $[R4 * \sqrt{\epsilon_s} * \cos(29 * \pi/64.0), R4 * \sqrt{\epsilon_s} * \sin(29 * \pi/64.0)]$ |
| 00111010 | $[R4 * \sqrt{\epsilon_s} * \cos(25 * \pi/64.0), R4 * \sqrt{\epsilon_s} * \sin(25 * \pi/64.0)]$ |
| 00111011 | $[R4 * \sqrt{\epsilon_s} * \cos(27 * \pi/64.0), R4 * \sqrt{\epsilon_s} * \sin(27 * \pi/64.0)]$ |
| 00111100 | $[R4 * \sqrt{\epsilon_s} * \cos(17 * \pi/64.0), R4 * \sqrt{\epsilon_s} * \sin(17 * \pi/64.0)]$ |
| 00111101 | $[R4 * \sqrt{\epsilon_s} * \cos(19 * \pi/64.0), R4 * \sqrt{\epsilon_s} * \sin(19 * \pi/64.0)]$ |
| 00111110 | $[R4 * \sqrt{\epsilon_s} * \cos(23 * \pi/64.0), R4 * \sqrt{\epsilon_s} * \sin(23 * \pi/64.0)]$ |
| 00111111 | $[R4 * \sqrt{\epsilon_s} * \cos(21 * \pi/64.0), R4 * \sqrt{\epsilon_s} * \sin(21 * \pi/64.0)]$ |
| 01000000 | $[R2 * \sqrt{\epsilon_s} * \cos(31 * \pi/32.0), R2 * \sqrt{\epsilon_s} * \sin(31 * \pi/32.0)]$ |
| 01000001 | $[R1 * \sqrt{\epsilon_s} * \cos(31 * \pi/32.0), R1 * \sqrt{\epsilon_s} * \sin(31 * \pi/32.0)]$ |
| 01000010 | $[R2 * \sqrt{\epsilon_s} * \cos(29 * \pi/32.0), R2 * \sqrt{\epsilon_s} * \sin(29 * \pi/32.0)]$ |
| 01000011 | $[R1 * \sqrt{\epsilon_s} * \cos(29 * \pi/32.0), R1 * \sqrt{\epsilon_s} * \sin(29 * \pi/32.0)]$ |
| 01000100 | $[R2 * \sqrt{\epsilon_s} * \cos(25 * \pi/32.0), R2 * \sqrt{\epsilon_s} * \sin(25 * \pi/32.0)]$ |
| 01000101 | $[R1 * \sqrt{\epsilon_s} * \cos(25 * \pi/32.0), R1 * \sqrt{\epsilon_s} * \sin(25 * \pi/32.0)]$ |
| 01000110 | $[R2 * \sqrt{\epsilon_s} * \cos(27 * \pi/32.0), R2 * \sqrt{\epsilon_s} * \sin(27 * \pi/32.0)]$ |
| 01000111 | $[R1 * \sqrt{\epsilon_s} * \cos(27 * \pi/32.0), R1 * \sqrt{\epsilon_s} * \sin(27 * \pi/32.0)]$ |
| 01001000 | $[R2 * \sqrt{\epsilon_s} * \cos(17 * \pi/32.0), R2 * \sqrt{\epsilon_s} * \sin(17 * \pi/32.0)]$ |
| 01001001 | $[R1 * \sqrt{\epsilon_s} * \cos(17 * \pi/32.0), R1 * \sqrt{\epsilon_s} * \sin(17 * \pi/32.0)]$ |
| 01001010 | $[R2 * \sqrt{\epsilon_s} * \cos(19 * \pi/32.0), R2 * \sqrt{\epsilon_s} * \sin(19 * \pi/32.0)]$ |
| 01001011 | $[R1 * \sqrt{\epsilon_s} * \cos(19 * \pi/32.0), R1 * \sqrt{\epsilon_s} * \sin(19 * \pi/32.0)]$ |
| 01001100 | $[R2 * \sqrt{\epsilon_s} * \cos(23 * \pi/32.0), R2 * \sqrt{\epsilon_s} * \sin(23 * \pi/32.0)]$ |
| 01001101 | $[R1 * \sqrt{\epsilon_s} * \cos(23 * \pi/32.0), R1 * \sqrt{\epsilon_s} * \sin(23 * \pi/32.0)]$ |
| 01001110 | $[R2 * \sqrt{\epsilon_s} * \cos(21 * \pi/32.0), R2 * \sqrt{\epsilon_s} * \sin(21 * \pi/32.0)]$ |
| 01001111 | $[R1 * \sqrt{\epsilon_s} * \cos(21 * \pi/32.0), R1 * \sqrt{\epsilon_s} * \sin(21 * \pi/32.0)]$ |
| 01010000 | $[R3 * \sqrt{\epsilon_s} * \cos(63 * \pi/64.0), R3 * \sqrt{\epsilon_s} * \sin(63 * \pi/64.0)]$ |
| 01010001 | $[R3 * \sqrt{\epsilon_s} * \cos(61 * \pi/64.0), R3 * \sqrt{\epsilon_s} * \sin(61 * \pi/64.0)]$ |
| 01010010 | $[R3 * \sqrt{\epsilon_s} * \cos(57 * \pi/64.0), R3 * \sqrt{\epsilon_s} * \sin(57 * \pi/64.0)]$ |
| 01010011 | $[R3 * \sqrt{\epsilon_s} * \cos(59 * \pi/64.0), R3 * \sqrt{\epsilon_s} * \sin(59 * \pi/64.0)]$ |
| 01010100 | $[R3 * \sqrt{\epsilon_s} * \cos(49 * \pi/64.0), R3 * \sqrt{\epsilon_s} * \sin(49 * \pi/64.0)]$ |

| Bit Label | [x, y] Coordinates |
|---|---|
| 01010101 | [R3 * $\sqrt{\epsilon_s}$ * cos(51 * π/64.0), R3 * $\sqrt{\epsilon_s}$ * sin(51 * π/64.0)] |
| 01010110 | [R3 * $\sqrt{\epsilon_s}$ * cos(55 * π/64.0), R3 * $\sqrt{\epsilon_s}$ * sin(55 * π/64.0)] |
| 01010111 | [R3 * $\sqrt{\epsilon_s}$ * cos(53 * π/64.0), R3 * $\sqrt{\epsilon_s}$ * sin(53 * π/64.0)] |
| 01011000 | [R3 * $\sqrt{\epsilon_s}$ * cos(33 * π/64.0), R3 * $\sqrt{\epsilon_s}$ * sin(33 * π/64.0)] |
| 01011001 | [R3 * $\sqrt{\epsilon_s}$ * cos(35 * π/64.0), R3 * $\sqrt{\epsilon_s}$ * sin(35 * π/64.0)] |
| 01011010 | [R3 * $\sqrt{\epsilon_s}$ * cos(39 * π/64.0), R3 * $\sqrt{\epsilon_s}$ * sin(39 * π/64.0)] |
| 01011011 | [R3 * $\sqrt{\epsilon_s}$ * cos(37 * π/64.0), R3 * $\sqrt{\epsilon_s}$ * sin(37 * π/64.0)] |
| 01011100 | [R3 * $\sqrt{\epsilon_s}$ * cos(47 * π/64.0), R3 * $\sqrt{\epsilon_s}$ * sin(47 * π/64.0)] |
| 01011101 | [R3 * $\sqrt{\epsilon_s}$ * cos(45 * π/64.0), R3 * $\sqrt{\epsilon_s}$ * sin(45 * π/64.0)] |
| 01011110 | [R3 * $\sqrt{\epsilon_s}$ * cos(41 * π/64.0), R3 * $\sqrt{\epsilon_s}$ * sin(41 * π/64.0)] |
| 01011111 | [R3 * $\sqrt{\epsilon_s}$ * cos(43 * π/64.0), R3 * $\sqrt{\epsilon_s}$ * sin(43 * π/64.0)] |
| 01100000 | [R5 * $\sqrt{\epsilon_s}$ * cos(63 * π/64.0), R5 * $\sqrt{\epsilon_s}$ * sin(63 * π/64.0)] |
| 01100001 | [R5 * $\sqrt{\epsilon_s}$ * cos(61 * π/64.0), R5 * $\sqrt{\epsilon_s}$ * sin(61 * π/64.0)] |
| 01100010 | [R5 * $\sqrt{\epsilon_s}$ * cos(57 * π/64.0), R5 * $\sqrt{\epsilon_s}$ * sin(57 * π/64.0)] |
| 01100011 | [R5 * $\sqrt{\epsilon_s}$ * cos(59 * π/64.0), R5 * $\sqrt{\epsilon_s}$ * sin(59 * π/64.0)] |
| 01100100 | [R5 * $\sqrt{\epsilon_s}$ * cos(49 * π/64.0), R5 * $\sqrt{\epsilon_s}$ * sin(49 * π/64.0)] |
| 01100101 | [R5 * $\sqrt{\epsilon_s}$ * cos(51 * π/64.0), R5 * $\sqrt{\epsilon_s}$ * sin(51 * π/64.0)] |
| 01100110 | [R5 * $\sqrt{\epsilon_s}$ * cos(55 * π/64.0), R5 * $\sqrt{\epsilon_s}$ * sin(55 * π/64.0)] |
| 01100111 | [R5 * $\sqrt{\epsilon_s}$ * cos(53 * π/64.0), R5 * $\sqrt{\epsilon_s}$ * sin(53 * π/64.0)] |
| 01101000 | [R5 * $\sqrt{\epsilon_s}$ * cos(33 * π/64.0), R5 * $\sqrt{\epsilon_s}$ * sin(33 * π/64.0)] |
| 01101001 | [R5 * $\sqrt{\epsilon_s}$ * cos(35 * π/64.0), R5 * $\sqrt{\epsilon_s}$ * sin(35 * π/64.0)] |
| 01101010 | [R5 * $\sqrt{\epsilon_s}$ * cos(39 * π/64.0), R5 * $\sqrt{\epsilon_s}$ * sin(39 * π/64.0)] |
| 01101011 | [R5 * $\sqrt{\epsilon_s}$ * cos(37 * π/64.0), R5 * $\sqrt{\epsilon_s}$ * sin(37 * π/64.0)] |
| 01101100 | [R5 * $\sqrt{\epsilon_s}$ * cos(47 * π/64.0), R5 * $\sqrt{\epsilon_s}$ * sin(47 * π/64.0)] |
| 01101101 | [R5 * $\sqrt{\epsilon_s}$ * cos(45 * π/64.0), R5 * $\sqrt{\epsilon_s}$ * sin(45 * π/64.0)] |
| 01101110 | [R5 * $\sqrt{\epsilon_s}$ * cos(41 * π/64.0), R5 * $\sqrt{\epsilon_s}$ * sin(41 * π/64.0)] |
| 01101111 | [R5 * $\sqrt{\epsilon_s}$ * cos(43 * π/64.0), R5 * $\sqrt{\epsilon_s}$ * sin(43 * π/64.0)] |
| 01110000 | [R4 * $\sqrt{\epsilon_s}$ * cos(63 * π/64.0), R4 * $\sqrt{\epsilon_s}$ * sin(63 * π/64.0)] |
| 01110001 | [R4 * $\sqrt{\epsilon_s}$ * cos(61 * π/64.0), R4 * $\sqrt{\epsilon_s}$ * sin(61 * π/64.0)] |
| 01110010 | [R4 * $\sqrt{\epsilon_s}$ * cos(57 * π/64.0), R4 * $\sqrt{\epsilon_s}$ * sin(57 * π/64.0)] |
| 01110011 | [R4 * $\sqrt{\epsilon_s}$ * cos(59 * π/64.0), R4 * $\sqrt{\epsilon_s}$ * sin(59 * π/64.0)] |
| 01110100 | [R4 * $\sqrt{\epsilon_s}$ * cos(49 * π/64.0), R4 * $\sqrt{\epsilon_s}$ * sin(49 * π/64.0)] |
| 01110101 | [R4 * $\sqrt{\epsilon_s}$ * cos(51 * π/64.0), R4 * $\sqrt{\epsilon_s}$ * sin(51 * π/64.0)] |
| 01110110 | [R4 * $\sqrt{\epsilon_s}$ * cos(55 * π/64.0), R4 * $\sqrt{\epsilon_s}$ * sin(55 * π/64.0)] |
| 01110111 | [R4 * $\sqrt{\epsilon_s}$ * cos(53 * π/64.0), R4 * $\sqrt{\epsilon_s}$ * sin(53 * π/64.0)] |
| 01111000 | [R4 * $\sqrt{\epsilon_s}$ * cos(33 * π/64.0), R4 * $\sqrt{\epsilon_s}$ * sin(33 * π/64.0)] |
| 01111001 | [R4 * $\sqrt{\epsilon_s}$ * cos(35 * π/64.0), R4 * $\sqrt{\epsilon_s}$ * sin(35 * π/64.0)] |
| 01111010 | [R4 * $\sqrt{\epsilon_s}$ * cos(39 * π/64.0), R4 * $\sqrt{\epsilon_s}$ * sin(39 * π/64.0)] |
| 01111011 | [R4 * $\sqrt{\epsilon_s}$ * cos(37 * π/64.0), R4 * $\sqrt{\epsilon_s}$ * sin(37 * π/64.0)] |
| 01111100 | [R4 * $\sqrt{\epsilon_s}$ * cos(47 * π/64.0), R4 * $\sqrt{\epsilon_s}$ * sin(47 * π/64.0)] |
| 01111101 | [R4 * $\sqrt{\epsilon_s}$ * cos(45 * π/64.0), R4 * $\sqrt{\epsilon_s}$ * sin(45 * π/64.0)] |
| 01111110 | [R4 * $\sqrt{\epsilon_s}$ * cos(41 * π/64.0), R4 * $\sqrt{\epsilon_s}$ * sin(41 * π/64.0)] |
| 01111111 | [R4 * $\sqrt{\epsilon_s}$ * cos(43 * π/64.0), R4 * $\sqrt{\epsilon_s}$ * sin(43 * π/64.0)] |
| 10000000 | [R2 * $\sqrt{\epsilon_s}$ * cos(63 * π/32.0), R2 * $\sqrt{\epsilon_s}$ * sin(63 * π/32.0)] |
| 10000001 | [R1 * $\sqrt{\epsilon_s}$ * cos(63 * π/32.0), R1 * $\sqrt{\epsilon_s}$ * sin(63 * π/32.0)] |
| 10000010 | [R2 * $\sqrt{\epsilon_s}$ * cos(61 * π/32.0), R2 * $\sqrt{\epsilon_s}$ * sin(61 * π/32.0)] |
| 10000011 | [R1 * $\sqrt{\epsilon_s}$ * cos(61 * π/32.0), R1 * $\sqrt{\epsilon_s}$ * sin(61 * π/32.0)] |
| 10000100 | [R2 * $\sqrt{\epsilon_s}$ * cos(57 * π/32.0), R2 * $\sqrt{\epsilon_s}$ * sin(57 * π/32.0)] |
| 10000101 | [R1 * $\sqrt{\epsilon_s}$ * cos(57 * π/32.0), R1 * $\sqrt{\epsilon_s}$ * sin(57 * π/32.0)] |
| 10000110 | [R2 * $\sqrt{\epsilon_s}$ * cos(59 * π/32.0), R2 * $\sqrt{\epsilon_s}$ * sin(59 * π/32.0)] |
| 10000111 | [R1 * $\sqrt{\epsilon_s}$ * cos(59 * π/32.0), R1 * $\sqrt{\epsilon_s}$ * sin(59 * π/32.0)] |
| 10001000 | [R2 * $\sqrt{\epsilon_s}$ * cos(49 * π/32.0), R2 * $\sqrt{\epsilon_s}$ * sin(49 * π/32.0)] |
| 10001001 | [R1 * $\sqrt{\epsilon_s}$ * cos(49 * π/32.0), R1 * $\sqrt{\epsilon_s}$ * sin(49 * π/32.0)] |
| 10001010 | [R2 * $\sqrt{\epsilon_s}$ * cos(51 * π/32.0), R2 * $\sqrt{\epsilon_s}$ * sin(51 * π/32.0)] |
| 10001011 | [R1 * $\sqrt{\epsilon_s}$ * cos(51 * π/32.0), R1 * $\sqrt{\epsilon_s}$ * sin(51 * π/32.0)] |
| 10001100 | [R2 * $\sqrt{\epsilon_s}$ * cos(55 * π/32.0), R2 * $\sqrt{\epsilon_s}$ * sin(55 * π/32.0)] |
| 10001101 | [R1 * $\sqrt{\epsilon_s}$ * cos(55 * π/32.0), R1 * $\sqrt{\epsilon_s}$ * sin(55 * π/32.0)] |
| 10001110 | [R2 * $\sqrt{\epsilon_s}$ * cos(53 * π/32.0), R2 * $\sqrt{\epsilon_s}$ * sin(53 * π/32.0)] |
| 10001111 | [R1 * $\sqrt{\epsilon_s}$ * cos(53 * π/32.0), R1 * $\sqrt{\epsilon_s}$ * sin(53 * π/32.0)] |
| 10010000 | [R3 * $\sqrt{\epsilon_s}$ * cos(127 * π/64.0), R3 * $\sqrt{\epsilon_s}$ * sin(127 * π/64.0)] |
| 10010001 | [R3 * $\sqrt{\epsilon_s}$ * cos(125 * π/64.0), R3 * $\sqrt{\epsilon_s}$ * sin(125 * π/64.0)] |
| 10010010 | [R3 * $\sqrt{\epsilon_s}$ * cos(121 * π/64.0), R3 * $\sqrt{\epsilon_s}$ * sin(121 * π/64.0)] |
| 10010011 | [R3 * $\sqrt{\epsilon_s}$ * cos(123 * π/64.0), R3 * $\sqrt{\epsilon_s}$ * sin(123 * π/64.0)] |
| 10010100 | [R3 * $\sqrt{\epsilon_s}$ * cos(113 * π/64.0), R3 * $\sqrt{\epsilon_s}$ * sin(113 * π/64.0)] |
| 10010101 | [R3 * $\sqrt{\epsilon_s}$ * cos(115 * π/64.0), R3 * $\sqrt{\epsilon_s}$ * sin(115 * π/64.0)] |
| 10010110 | [R3 * $\sqrt{\epsilon_s}$ * cos(119 * π/64.0), R3 * $\sqrt{\epsilon_s}$ * sin(119 * π/64.0)] |
| 10010111 | [R3 * $\sqrt{\epsilon_s}$ * cos(117 * π/64.0), R3 * $\sqrt{\epsilon_s}$ * sin(117 * π/64.0)] |
| 10011000 | [R3 * $\sqrt{\epsilon_s}$ * cos(97 * π/64.0), R3 * $\sqrt{\epsilon_s}$ * sin(97 * π/64.0)] |
| 10011001 | [R3 * $\sqrt{\epsilon_s}$ * cos(99 * π/64.0), R3 * $\sqrt{\epsilon_s}$ * sin(99 * π/64.0)] |
| 10011010 | [R3 * $\sqrt{\epsilon_s}$ * cos(103 * π/64.0), R3 * $\sqrt{\epsilon_s}$ * sin(103 * π/64.0)] |
| 10011011 | [R3 * $\sqrt{\epsilon_s}$ * cos(101 * π/64.0), R3 * $\sqrt{\epsilon_s}$ * sin(101 * π/64.0)] |
| 10011100 | [R3 * $\sqrt{\epsilon_s}$ * cos(111 * π/64.0), R3 * $\sqrt{\epsilon_s}$ * sin(111 * π/64.0)] |
| 10011101 | [R3 * $\sqrt{\epsilon_s}$ * cos(109 * π/64.0), R3 * $\sqrt{\epsilon_s}$ * sin(109 * π/64.0)] |
| 10011110 | [R3 * $\sqrt{\epsilon_s}$ * cos(105 * π/64.0), R3 * $\sqrt{\epsilon_s}$ * sin(105 * π/64.0)] |
| 10011111 | [R3 * $\sqrt{\epsilon_s}$ * cos(107 * π/64.0), R3 * $\sqrt{\epsilon_s}$ * sin(107 * π/64.0)] |
| 10100000 | [R5 * $\sqrt{\epsilon_s}$ * cos(127 * π/64.0), R5 * $\sqrt{\epsilon_s}$ * sin(127 * π/64.0)] |
| 10100001 | [R5 * $\sqrt{\epsilon_s}$ * cos(125 * π/64.0), R5 * $\sqrt{\epsilon_s}$ * sin(125 * π/64.0)] |
| 10100010 | [R5 * $\sqrt{\epsilon_s}$ * cos(121 * π/64.0), R5 * $\sqrt{\epsilon_s}$ * sin(121 * π/64.0)] |
| 10100011 | [R5 * $\sqrt{\epsilon_s}$ * cos(123 * π/64.0), R5 * $\sqrt{\epsilon_s}$ * sin(123 * π/64.0)] |
| 10100100 | [R5 * $\sqrt{\epsilon_s}$ * cos(113 * π/64.0), R5 * $\sqrt{\epsilon_s}$ * sin(113 * π/64.0)] |
| 10100101 | [R5 * $\sqrt{\epsilon_s}$ * cos(115 * π/64.0), R5 * $\sqrt{\epsilon_s}$ * sin(115 * π/64.0)] |
| 10100110 | [R5 * $\sqrt{\epsilon_s}$ * cos(119 * π/64.0), R5 * $\sqrt{\epsilon_s}$ * sin(119 * π/64.0)] |
| 10100111 | [R5 * $\sqrt{\epsilon_s}$ * cos(117 * π/64.0), R5 * $\sqrt{\epsilon_s}$ * sin(117 * π/64.0)] |
| 10101000 | [R5 * $\sqrt{\epsilon_s}$ * cos(97 * π/64.0), R5 * $\sqrt{\epsilon_s}$ * sin(97 * π/64.0)] |
| 10101001 | [R5 * $\sqrt{\epsilon_s}$ * cos(99 * π/64.0), R5 * $\sqrt{\epsilon_s}$ * sin(99 * π/64.0)] |
| 10101010 | [R5 * $\sqrt{\epsilon_s}$ * cos(103 * π/64.0), R5 * $\sqrt{\epsilon_s}$ * sin(103 * π/64.0)] |
| 10101011 | [R5 * $\sqrt{\epsilon_s}$ * cos(101 * π/64.0), R5 * $\sqrt{\epsilon_s}$ * sin(101 * π/64.0)] |
| 10101100 | [R5 * $\sqrt{\epsilon_s}$ * cos(111 * π/64.0), R5 * $\sqrt{\epsilon_s}$ * sin(111 * π/64.0)] |
| 10101101 | [R5 * $\sqrt{\epsilon_s}$ * cos(109 * π/64.0), R5 * $\sqrt{\epsilon_s}$ * sin(109 * π/64.0)] |
| 10101110 | [R5 * $\sqrt{\epsilon_s}$ * cos(105 * π/64.0), R5 * $\sqrt{\epsilon_s}$ * sin(105 * π/64.0)] |
| 10101111 | [R5 * $\sqrt{\epsilon_s}$ * cos(107 * π/64.0), R5 * $\sqrt{\epsilon_s}$ * sin(107 * π/64.0)] |
| 10110000 | [R4 * $\sqrt{\epsilon_s}$ * cos(127 * π/64.0), R4 * $\sqrt{\epsilon_s}$ * sin(127 * π/64.0)] |
| 10110001 | [R4 * $\sqrt{\epsilon_s}$ * cos(125 * π/64.0), R4 * $\sqrt{\epsilon_s}$ * sin(125 * π/64.0)] |
| 10110010 | [R4 * $\sqrt{\epsilon_s}$ * cos(121 * π/64.0), R4 * $\sqrt{\epsilon_s}$ * sin(121 * π/64.0)] |
| 10110011 | [R4 * $\sqrt{\epsilon_s}$ * cos(123 * π/64.0), R4 * $\sqrt{\epsilon_s}$ * sin(123 * π/64.0)] |
| 10110100 | [R4 * $\sqrt{\epsilon_s}$ * cos(113 * π/64.0), R4 * $\sqrt{\epsilon_s}$ * sin(113 * π/64.0)] |
| 10110101 | [R4 * $\sqrt{\epsilon_s}$ * cos(115 * π/64.0), R4 * $\sqrt{\epsilon_s}$ * sin(115 * π/64.0)] |
| 10110110 | [R4 * $\sqrt{\epsilon_s}$ * cos(119 * π/64.0), R4 * $\sqrt{\epsilon_s}$ * sin(119 * π/64.0)] |
| 10110111 | [R4 * $\sqrt{\epsilon_s}$ * cos(117 * π/64.0), R4 * $\sqrt{\epsilon_s}$ * sin(117 * π/64.0)] |
| 10111000 | [R4 * $\sqrt{\epsilon_s}$ * cos(97 * π/64.0), R4 * $\sqrt{\epsilon_s}$ * sin(97 * π/64.0)] |
| 10111001 | [R4 * $\sqrt{\epsilon_s}$ * cos(99 * π/64.0), R4 * $\sqrt{\epsilon_s}$ * sin(99 * π/64.0)] |
| 10111010 | [R4 * $\sqrt{\epsilon_s}$ * cos(103 * π/64.0), R4 * $\sqrt{\epsilon_s}$ * sin(103 * π/64.0)] |
| 10111011 | [R4 * $\sqrt{\epsilon_s}$ * cos(101 * π/64.0), R4 * $\sqrt{\epsilon_s}$ * sin(101 * π/64.0)] |
| 10111100 | [R4 * $\sqrt{\epsilon_s}$ * cos(111 * π/64.0), R4 * $\sqrt{\epsilon_s}$ * sin(111 * π/64.0)] |
| 10111101 | [R4 * $\sqrt{\epsilon_s}$ * cos(109 * π/64.0), R4 * $\sqrt{\epsilon_s}$ * sin(109 * π/64.0)] |
| 10111110 | [R4 * $\sqrt{\epsilon_s}$ * cos(105 * π/64.0), R4 * $\sqrt{\epsilon_s}$ * sin(105 * π/64.0)] |
| 10111111 | [R4 * $\sqrt{\epsilon_s}$ * cos(107 * π/64.0), R4 * $\sqrt{\epsilon_s}$ * sin(107 * π/64.0)] |
| 11000000 | [R2 * $\sqrt{\epsilon_s}$ * cos(33 * π/32.0), R2 * $\sqrt{\epsilon_s}$ * sin(33 * π/32.0)] |
| 11000001 | [R1 * $\sqrt{\epsilon_s}$ * cos(33 * π/32.0), R1 * $\sqrt{\epsilon_s}$ * sin(33 * π/32.0)] |
| 11000010 | [R2 * $\sqrt{\epsilon_s}$ * cos(35 * π/32.0), R2 * $\sqrt{\epsilon_s}$ * sin(35 * π/32.0)] |
| 11000011 | [R1 * $\sqrt{\epsilon_s}$ * cos(35 * π/32.0), R1 * $\sqrt{\epsilon_s}$ * sin(35 * π/32.0)] |
| 11000100 | [R2 * $\sqrt{\epsilon_s}$ * cos(39 * π/32.0), R2 * $\sqrt{\epsilon_s}$ * sin(39 * π/32.0)] |
| 11000101 | [R1 * $\sqrt{\epsilon_s}$ * cos(39 * π/32.0), R1 * $\sqrt{\epsilon_s}$ * sin(39 * π/32.0)] |
| 11000110 | [R2 * $\sqrt{\epsilon_s}$ * cos(37 * π/32.0), R2 * $\sqrt{\epsilon_s}$ * sin(37 * π/32.0)] |
| 11000111 | [R1 * $\sqrt{\epsilon_s}$ * cos(37 * π/32.0), R1 * $\sqrt{\epsilon_s}$ * sin(37 * π/32.0)] |
| 11001000 | [R2 * $\sqrt{\epsilon_s}$ * cos(47 * π/32.0), R2 * $\sqrt{\epsilon_s}$ * sin(47 * π/32.0)] |
| 11001001 | [R1 * $\sqrt{\epsilon_s}$ * cos(47 * π/32.0), R1 * $\sqrt{\epsilon_s}$ * sin(47 * π/32.0)] |
| 11001010 | [R2 * $\sqrt{\epsilon_s}$ * cos(45 * π/32.0), R2 * $\sqrt{\epsilon_s}$ * sin(45 * π/32.0)] |
| 11001011 | [R1 * $\sqrt{\epsilon_s}$ * cos(45 * π/32.0), R1 * $\sqrt{\epsilon_s}$ * sin(45 * π/32.0)] |
| 11001100 | [R2 * $\sqrt{\epsilon_s}$ * cos(41 * π/32.0), R2 * $\sqrt{\epsilon_s}$ * sin(41 * π/32.0)] |
| 11001101 | [R1 * $\sqrt{\epsilon_s}$ * cos(41 * π/32.0), R1 * $\sqrt{\epsilon_s}$ * sin(41 * π/32.0)] |
| 11001110 | [R2 * $\sqrt{\epsilon_s}$ * cos(43 * π/32.0), R2 * $\sqrt{\epsilon_s}$ * sin(43 * π/32.0)] |
| 11001111 | [R1 * $\sqrt{\epsilon_s}$ * cos(43 * π/32.0), R1 * $\sqrt{\epsilon_s}$ * sin(43 * π/32.0)] |
| 11010000 | [R3 * $\sqrt{\epsilon_s}$ * cos(65 * π/64.0), R3 * $\sqrt{\epsilon_s}$ * sin(65 * π/64.0)] |
| 11010001 | [R3 * $\sqrt{\epsilon_s}$ * cos(67 * π/64.0), R3 * $\sqrt{\epsilon_s}$ * sin(67 * π/64.0)] |
| 11010010 | [R3 * $\sqrt{\epsilon_s}$ * cos(71 * π/64.0), R3 * $\sqrt{\epsilon_s}$ * sin(71 * π/64.0)] |
| 11010011 | [R3 * $\sqrt{\epsilon_s}$ * cos(69 * π/64.0), R3 * $\sqrt{\epsilon_s}$ * sin(69 * π/64.0)] |
| 11010100 | [R3 * $\sqrt{\epsilon_s}$ * cos(79 * π/64.0), R3 * $\sqrt{\epsilon_s}$ * sin(79 * π/64.0)] |
| 11010101 | [R3 * $\sqrt{\epsilon_s}$ * cos(77 * π/64.0), R3 * $\sqrt{\epsilon_s}$ * sin(77 * π/64.0)] |
| 11010110 | [R3 * $\sqrt{\epsilon_s}$ * cos(73 * π/64.0), R3 * $\sqrt{\epsilon_s}$ * sin(73 * π/64.0)] |
| 11010111 | [R3 * $\sqrt{\epsilon_s}$ * cos(75 * π/64.0), R3 * $\sqrt{\epsilon_s}$ * sin(75 * π/64.0)] |
| 11011000 | [R3 * $\sqrt{\epsilon_s}$ * cos(95 * π/64.0), R3 * $\sqrt{\epsilon_s}$ * sin(95 * π/64.0)] |
| 11011001 | [R3 * $\sqrt{\epsilon_s}$ * cos(93 * π/64.0), R3 * $\sqrt{\epsilon_s}$ * sin(93 * π/64.0)] |
| 11011010 | [R3 * $\sqrt{\epsilon_s}$ * cos(89 * π/64.0), R3 * $\sqrt{\epsilon_s}$ * sin(89 * π/64.0)] |
| 11011011 | [R3 * $\sqrt{\epsilon_s}$ * cos(91 * π/64.0), R3 * $\sqrt{\epsilon_s}$ * sin(91 * π/64.0)] |
| 11011100 | [R3 * $\sqrt{\epsilon_s}$ * cos(81 * π/64.0), R3 * $\sqrt{\epsilon_s}$ * sin(81 * π/64.0)] |
| 11011101 | [R3 * $\sqrt{\epsilon_s}$ * cos(83 * π/64.0), R3 * $\sqrt{\epsilon_s}$ * sin(83 * π/64.0)] |
| 11011110 | [R3 * $\sqrt{\epsilon_s}$ * cos(87 * π/64.0), R3 * $\sqrt{\epsilon_s}$ * sin(87 * π/64.0)] |
| 11011111 | [R3 * $\sqrt{\epsilon_s}$ * cos(85 * π/64.0), R3 * $\sqrt{\epsilon_s}$ * sin(85 * π/64.0)] |
| 11100000 | [R5 * $\sqrt{\epsilon_s}$ * cos(65 * π/64.0), R5 * $\sqrt{\epsilon_s}$ * sin(65 * π/64.0)] |
| 11100001 | [R5 * $\sqrt{\epsilon_s}$ * cos(67 * π/64.0), R5 * $\sqrt{\epsilon_s}$ * sin(67 * π/64.0)] |
| 11100010 | [R5 * $\sqrt{\epsilon_s}$ * cos(71 * π/64.0), R5 * $\sqrt{\epsilon_s}$ * sin(71 * π/64.0)] |
| 11100011 | [R5 * $\sqrt{\epsilon_s}$ * cos(69 * π/64.0), R5 * $\sqrt{\epsilon_s}$ * sin(69 * π/64.0)] |
| 11100100 | [R5 * $\sqrt{\epsilon_s}$ * cos(79 * π/64.0), R5 * $\sqrt{\epsilon_s}$ * sin(79 * π/64.0)] |
| 11100101 | [R5 * $\sqrt{\epsilon_s}$ * cos(77 * π/64.0), R5 * $\sqrt{\epsilon_s}$ * sin(77 * π/64.0)] |
| 11100110 | [R5 * $\sqrt{\epsilon_s}$ * cos(73 * π/64.0), R5 * $\sqrt{\epsilon_s}$ * sin(73 * π/64.0)] |
| 11100111 | [R5 * $\sqrt{\epsilon_s}$ * cos(75 * π/64.0), R5 * $\sqrt{\epsilon_s}$ * sin(75 * π/64.0)] |
| 11101000 | [R5 * $\sqrt{\epsilon_s}$ * cos(95 * π/64.0), R5 * $\sqrt{\epsilon_s}$ * sin(95 * π/64.0)] |
| 11101001 | [R5 * $\sqrt{\epsilon_s}$ * cos(93 * π/64.0), R5 * $\sqrt{\epsilon_s}$ * sin(93 * π/64.0)] |
| 11101010 | [R5 * $\sqrt{\epsilon_s}$ * cos(89 * π/64.0), R5 * $\sqrt{\epsilon_s}$ * sin(89 * π/64.0)] |
| 11101011 | [R5 * $\sqrt{\epsilon_s}$ * cos(91 * π/64.0), R5 * $\sqrt{\epsilon_s}$ * sin(91 * π/64.0)] |
| 11101100 | [R5 * $\sqrt{\epsilon_s}$ * cos(81 * π/64.0), R5 * $\sqrt{\epsilon_s}$ * sin(81 * π/64.0)] |
| 11101101 | [R5 * $\sqrt{\epsilon_s}$ * cos(83 * π/64.0), R5 * $\sqrt{\epsilon_s}$ * sin(83 * π/64.0)] |
| 11101110 | [R5 * $\sqrt{\epsilon_s}$ * cos(87 * π/64.0), R5 * $\sqrt{\epsilon_s}$ * sin(87 * π/64.0)] |

-continued

| Bit Label | [x, y] Coordinates |
|---|---|
| 11101111 | [R5 * $\sqrt{\epsilon_s}$ * cos(85 * π/64.0), R5 * $\sqrt{\epsilon_s}$ * sin(85 * π/64.0)] |
| 11110000 | [R4 * $\sqrt{\epsilon_s}$ * cos(65 * π/64.0), R4 * $\sqrt{\epsilon_s}$ * sin(65 * π/64.0)] |
| 11110001 | [R4 * $\sqrt{\epsilon_s}$ * cos(67 * π/64.0), R4 * $\sqrt{\epsilon_s}$ * sin(67 * π/64.0)] |
| 11110010 | [R4 * $\sqrt{\epsilon_s}$ * cos(71 * π/64.0), R4 * $\sqrt{\epsilon_s}$ * sin(71 * π/64.0)] |
| 11110011 | [R4 * $\sqrt{\epsilon_s}$ * cos(69 * π/64.0), R4 * $\sqrt{\epsilon_s}$ * sin(69 * π/64.0)] |
| 11110100 | [R4 * $\sqrt{\epsilon_s}$ * cos(79 * π/64.0), R4 * $\sqrt{\epsilon_s}$ * sin(79 * π/64.0)] |
| 11110101 | [R4 * $\sqrt{\epsilon_s}$ * cos(77 * π/64.0), R4 * $\sqrt{\epsilon_s}$ * sin(77 * π/64.0)] |
| 11110110 | [R4 * $\sqrt{\epsilon_s}$ * cos(73 * π/64.0), R4 * $\sqrt{\epsilon_s}$ * sin(73 * π/64.0)] |
| 11110111 | [R4 * $\sqrt{\epsilon_s}$ * cos(75 * π/64.0), R4 * $\sqrt{\epsilon_s}$ * sin(75 * π/64.0)] |
| 11111000 | [R4 * $\sqrt{\epsilon_s}$ * cos(95 * π/64.0), R4 * $\sqrt{\epsilon_s}$ * sin(95 * π/64.0)] |
| 11111001 | [R4 * $\sqrt{\epsilon_s}$ * cos(93 * π/64.0), R4 * $\sqrt{\epsilon_s}$ * sin(93 * π/64.0)] |
| 11111010 | [R4 * $\sqrt{\epsilon_s}$ * cos(89 * π/64.0), R4 * $\sqrt{\epsilon_s}$ * sin(89 * π/64.0)] |
| 11111011 | [R4 * $\sqrt{\epsilon_s}$ * cos(91 * π/64.0), R4 * $\sqrt{\epsilon_s}$ * sin(91 * π/64.0)] |
| 11111100 | [R4 * $\sqrt{\epsilon_s}$ * cos(81 * π/64.0), R4 * $\sqrt{\epsilon_s}$ * sin(81 * π/64.0)] |
| 11111101 | [R4 * $\sqrt{\epsilon_s}$ * cos(83 * π/64.0), R4 * $\sqrt{\epsilon_s}$ * sin(83 * π/64.0)] |
| 11111110 | [R4 * $\sqrt{\epsilon_s}$ * cos(87 * π/64.0), R4 * $\sqrt{\epsilon_s}$ * sin(87 * π/64.0)] |
| 11111111 | [R4 * $\sqrt{\epsilon_s}$ * cos(85 * π/64.0), R4 * $\sqrt{\epsilon_s}$ * sin(85 * π/64.0)] |

Additionally, with respect to the outer BCH coding of the FEC encoding, in accordance with exemplary embodiments of the present invention, the BCH t-error correcting capabilities are reflected in the following table:

| Long/Short FEC Frame | Modulation: Code Rate | BCH t-Error Correction |
|---|---|---|
| Long | BPSK: 1/5 | 12 |
| Long | QPSK: 2/9 | 8 |
| Short | QPSK: 2/9 | 10 |
| Long | QPSK: 13/45 | 6 |
| Short | QPSK: 13/45 | 10 |
| Long | QPSK: 9/20 | 2 |
| Long | QPSK: 11/20 | 2 |
| Short | QPSK: 11/20 | 8 |
| Long | 8PSK: 23/36 | 2 |
| Short | 8PSK: 23/36 | 2 |
| Long | 8PSK: 25/36 | 0 |
| Short | 8PSK: 25/36 | 0 |
| Long | 8PSK: 13/18 | 0 |
| Short | 8PSK: 13/18 | 0 |
| Long | 16APSK: 19/36 | 6 |
| Short | 16APSK: 19/36 | 0 |
| Long | 16APSK: 11/20 | 2 |
| Short | 16APSK: 11/20 | 8 |
| Long | 16APSK: 26/45 | 6 |
| Short | 16APSK: 26/45 | 4 |
| Long | 16APSK: 3/5 | 0 |
| Long | 16APSK: 28/45 | 2 |
| Short | 16APSK: 28/45 | 6 |
| Long | 16APSK: 23/36 | 4 |
| Short | 16APSK: 23/36 | 6 |
| Long | 16APSK: 25/36 | 0 |
| Short | 16APSK: 25/36 | 2 |
| Long | 16APSK: 13/18 | 0 |
| Short | 16APSK: 13/18 | 0 |
| Long | 16APSK: 7/9 | 0 |
| Long | 16APSK: 31/36 | 0 |
| Long | 32APSK: 2/3 | 2 |
| Long | 32APSK: 13/18 | 0 |
| Short | 32APSK: 13/18 | 0 |
| Long | 32APSK: 7/9 | 0 |
| Long | 64APSK: 13/18 | 0 |
| Short | 64APSK: 13/18 | 0 |
| Long | 64APSK: 3/4 | 0 |
| Long | 64APSK: 7/9 | 0 |
| Long | 64APSK: 4/5 | 0 |
| Long | 64APSK: 5/6 | 0 |
| Long | 64APSK: 31/36 | 0 |
| Short | 64APSK: 31/36 | 8 |
| Long | 256APSK: 2/3 | 6 |
| Long | 256APSK: 25/36 | 10 |
| Short | 256APSK: 25/36 | 10 |
| Long | 256APSK: 13/18 | 6 |
| Short | 256APSK: 13/18 | 6 |
| Long | 256APSK: 3/4 | 4 |
| Long | 256APSK: 7/9 | 0 |
| Long | 256APSK: 4/5 | 0 |
| Long | 256APSK: 5/6 | 0 |
| Long | 256APSK: 31/36 | 0 |

Further, with respect to bit interleaving, exemplary embodiments of the present invention provide improved bit interleaving protocols. As specified above for the DVB-S2 standard, coded bits are written to the interleaver array column-by-column and read out row-by-row from left to right (except for the 8PSK 3/5 modcod—for which the bits are read out right to left). Referring to theses conventions as 0-1-2 for 8PSK, 0-1-2-3 for 16APSK, and 0-1-2-3-4 for 32APSK (and 2-1-0 for the 8PSK 3/5 modcod), according to embodiments of the present invention, the coded bits are similarly written to the interleaver array column-by-column, but are read out based on certain improved orders for the respective new modcods, as listed in the following table:

TABLE 7

Bit Interleaver Patterns

| Modulation: Code Rate | Bit Interleaver Pattern | Modulation: Code Rate | Bit Interleaver Pattern |
|---|---|---|---|
| QPSK: 13/45 | N/A | 32APSK: 13/18 | 3-0-2-1-4 |
| QPSK: 9/20 | N/A | 32APSK: 7/9 | 1-0-2-3-4 |
| QPSK: 11/20 | N/A | 64APSK: 13/18 | 4-1-2-5-0-3 |
| 8PSK: 23/36 | 0-1-2 | 64APSK: 3/4 | 2-3-5-0-4-1 |
| 8PSK: 25/36 | 1-0-2 | 64APSK: 7/9 | 2-0-1-5-4-3 |
| 8PSK: 13/18 | 1-0-2 | 64APSK: 4/5 | 1-2-4-0-5-3 |
| 16APSK: 19/36 | 0-3-1-2 | 64APSK: 5/6 | 4-2-1-0-5-3 |
| 16APSK: 11/20 | 2-1-3-0 | 64APSK: 31/36 | 2-3-4-0-5-1 |
| 16APSK: 26/45 | 3-2-0-1 | 256APSK: 2/3 | 1-3-2-4-7-6-5-0 |
| 16APSK: 3/5 | 3-2-1-0 | 256APSK: 25/36 | 4-2-3-5-1-0-6-7 |
| 16APSK: 28/45 | 3-0-1-2 | 256APSK: 13/18 | 4-5-3-2-1-0-7-6 |
| 16APSK: 23/36 | 3-0-2-1 | 256APSK: 3/4 | 5-1-2-4-3-6-0-7 |
| 16APSK: 25/36 | 2-3-1-0 | 256APSK: 7/9 | 2-1-3-5-4-0-6-7 |
| 16APSK: 13/18 | 3-0-2-1 | 256APSK: 4/5 | 1-3-4-2-7-0-5-6 |
| 16APSK: 7/9 | 0-3-2-1 | 256APSK: 5/6 | 3-5-6-1-2-4-0-7 |
| 32APSK: 2/3 | 2-1-4-3-0 | 256APSK: 31/36 | 3-4-1-2-6-0-7-5 |
| 16APSK: 31/36 | 1-0-3-2 | | |

With respect to the inner LDPC coding of the FEC encoding, in accordance with exemplary embodiments of the present invention, the respective parity bit accumulator address tables for the respective code rates and FEC Frame lengths are specified in the following tables (where, for each code rate R, the q values are as follows: (1) q=(n–k)/360, (where n=64800 and k=R*n); and (2) q=(n–k)/90, (where n=16200 and k=R*n)):

TABLE 8a (Rate 1/5) ($n_{ldpc}$ = 64800)

30434 15118 35871 1042 34043 34085 42341 18485 44500 24268 28843 51748 21972
30300 24347 46808 8416 11111 41481 32215 4130 867 22576 9928 23980 15170
43863 15038 42905 19719 398 39956 47109 48347 26991 18214 24206 47552 15884
49234 51671 11523 41411 21249 16660 17729 852 21114 22858 19843 10501 37683
33159 15595 43687 9791 41121 30595 50762 36562 30611 6196 16501 1860 19594
45948 42827 9110 2671 44915 51640 33959 16649 37658 45143 11861 37 13823
3703 41861 6198 39321 37404 36745 7515 37433 17583 30253 42537 16920 44989
37745 27350 9903 13623 50660 35965 29455 36432 49774 8755 33362 12907 10543
34407 13960 9808 41065 17820 41780 13846 25968 45228 51694 1005 14230 7622
34849 38545 36256 10235 39642 27136 13787 42968 28454 9406 5612 9674 15364
45347 13550 44977 39547 37964 33817 48680 49571 37335 47548 45117 26148 17828
50113 9061 27964 47828 8518 12777 9523 45788 14839 30154 35408 42366 48162
32305 18501 34537 3974 41796 46590 39195 43248 28063 25179 21119 42374 46860
12591 49973 16248 31005 46401 45858 18919 39056 2622 31398 7488 40408 21230
7021 46583 18669 3999 46160 17929 25853 46018 16689 33374 14070 31593 44601
49986 25832 37105 12112 33290 8907 41215 28842 38633 191 17402 29860 28641
12889 28172 1706 23997 18785 3728 43051 43506 28074 20093 25247 4390 3534
35866 5423 48667 31399 44664 42319 17038 19121 2653 3699 43234 5448 2965
5554 6606 46032
10606 34309 48885
30552 28313 15011
35464 35537 42531
47350 49896 34368
50709 33315 29146
27506 37421 7219
5613 19620 22073
21932 40199 36978
30032 22322 39521
22458 18157 28917
42547 10696 22422
42365 45341 34234
4869 37037 6282
42657 1832 25254
24440 13374 34902
36356 9003 17404
29739 5586 29932

TABLE 8b (Rate 2/9) ($n_{ldpc}$ = 64800)

5332 8018 35444 13098 9655 41945 44273 22741 9371 8727 43219
41410 43593 14611 46707 16041 1459 29246 12748 32996 676 46909
9340 35072 35640 17537 10512 44339 30965 25175 9918 21079 29835
3332 12088 47966 25168 50180 42842 40914 46726 17073 41812 34356
15159 2209 7971 22590 20020 27567 4853 10294 38839 15314 49808
20936 14497 23365 22630 38728 28361 34659 956 8559 44957 22222
28043 4641 25208 47039 30612 25796 14661 44139 27335 12884 6980
32584 33453 1867 20185 36106 30357 809 28513 46045 27862 4802
43744 13375 36066 23604 30766 6233 45051 23660 20815 19525 25207
27522 3854 9311 21925 41107 25773 26323 24237 24344 46187 44503
10256 20038 12177 26635 5214 14191 34404 45807 4938 4173 31344
32043 26501 46725 4648 16718 31060 26633 19036 14222 13886 26535
18103 8498 36814 34600 36495 36712 29833 27396 11877 42861 1834
36592 1645 3649 30521 14674 3630 890 13307 41412 24682 9907
4401 44543 13784 5828 32862 25179 29736 39614 5186 49749 38317
41460 39101 50080 40137 32691 26528 35332 44067 8467 14286 10470
12211 34019 37870 36918 36419 33153 50070 41498 47741 30538 12342
33751 23988 33624 41882 34075 25552 3106 17611 13190 29536 312
5667 35483 35460 16153 37267 28308 50009 46345 34204 32756 38243
5657 24157 36834 6890 49576 46244 43875 16738 47225 2944 36882
30341 48485 3700

TABLE 8b-continued (Rate 2/9) ($n_{ldpc}$ = 64800)

14451 20438 18875
13634 41138 42962
46459 13369 27974
21493 14629 2369
11351 40226 42457
34749 39000 3912
18128 46776 47055
2221 26806 11345
35143 630 2229
44009 41295 34646
32163 16657 26544
31770 23641 43623
45826 10902 39490
7514 20480 28511
11429 19834 35430
50112 38163 5738
16191 16862 6783
6085 39149 34988
41497 32023 28688

TABLE 8c (Rate 13/45) ($n_{ldpc}$ = 64800)

15210 4519 18217 34427 18474 16813 28246 17687 44527 31465 13004 43601
28576 13611 24294 15041 503 11393 26290 9278 19484 20742 13226 28322
32651 27323 22368 15522 37576 20607 20152 19741 26700 31696 21061 35991
44168 27910 31104 34776 38835 45450 40002 31522 7807 26330 2410 44983
15861 39215 14631 42584 26502 41864 27885 32276 29049 16878 37480 42550
38795 13012 7912 4058 23869 3325 42889 19921 13826 40323 18162 10005
35100 5483 7629 35166 1239 10772 5289 286 16172 41843 42612 38493

TABLE 8c-continued (Rate 13/45) ($n_{ldpc}$ = 64800)

11997 40340 19047 16236 43557 9104 24032 2915 19265 36209 6443 40947
43527 29675 4195 31926 35392 20400 7515 45806 36068 33079 37325 6301
4580 20492 40934 14478 8238 2425 28901 43602 7224 17640 28259 6850
41859 14006 19132 5690 16223 11575 30562 44797 3759 9833 36529 21084
45546 16044 26763 13559 29092 41595 5726 13733 9164 15354 20145 10655
24076 40883 13424 30325 40589 32367 36270 9286 40151 8501 3871 22109
26239 29805 5358 44835 11609 3899 9760 39600 43422 13295 45431 14515
5392 37010 12386 40193 21492 45146 12376 41952 43153 45733 718 35726
33884 38006 16927 20958 25413 44561 11245 12984 35198 30977 31916 10657
1412 1048 14965 31879 29967 41000 32087 22 34773 768 27289 19898
43051 6964 31807 4119 33509 15950 6304 2813 35192 38282 39710 26356
9889 18957 6355 18770 40381 1876 38889 17958 20309 10744 1744 228
41543 36505 32795 12454 8520 4916 22313 1363 13010 8770 17057 8694
22987 29564 13804 3110 1382 33844 15117 42314 36045 25295 28421 22044
15951 42952 17458 6926 21257 41243 8662 17046 15054 15302 16964 40079
13359 45754 16715 9586 10960 25406 14675 8880 5087 12303 28993 13571
24824 31012 4121 808 30962 28736 11013 20488 7715 7637 6217 25114
23615 5760 5554
18072 21605 39242
24190 6592 12281
44681 6563 7001
18291 19605 33476
2884 30927 18430
23674 36414 30649
15364 22089 19757
41162 14454 17627
16676 28573 22163
8851 36803 27589
40049 476 1413
41013 34505 33296
29782 38018 42124
22625 7485 11772
2052 37567 14082
30106 43203 20858
7399 3796 22396
38745 792 44483
28268 33355 41030
30098 37269 12871
35769 33119 16738
3307 43434 13244
17852 9133 23190
35184 20115 24202
14760 43026 19425
26414 16821 6625
30362 35769 42608

TABLE 8d (Rate 9/20) ($n_{ldpc}$ = 64800)

30649 35117 23181 15492 2367 31230 9368 13541 6608 23384 18300 5905
1961 8950 20589 17688 9641 1877 4937 15293 24864 14876 6516 10165
4229 26034 28862 8265 27847 3 22728 13946 27162 26003 17696 13261
31719 25669 17149 17377 33106 12630 4814 16334 1480 32952 11187 3849
30186 20938 7946 23283 11042 28080 26642 34560 11302 4991 5121 6879
13445 22794 18048 15116 5657 9853 15581 34960 13240 11176 17937 25081
4868 28235 30286 29706 7073 6773 10390 27002 13015 7388 14772 19581
11765 16642 11431 19588 20154 8027 29758 5501 6398 4268 21337 21136
2275 7899 25943 12939 14478 20369 22877 3591 12217 19130 24252 32444
24599 21382 4689 3524 11304 20423 13677 19639 10577 28279 22330 30722
21622 26233 3921 17722 6843 5999 8186 2355 33632 34632 30285 9616
19909 30417 19587 27853 13896 3689 155 20457 33362 21739 22779 33862
3713 32975 9403 2836 23109 11099 3505 14562 17309 26470 4843 12279
24216 26340 22073 32570 12936 19797 21801 8918 7999 24408 5783 25190
8817 29367 17017 6208 21402 2280 2110 7975 32039 34605 1235 912
23116 33017 31405 638 4707 31760 18043 3507 11989 26632 32829 11262
9274 2553 10697 13507 15323 27080 3752 33191 12363 24664 14068 1416
21670 26696 18570 25197 1517 7765 32686 6572 30901 28242 17802 24056
35388 26895 8023 31249 29290 13440 7156 17367 21472 27219 14447 9655
11100 27918 2900 33262 15301 4664 15728 1185 24818 32995 31108 16368
34978 31690 30464 13044 5492 10047 2768 14336 30880 32780 10993 24750
7022 19718 26036 19145 21177 33949 17135 5193 33718 2539 13920 25537
918 18514 14530 13699 11902 22721 8335 35346 24655 3332 14708 20822
11191 24064 32825 12321 11771 23299 31325 25526 16785 22212 34075 9066
31209 27819 5974 19918 26831 33338 26647 9480 28489 7827 18562 2401

TABLE 8d-continued (Rate 9/20) ($n_{ldpc}$ = 64800)

17395 23192 10277 28458 23028 18793 10463 10740 616 24647 4153 10128
2873 22381 8132 18239 31614 4193 32313 7575 25801 27591 19872 17992
4609 9114 14764 13516
19192 9882 13112 16075
12510 28902 8784 32679
4578 34533 30609 25543
13739 3465 5330 999
33254 13085 5001 29061
28369 79 17750 13399
24851 9524 30966 10422
18251 34810 12259 25103
25193 16945 1059
11266 13612 30508
24778 25364 1322
14492 11111 13693
15125 8205 1749
8494 9902 9395
23936 3981 22799
28448 28076 26544
19652 13424 8915
2885 11356 3241
1609 10284 24350
2462 19358 15717
29327 15960 14743
5388 32927 1288
19074 6322 32214
34208 30535 35462
23415 20836 21819
17986 12196 30030
8422 2647 5710
3200 23132 23337
22307 29841 4813
15309 26942 29970
23288 7493 3005
20661 34283 33192
23033 9541 6424
22003 24665 5534
4684 1411 33340
26042 6426 3808
285 21942 14302
16023 6825 20084
34878 12295 32028
2591 178 24107
16379 2912 9912
15375 16120 28375
20170 726 11291
8185 13471 8448
23205 14239 17896
17950 19308 1591
3170 23836 18879
12853 10678 18431
21157 31624 3153
27682 12433 3458
312 4844 13138
17715 35138 15456
30507 33307 30783

TABLE 8e (Rate 19/36) ($n_{ldpc}$ = 64800)

4852 21528 7920 5827 25497 26912 13790 5647 5349 26209 30575 10701
15230 6020 12821 18153 28229 23784 7846 2405 6175 25057 24745 11338
20902 7232 5966 20079 11898 7024 17575 30172 23114 7408 1444 10470
21964 6794 1849 19639 42 2805 10297 14296 17686 18756 6814 9207
13761 23515 17223 21044 557 5255 27297 13440 21226 26060 28875 300
8454 396 27979 25998 8734 9820 22370 3875 26358 26384 12591 26114
29610 12183 15722 29971 5804 10489 2548 29277 13097 19843 19372 19804
12467 2412 3711 4225 15202 24051 29399 5140 19293 5563 5975 10604
8722 11230 8796 6205 27377 23788 7237 16738 14133 11767 12239 7354
27329 14432 12580 11872 15339 16324 5281 2272 15919 18405 23238 3644
20037 7221 19740 14881 9948 21458 21721 20274 632 7531 22448 29320
28575 1484 1684 23572 314 17511 10742 23432 6120 1756 13668 831
23308 709 12194 11481 15426 16126 27391 12597 14490 15204 11820 11558
15988 14707 14715 28040 27022 2964 11343 9853 20469 20448 7921 30386

TABLE 8e-continued (Rate 19/36) ($n_{ldpc}$ = 64800)

8030 10079 10797 9471 12773 12408 22081 27431 11141 647 5583 4867
19597 9640 21448 7774 22031 978 14982 9318 5329 23331 747 1599
24719 13982 10148 22796 19316 16641 13398 1385 11074 21429 27365 15030
17211 3435 3121 19692 22379 14270 22290 12713 25821 29202 30112 23466
418 19299 5266 19721 19875 4120 27217 3456 12505 29571 29323 1359
29271 18848 23988 3711 27838 30064 9471 15792 13372 25101 28859 3582
24067 921 10735 1252 24500 16866 9523 24035 25043 22577 6407 20445
8841 13840 17428 23024 13023 27418 13669 2039 5284 4272 20790 12124
14854 8589 24186 2542 124 11300 10583 13607 8364 7702 22179 8034
18294 25817 9609 29141 26471 28410 0 28693 25766 12550 25246 15174
21691 27153 3960 7108 15248 8867 8637 7526 25098 25457 9549 4919
29817 17975 29608
12231 5214 13215
7529 3174 28008
29496 12796 3906
11660 28238 4295
24868 28946 3822
14643 7700 8772
4564 25809 28687
16723 12784 545
1026 24533 10526
2781 18949 19829
11457 8993 22179
15321 4961 2623
2304 7882 9519
1755 19477 14008
20611 17807 13434
20328 25809 15475
20333 14032 22015
9478 521 7297
11756 11083 30411
6101 23078 13808
7653 3799 14951
12091 8232 4961
10525 4842 4867
13342 20032 9328
14808 11890 9097
1406 17654 21576
13916 19328 21178
9578 4949 26018
16604 13328 21777
18932 7321 2070
7697 14266 9879
12271 19185 26947
14798 20341 18010
753 12687 20366
16795 22301 4021
24333 15105 8536
13240 28609 17761
5504 518 17937
3329 3001 25432
26541 3002 3436
16197 9838 15328
16775 26537 2795
25184 7045 17243
22843 12232 10984
15198 11963 17345
12186 18466 29254
26266 21216 1565
17729 29158 7355
4837 1356 28911
6749 26024 20177
19405 24682 20539
23639 23171 19707
1278 1465 17435
10327 16584 14678
15700 28585 6210
24813 1477 19918
7305 17774 20937
30288 20203 23788
21655 16483 18985
17501 28765 13494
25663 1925 12695
7109 16881 2053
12382 4765 11370
13410 10697 9692
29500 21773 16350
12204 23752 14420

TABLE 8e-continued (Rate 19/36) ($n_{ldpc}$ = 64800)

29567 3862 8483
5243 12830 24323
27405 20033 30085

TABLE 8f (Rate 11/20) ($n_{ldpc}$ = 64800)

20834 22335 21330 11913 6036 15830 11069 10539 4244 15068 7113 2704 16224
2010 5628 27960 11690 22545 24432 4986 21083 17529 4104 11941 21239 9602
689 13248 1777 4876 2537 20869 15718 9575 18164 5294 13914 21711 23374
9675 21239 13600 24710 10613 14804 19412 23270 26741 10503 25258 17816 25210
12518 8680 6422 22715 25097 26959 3913 26493 7797 25977 4896 27063 20781
21715 12850 7963 4027 4295 14931 18158 616 20570 8720 16487 19050 23925
7939 21089 15170 24325 6651 22352 5633 27903 2685 1310 5594 9296 25670
25121 13906 8217 25390 9112 13945 9826 10844 11418 10724 11518 9280 9576
25979 23644 16073 27407 3476 28057 4003 2279 17490 7558 9538 22115 20439
20708 22572 14997 15780 5159 11356 10931 8514 23275 2560 912 15935 20703
26467 17173 21964 15469 21967 10380 16222 15106 16786 19542 28560 18387 27909
14897 6167 24295 1266 16902 9546 11628 12048 24495 3706 22629 14165 2333
19403 18738 28140 13141 6151 22785 9620 4290 2342 4902 15856 19033 22820
15761 1985 9160 4435 11164 5442 23572 6951 19077 15406 16658 18324 19229
16997 10094 19982 22821 7810 19660 1182 21968 16564 17453 10780 17034 16405
11 28611 10411 15799 15705 2773 28601 19333 19447 16790 4618 15841 23854
24686 4131 1013 2141 6052 11896 18719 16813 22420 23406 21052 4333 17754
16425 17614 26883 12101 8224 13979 6869 25215 25991 28968 19337 25361 20513
1671 14990 20692 24951 19446 7163 4959 13197 19201 3883 22532 15468 11856
22758 23586 16985 18396 7434 11817 363 11824 285 20897 16646 16095 17011
25144 14916 6302 20972 25439 6156 21776 19701 27803 9695 12941 23541 27425
6979 27910 7378 8983 6280 4134 28860 8079 20892 28776 7899 23399 87
18045 23929 25876 15560 23629 18376 4053 14655 2450 11907 19535 28543 3513
4704 16512 16554 14062 2596 10357 17316 1011 22090 11353 20300 15300 18536
14293 4746 28831 20028 16742 16835 28405 11245 10802 20242 17737 9590 20693
26547 22557 22517 6285 5336 3998 2351 6628 22949 1517 4712 1770 9207
28522 14116 5455 13105 18709 3030 4217 6306 27448 1943 23866 20212 18857
14794 21425 15659
4446 21140 13454
21115 3271 1443
2153 12424 6159
23559 22473 26065
15914 22980 12766
3482 16233 5719
27020 12322 24014
25438 26499 26506
21987 16027 6832
17330 2620 20756
15985 10471 23302
593 6869 27185
22961 9129 25646
10702 12334 23959
6375 23299 26942
8029 4072 24051
15147 5113 14725
1451 27291 28731
18808 11561 249
28962 21405 18944
6889 3314 23457
27708 14530 8795
6185 28821 6550
2259 17627 701
20819 18831 20140
4991 11369 4282
13230 3413 27092
14556 5068 16209
4337 24652 498
715 28883 2285
16524 25513 26034
21067 15122 21667
27982 15280 3313
7563 22779 22453
4744 17277 27210
19170 10806 18815
26424 26442 7837
26264 28931 6020
4645 20678 13160

TABLE 8f-continued (Rate 11/20) ($n_{ldpc}$ = 64800)

18111 28045 23883
5128 10876 3087
28551 26276 3541
20152 10181 28172
26430 14769 6809
4956 16130 11348
1691 10216 5743
7848 20236 2661
10660 8321 6155
2757 6963 2596
27791 6707 258
12785 21176 15450
7477 17274 25201
262 18996 15836
5287 11970 13365
3098 17823 10786
21831 14476 11447
1893 3625 25404
20880 21987 1228
20942 15045 21358
18237 28914 15673
24273 284 9803
13949 15670 16693
15553 27782 22644
27980 24820 27733
7015 20974 10016
26164 20314 25916
11489 13663 11777
18230 11483 5655
1618 19977 26521
25639 13184 28994
3821 18349 13846

TABLE 8g (Rate 26/45) ($n_{ldpc}$ = 64800)

12918 15296 894 10855 350 453 11966 1667 18720 12943 24437 8135 2834
11861 3827 15431 8827 8253 23393 15048 5554 16297 2994 6727 19453 2371
26414 3044 20240 18313 11618 3145 10976 5786 5609 16358 2547 11557 14755
26434 2510 26719 4420 6753 917 7821 26765 11684 9811 5420 6653 19554
11928 20579 17439 19103 21162 11235 19172 22254 3420 10558 3646 11858 24120
10189 8172 5004 26082 4345 5139 15135 26522 6172 17492 8462 4392 4546
27330 21498 13424 8077 10165 9739 482 23749 1515 12788 10464 9085 20875
12009 22276 18401 7541 5871 23053 16979 16300 13566 19424 5293 18290 23917
9613 24175 11374 11736 17676 13126 20931 20290 20659 2000 7969 9386
21507 24494 11822 21771 26776 21175 27354 15815 7598 19809 611 10144
195 14244 7229 13002 14328 17987 14595 6985 7642 9434 7079 5571
10013 3641 14064 11716 4620 18119 23365 26446 26273 25164 11262 26019
15166 19403 5606 20138 1893 645 5414 12097 18635 21648 12255 13269
1895 9969 8372 17737 21679 17061 20219 2513 27199 11242 17025 1261
12845 13086 16256 15177 20822 10862 18375 6751 17532 24725 6966 18489
8373 25550 20688 16686 7894 24599 21578 12516 7115 4836 23473 25162
14375 9150 6606 21633 16224 23708 20350 4575 143 13356 10239 22868
10760 19807 7079 16382 26236 22606 16777 24312 16941 26684 8658 19279
15136 8603 332 2898 21821 23778 3232 12052 14336 7832 5600 27015
14392 26564 21616 8332 21750 10379 19730 7553 27352 2718 15202 25661
6891 13210 15284 21940 8742 10965 3176 25034 25137 25161 13267 7012
4993 9943 13260 20980 20224 20129 2120 23111 16640 23548 21445 10794
4846 2858 22663 12584 20448 4629 17825 22269 11278 26312 9463 21085
24282 18233 9220 14979 24106 14507 24838 19689 17589 7926 7893 21701
12253 26122 8035 20823 2584 4703 25178 5460 4190 7057 1144 8426
12354 7216 19484 4110 22105 1452 11457 12539 27106 14256 14113 20701
2547 26926 25933 11919 12026 24639 19741 15457 9239 26713 22838 6051
8782 14714 23363 450 19972 2622 19473 24182 2391 26205 10018 9202
15690 10472 20263 469 18876 23660 9005 12595 23818 26430 926 6156
5440 5209 14958 9882 18843 22063 12749 18473 22546 11768 4493 12833
18540 3544 9471 15893 14761 23479 22010 15491 19608 25035 9094 24836
15909 16594 23538 25136 25063 24995 5354 905 18580 15476 20710 7774
6088 17133 11498
4721 17594 18267
1645 23638 26645
14800 17920 22016
12927 350 19391
19447 19886 25992

TABLE 8g-continued (Rate 26/45) ($n_{ldpc}$ = 64800)

26120 1747 11234
1588 23170 27232
2230 15468 18709
17410 11055 20645
3244 25815 14204
2858 7980 12780
3256 20418 24355
24260 16245 20948
11122 1503 15651
19272 24054 6075
4905 931 18884
23633 17244 6067
5568 26403 490
16113 16055 10524
23013 8138 12876
20699 20123 15435
27272 27296 22638
7658 17259 20553
14914 17891 12137
16323 1085 18895
21503 17141 2915
21979 23246 1271
14409 11303 12604
25591 12157 14704
18739 19265 8140
11244 5962 6647
3589 6029 6489
16416 185 9426
1267 14086 22473
17159 22404 23608
7230 22514 21605
7645 1239 10717
12028 13404 12140
14784 15425 14895
26165 18980 15386
14399 7725 14908
8463 22853 22095
5517 1854 8283
24381 260 12595
839 23743 22445
13473 8017 7716
8697 13050 16975
26656 16911 11972
26173 2504 15216
7493 6461 12840
4464 14912 3745
21461 9734 25841
4659 7599 9984
17519 7389 75
12589 9862 8680
23053 21981 25299
19246 3243 15916
21733 4467 26491
4959 10093 20074
9140 15000 12783
854 10701 25850
13624 7755 10789
3977 15812 10783
5830 6774 10151
21375 25110 5830
15985 18342 2623
4716 27211 18500
18370 12487 7335
4362 21569 16881
10421 15454 13015
5794 1239 9934

TABLE 8h (Rate 28/45) ($n_{ldpc}$ = 64800)

24402 4786 12678 6376 23965 10003 15376 15164 21366 24252 3353
8189 3297 18493 17994 16296 11970 16168 15911 20683 11930 3119
22463 11744 13833 8279 21652 14679 23663 4389 15110 17254 17498
13616 426 18060 598 19615 9494 3987 8014 13361 4131 13185

TABLE 8h-continued (Rate 28/45) ($n_{ldpc}$ = 64800)

4176 17725 14717 3414 10033 17879 8079 12107 10852 1375 19459
1450 4123 2111 17490 13209 8048 15285 4422 11667 18290 19621
2067 15982 304 8658 19120 6746 13569 19253 2227 22778 23826
11667 11145 20469 17485 13697 3712 4258 16831 22634 18035 7275

TABLE 8h-continued (Rate 28/45) ($n_{ldpc}$ = 64800)

23804 14496 17938 15883 14984 15944 2816 22406 22111 2319 14731
8541 12579 22121 8602 16755 6704 23740 16151 20297 9633 1100
19569 10549 19086 21110 11659 6901 21295 7637 11756 8293 9071
9527 9135 7181 19534 2157 788 13347 17355 17509 711 20116
21217 15801 12175 9604 17521 2127 21103 1346 8921 7976 3363
11036 5152 19173 8086 3571 1955 4146 13309 15934 19132 5510
12935 13966 15399 16179 8206 19233 16702 7127 12185 15420 1383
6222 6384 20549 18914 23658 11189 638 9297 17741 9747 13598
17209 11974 20776 2146 9023 3192 19646 3393 1727 15588 20185
5008 3885 5035 15852 5189 13877 15177 3049 22164 16540 21064
24004 10345 12255 36 24008 8764 13276 13131 2358 24010 16203
21121 21691 8555 11918 129 8860 23600 3042 3949 19554 12319
22514 11709 11874 11656 536 9142 3901 580 1547 10749 5529
3324 6251 1156 112 13086 5373 5119 132 18069 10482 19519
17279 2017 14846 21417 17154 21735 18788 11759 192 16027 6234
20417 3788 15159 22188 21251 16633 13579 8128 1841 23554 15056
12104 9182 6147 1553 12750 4071 6495
4961 18460 23266 10785 10973 4405 2707
7665 7043 1968 3589 15378 9642 21148
13073 13298 20040 13582 17124 348 12055
378 7476 9838
15454 5218 14834
17678 3445 18453
2767 388 12638
5688 56 6360
20009 872 16872
10206 5551 477
10662 23689 19768
8965 17535 4421
19397 18734 5422
10043 22104 21682
508 1588 23853
1092 7288 4358
2283 22298 10504
15022 8592 22291
11844 17038 2983
17404 14541 6446
20724 7498 2993
14715 9410 6844
20213 14674 263
4822 20951 635
20651 23174 5057
22237 9229 4859
17280 9586 20334
19508 8068 11375
5776 21209 9418
6872 6349 20397
11165 19619 13108
13550 10715 5122
5655 10699 8415
9864 4985 7986
6436 3754 7690
4257 17119 5328
659 4687 6006
527 10824 8234
11291 1735 22513
7254 2617 1493
3015 7462 10953
15705 2181 11992
4628 19430 18223
9426 21808 13549
17008 3470 22568
13643 24195 21816
936 14226 22874
6156 19306 18215
23984 14714 12907
5139 18639 15609
11908 5446 8958
6315 16864 15814
10686 22570 16196
203 4208 13716
494 14172 11778
15112 14244 8417
21087 4602 15570
19758 4401 22270
8218 11940 5009
23833 13785 12569
1698 7113 18541
18711 19991 19673
8025 17107 14784
5954 6817 19810
24143 12236 18063
23748 23956 10369
7805 13982 13861
5198 10889 6787
10406 13918 3305
12219 6523 12999
9964 2004 17361
23759 21507 11984
4188 19754 13358
8027 3662 2411
19762 16017 9125
2393 4619 5452
24176 6586 10895
15872 1795 15801
6911 15300 14787
2584 4905 8833
1327 12862 9476
16768 12633 7400
11983 6276 18370
12939 12793 20048
20284 12949 21345
19545 4503 16017
1253 12068 18813

TABLE 8i (Rate 23/36) ($n_{ldpc}$ = 64800)

2475 3722 16456 6081 4483 19474 20555 10558 4351 4052 20066
1547 5612 22269 11685 23297 19891 18996 21694 7927 19412 15951
288 15139 7767 3059 1455 12056 12721 7938 19334 3233 5711
6664 7486 17133 2931 20176 20158 9634 20002 13129 10015 13595
218 22642 9357 11999 22898 4446 8059 1913 22365 10039 15203
10305 22970 7928 16564 8402 9988 7039 10195 22389 5451 8731
19073 1005 18826 11109 13748 11891 21530 15924 21128 6841 11064
3240 11632 18386 22456 3963 14719 4244 4599 8098 7599 12862
5666 11543 9276 19923 19171 19591 6005 8623 22777 1255 20078
17064 13244 323 11349 6637 8611 6695 4750 20985 18144 5584
20309 6210 16745 10959 14284 2893 20916 10985 9664 9065 11703
17833 21598 22375 12890 10779 11241 13115 9222 21139 1217 15337
15514 12517 18953 11458 17296 8751 7213 12078 4994 4391 14976
3842 21548 10955 11679 16551 8514 17999 20557 16497 12122 23056
10551 20186 66 11038 22049 2130 1089 22093 9069 3470 8079
19208 22044 2732 1325 22309 967 22951 1366 11745 5556 6926
2805 18271 10046 4277 207 19518 17387 9701 8515 6813 10532
19714 21923 13493 1768 18819 6093 14086 13695 12781 9782 445
22160 15778 13629 10312 19769 8567 22096 15558 19730 11861 18492
10729 16847 273 4119 4392 11480 20396 3505 7220 390 5546
17277 8531 17390 22364 7167 2217
7325 3832 19899 21104 8400 3906
6218 20330 14943 14477 5614 1582
21534 14286 14624 14809 6775 22838
15786 6527 15848 5288 13523 9692
12696 15315 602
17081 6828 13578
3492 6510 20337
6113 5090 7290
20122 15539 19267
10412 19090 17863
2546 2295 19448
20296 2296 2627
6740 14224 10460
12878 6055 15452
15152 15699 563
15414 21900 19161
11126 15975 3733
4379 15742 6475
17203 5870 18537
4912 260 21115
23164 4273 1694
1082 5287 11152
14537 2277 19232

TABLE 8i-continued (Rate 23/36) ($n_{ldpc}$ = 64800)

13414 15608 12926
17043 18241 18313
208 6118 20777
9140 19241 22845
18527 5035 4161
20867 22650 5585
7875 10358 1898
3563 14833 21329
14705 3359 13959
4507 11976 20017
22424 12925 8308
8739 15561 8010
6408 20723 20928
12337 7864 15777
12742 20430 17351
6259 1865 9808
8343 17441 2551
2167 3025 23181
22718 13243 4797
4223 4982 4395
1609 16748 17625
8463 15204 19632
6583 9112 20284
11334 19370 4763
746 18560 15222
8796 12725 15176
10245 15567 9991
17447 18373 21523
1473 5286 15793
17675 21170 6699
15515 15942 8733
7047 11348 14584
20435 19603 1961
18851 7069 11402
19180 6487 2979
2650 13282 9040
22613 23266 4786
20832 3001 23129
3850 5255 6601
19827 15438 13956
15798 4430 11318
4724 8719 21209
18127 844 21379
7427 22987 10233
22949 8145 21778
7622 14471 18874
8566 14340 3381
3373 419 11514
15127 917 13136
19375 18740 4951
960 2856 17804
662 8107 10298
10993 11755 19142
11400 18818 521
7210 18658 8285
9496 20836 5655
14654 13694 12705
20381 16473 7271
12796 3280 23370
13893 7667 1736
5485 18321 7789
11242 18771 17282
817 21060 15985
666 20461 22464
7696 19774 4324
12239 14014 4759
5011 10472 4137
3047 2444 3818
1594 20382 538
7051 21874 1697
18539 26 21487

TABLE 8j (Rate 25/36) ($n_{ldpc}$ = 64800)

11863 9493 4143 12695 8706 170 4967 798 9856 6015 5125
12288 19567 18233 15430 1671 3787 10133 15709 7883 14260 17039
2066 12269 14620 7577 11525 19519 6181 3850 8893 272 12473
8857 12404 1136 19464 15113 12598 12147 4987 13843 12152 13241
1354 12339 4308 23 12677 11533 3187 11609 4740 14630 19630
14508 10946 3928 580 3526 17836 3786 15739 13991 1238 1071
6977 13222 13811 585 8154 2579 8314 12185 15876 7738 5691
12901 12576 11597 4893 17238 15556 8106 12472 10455 14530 17432
8373 12875 16582 14611 14267 15093 2405 9342 18326 12125 9257
5861 12284 2441 13280 2762 5076 17758 4359 6156 18961 13208
4400 8474 19629 19528 14125 12780 12740 19316 491 4761 1719
7270 6615 1175 15848 6943 18360 8905 13921 10807 19688 18757
8312 12234 17907 17254 7699 18399 5508 12215 4818 18107 2874
19496 13973 10432 13445 15320 13648 1501 10549 6710 8897 1998
1575 12713 10916 5316 13713 11318 4055 5782 5828 17981 3141
12177 10726 4244 3138 15996 6822 7495 5257 8909 6180 10680
6650 1909 19146 1038 17229 10050 3051 9793 10839 3532 14759
5337 8448 4939 14792 7585 17860 8612 2229 18965 1519 2031
13845 9320 579 15441 15050 752 8303 6989 13360 12927 15255
17286 3639 1733 16883 8457 9475 2939 3234 1993 8554 9939
6359 15474 12100 6992 13844 16988 7481 16977 9052 9262 15270
7181 3624 3814 16379 182 4338 17627 3315 5745 14093 15574
10709 18662 6909 11248 5268 412 5854 16782 16059 10498 5061
13321 617 6734 3718 15441 19241 17214 1682 18641 18646 6330
7377 16951 14477 6507 9922 11464 2563 5702 12691 10606 17874
7198 12571 17617 4862 18899 7100 8130 9665 10779
6789 11459 17651 3693 13332 3854 7737 12589 15189
16260 14569 9442 17890 18097 6845 6960 1376 8099
12719 14986 18999 14013 3449 13618 14807 265 1508
11231 966 15957 8315 3384 2570 5700 10911 17372
153 8445 19598
7841 14806 54
2492 14099 11718
18608 4278 333
59 3982 16986
3494 12496 2775
18320 10650 16234
9739 16537 19706
7587 19072 18775
14133 12042 2922
229 17958 15889
5130 11029 271
5122 7021 7067
12258 16611 9245
15493 15347 15939
741 12055 2822
12804 3480 5690
18598 19273 16354
2569 16771 13693
15051 853 956
12256 2756 15137
15685 2802 16479
14687 12470 3583
15473 17781 867
4843 6765 13122
11287 3680 19101
4609 11385 13470
12353 6632 206
10984 3116 1263
9419 14455 19438
9528 1808 435
2238 12870 10119
10868 8402 11111
11081 7197 2667
13780 10759 19722
3768 3052 1836
446 1642 12388
16876 8398 14485
7301 14815 13811
5678 10419 14396
1877 14384 12817
19028 19589 6893
8725 6346 676
13611 12486 2054
11203 14908 14692
18139 5334 1253
16233 9749 16946
18885 4332 16306

TABLE 8j-continued

(Rate 25/36) ($n_{ldpc}$ = 64800)

3862 10395 13871
3747 8900 3381
13367 14132 7220
15095 4219 15869
13519 18079 17541
19012 13943 19471
2221 5710 13711
5185 3363 10195
9580 17331 15360
14387 7596 9614
17336 6371 6030
14629 10636 10159
2402 9170 4321
1040 5899 153
7710 7637 13966
10919 8535 3791
1968 2567 4986
4166 8744 17691
540 10695 10019
17710 1188 10821
5858 17012 17389
3083 17587 12682
5354 9537 6807
4964 15942 9653
9000 17053 13291
11685 8503 10777
13919 18155 9877
1625 15314 13879
18520 7074 17061
3748 2752 7298
493 19163 14139
2260 18339 10688
8928 17695 10276
7640 18547 3561
11275 5297 13167
19691 19542 15725
11837 7273 11297
17873 7840 19563
8109 3811 18417
17759 17623 13175
10041 4152 2249
18452 1450 19309
9161 11651 4614
11547 14058 639
9384 3272 12368
5898 2578 14635
15963 6733 11048

TABLE 8k

(Rate 13/18) ($n_{ldpc}$ = 64800)

2510 12817 11890 13009 5343 1775 10496 13302 13348 17880
6766 16330 2412 7944 2483 7602 12482 6942 3070 9231
16410 1766 1240 10046 12091 14475 7003 202 7733 11237
15562 4695 13931 17100 11102 770 3848 4216 7132 10929
16469 17153 8177 8723 12861 15948 2251 1500 11526 8590
14813 3505 12654 1079 11736 6290 2299 17073 6330 5997
390 16492 13989 1320 14600 7061 6583 458 894 1596
8625 7644 1322 16647 15763 10439 8740 5529 2969 13893
13425 13121 5344 8739 4953 7654 17848 9334 9533 2731
12506 10992 8762 5395 6424 11688 3193 17601 14679 8204
5466 15487 1642 6671 13557 4074 7182 4436 12398 12973
1958 13041 6579 15984 3762 16633 6113 11509 7227 28
17202 4813 14024 15099 2648 4476 2260 6507 9930 9232
14186 14510 6818 7665 12708 2645 16687 13255 8239 15884
1751 7847 17987 11410 3345 17133 17655 5027 1261 17191
8056 4264 13915 8217 6118 8072 6278 6835 5038 15008
13625 2999 5336 11687 13500 5723 13903 766 6293 155
12316 14093 7372 16846 15357 9865 17869 1429 16681 202
15062 1123 6454 17625 3213 39 1669 1770 13636 16555
13053 7597 11481 1336 3343 11387 5463 17830 13741 5976
1956 13509 1664 16867 8168 13421 17078 3285 17138 1572
16711 1499 4805 13584 14759 2844 13110 7356 5850 8330
6521 8528 14170 6681 16992 12867 14326 15227 4082 8595

TABLE 8k-continued

(Rate 13/18) ($n_{ldpc}$ = 64800)

16176 8184 8572 1923 935 8900 13020 6812 9778 3391
3946 4711 15314 15108 15634 4144 4372 9207 10715 1291
16601 5864 10968 4724 9235 6988 3307 6515 7004 16328
16217 4227 9735 15857 5003 2532 4451 8574 2149 6908
9506 8949 12035 9701 3124 14295 8567 13614 5159 16746
2418 8669 10921 5738 147 1004 2692 9065 12877 7559
16706 8511 10314 3118 1219 7071 12376 538 2389 3297
12492 10589 5791
13528 1653 6618
10485 1307 4102
347 13580 4039
523 10311 10540
4183 6192 17159
11458 6521 9632
11594 15791 10384
11654 126 11715
6265 34 5091
7271 13900 7588
3960 11297 1612
9857 4695 16399
6423 2197 15040
4219 5979 13959
2959 578 8404
4585 658 6474
15900 11357 5249
7414 8642 1151
4130 9064 14537
14517 1356 3748
13865 12085 17295
9530 5110 1570
10862 8458 15322
16355 1774 5270
1229 11587 1632
17039 787 4703
11423 15388 6136
8413 9703 13946
4678 4072 16702
6244 4690 7164
7238 14169 5398
8679 122 11593
10954 15802 16427
9413 6717 16406
1027 17863 7836
655 8827 10286
4124 12599 12482
12955 3121 15318
8343 16634 6301
13568 5056 9920
1948 10 17395
8550 131 2151
15226 15994 13093
10966 15412 2781
13425 15831 5346
2261 1067 6346
6625 1966 13533
10575 4483 5761
14366 2019 14426
16746 1450 4830
13109 7358 7942
15376 7284 14035
14341 12625 3306
9375 7529 1537
13831 13447 4549
15658 15299 8238
4005 13264 9766
4715 6285 15383
1262 12883 15434
11123 14975 3434
5307 1112 16967
12163 12009 3681
9174 13153 10344
13456 13197 9562
1785 7549 15347
663 9748 9436
4961 11903 11574
16248 6238 666
11426 13748 14763
14431 1443 2069

TABLE 8k-continued (Rate 13/18) ($n_{ldpc}$ = 64800)

2376 8154 14978
13140 1289 9046
1159 300 3319
11510 7769 15877
6430 14946 6856
8868 15622 12458
4867 6622 6850
14721 11241 12760
14233 9874 17682
16677 13195 15086
11155 7067 14160
12741 14379 8922
1930 17055 11752
12361 6523 9568
12165 5636 16011
11389 4754 9916
15903 15542 8301
12073 4918 9754
16544 17907 14814
10839 1401 5107
12320 1095 8592
15088 6521 12015
14802 3901 8920
17932 2990 1643
5102 3870 2045
540 2643 2287
5844 2482 9471
10428 637 3629
8814 7277 2678

TABLE 8l (Rate 7/9) ($n_{ldpc}$ = 64800)

13057 12620 2789 3553 6763 8329 3333 7822 10490 13943 4101 2556
658 11386 2242 7249 5935 2148 5291 11992 3222 2957 6454 3343
93 1205 12706 11406 9017 7834 5358 13700 14295 4152 6287 4249
6958 2768 8087 1759 11889 4474 3925 4004 14392 8923 6962 4822
6719 5436 1905 10228 5059 4892 12448 26 12891 10607 12210 10424
8368 10667 9045 7694 13097 3555 4831 411 8539 6527 12753 11530
4960 6647 13969 3556 9997 7898 2134 9931 3749 4305 11242 10410
9125 9075 9916 12370 8720 6056 8128 5425 979 3421 5660 9473
4348 11979 5985 395 11255 13878 7797 4962 13519 13323 7596 5520
2852 8519 3022 9432 3564 9467 8569 12235 11837 5031 4246 2
4081 3630 1619 2525 3773 11491 14076 9834 3618 2008 4694 6948
7684 9642 5970 1679 13207 12368 262 7401 11471 2861 5620 4754
7474 10418 1422 10960 13852 988 13465 6415 86 2432 7595 12239
8539 11749 8794 6350 1947 13325 13061 7385 13017 2536 13121 15
7944 13831 5126 9938 11758 335 980 9736 12143 5753 4533 10814
10706 12618 6949 2684 4107 14388 11372 6321 13832 9190 2838 13860
10830 1947 13803 3257 2677 406 8400 10536 12911 3629 251 9784
13343 13304 301 801 6456 6351 6155 6763 3812 11337 8446 9306
524 5573 503 10544 8990 673 2309 12376 466 11441 960 1557
4403 3564 1732 13453 12054 8941 1383 12424 4347 9830 3553 5158
2025 4282 4983 13553 10776
11833 13099 5078 4420 3527
1544 7474 2780 7749 4153
11189 520 8463 12230 7712
10409 13367 2604 2966 9248
1412 420 3507 9818 7955
1122 12483 9375 10232 9456
2799 7033 10404 4495 12059
2569 5970 6262 2199 8045
11724 511 12693 12855 9597
756 12900 13391 13623 10683
2095 13479 1488 9469 11142
13849 1356 10776 3530 9866
13449 14225 2072 12772 9461
6466 6181 6502 401 7439
4631 1086 3062 11789 11811
6788 14007 2270 14132 2764
4643 10272 11316 2608 8511
5221 9028 2736 7223 1051
1974 2737 6739 13904 6156
5 9082 3915

TABLE 8l-continued (Rate 7/9) ($n_{ldpc}$ = 64800)

2400 7195 3413
606 221 8171
4548 1267 5310
12795 2160 8305
10563 3507 12190
6325 2499 9717
9251 6046 13308
11704 10834 11241
4777 3774 11533
12487 10365 6852
58 2650 2027
7248 13704 5573
12777 7834 8561
7906 8121 7774
554 3105 6000
11198 3586 10410
9002 4094 11297
12058 1037 13638
1258 12917 11078
2430 51 10276
7841 9451 10236
11045 1058 10352
9629 9428 86
8146 1255 3802
10820 6337 4199
9364 7723 1139
438 6445 583
2683 5358 10730
8471 3061 13380
3005 2840 4754
8210 1814 11502
8667 14258 5985
8407 13336 10970
6363 11715 5053
104 13618 13817
6562 4087 294
1742 10528 4626
6607 2692 1587
11097 8361 2788
13451 3541 823
4060 13604 9816
157 6106 1062
8853 5159 4270
9352 13164 2919
7526 5174 12501
12634 13077 5129
5750 1568 6281
269 5985 10973
8518 9415 1028
4722 13275 634
12113 7104 7436
12787 1032 5936
3425 11526 10797
784 9208 15
11223 12849 4913
10635 3553 8852
11749 10619 3532
4080 9831 9219
6560 6049 6111
1304 11770 12585
13209 8589 11287
2887 10699 14307
4752 456 4073
1175 13156 4894
12756 3237 6279
10125 7074 2344
7533 7103 5226
4000 4425 12173
10056 5312 1599
7445 8696 12533
11509 14050 2483
12405 2876 5033
4512 4955 5627
5572 5099 10987
10665 404 3082
2075 1583 13454
5666 7228 524
13290 7634 418

TABLE 8l-continued (Rate 7/9) (n$_{ldpc}$ = 64800)

9006 7368 4181
9447 3674 8171
9355 10211 9342
12572 3681 3322
3295 186 7491
7926 212 5241
5479 1654 8097
5078 423 4817
1357 12780 3664
11900 402 13108
299 7166 12008
5750 3041 5618
8357 1229 8884
3713 8791 13375
4390 6302 568
1009 4440 10003
1209 11978 11711
1803 9838 13537
11318 9750 12421
2388 3021 7880
7220 1062 6871

TABLE 8m (Rate 31/36) (n$_{ldpc}$ = 64800)

8971 1759 4661 2344 8810 3677 5653 5575 7855 8916 1232
6045 3232 8535 7071 6764 5731 2016 8662 3813 223 4080
3502 3358 2640 7181 793 289 4907 6380 6437 261 7395
3264 6823 551 107 3672 245 2133 2328 2462 2349 1096
4755 5134 5661 5948 3017 7071 6140 2620 4479 5669 508
5209 2522 3677 7033 4553 4780 8149 6346 4190 5242 3118
8430 2284 8323 3944 7479 7765 7974 3145 4381 47 3257
584 8668 3622 7087 6946 4527 5274 6111 4151 1805 3370
3713 3710 186 758 1606 8866 2975 3305 6548 2039 2197
4021 661 7382 3627 628 8334 4880 2742 5139 1910 5450
6338 8246 8710 8382 2952 3468 4905 3623 6578 2519 8966
1781 4964 623 4641 7520 6371 6835 1853 8584 3351 7486
7368 1500 5916 5328 2390 7684 8660 4286 7833 8517 3696
8199 4143 538 3959 8390 3414 8353 5244 5698 1645 3804
2158 1979 10 8920 6848 434 4640 3443 4662 3311 8682
4678 5773 8736 4743 7365 213 3257 1449 7394 7035 356
7916 2503 7790 8719 7879 4639 4251 1160 542 8333 3163
713 304 1515 3019 5747 7901 581 857 7416 6967 4325
1224 8200 817 7526 3694 1563 5341 4464 1668 4154 2731
5150 3051 3027 4312 8372 8168 2438 6549 1669 2508 792
5112 6776 1508
8775 1199 2766
456 4827 7450
6774 4851 6529
3650 1777 4738
4717 6245 427
5897 956 7912
829 3876 5237
7972 6664 7929
8937 8392 7322
6575 7176 1446
4850 5066 8804
8899 8400 3469
6998 3642 3011
7923 4486 1765
6452 3059 5714
788 2207 3170
7267 1301 4997
4439 5972 2812
1780 6970 1589
7959 8278 6071
4534 3352 97
8471 2786 2155
2310 981 4507
7595 8390 1576
903 4985 906
4329 6038 3816
6655 3181 8643
462 6342 369

TABLE 8m-continued (Rate 31/36) (n$_{ldpc}$ = 64800)

7927 5468 4640
5158 5099 8728
1162 1013 1668
4991 10 4023
7683 2169 5932
4904 1508 8599
81 7255 1696
4953 2574 3819
8670 4354 5201
3245 8547 2582
8283 5948 112
0 3555 8320
7361 3833 6990
2073 8147 3267
443 5558 422
4028 6204 3714
3204 1319 5834
385 2462 1221
7359 5931 8590
8507 6028 1036
6649 411 8848
2741 8385 2
734 5600 5141
6463 8874 5635
7438 4542 4355
8441 7926 3737
106 6421 5843
4827 1068 8169
4377 6957 13
3539 1226 175
8814 7140 3442
5985 8721 8564
6126 3850 8168
7291 8950 3881
1495 7555 8118
5993 6269 2364
6839 185 4721
8226 3508 5415
7558 6282 5985
8472 2791 4386
6780 6798 2965
6375 8983 3049
7644 5774 6057
8856 1119 6354
8565 6181 1611
8078 3236 6834
5834 2671 1352
3780 2609 3762
2341 1778 6913
523 2420 1779
6462 8692 4898
3367 3526 2137
1829 1013 953
6042 4363 347
7052 5170 5807
5302 2622 4624
8309 4278 3905
7431 3576 391
6 2284 6866
624 7584 7746
3739 5085 2171
7148 1787 5217
7011 3901 8124
6487 2318 1527
8208 889 7568
4516 1340 1403
7681 680 8128
3502 8037 5595
6254 6343 455
3114 8126 6908
1370 3185 1047
4035 8017 2815
7533 1663 2346
4345 238 3292
527 7323 8811
7598 2211 5857
949 554 7169
8797 1600 869

TABLE 8m-continued (Rate 31/36) ($n_{ldpc}$ = 64800)

1269 3815 4457
4850 3857 3079
4500 4413 7547
2532 250 46
3357 7128 442
1828 1156 566
7441 603 6927
7801 2986 3767
1008 5843 4822
979 1910 262
7958 721 2898
3835 1141 3693
1448 4271 394
4379 4286 422
2275 2026 4383
4840 7098 8809
742 129 7220
550 7440 6138
4257 7627 3234
8724 7147 631
2669 680 3924
6213 3684 935
2781 3219 8705
4977 2276 6690
8586 4945 8664
7205 5893 7264
6887 1064 6249
3962 7938 4495

TABLE 8n (Rate 2/9) ($n_{ldpc}$ = 16200)

1412 2138 8984 3438 2515 10585 11093 5801 2511 2287 10879
10470 10973 3691 11847 4141 479 7406 3228 8356 256 11769
2480 8892 9040 4517 2672 11159 7865 6415 2638 5399 7575
952 3128 12126 6408 60 10782 10254 11866 4473 10592 8736
3819 669 2091 5790 5040 6987 1353 2734 9859 3974 12568
5396 3717 6005 5830 9748 7221 8759 396 2259 11357 5702
7043 1281 6308 11899 7792 6476 3741 11099 6895 3224 1940
8224 8533 607 5065 9226 7677 389 7233 11605 7002 1302
10984 3435 9186 5964 7806 1613 11451 6020 5275 4965 6307
6942 1054 2451 5545 10447 6453 6583 6177 6284 11747 11323
2696 5058 3217 6755 1434 3691 8784 11507 1298 1233 7964
8103 6761 11865 1288 4258 7960 6753 4896 3722 3526 6795
4663 2198 9374 8700 9195 9272 7573 6956 3057 10801 574
9292 525 989 7701 3754 1110 330 3367 10472 6202 2627
1181 11223 3564 1628 8362 6419 7476 10074 1406 12509 9757
10380 9841 100 10177 8331 6788 8872 11167 2167 3646 2770
3111 8679 9590 9338 9119 8373 90 10418 12041 7718 3102
8551 6068 8424 10522 8595 6512 866 4591 3390 7496 172
1467 9023 9000 4113 9407 7168 29 11625 8584 8396 9683
1457 6097 9254 1850 12476 11664 11115 4278 11945 844 9302
7661 12225 1040
3671 5318 4875
3554 10478 10902
11739 3429 7114
5533 3709 689
2951 10126 10677
8709 9880 1112
681 6786 2945
8823 210 689
6648 509 2228
11109 10495 8746
8223 4337 6804
371 5245 7435
8110 6001 11003
5097 2116 3826
2054 5220 7231
3029 5134 8970
132 9603 1538
10743 262 11188
990 6782 3283

TABLE 8o (Rate 13/45) ($n_{ldpc}$ = 16200)

7200 3499 6246 3905 247 2945 6706 2366 4892 5254 3370 7202
8203 6971 5728 4002 9544 5247 5176 5021 6732 8016 5317 9111
11144 7046 7808 8792 9779 11402 10050 7970 2047 6746 746 11319
4085 9903 3751 10712 6662 10504 7149 8084 7417 4334 9448 10678
9739 3412 2152 1114 6077 1021 10761 5073 3458 10115 4722 2581
8860 1515 1997 8926 471 2708 1449 158 4140 10611 10740 9693
3165 10132 4839 4204 10917 2320 6112 867 4929 9201 1707 10355
10887 7531 1123 8118 8896 5168 2011 110 9188 8375 9421 1693
1252 5132 10342 3726 2094 761 7397 10962 1848 4584 7139 1858
10499 3638 4924 1466 4191 2999 7778 11389 1071 2537 9265 5340
11498 4140 6795 3575 7332 10491 1502 3493 2380 3962 5169 2719
6028 10291 3440 7669 10253 8175 9134 2374 10199 2229 1055 5597
6655 7533 1518 11299 3033 1083 2464 10032 10910 3439 11511 3763
1424 9362 3170 10113 5492 11354 3160 10592 10897 37 334 8974
8540 9590 4255 5342 6469 11153 2925 3384 8958 7809 8108 2721
388 280 3829 8071 7567 10280 8151 22 8789 256 6937 5050
10795 1844 7999 1047 8549 4046 1696 893 8952 9610 10014 6772
485 9159 11346 10133 4447 10089 9419 7756 2637 6446 11400 9357
9302 2726 1559 7231 9930 9385 7889 2356 11066 14 1180 8283
458 5862 5540 3284 7878 9379 4637 11123 7791 8965 10476 2620
2593 4749 1747 4818 10173 596 9833 4518 5205 2808 592 228
10538 5907 164 2111 6334 1930 7625 11378 1531 3798 8978 4224
10183 8729 2755 10694 4801 2302 2649 1977 10031 3495 4789 1102
760 9858 700 3625 8633 3152 6230 9510 6123 2053 10767 50
1777 10548 6803
3935 1861 220
3117 211 7402
7164 5909 10691
4175 4997 7823
830 6156 5451
11467 1346 2838
5962 2858 10343
905 3219 1146
584 10896 5474
5315 3529 5378
4164 3155 9405
11386 10011 9288
7404 1200 8828
649 9557 9284
11419 7104 6268
918 3637 11395
5539 4612 4850
1965 8574 7497
8644 857 2038
10674 10465 886
10864 7119 353
9657 3090 7792
408 26 5892
4193 3663 10393
11181 5241 2721
10010 3240 7704
9370 8872 9280

TABLE 8p (Rate 11/20) ($n_{ldpc}$ = 16200)

4692 1824 629 6885 466 5885 1190 3308 7241 3690 4845 4383 7107
5761 3200 4648 2401 6747 4908 1777 796 6724 1310 2462 3313 5669
6966 7054 6004 4230 1509 1194 4523 4356 1438 7261 5516 3549 4934
4308 7052 3603 6516 945 3511 617 5820 4168 5622 4545 1242 4382
1781 3490 4461 2464 6762 4082 2975 6166 894 1316 5228 5057 4644
5319 784 7037 3831 3570 853 1703 5064 1011 1642 6895 863 4176
1115 5811 4326 4263 2325 2685 223 6496 669 571 5057 1096 3594
7208 3140 3336 992 3516 4296 4492 5796 1875 3068 4970 6802 2652
214 6831 3611 2470 846 640 2983 2208 5295 5924 5242 5747 3017
1208 974 4819 2163 1631 1198 4570 2983 3664 2253 6131 4672 4698
3272 3537 4532 346 4936 5696 1275 6386 2124 7138 1179 4236 5891
3688 3376 6079 2437 4585 6404 1101 2289 378 6773 2800 2195 5013
3121 6579 5086 4192 3925 6844 4327 6329 6075 2738 6941 4088 4631
5613 2332 1432 5655 2516 5657 5383 3494 1235 3237 3282 449 1982
4339 6071 3262 5233 7004 390 2526 4128 3762 1284 4669 5897 6506
5840 2240 5046 1769 2539 6637 5000 4013 2325 1798 4680 6318 6746
5262 215 6980 2436 6086 1764 4227 4273 3163 2663 2406 2037 2549
649 4346 2391 420 3069 4930 6338 1834 6713 7013 1483 1918 2122

TABLE 8p-continued (Rate 11/20) ($n_{ldpc}$ = 16200)

4147 1365 240 6277 6965 2436 2263 1334 2766 3525 5125 5808 4540
270 479 6244 2162 1409 7159 621 1439 4703 6526 6147 2701 7284
5510 558 3472 4520 7268 6903 4942 2301 4603 3451 512 3982 1219
30 2433 3797 469 4999 1845 6340 2327 1127 4663 6218 2112 4826
4851 1442 312 4788 5715 2449 2205 5056 1293 3985 1505 5768 5534
2604 6887 1831 1693 3557 5558 4425 3317 908 6236 5087 2257 3043
7159 3988 4837 4823 2208 908 6145 7232 1654 5099 5820 154 5058
3816 5710 5209 4080 5824 3820 7136 7066 6226 4999 4818 3081 1008
2378 3443 4210 525 3330 6183 1159 5073 5340 5786 3287 325 590
4048 4667 2821
4634 4645 2287
6592 580 4814
4375 4460 1799
160 2686 372
2129 5124 2066
1088 5047 995
226 5085 6263
2380 6679 3460
3011 3728 368
2642 365 3253
3801 2032 824
3243 4488 7088
6069 1002 1830
5718 3944 5213
7126 4207 5638
5780 1663 1081
1969 7238 1671
188 6826 499
5878 4110 393
2845 3816 3302
3755 2810 3055
5876 4890 3663
4288 2134 2926
2633 964 5454
2540 4811 2737
7149 2494 3042
7140 3546 376
4567 5871 4351
797 4245 7178
6811 6722 1351
5102 7241 6537
6828 1345 266
3094 2749 3658
5328 2573 1454
6444 5267 4847
1407 1305 6597
665 860 1934
6150 4115 3799
4362 4407 6956
6703 1355 2152
943 3688 6536
1737 1856 3374
6987 2896 3414
4897 1339 3530
6599 2011 6911
4907 4542 3723
4374 1444 3344
568 4887 4732
6402 1609 4422
2809 2306 570
3063 4645 2697
5994 505 5805
1353 74 6648
1738 725 4900
1614 5497 841
649 731 3474
4246 1530 6986
2023 4976 259
6173 987 5313
2276 3770 4029
5101 4900 3767
6863 3991 2090
6639 1708 6603
328 1674 1476
3494 1497 3083
5233 4103 6677
2522 6812 6404
25 1986 409

TABLE 8p-continued (Rate 11/20) ($n_{ldpc}$ = 16200)

2739 1882 3534
1958 861 7072
1958 2364 5609

TABLE 8q (Rate 23/36) ($n_{ldpc}$ = 16200)

4626 1140 3468 5725 2133 2303 473 1009 822 4351 2620
4725 4712 5060 4753 2897 5002 147 236 1234 4181 103
3305 947 2893 3155 3944 5064 1931 2538 3341 4027 4268
5630 671 2963 4446 1161 4388 5381 4986 5105 5817 4928
4420 3543 3452 5455 4711 3255 1654 2549 2963 1256 2235
1127 171 2482 1282 75 1645 2833 5326 2386 4508 4547
3789 1497 5124 2650 2370 4577 1421 962 2986 1788 4993
5240 1659 1071 980 4674 2477 5373 5719 1828 3904 5050
2516 58 4982 5550 5600 3411 1568 3674 2916 4767 5114
3143 4289 2589 1305 4489 1050 5696 1860 2030 4584 1514
4425 3025 5051 5435 5675 2726 81 5031 193 4032 3282
228 392 4389 2396 5698 5563 4218 1740 4605 714 5520
3616 5534 1115 2065 1267 128 2019 5820 791 4558 5700
4883 2655 2903 2269 4669 367 3392 3845 1937 581 928
713 4773 2637 1195 2941 3974 2614 2251 2311 3724 357
5847 1614 543 1039 4426 2821 3108 2323 224 4424 622
4731 2476 5740 1002 5065 4869 1384 50 5035 825 1302
2500 214 5711 4191 4268 5218 3679 1327 4629 921 1368
2672 429 4639 1916 4278 3126 3440 50 3976 5237 4865
2990 911 1768 4500 992 4704 5171 1737 4858 244 5647
4413 3838 930 1764 1832 4028
4958 4098 1522 1326 701 432
63 5603 3397 4963 3719 1757
545 3634 2417 51 476 3169
1744 2751 3068 2754 5788 435
502 3431 5141
217 5343 2096
1154 5301 5455
1306 5538 1821
3787 3714 805
967 4366 40
5228 624 3319
4013 4113 2110
1412 4137 2376
5135 3884 4890
512 5327 5807
2441 3652 5512
3623 1827 1019
1357 2629 2039
4047 4608 152
1129 634 4708
5165 4941 3432
1682 2583 437
4956 989 3149
2444 5476 5063
3147 93 2652
2694 3510 3484
5215 3576 5330
1214 1301 4752
2544 665 1669
3425 3851 917
1677 1696 4385
3184 5716 2684
416 1587 5466
5117 807 402
1819 684 2619
1271 5820 1818
1010 3901 2373
3739 4706 823
3718 3738 565
5476 4945 1396
4745 4776 2784
1079 918 677
3991 5626 3195
2401 1007 3257
1378 5770 2213
4972 2611 2515

TABLE 8q-continued (Rate 23/36) ($n_{ldpc}$ = 16200)

4883 4015 4442
3965 5844 448
4852 2035 3579
1090 4495 2482
3385 2415 5603
3036 2307 2416
4994 4832 4212
380 38 2773
2057 1308 436
2291 924 3045
3575 3084 4507
4803 3768 1673
118 4804 3762
2931 4736 5619
1357 2531 3547
1153 343 2676
3784 1810 4515
2576 348 1551
2939 4088 834
5396 1260 3465
1734 803 907
2471 257 1523
1632 3775 2968
5100 166 4352
962 1869 5173
47 4415 5040
782 2449 1611
2239 4649 1664
4422 4211 4708
5777 5762 2579
4418 609 3241
5088 3031 4033
5306 3404 2633
3330 4899 3679
2287 584 5181
4162 3310 1783
2487 2229 334
5507 508 5296
5348 4143 1902
4200 3938 2790
5150 5834 4250
4392 5223 5221
1662 2779 170
2942 116 2334
134 4175 1970
1114 4668 2250
3336 393 1764
3709 5156 3925

TABLE 8r (Rate 25/36) ($n_{ldpc}$ = 16200)

3717 2086 2490 983 835 4687 4347 4476 3404 1761 576
4145 578 368 2845 3005 909 364 3235 3961 4076 512
936 592 765 2964 746 1927 4924 2903 3317 3261 1270
4535 4082 4236 1298 2632 3931 2365 4093 4275 1695 2374
428 2881 2308 1623 277 3560 3583 2093 2563 3756 2174
186 101 1014 1629 496 1763 2714 3520 1193 243 2712
2503 1332 1039 3201 3305 4587 3408 433 267 4567 3310
3949 1938 280 3951 4404 4528 4292 2791 2944 1533 1437
274 1965 2557 4701 2488 858 3540 2134 342 4890 2891
1947 1353 2021 1422 388 3045 605 2847 4059 1204 3680
1505 2758 3764 1874 2296 4804 337 2581 1810 2235 3623
3387 484 262 177 3981 2578 3711 215 4569 3281 572
949 2395 1082 1689 2912 45 2900 4391 1219 3966 3939
1521 3156 557 2258 1247 4471 1347 349 1683 4762 2854
1469 1924 3164 1079 1270 4828 2363 2104 1792 22 3231
2775 2423 3177 2287 2571 2530 3480 374 4526 4713 4760
3606 1798 2371 2510 4392 2655 3731 635 1264 4808 586
1530 3539 4714 4507 3826 4767 4887 750 3153 2851 2381
3547 3114 4280 4442 4710 4773 3920 4356 2976 1155 1394
9 2545 879 4188 4150 69 1372 3483 1347 2676 698
2922 2547 4926 391 2998 2896 3684 92 470 884 3186
3751 999 2259 575 4155 2053 337 353 3449 65 2292

TABLE 8r-continued (Rate 25/36) ($n_{ldpc}$ = 16200)

726 4700 4012 3049 3508 1443 2438 132 3100 4427 2810
2208 3640 1993 4029 3104 3956 3298 1291 9 2926 39
1053 3365 1223 344 4142 3983 1564 3438 271 3187 2143
1179 1422 4808 4103 4814 3081 1550 2594 679
3404 344 1749 1011 449 4522 3490 2052 757
2508 2035 3087 2578 2330 3765 883 3322 3949
2156 1486 1230 4166 4106 3157 3789 1804 4237
4644 4832 538 2571 1231 83 3391 968 620
3841 4072 430
3715 3034 3594
52 1688 1107
2451 2790 4493
3131 4635 3197
714 231 4226
2122 961 1094
1118 1540 1550
1283 940 3985
679 914 952
983 3030 868
353 562 4129
3178 1719 931
3248 659 378
122 3064 1132
446 86 2986
399 3004 1700
217 4511 4712
3852 3189 4715
3500 4823 2186
2221 1472 4220
4206 376 1077
602 1281 4257
1385 4528 1354
2730 2701 738
2008 3989 3825
302 664 995
3473 4540 2668
1663 2271 2465
2334 3551 4028
799 3523 3877
3738 3999 2832
2187 4404 597
1291 2382 1411
3478 831 1080
1720 460 2630
548 1359 3736
943 1813 396
3447 1040 55
1438 3007 2305
99 4399 2097
672 127 1972
2670 3843 2060
4500 2824 1088
3904 1646 3473
920 1832 3307
1885 891 370
3530 3988 1530
1622 3751 2515
4840 4819 532
2263 4213 1894
3241 2172 1720
1298 3976 780
3088 1683 4340
3075 2980 316
2455 1701 1106
2560 2811 151
2481 3157 1670
552 1329 3876
3378 1137 4060
37 1087 4074
2256 787 1840
4448 2800 3711
744 3710 4914
58 2171 2569
2173 1552 3975
4486 1025 2337
3313 1972 3531
1465 1836 3509
452 2216 2993

TABLE 8r-continued (Rate 25/36) ($n_{ldpc}$ = 16200)

3440 3921 3059
1143 2621 1196
3864 2468 3362
4556 3153 3242
825 53 4058
1046 3814 550
169 1123 533
2467 4843 1523
64 3493 3882
2708 1378 647
3834 4460 1989
3734 1011 4453
847 3376 3723
1065 1964 4882
2409 3797 651
3980 4069 4291
1004 4321 4214
2961 4944 2277
1984 4617 3331
1022 1204 1943
992 1609 2287
438 2425 1553
1922 2389 2119
3996 574 2810
3813 2944 4546

TABLE 8s (Rate 13/18) ($n_{ldpc}$ = 16200)

2192 1265 868 3272 569 2864 2608 666 2275 105
2140 2364 299 3944 3601 3720 588 2437 3256 823
1834 2010 1287 96 3400 491 1853 892 3359 202
1517 4347 1598 3895 686 2526 434 28 18 1702
582 3070 1123 1334 3288 1717 1954 3993 2483 2045
35 441 713 2921 3908 2027 3853 2180 1670 1473
2087 2054 3055 2764 1440 2563 1192 2573 3322 4436
4435 1417 1879 1661 1555 2334 1473 2207 4190 172
2640 4281 2091 3492 2509 339 3293 105 3822 445
1170 1350 1994 2696 3867 4048 3816 845 3661 1841
3485 3973 522 4150 3497 1752 284 387 2392 2776
1116 3378 1486 1249 4354 1539 2944 93 1914 1602
2903 3143 3574 179 1280 149 2558 2450 1120 4418
1355 3730 570 4107 4422 4406 1492 4313 4415 2767
1547 4305 1658 1693 289 654 3281 3159 1076 798
3801 1160 462 1419 3371 924 3575 2427 232 4083
1375 29 2364 2909 2843 3668 432 2488 183 4498
752 84 663 3968 1901 2766 2056 1497 1087 3498
4169 933 2713 3947 2418 1075 685 99 1010 1144
851 4150 2141 48 2111 4190 3875 1906 2883 794
2357 662 2065 971 3174 3127 3428 2481 3696 1816
3712 1751 3777 3381 3107 486 2649 3947 4335 1971
401 1539 3940 3111 3506 2088 1113 91 2769 1509
888 1769 960 2853 2485 433 2329 4489 3907 4394
2800 2226 3816 1352 4429 2481 1632 2459 3107 317
2662 1465 624 2078 980 2296 714 3758 838 4479
3212 3165 160 2037 3445 4296 626 2678 254 2577
1510 4195 2262 4158 3656 4026 2203 3427 199 3904
361 471 3274 930 1932 4386 2789 1078 475 2319
1903 1961 3515 1121 1374 3930 3231 1782 36 3846
3586 4292 1220
3459 1843 4285
2959 3197 737
1475 2767 3284
2071 4248 1601
1692 3935 783
1613 4030 3217
3574 4439 2783
1366 1849 1685
3923 2519 2224
559 1215 663
2654 2213 1720
2642 4206 253
3869 2100 1908
738 1269 2067

TABLE 8s-continued (Rate 13/18) ($n_{ldpc}$ = 16200)

1314 3511 4104
251 3250 1429
1997 557 2622
2684 4196 3297
4162 1270 3774
4377 1188 1614
178 910 3254
1707 4401 684
1006 1808 933
160 73 4031
2416 131 3480
3545 661 3762
1057 3179 999
1545 4068 352
4394 2240 3846
794 4489 505
1749 781 1561
3982 1960 2888
3246 2468 1277
3752 2091 964
4143 1702 2300
2330 505 3566
4190 1808 2698
2173 4106 1144
1822 4295 462
3187 793 175
3276 415 3371
1725 4436 1079
3227 4428 2968
1471 1103 926
3455 2826 2803
2122 1078 3315
640 387 182
3191 1486 4489
4282 2241 3748
589 4076 2164
567 677 490
3887 2508 1393
764 577 3086
2108 2784 1762
1281 601 460
3810 429 4396
3043 125 1429
1028 3836 2717
3938 279 2184
4248 466 1653
3827 2192 889
1522 2435 3058
3583 1619 2134
3857 3089 814
301 4380 320
1628 3244 3490
1838 2136 632
4093 3101 1319
3738 1154 1331
1965 2897 3650
4390 3487 1768
2578 1487 3465
665 4350 1083
2935 2974 1354
2782 1726 2041
292 2848 4068
118 2581 3525
1283 691 2946
2957 21 1450
3182 1709 2373
1320 2098 3911
1752 2805 2426
2356 2885 3662
175 1446 3774
709 2773 1345
1704 963 912
3353 4220 16
599 463 3105
3157 41 4244
3244 72 410
455 2849 1847
1197 174 4056

TABLE 8s-continued (Rate 13/18) ($n_{ldpc}$ = 16200)

2745 1903 1271
171 3511 3072
395 4469 892
2567 2413 1956
2430 1349 4352
2561 1030 2
1809 3416 3973

TABLE 8t (Rate 19/36) ($n_{ldpc}$ = 16200)

1282 5463 2055 1492 6457 6767 3505 1482 1439 6574 60 2796
3840 1600 3301 4638 7064 6019 1981 620 1585 6357 6215 2923
5347 1877 1546 5034 3058 1839 4485 7647 5859 1883 424 2650
5559 1779 574 4934 42 765 2647 3586 4426 4731 1714 2322
3561 5920 4388 5319 217 1430 6897 3410 5416 6595 7285 130
2164 141 7069 6618 2274 2510 5625 1070 6638 6664 3156 6564
7425 3088 3992 7531 1469 2669 763 7347 3322 5053 4922 5014
3202 627 991 1165 3897 6116 7469 1315 4928 1483 1555 2699
2262 2815 2251 1615 6892 6023 1882 4243 3593 3012 3144 1914
6929 3722 3145 3032 3864 4084 1371 657 4019 4635 5898 1009
5077 1866 4950 3746 2553 5393 5486 5144 207 1921 5618 7390
7155 464 494 5977 144 4421 2752 5922 1530 481 3468 321
5883 199 3099 2896 3951 4141 6906 3162 3695 3899 2980 2973
4003 3742 3750 7130 6877 839 2928 2543 5169 5148 2056 41
2080 2599 2722 2416 3253 3228 5591 6946 2811 222 1503 1297
4977 2500 5383 1994 5541 298 3762 2433 1419 5906 237 494
6274 3527 2583 5711 4866 4231 3453 365 2829 5364 6965 3810
4376 885 826 4987 5634 3645 5630 3278 6526 7357 7587 5871
163 4849 1441 4931 5085 1060 6817 906 3155 7471 7393 424
7341 4823 6053 991 7013 7624 2416 4062 3427 6316 7269 947
6047 326 2745 402 6140 4286 2383 6100 6343 5747 1647 5145
2211 3555 4423 5854 3333 6933 3469 594 1374 1127 5235 3114
3804 2214 6081 757 124 2885 2678 3407 2159 2007 5604 2084
2605 4435 3893 1119 5601 4518 1252 5314 7546 5244 2570 1794
6227 4193 3178 2890 4720 5205 2902 3488 5583 3873 5066 967
1809 3834 2284
2649 3798 1431
7547 4545 7423
3136 1389 3355
1919 879 7098
7396 3276 1101
5577 6466 243
6253 7271 1017
3678 2005 2227
1249 6514 7267
2076 4668 4521
7170 2955 1293
741 4839 5039
2957 2363 5604
3846 1306 753
604 2017 2464
6487 2840 7272
6063 7068 42
113 1406 1468
2423 181 1942
5402 4675 1733
1596 5823 3523
1958 994 3816
5818 1244 4898
6341 7032 5426
1432 326 5651
3397 5072 2443
2461 4560 2472
3758 3050 2297
5776 6071 1640
3546 4878 5368
2438 1294 6553
5618 5324 5595
4194 3383 5457
2707 1713 932
3538 1262 5996
6778 1405 6942
3091 4905 6802

TABLE 8t-continued (Rate 19/36) ($n_{ldpc}$ = 16200)

3748 5126 4580
243 3252 5151
7106 3489 5405
5216 2129 5194
4300 5641 1046
6143 3885 2161
864 791 6392
1100 5526 2661
4948 6150 925
3893 3038 4340
7175 5967 7475
3905 7246 2988
5017 7236 2542
4959 4592 2020
4870 6237 5239
515 2569 6152
7596 1508 600
2636 5149 3379
969 5263 7120
6849 3730 1755
19 134 908
1085 820 2457
4609 1863 683
3633 1875 4627
122 877 2706
27 6193 2665
7028 1598 3375
6927 5785 1347
5121 3665 1560
2584 4965 1456
3102 5026 914
7416 6150 4030

TABLE 8u (Rate 26/45) ($n_{ldpc}$ = 16200)

3342 3896 286 2799 122 225 3074 527 4736 3291 6197 2055 782
2969 1015 3879 2215 2097 5913 3800 1450 4137 790 1711 4937 623
6654 764 5116 4633 2954 865 2768 1454 1505 4122 723 2893 3735
6674 686 6731 1152 1737 233 2045 6701 3020 2515 1392 1713 4962
3036 5227 4443 4815 5354 2875 4808 5610 912 2730 986 2966 6108
2589 2092 1356 6550 1153 1339 3811 6686 1612 4420 2154 1200 1202
46 5462 3392 2073 2641 2443 178 5965 451 3212 2712 2321 5295
3041 5632 4645 1917 1539 5801 4287 4140 3458 4908 1417 4610 6057
2469 6087 2938 2996 4452 3322 5275 5166 5231 556 2041 2394
5471 6178 3006 5507 6712 5367 70 3959 1974 4989 155 2620
119 3604 1833 3274 3612 4535 3651 1817 1942 2366 1835 1467
3842 4887 1502 5090 525 189 1386 3053 4727 5460 3135 3389
527 2521 2140 4513 5491 4293 5095 689 67 2882 4257 349
3269 3282 4172 3853 5318 2806 4695 1735 4460 6257 1798 4657
2292 2320 2999 4233 5016 3609 278 4528 6127 466 2331 926
6766 1132 3582 4533 678 1157 5108 3778 1832 4139 5790 5090
2141 6398 5184 4222 2042 6207 5466 3168 1871 1264 5917 6314
3659 2310 1742 5445 4140 6000 5150 1155 143 3400 2639 5768
2780 4987 1835 4146 6628 5734 4237 6148 4325 6696 2274 4915
3676 6728 5428 2176 5486 2627 4986 1929 68 742 3802 6509
1799 3406 3884 5524 2206 2757 896 6338 6365 6313 3387 1768
1345 2571 3380 5248 5100 5081 600 5783 4252 5992 5409 2738
1274 806 5715 3236 5172 1209 4525 5625 2842 6628 2395 5353
6118 4629 2380 3807 6094 3715 6294 4945 4441 1998 2041 5513
3323 4863 5342 1204 5258 5620 1792 4297 2964 3532 3457 2602
4708 960 2403 4037 3741 5923 5594 3939 4940 6339 2330 6292
4804 3631 6783 1879 2106 550 5910 2807 6503 4535 5812 4836
2742 35 5825 787 2097 3210 1116 2407 3792 903 5096 6116
4529 3796 2160 6276 3078 3567 3214 5177 3631 1224 285 4740
4420 1573 6196 5175 5035 3928 2295 4470 1737 5276 1239 6625
2942 4132 2375 1607 3463 5951 1281 82 1012 3477 1806 4920
1925 5574 5913 379 983 5057 6791 2752 1852 1132 3663 2878
2753 3655 1523
3624 6439 3113
6090 4755 4901
6589 2815 1145
2363 3350 5683
1992 1301 2028

TABLE 8u-continued (Rate 26/45) ($n_{ldpc}$ = 16200)

1707 6200 5759
6062 6802 6165
4302 929 1545
6677 4104 109
3925 185 789
3408 6198 5102
459 2275 4508
5677 6836 4901
2072 6137 2648
2512 4391 5684
5406 2791 4801
2737 1955 3948
1201 3711 4746
1808 3060 3372
3310 555 188
133 3764 3949
2517 173 5046
3770 6557 4844
1249 2441 2706
5831 3683 2025
1935 2155 5753
3247 4264 5927
929 6555 4057
5649 1061 1378
2182 3482 1173
4857 2834 3977
4818 1849 516
3296 6744 4295
1249 2379 5218
386 1945 1673
3218 2083 4442
549 1634 2488
5987 1064 6001
2585 1821 5471
1009 6675 2846
4145 3467 3817
1096 6516 2071
2266 616 6128
6668 6004 5264
6787 5425 2438
2641 5574 6634
3556 780 5997
2387 4854 911
2855 4426 5797
6375 2520 6703
4228 6706 154
3603 3039 900
6570 6006 1980
2520 4509 863
1048 5120 6272
2444 2648 3009
39 455 2371
3763 3299 1389
1369 1042 5140
1690 6798 5400
6540 121 3308
4059 3300 4207
713 2486 4294
5370 4587 4522
3069 4534 5502
1111 3750 6526
750 5578 2265
1483 5754 1394
2879 4317 4966
1429 1891 4930
4675 745 5615

TABLE 8v (Rate 28/45) ($n_{ldpc}$ = 16200)

2216 5353 6062 4045 2714 439 5415 1685 2362 1169 4069
4589 1144 2027 368 1630 3581 3086 1765 399 916 2662
4830 39 4003 2405 4737 4538 3125 2372 3690 4433 4812
3027 3019 5751 2219 883 2853 329 5644 2032 687 631

TABLE 8v-continued (Rate 28/45) ($n_{ldpc}$ = 16200)

5202 3622 1372 4048 1947 4836 4630 5995 2000 933 917
1916 3151 4394 500 2889 2079 533 1817 6090 4829 5007
462 1363 4535 2260 2567 3541 3963 639 2123 3398 4196
1880 4933 3898 5325 3699 195 2509 6098 5401 2490 1934
4540 2715 2247 70 2526 5625 5855 3484 5293 3423 4853
2217 3597 5507 3633 5580 978 3900 479 5950 685 5778
186 1898 160 5418 197 2148 3231 3009 1214 2492 4687
3664 3441 4152 4621 3875 5621 2310 3414 3746 1618 1397
429 446 1402 5545 6016 218 255 4024 647 4204 3631
5470 173 871 5457 3157 619 2109 4665 5695 1996 277
5885 3967 5368 2835 5308 1675 4930 633 3581 1814 3494
5422 5575 4330 1686 479 1866 2365 2688 4753 698 5772
5857 2196 895 1433 4470 3550 740 431 418 2955 45
5727 5395 2902 2394 2986 5308 4595 535 1194 1834 632
1280 501 5445 5943 21 6059 5488 5287 2276 985 1833
220 1823 4772 476 5431 1362 9 1039 5597 2429 638
1928 109 5380 3549 2870 2193 5084 1568 74 1281 5299
5525 4099 5879 1684 5362 3542 1402 5044 3685 2767 3204
99 4201 1599 3598 5362 5780 3135 2119 54 986 1831
1858 1152 123 3250 936 4422 1254 1437 1101 615 1899
86 239 3572 3224 5850 3362 4258
1598 2433 1343 4786 40 4646 2069
1058 1453 877 418 1551 3509 4693
1851 1040 3104 388 4688 2306 5765
5836 1650 1988
398 2185 6068
4904 3583 4510
6071 2846 2144
5664 44 3840
2468 2632 5795
2988 3769 515
164 4562 3784
144 6001 5591
6032 1728 3749
3265 2300 4986
3085 1052 5096
2078 4664 1088
1119 6053 5544
11 3944 5079
3955 3576 1087
3175 457 492
5024 4484 174
572 2038 1979
4792 42 2230
587 3850 2663
2563 5654 1013
3026 465 4617
173 4316 1702
2914 5227 965
3472 5892 2667
256 5291 820
2850 1079 1882
4774 5825 5021
178 1791 3300
5047 6031 2350
5957 5190 4900
5174 1441 964
4274 599 1710
5031 2827 5490
3188 4508 628
5088 2262 3594
2622 954 499
76 4082 2678
4959 1174 5858
4221 2400 1477
3539 2175 2334
550 3994 639
5229 1628 4748
4845 157 1272
4726 1588 4984
3113 3011 5302
4257 4843 5548
1230 2197 2376
3119 3906 3481
475 2111 5481
5658 2372 5009
1651 12 2607
5285 5932 2683

TABLE 8v-continued (Rate 28/45) ($n_{ldpc}$ = 16200)

1601 463 3431
5828 3783 4119
2358 3276 1966
1515 5809 1550
5938 3060 171
1727 2096 1254
5366 3267 1232
1867 4901 620
592 4316 5369
841 5451 1322
3247 2038 3029
823 4017 2171
408 788 4184
5128 2568 4318
5144 5968 5917
2086 5748 4216
322 5021 5857
1437 2016 2406
3114 1467 2221
3485 2093 2355
5344 3836 2942
3611 595 1241
3973 1357 1795
1685 5201 3401
79 1248 29
2269 2462 3871
4429 501 4446
4931 3977 4761
1207 3693 1461
4852 443 2989

TABLE 8w (Rate 31/36) ($n_{ldpc}$ = 16200)

1271 1259 112 172 1770 1792 355 58 2103 1704 151
1728 542 1193 1157 1387 388 576 252 159 325 2049
1249 242 682 894 1040 1879 1088 233 597 1360 1189
761 1734 353 1039 817 1202 481 1401 855 1310 2033
1358 192 205 1906 860 1749 1216 1195 1550 484 1444
2004 589 1048 1927 883 2115 1203 705 1163 1482 531
2043 1375 504 682 1896 1312 984 845 928 1692 1139
2073 543 1326 219 970 1550 166 79 2110 1152 253
1651 1032 2079 493 764 266 848 1522 469 31 945
1553 564 1144 712 1499 1870 1747 688 1450 1821 58
2060 1607 1502 946 240 1559 668 1214 2213 1426 294
2033 1878 115 986 1285 609 572 257 2245 1605 2006
2152 685 1059 314 737 2055 467 1593 940 1432 1979
2140 1056 562 564 1749 1022 1835 626 1892 2155 266
232 788 222 1608 2062 1723 1480 1439 666 1715 76
325 354 1846 1328 1768 623 361 1766 1660 1351 2052
1977 1504 1224 157 1645 1512 298 1201 50 1606 1917
1846 619 2045 90 1503 1729 911 1252 497 1984 1917
798 1638 1309 1658 1436 1565 1260 1019 1568 1106 371
1361 1316 2074 2175 2146 1618 755 148 1783 1263 2231
918 2061 1546
1441 1356 927
1574 1021 1888
1737 1386 38
1665 1125 1069
744 1512 1136
336 1995 916
430 1673 1022
1799 2175 1391
472 273 1724
410 2180 2169
1411 2238 398
2105 812 1516
162 178 193
1116 1510 1261
1711 1619 1045
1912 451 415
1258 1141 1477
1001 377 1807
543 1352 438

TABLE 8w-continued (Rate 31/36) ($n_{ldpc}$ = 16200)

1868 1658 929
2145 176 2042
1934 250 24
1874 825 1230
1170 2075 806
846 2082 2190
134 1471 479
2167 669 1857
590 1131 2078
73 1484 1108
2004 647 306
246 1492 1838
799 914 310
1489 722 1978
39 72 1748
1695 931 666
1559 1192 275
365 1229 1142
1738 1035 1955
1433 1573 1640
1152 1924 83
873 702 1020
1837 1776 2036
1782 441 1755
1498 1210 1513
1070 2193 296
313 300 2187
511 2243 1099
824 1456 1396
258 2243 607
287 1021 1782
1027 1611 1265
316 1153 704
814 1679 978
2192 709 1144
1253 856 64
1989 1251 1880
1434 172 944
1447 1200 776
1010 1844 747
655 582 1313
1664 2197 1385
2168 804 733
1711 981 273
367 161 1003
489 1422 1055
1710 1864 1729
1869 2240 891
567 649 475
952 1503 129
594 200 1215
1906 40 1952
1778 458 52
180 1098 1682
1757 2022 1487
1320 1148 1562
2006 2101 546
783 1711 1366
1141 85 1184
1376 268 1045
720 263 701
1844 1742 938
1909 2171 1093
74 421 1912
1675 309 974
1112 243 1691
139 2151 1557
2208 2057 2196
2135 1657 1026
852 1879 1397
381 2248 968
67 1315 1126
1909 258 955
1342 1238 1010
1499 511 1717
658 1841 831
1993 687 1484
631 2186 1496

TABLE 8w-continued (Rate 31/36) ($n_{ldpc}$ = 16200)

625 1438 945
1210 675 1534
1394 1991 1771
1820 550 780
1537 61 1189
278 1672 2149
972 1289 1838
1330 819 348
2220 399 1644
1748 353 890
1477 904 1690
802 203 1529
1338 616 380
1246 806 1383
1237 1580 1651
1369 828 1964
1950 862 840
1356 2087 1674
1477 1996 1506
885 2093 179
282 189 42
992 1516 2005
576 225 470
1543 1320 402
2021 1020 694
2134 165 1499
1474 268 1082
1063 561 242
1111 554 1653
1416 401 19
1753 2064 1052
1447 2035 890
1260 963 1975
1536 1129 1158
984 373 1707
1697 623 1184
8 97 648

Figure 6:
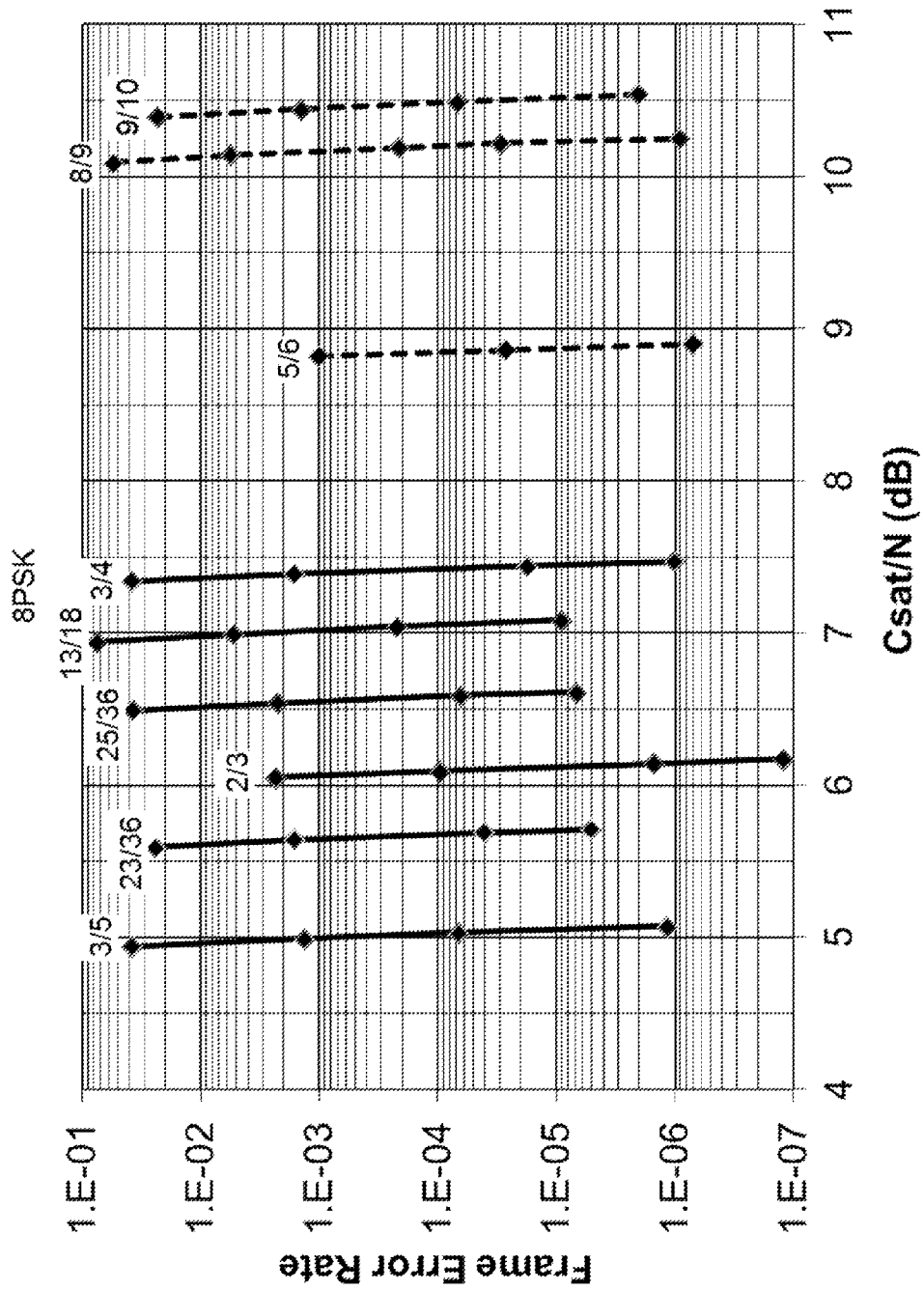
FIG. 6 illustrates simulated performance curves for various FEC codes with 8PSK modulation over an AWGN channel, in accordance with exemplary embodiments of the present invention.
Figure 7:
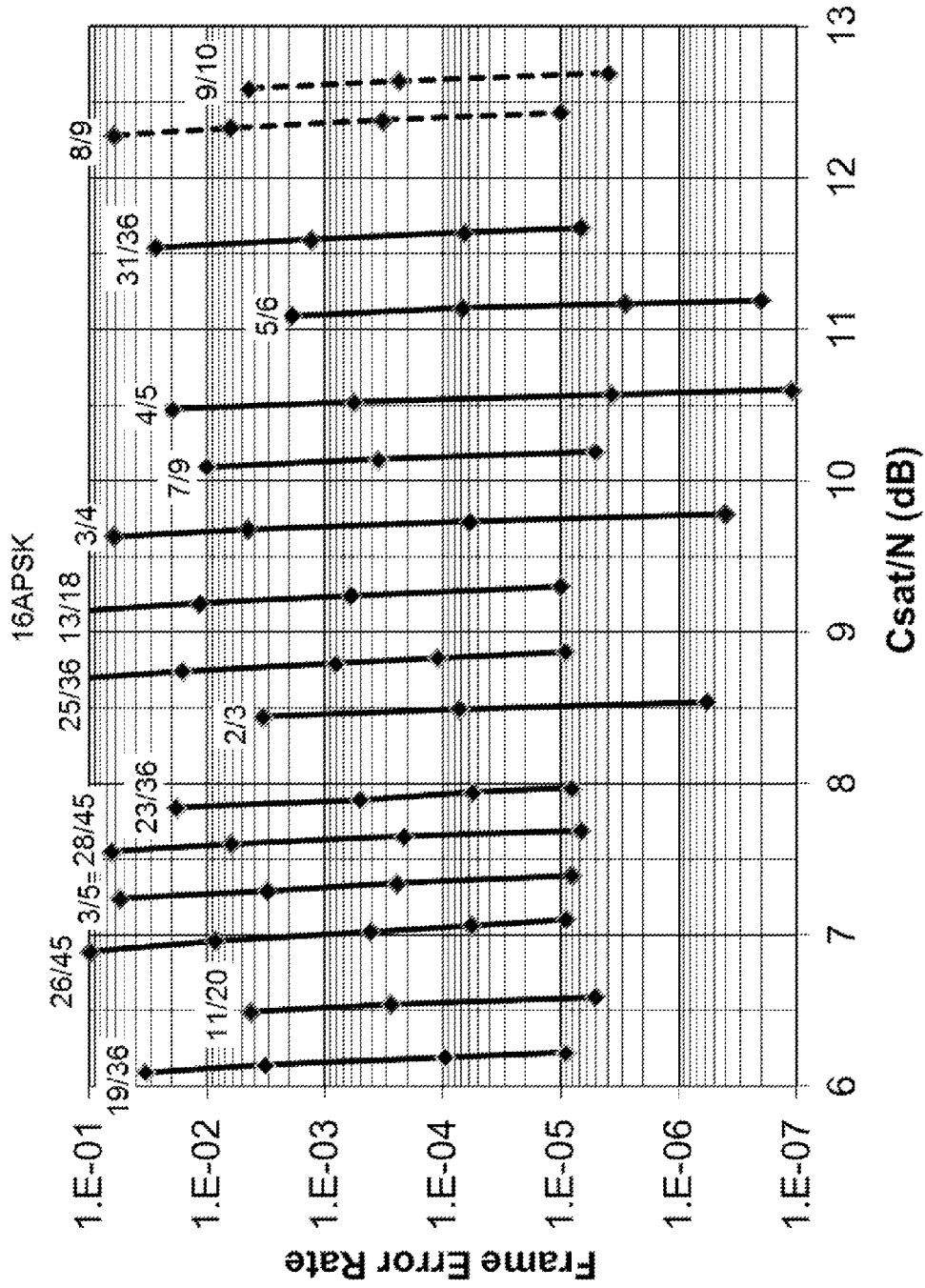
FIG. 7 illustrates simulated performance curves for the various FEC codes with 16APSK modulation over an AWGN channel, in accordance with exemplary embodiments of the present invention.
Figure 8:
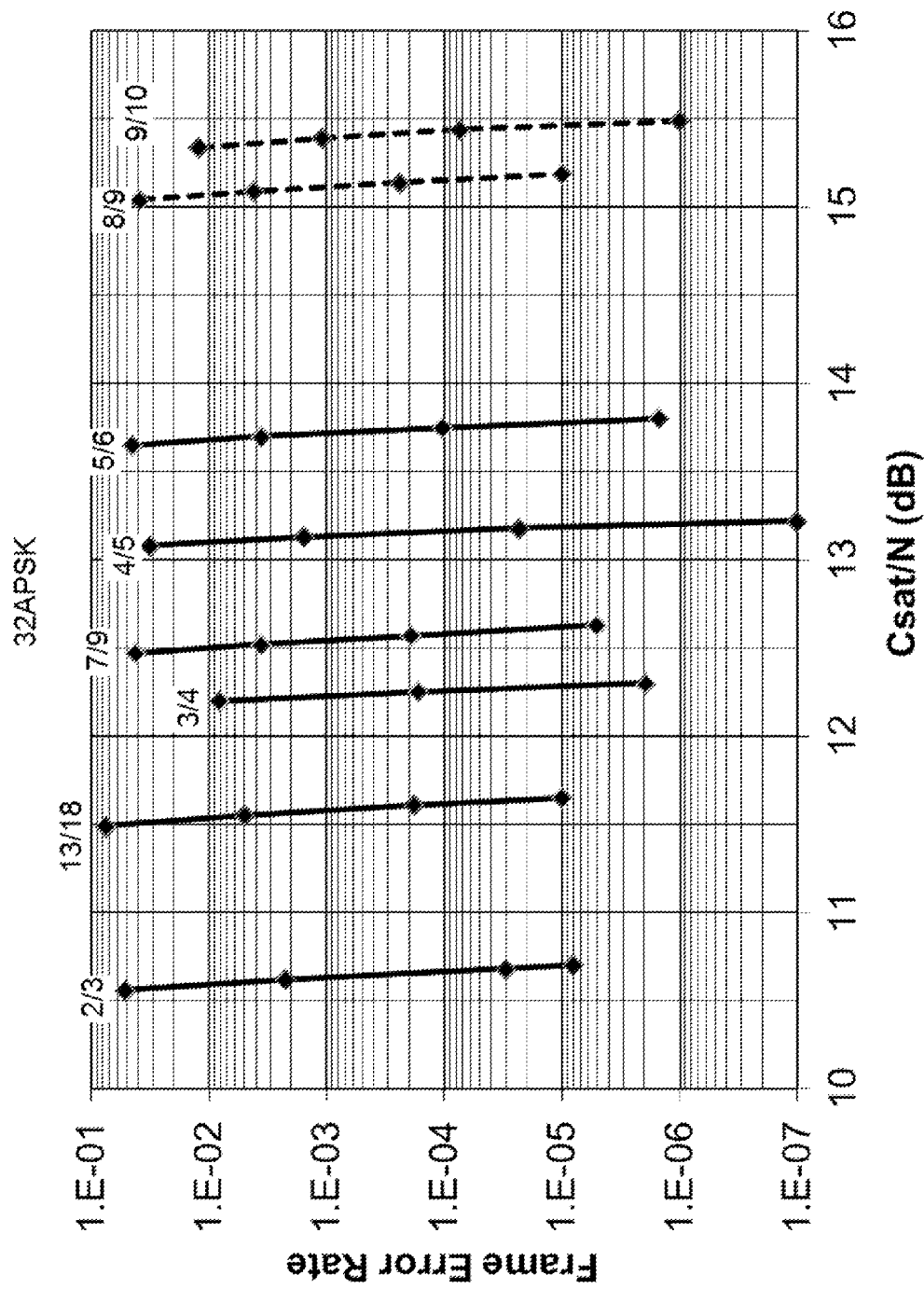
FIG. 8 illustrates simulated performance curves for the various FEC codes with 32APSK modulation over an AWGN channel, in accordance with exemplary embodiments of the present invention.
Figure 9:
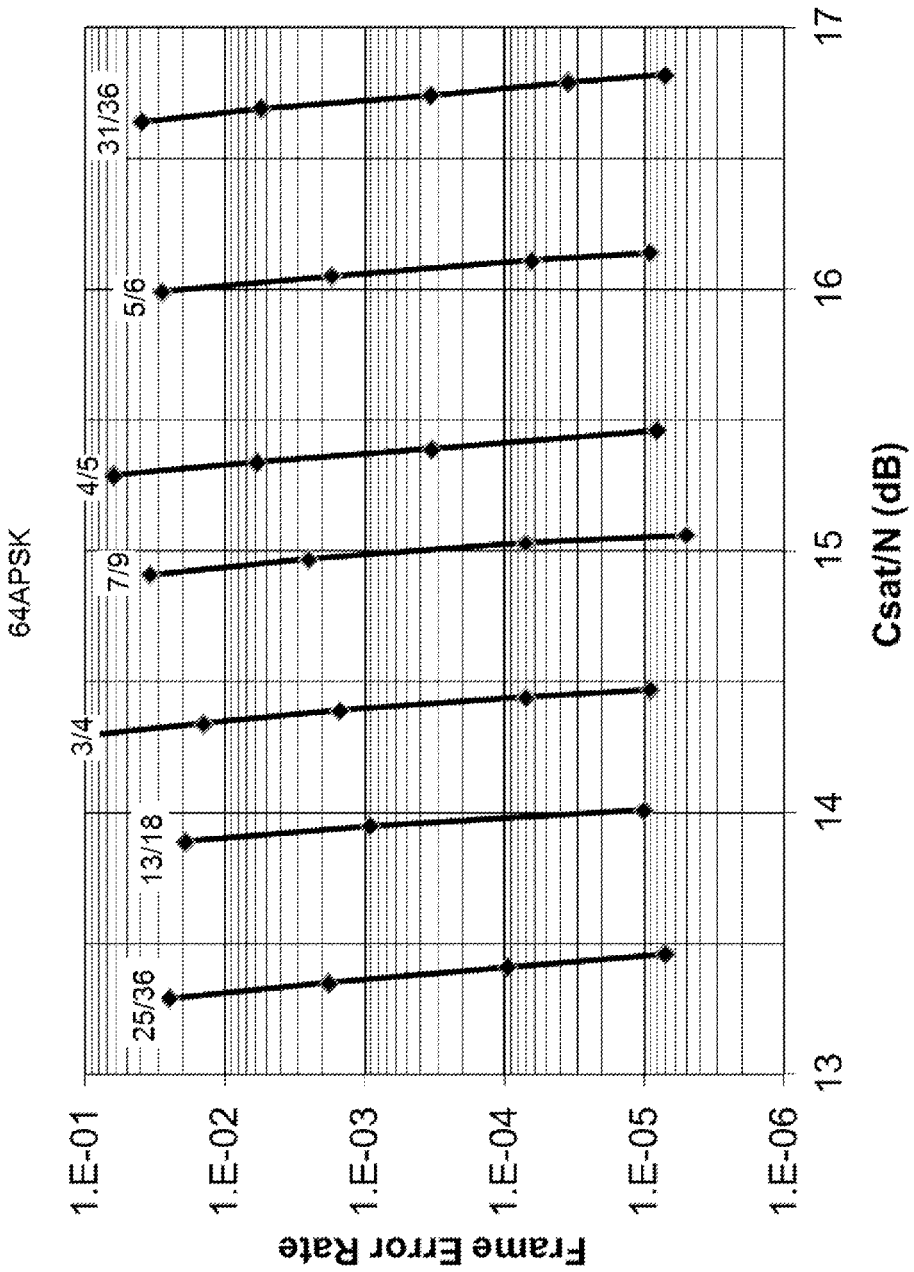
FIG. 9 illustrates simulated performance curves for the various FEC codes with 64APSK modulation over an AWGN channel, in accordance with exemplary embodiments of the present invention.
Figure 10:
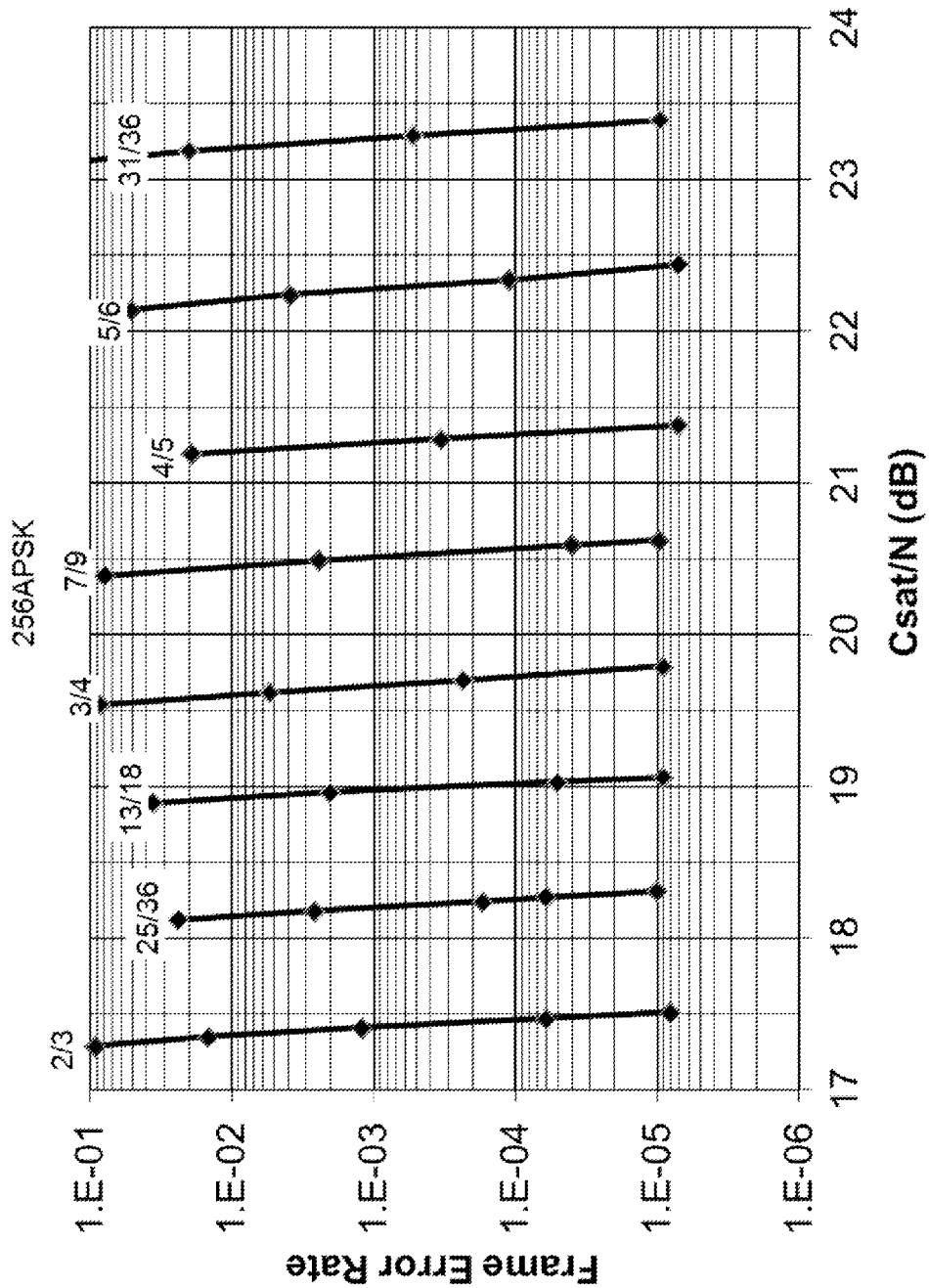
FIG. 10 illustrates simulated performance curves for the various FEC codes with 256APSK modulation over an AWGN channel, in accordance with exemplary embodiments of the present invention.

FIGS. 5-10 illustrate various simulated performance curves, in accordance with various exemplary embodiments, for the modulation and coding schemes specified herein. FIG. 5 illustrates simulated performance curves for various FEC codes with QPSK modulation over an AWGN channel, in accordance with exemplary embodiments of the present invention. FIG. 6 illustrates simulated performance curves for various FEC codes with 8PSK modulation over an AWGN channel, in accordance with exemplary embodiments of the present invention. FIG. 7 illustrates simulated performance curves for the various FEC codes with 16APSK modulation over an AWGN channel, in accordance with exemplary embodiments of the present invention. FIG. 8 illustrates simulated performance curves for the various FEC codes with 32APSK modulation over an AWGN channel, in accordance with exemplary embodiments of the present invention. FIG. 9 illustrates simulated performance curves for the various FEC codes with 64APSK modulation over an AWGN channel, in accordance with exemplary embodiments of the present invention. FIG. 10 illustrates simulated performance curves for the various FEC codes with 256APSK modulation over an AWGN channel, in accordance with exemplary embodiments of the present invention.

Figure 11:
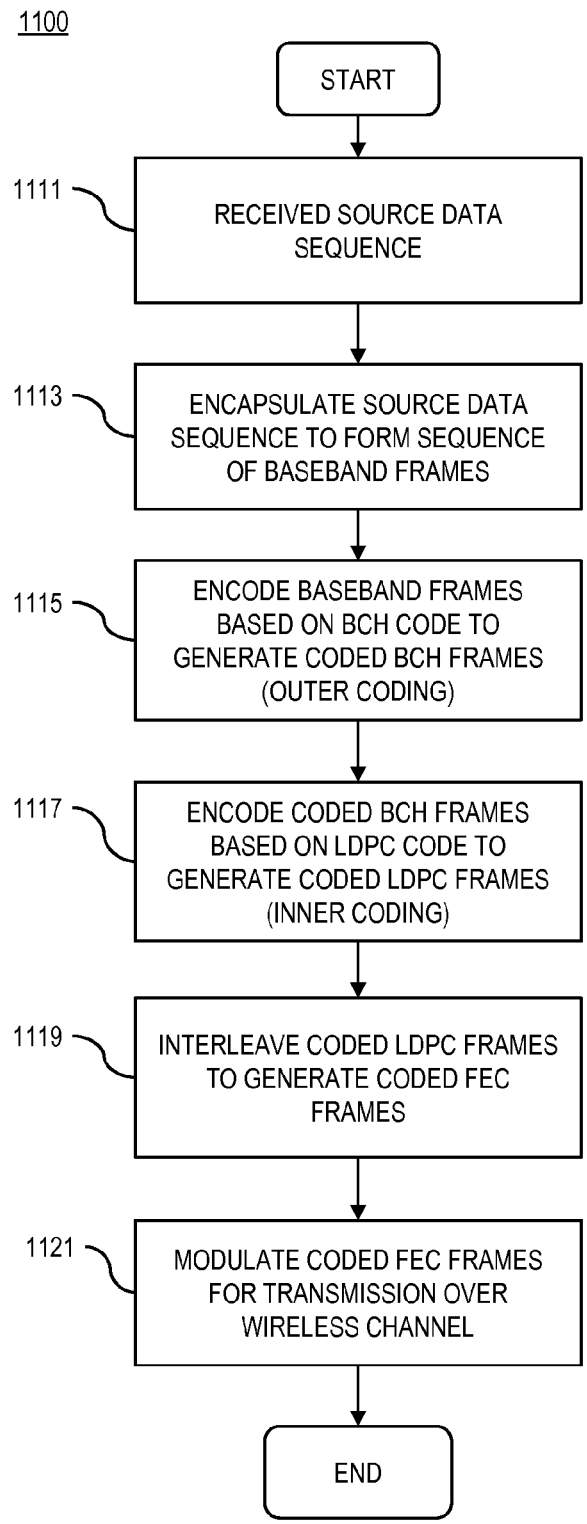
FIG. 11 illustrates a flow chart of an exemplary process for encoding and modulating a source data sequence of information bits, in accordance with exemplary embodiments of the present invention.

FIG. 11 illustrates a flow chart of the encoding and modulation processes described above, in accordance with exemplary embodiments of the present invention. For example, the encoding and modulation process 1100 may be performed by a transmitter 210 as depicted in FIG. 2A. With reference to FIG. 11, the process starts at step 1111, where a source data sequence is received, for example, by the data encapsulation module 211. At step 1113, the encapsulation module encapsulates the source data sequence to form a sequence of baseband frames. At step 1115, the BCH encoder 213a encodes the baseband frames in accordance with a t-error BCH code to generate respective coded BCH data frames. At step 1117, the LDPC encoder 213b encodes the coded BCH data frames in accordance with a structured LDPC code to generate coded LDPC data frames. At step 1119, the bit interleaver 213c interleaves the coded bits of the coded LDPC data frames to generate coded FEC frames. At step 1121 the modulator 215 modulates the coded FEC frames in accordance with a selected modulation scheme for transmission over the wireless satellite channel 114.

Figure 12:
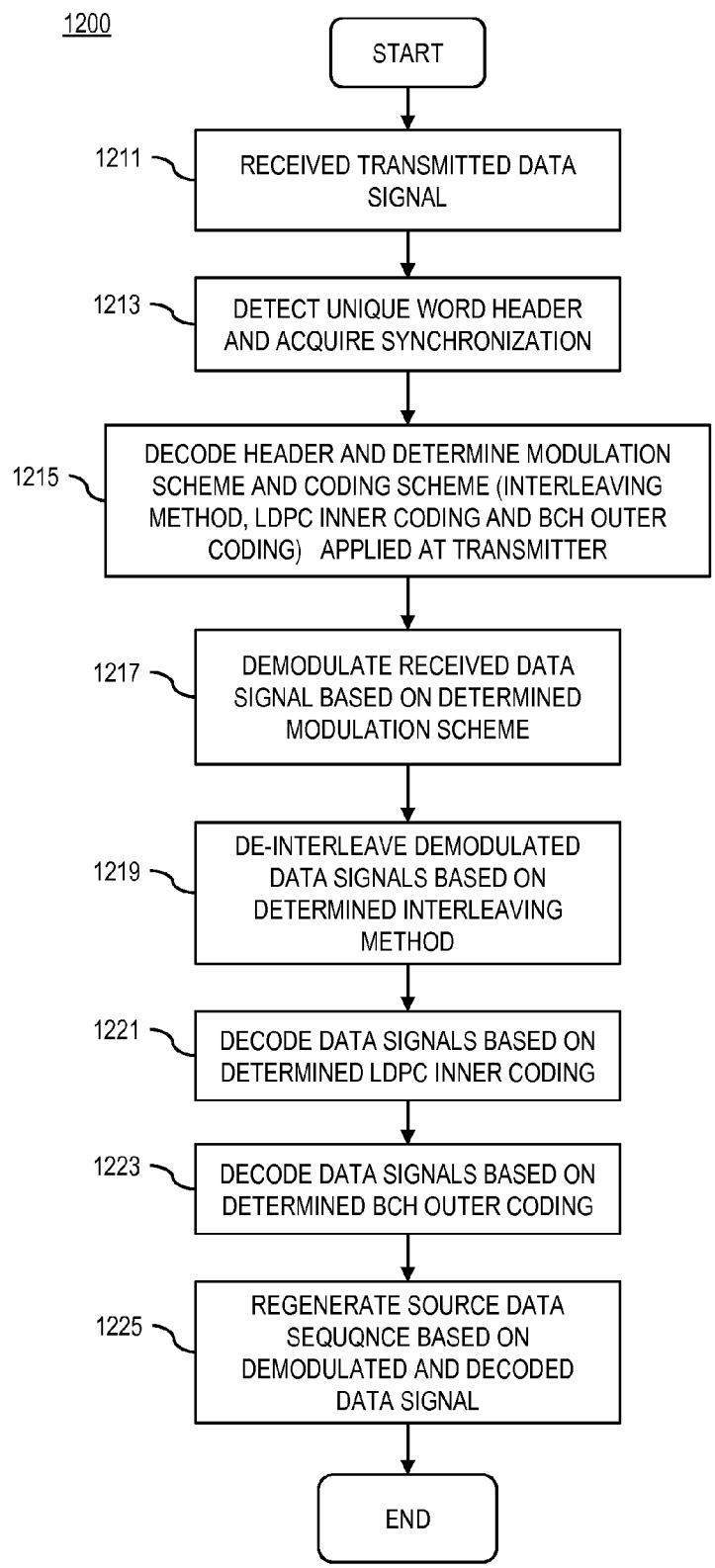
FIG. 12 illustrates a flow chart of an exemplary process for demodulating and decoding a received data signal transmission to replicate a source data sequence of information bits that was encoded and modulated, in accordance with exemplary embodiments of the present invention.

FIG. 12 illustrates a flow chart of an exemplary process for demodulating and decoding a received data signal transmission to replicate a source data sequence of information bits that was encoded and modulated as described above, in accordance with exemplary embodiments of the present invention. For example, the encoding and modulation process 1200 may be performed by a receiver 220 as depicted in FIG. 2B. With reference to FIG. 11, the process starts at step 1211, where the data signals transmitted over the satellite channel 114 are received by the receiver 220. At step 1213, the sync module 227 detects the unique word and acquires synchronization. At step 1215, the receiver decodes header information to determine the modulation scheme and coding scheme (e.g., the interleaving method, LDPC inner coding and BCH outer coding applied at the transmitter. The decoding of the header information, for example, may be performed by the sync module 227 or the decoder module 223 (or by another module of the receiver configured to perform such header decoding—not shown in FIG. 2B). At step 1217, the demodulator 225 demodulates the received data signals based on the determined modulation scheme to generate a received replica of the transmitted FEC frames. At step 1219, the decoder 223 de-interleaves the demodulated data frames based on the determined interleaving method. At step 1221, the decoder 223 decodes the de-interleaved data based on the determined LDPC inner coding. At step 1223, the decoder 223 further decodes the data frames based on the determined BCH outer coding. Then at step 1225, the data de-encapsulation module de-encapsulates the decoded data frames to generate a replica of the original source data sequence.

FIG. 13 illustrates a block diagram of a chip set that can be utilized in implementing communications system protocols, according to exemplary embodiments of the present invention. With reference to FIG. 13, chip set 1300 includes, for instance, processor and memory components described with respect to FIG. 5 incorporated in one or more physical packages. By way of example, a physical package includes an arrangement of one or more materials, components, and/or wires on a structural assembly (e.g., a baseboard) to provide one or more characteristics such as physical strength, conservation of size, and/or limitation of electrical interaction.

In one embodiment, the chip set 1300 includes a communication mechanism such as a bus 1301 for passing information among the components of the chip set. A processor 1303 has connectivity to the bus 1301 to execute instructions and process information stored in, for example, a memory 1305. The processor 1303 includes one or more processing cores with each core configured to perform independently. A multi-core processor enables multiprocessing within a single physical package. Examples of a multi-core processor include two, four, eight, or greater numbers of processing cores. Alternatively or in addition, the processor 503 includes one or more microprocessors configured in tandem via the bus 1301 to enable independent execution of instructions, pipelining, and multithreading. The processor 1303 may also be accompanied with one or more specialized components to perform certain processing functions and tasks such as one or more digital signal processors (DSP) 1307, and/or one or more application-specific integrated circuits (ASIC) 1309. A DSP 1307 typically is configured to process real-world signals (e.g., sound) in real time independently of the processor 1303. Similarly, an ASIC 1309 can be configured to performed specialized functions not easily performed by a general purposed processor. Other specialized components to aid in performing the inventive functions described herein include one or more field programmable gate arrays (FPGA) (not shown), one or more controllers (not shown), or one or more other special-purpose computer chips.

The processor 1303 and accompanying components have connectivity to the memory 1305 via the bus 1301. The memory 1305 may comprise various forms of computer-readable media, e.g., including both dynamic memory (e.g., RAM) and static memory (e.g., ROM) for storing executable instructions that, when executed by the processor 1303 and/or the DSP 1307 and/or the ASIC 1309, perform the process of exemplary embodiments as described herein. The memory 1305 also stores the data associated with or generated by the execution of the process.

The term "computer-readable medium" or "computer-readable media," as used herein, refers to any medium that participates in providing instructions for execution by the processor 1303, and/or one or more of the specialized components, such as the one or more digital signal processors (DSP) 1307, and/or one or more application-specific integrated circuits (ASIC) 1309. Such a medium may take many forms, including but not limited to non-volatile media, volatile media, and transmission media. Non-volatile media include, for example, read only memory (ROM), included within memory 1305. Volatile media, for example, may include dynamic random access memory (RAM), included within memory 1305. Transmission media may include copper or other conductive wiring, fiber optics, or other physical transmission media, including the wires and/or optical fiber that comprise bus 1301. Transmission media can also take the form of wireless data signals, such as those generated during radio frequency (RF) and infrared (IR) data communications. Common forms of computer-readable media include, for example, magnetic storage media (e.g., magnetic hard disks or any other magnetic storage medium), solid state or semiconductor storage media (e.g., RAM, PROM, EPROM, FLASH EPROM, a data storage device that uses integrated circuit assemblies as memory to store data persistently, or any other storage memory chip or module), optical storage media (e.g., CD ROM, CDRW, DVD, or any other optical storage medium), a or any other medium for storing data from which a computer or processor can read.

Various forms of computer-readable media may be involved in providing instructions to a processor for execution. For example, the instructions for carrying out at least part of the present invention may initially be borne on a magnetic disk of a remote computer. In such a scenario, the remote computer loads the instructions into main memory and sends the instructions over a telephone line using a modem. A modem of a local computer system receives the data on the telephone line and uses an infrared transmitter to convert the data to an infrared signal and transmit the infrared signal to a portable computing device, such as a personal digital assistance (PDA) and a laptop. An infrared detector on the portable computing device receives the information and instructions borne by the infrared signal and places the data on a bus. The bus conveys the data to main memory, from which a processor retrieves and executes the instructions. The instructions received by main memory may optionally be stored on storage device either before or after execution by processor.

Moreover, as will be appreciated, a module or component (as referred to herein) may be composed of software component(s), which are stored in a memory or other computer-readable storage medium, and executed by one or more processors or CPUs of the respective devices. As will also be appreciated, however, a module may alternatively be composed of hardware component(s) or firmware component(s), or a combination of hardware, firmware and/or software components. Further, with respect to the various exemplary embodiments described herein, while certain of the functions are described as being performed by certain components or modules (or combinations thereof), such descriptions are provided as examples and are thus not intended to be limiting. Accordingly, any such functions may be envisioned as being performed by other components or modules (or combinations thereof), without departing from the spirit and general scope of the present invention.

While exemplary embodiments of the present invention may provide for various implementations (e.g., including hardware, firmware and/or software components), and, unless stated otherwise, all functions are performed by a CPU or a processor executing computer executable program code stored in a non-transitory memory or computer-readable storage medium, the various components can be implemented in different configurations of hardware, firmware, software, and/or a combination thereof. Except as otherwise disclosed herein, the various components shown in outline or in block form in the figures are individually well known and their internal construction and operation are not critical either to the making or using of this invention or to a description of the best mode thereof.

In the preceding specification, various embodiments have been described with reference to the accompanying drawings. It will, however, be evident that various modifications may be made thereto, and additional embodiments may be implemented, without departing from the broader scope of the invention as set forth in the claims that follow. The specification and drawings are accordingly to be regarded in an illustrative rather than restrictive sense.

What is claimed is:

1. A method comprising:
encoding, by a processor of a device, a source data sequence of information bits based on a predetermined structured parity check matrix of a Low Density Parity Check (LDPC) code, wherein the encoding is performed based on frames of the source data sequence, each frame being of a length of $k_{ldpc}$ information bits ($i_0, i_1, \ldots, i_{k_{ldpc}-1}$), and the output of the encoding comprises coded LDPC frames each being $n_{ldpc}$ coded bits in length, and wherein the structured parity check matrix is represented by tabular information of a format wherein each row represents occurrences of one values within a respective column of the parity check matrix, and the columns of the parity check matrix are derived according to a predetermined operation based on the respective rows of the tabular information, and wherein the tabular information comprises a one of Tables 1a through 1w (below);
wherein the encoding comprises generating $n_{ldpc}-k_{ldpc}$ parity bits ($p_0, p_1, \ldots, p_{n_{ldpc}-k_{ldpc}-1}$) for each frame of the source data sequence, wherein the generation of the parity bits comprises:
initializing parity bit accumulators for $p_0, p_1, \ldots, p_{n_{ldpc}-k_{ldpc}-1}$ to zero;

accumulating information bit $i_0$ at parity bit accumulator addresses specified in the first row of the table;

for the next group of m−1 information bits, $i_y$, (y=1, 2, . . . , m−1), accumulating each information bit at parity bit accumulator addresses $\{x+(y \bmod m)*q\} \bmod (n_{ldpc}-k_{ldpc})$, wherein x denotes an address of a parity bit accumulator corresponding to the information bit $i_0$, and q is a code-rate dependent constant $(q=(n_{ldpc}-k)/m)$, and wherein m is a code-dependent constant and k=R*n (where R is the code rate);

accumulating $i_m$ at parity bit accumulator addresses specified in the second row of the table, and, in a similar manner as for the group of m−1 information bits (above), accumulating each information bit of the next group of m−1 information bits $i_z$, z=(m+1, m+2, . . . , 2m) at $\{x+(z \bmod m)*q\} \bmod (n_{ldpc}-k_{ldpc})$, wherein x denotes the address of the parity bit accumulator corresponding to the information bit $i_m$ (the entries of the second row of the table);

in a similar manner, for each subsequent group of m information bits, accumulating the information bits at parity bit addresses based on a next row of the table; and after all of the information bits of the frame are accumulated, performing operations according to $p_i = p_i \oplus p_{i-1}$, wherein for i=1, 2, . . . , $(n_{ldpc}-k_{ldpc}-1)$, each $p_i$ resulting from the operation for a given i is equal to the parity bit $p_i$;

TABLE 1a (Rate 1/5) ($n_{ldpc}$ = 64800)

30434 15118 35871 1042 34043 34085 42341 18485 44500 24268 28843 51748 21972
30300 24347 46808 8416 11111 41481 32215 4130 867 22576 9928 23980 15170
43863 15038 42905 19719 398 39956 47109 48347 26991 18214 24206 47552 15884
49234 51671 11523 41411 21249 16660 17729 852 21114 22858 19843 10501 37683
33159 15595 43687 9791 41121 30595 50762 36562 30611 6196 16501 1860 19594
45948 42827 9110 2671 44915 51640 33959 16649 37658 45143 11861 37 13823
3703 41861 6198 39321 37404 36745 7515 37433 17583 30253 42537 16920 44989
37745 27350 9903 13623 50660 35965 29455 36432 49774 8755 33362 12907 10543
34407 13960 9808 41065 17820 41780 13846 25968 45228 51694 1005 14230 7622
34849 38545 36256 10235 39642 27136 13787 42968 28454 9406 5612 9674 15364
45347 13550 44977 39547 37964 33817 48680 49571 37335 47548 45117 26148 17828
50113 9061 27964 47828 8518 12777 9523 45788 14839 30154 35408 42366 48162
32305 18501 34537 3974 41796 46590 39195 43248 28063 25179 21119 42374 46860
12591 49973 16248 31005 46401 45858 18919 39056 2622 31398 7488 40408 21230
7021 46583 18669 3999 46160 17929 25853 46018 16689 33374 14070 31593 44601
49986 25832 37105 12112 33290 8907 41215 28842 38633 191 17402 29860 28641
12889 28172 1706 23997 18785 3728 43051 43506 28074 20093 25247 4390 3534
35866 5423 48667 31399 44664 42319 17038 19121 2653 3699 43234 5448 2965
5554 6606 46032
10606 34309 48885
30552 28313 15011
35464 35537 42531
47350 49896 34368
50709 33315 29146

TABLE 1a-continued (Rate 1/5) ($n_{ldpc}$ = 64800)

27506 37421 7219
5613 19620 22073
21932 40199 36978
30032 22322 39521
22458 18157 28917
42547 10696 22422
42365 45341 34234
4869 37037 6282
42657 1832 25254
24440 13374 34902
36356 9003 17404
29739 5586 29932

TABLE 1b (Rate 2/9) ($n_{ldpc}$ = 64800)

5332 8018 35444 13098 9655 41945 44273 22741 9371 8727 43219
41410 43593 14611 46707 16041 1459 29246 12748 32996 676 46909
9340 35072 35640 17537 10512 44339 30965 25175 9918 21079 29835
3332 12088 47966 25168 50180 42842 40914 46726 17073 41812 34356
15159 2209 7971 22590 20020 27567 4853 10294 38839 15314 49808
20936 14497 23365 22630 38728 28361 34659 956 8559 44957 22222
28043 4641 25208 47039 30612 25796 14661 44139 27335 12884 6980
32584 33453 1867 20185 36106 30357 809 28513 46045 27862 4802
43744 13375 36066 23604 30766 6233 45051 23660 20815 19525 25207
27522 3854 9311 21925 41107 25773 26323 24237 24344 46187 44503
10256 20038 12177 26635 5214 14191 34404 45807 4938 4173 31344
32043 26501 46725 4648 16718 31060 26633 19036 14222 13886 26535
18103 8498 36814 34600 36495 36712 29833 27396 11877 42861 1834
36592 1645 3649 30521 14674 3630 890 13307 41412 24682 9907
4401 44543 13784 5828 32862 25179 29736 39614 5186 49749 38317
41460 39101 50080 40137 32691 26528 35332 44067 8467 14286 10470
12211 34019 37870 36918 36419 33153 50070 41498 47741 30538 12342
33751 23988 33624 41882 34075 25552 3106 17611 13190 29336 312
5667 35483 35460 16153 37267 28308 50009 46345 34204 32756 38243
5657 24157 36834 6890 24470 49576 46244 43875 16738 47225 2944 36882
30341 48485 3700
14451 20438 18875
13634 41138 42962
46459 13369 27974
21493 14629 2369
11351 40226 42457
34749 39000 3912
18128 46776 47055
2221 26806 11345
35143 630 2229
44009 41295 34646
32163 16657 26544
31770 23641 43623
45826 10902 39490
7514 20480 28511
11429 19834 35430
50112 38163 5738
16191 16862 6783
6085 39149 34988
41497 32023 28688

TABLE 1c (Rate 13/45) ($n_{ldpc}$ = 64800)

15210 4519 18217 34427 18474 16813 28246 17687 44527 31465 13004 43601
28576 13611 24294 15041 503 11393 26290 9278 19484 20742 13226 28322
32651 27323 22368 15522 37576 20607 20152 19741 26700 31696 21061 35991
44168 27910 31104 34776 38835 45450 40002 31522 7807 26330 2410 44983
15861 39215 14631 42584 26502 41864 27885 32276 29049 16878 37480 42550

TABLE 1c-continued

(Rate 13/45) ($n_{ldpc}$ = 64800)

38795 13012 7912 4058 23869 3325 42889 19921 13826 40323 18162 10005
35100 5483 7629 35166 1239 10772 5289 286 16172 41843 42612 38493
11997 40340 19047 16236 43557 9104 24032 2915 19265 36209 6443 40947
43527 29675 4195 31926 35392 20400 7515 45806 36068 33079 37325 6301
4580 20492 40934 14478 8238 2425 28901 43602 7224 17640 28259 6850
41859 14006 19132 5690 16223 11575 30562 44797 3759 9833 36529 21084
45546 16044 26763 13559 29092 41595 5726 13733 9164 15354 20145 10655
24076 40883 13424 30325 40589 32367 36270 9286 40151 8501 3871 22109
26239 29805 5358 44835 11609 3899 9760 39600 43422 13295 45431 14515
5392 37010 12386 40193 21492 45146 12376 41952 43153 45733 718 35726
33884 38006 16927 20958 25413 44561 11245 12984 35198 30977 31916 10657
1412 1048 14965 31879 29967 41000 32087 22 44773 768 27289 19898
43051 6964 31807 4119 33509 15950 6304 2813 35192 38282 39710 26356
9889 18957 6355 18770 40381 1876 38889 17958 20309 10744 1744 228
41543 36505 32795 12454 8520 4916 22313 1363 13010 8770 17057 8694
22987 29564 13804 3110 1382 33844 15117 42314 36045 25295 28421 22044
15951 42952 17458 6926 21257 41243 8662 17046 15054 15302 16964 40079
13359 45754 16715 9586 10960 25406 14675 8880 5087 12303 28993 13571
24824 31012 4121 808 30962 28736 11013 20488 7715 7637 6217 25114 23615 5760 5554
18072 21605 39242
24190 6592 12281
44681 6563 7001
18291 19605 33476
2884 30927 18430
23674 36414 30649
15364 22089 19757
41162 14454 17627
16676 28573 22163
8851 36803 27589
40049 476 1413
41013 34505 33296
29782 38018 42124
22625 7485 11772
2052 37567 14082
30106 43203 20858
7399 3796 22396
38745 792 44483
28268 33355 41030
30098 37269 12871
35769 33119 16738
3307 43434 13244
17852 9133 23190
35184 20115 24202
14760 43026 19425
26414 16821 6625
30362 35769 42608

TABLE 1d

(Rate 9/20) ($n_{ldpc}$ = 64800)

30649 35117 23181 15492 2367 31230 9368 13541 6608 23384 18300 5905
1961 8950 20589 17688 9641 1877 4937 15293 24864 14876 6516 10165
4229 26034 28862 8265 27847 3 22728 13946 27162 26003 17696 13261
31719 25669 17149 17377 33106 12630 4814 16334 1480 32952 11187 3849

TABLE 1d-continued

(Rate 9/20) ($n_{ldpc}$ = 64800)

30186 20938 7946 23283 11042 28080 26642 34560 11302 4991 5121 6879
13445 22794 18048 15116 5657 9853 15581 34960 13240 11176 17937 25081
4868 28235 30286 29706 7073 6773 10390 27002 13015 7388 14772 19581
11765 16642 11431 19588 20154 8027 29758 5501 6398 4268 21337 21136
2275 7899 25943 12939 14478 20369 22877 3591 12217 19130 24252 32444
24599 21382 4689 3524 11304 20423 13677 19639 10577 28279 22330 30722
21622 26233 3921 17722 6843 5999 8186 2355 33632 34632 30285 9616
19909 30417 19587 27853 13896 3689 155 20457 33362 21739 22779 33862
3713 32975 9403 2836 23109 11099 3505 14562 17309 26470 4843 12279
24216 26340 22073 32570 12936 19797 21801 8918 7999 24408 5783 25190
8817 29367 17017 6208 21402 2280 2110 7975 32039 34605 1235 912
23116 33017 31405 638 4707 31760 18043 3507 11989 26632 32829 11262
9274 2553 10697 13507 15323 27080 3752 33191 12363 24664 14068 1416
21670 26696 18570 25197 1517 7765 32686 6572 30901 28242 17802 24056
35388 26895 8023 31249 29290 13440 7156 17367 21472 27219 14447 9655
11100 27918 2900 33262 15301 4664 15728 1185 24818 32995 31108 16368
34978 31690 30464 13044 5492 10047 2768 14336 30880 32780 10993 24750
7022 19718 26036 19145 21177 33949 17135 5193 33718 2539 13920 25537
918 18514 14530 13699 11902 22721 8335 35346 24655 3332 14708 20822
11191 24064 32825 12321 11771 23299 31325 25526 16785 22212 34075 9066
31209 27819 5974 19918 26831 33338 26647 9480 28489 7827 18562 2401
17395 23192 10277 28458 23028 18793 10463 10740 616 24647 4153 10128
2873 22381 8132 18239 31614 4193 32313 7575 25801 27591 19872 17992
4609 9114 14764 13516
19192 9882 13112 16075
12510 28902 8784 32679
4578 34533 30609 25543
13739 3465 5330 999
33254 13085 5001 29061
28369 79 17750 13399
24851 9524 30966 10422
18251 34810 12259 25103
25193 16945 1059
11266 13612 30508
24778 25364 1322
14492 11111 13693
15125 8205 1749
8494 9902 9395
23936 3981 22799
28448 28076 26544
19652 13424 8915
2885 11356 3241
1609 10284 24350
2462 19358 15717
29327 15960 14743
5388 32927 1288
19074 6322 32214
34208 30535 35462
23415 20836 21819
17986 12196 30030
8422 2647 5710
3200 23132 23337
22307 29841 4813
15309 26942 29970
23288 7493 3005
20661 34283 33192
23033 9541 6424

TABLE 1d-continued (Rate 9/20) ($n_{ldpc}$ = 64800)

22003 24665 5534
4684 1411 33340
26042 6426 3808
285 21942 14302
16023 6825 20084
34878 12295 32028
2591 178 24107
16379 2912 9912
15375 16120 28375
20170 726 11291
8185 13471 8448
23205 14239 17896
17950 19308 1591
3170 23836 18879
12853 10678 18431
21157 31624 3153
27682 12433 3458
312 4844 13138
17715 35138 15456
30507 33307 30783

TABLE 1e (Rate 19/36) ($n_{ldpc}$ = 64800)

4852 21528 7920 5827 25497 26912 13790 5647 5349 26209 30575 10701
15230 6020 12821 18153 28229 23784 7846 2405 6175 25057 24745 11338
20902 7232 5966 20079 11898 7024 17575 30172 23114 7408 1444 10470
21964 6794 1849 19639 42 2805 10297 14296 17686 18756 6814 9207
13761 23515 17223 21044 557 5255 27297 13440 21226 26060 28875 300
8454 396 27979 25998 8734 9820 22370 3875 26358 26384 12591 26114
29610 12183 15722 29971 5804 10489 2548 29277 13097 19843 19372 19804
12467 2412 3711 4225 15202 24051 29399 5140 19293 5563 5975 10604
8722 11230 8796 6205 27377 23788 7237 16738 14133 11767 12239 7354
27329 14432 12580 11872 15339 16324 5281 2272 15919 18405 23238 3644
20037 7221 19740 14881 9948 21458 21721 20274 632 7531 22448 29320
28575 1484 1684 23572 314 17511 10742 23432 6120 1756 13668 831
23308 709 12194 11481 15426 16126 27391 12597 14490 15204 11820 11558
15988 14707 14715 28040 27022 2964 11343 9853 20469 20448 7921 30386
8030 10079 10797 9471 12773 12408 22081 27431 11141 647 5583 4867
19597 9640 21448 7774 22031 978 14982 9318 5329 23331 747 1599
24719 13982 10148 22796 19316 16641 13398 1385 11074 21429 27365 15030
17211 3435 3121 19692 22379 14270 22290 12713 25821 29202 30112 23466
418 19299 5266 19721 19875 4120 27217 3456 12505 29571 29323 1359
29271 18848 23988 3711 27838 30064 9471 15792 13372 25101 28859 3582
24067 921 10735 1252 24500 16866 9523 24035 25043 22577 6407 20445
8841 13840 17428 23024 13023 27418 13669 2039 5284 4272 20790 12124
14854 8589 24186 2542 124 11300 10583 13607 8364 7702 22179 8034
18294 25817 9609 29141 26471 28410 0 28693 25766 12550 25246 15174
21691 27153 3960 7108 15248 8867 8637 7526 25098 25457 9549 4919 29817 17975 29608
12231 5214 13215
7529 3174 28008
29496 12796 3906
11660 28238 4295
24868 28946 3822
14643 7700 8772
4564 25809 28687
16723 12784 545

TABLE 1e-continued (Rate 19/36) ($n_{ldpc}$ = 64800)

1026 24533 10526
2781 18949 19829
11457 8993 22179
15321 4961 2623
2304 7882 9519
1755 19477 14008
20611 17807 13434
20328 25809 15475
20333 14032 22015
9478 521 7297
11756 11083 30411
6101 23078 13808
7653 3799 14951
12091 8232 4961
10525 4842 4867
13342 20032 9328
14808 11890 9097
1406 17654 21576
13916 19328 21178
9578 4949 26018
16604 13328 21777
18932 7321 2070
7697 14266 9879
12271 19185 26947
14798 20341 18010
753 12687 20366
16795 22301 4021
24333 15105 8536
13240 28609 17761
5504 518 17937
3329 3001 25432
26541 3002 3436
16197 9838 15328
16775 26537 2795
25184 7045 17243
22843 12232 10984
15198 11963 17345
12186 18466 29254
26266 21216 1565
17729 29158 7355
4837 1356 28911
6749 26024 20177
19405 24682 20539
23639 23171 19707
1278 1465 17435
10327 16584 14678
15700 28585 6210
24813 1477 19918
7305 17774 20937
30288 20203 23788
21655 16483 18985
17501 28765 13494
25663 1925 12695
7109 16881 2053
12382 4765 11370
13410 10697 9692
29500 21773 16350
12204 23752 14420
29567 3862 8483
5243 12830 24323
27405 20033 30085

TABLE 1f (Rate 11/20) ($n_{ldpc}$ = 64800)

20834 22335 21330 11913 6036 15830 11069 10539 4244 15068 7113 2704 16224
2010 5628 27960 11690 22545 24432 4986 21083 17529 4104 11941 21239 9602
689 13248 1777 4876 2537 20869 15718 9575 18164 5294 13914 21711 23374
9675 21239 13600 24710 10613 14804 19412 23270 26741 10503 25258 17816 25210

TABLE 1f-continued (Rate 11/20) ($n_{ldpc}$ = 64800)

12518 8680 6422 22715 25097 26959 3913 26493 7797 25977 4896 27063 20781
21715 12850 7963 4027 4295 14931 18158 616 20570 8720 16487 19050 23925
7939 21089 15170 24325 6651 22352 5633 27903 2685 1310 5594 9296 25670
25121 13906 8217 25390 9112 13945 9826 10844 11418 10724 11518 9280 9576
25979 23644 16073 27407 3476 28057 4003 2279 17490 7558 9538 22115 20439
20708 22572 14997 15780 5159 11356 10931 8514 23275 2560 912 15935 20703
26467 17173 21964 15469 21967 10380 16222 15106 16786 19542 28560 18387 27909
14897 6167 24295 1266 16902 9546 11628 12048 24495 3706 22629 14165 2333
19403 18738 28140 13141 6151 22785 9620 4290 2342 4902 15856 19033 22820
15761 1985 9160 4435 11164 5442 23572 6951 19077 15406 16658 18324 19229
16997 10094 19982 22821 7810 19660 1182 21968 16564 17453 10780 17034 16405
11 28611 10411 15799 15705 2773 28601 19333 19447 16790 4618 15841 23854
24686 4131 1013 2141 6052 11896 18719 16813 22420 23406 21052 4333 17754
16425 17614 26883 12101 8224 13979 6869 25215 25991 28968 19337 25361 20513
1671 14990 20692 24951 19446 7163 4959 13197 19201 3883 22532 15468 11856
22758 23586 16985 18396 7434 11817 363 11824 285 20897 16646 16095 17011
25144 14916 6302 20972 25439 6156 21776 19701 27803 9695 12941 23541 27425
6979 27910 7378 8983 6280 4134 28860 8079 20892 28776 7899 23399 87
18045 23929 25876 15560 23629 18376 4053 14655 2450 11907 19535 28543 3513
4704 16512 16554 14062 2596 10357 17316 1011 22090 11353 20300 15300 18536
14293 4746 28831 20028 16742 16835 28405 11245 10802 20242 17737 9590 20693
26547 22557 22517 6285 5336 3998 2351 6628 22949 1517 4712 1770 9207
28522 14116 5455 13105 18709 3030 4217 6306 27448 1943 23866 20212 18857
14794 21425 15659
4446 21140 13454
21115 3271 1443
2153 12424 6159
23559 22473 26065
15914 22980 12766
3482 16233 5719
27020 12322 24014
25438 26499 26506
21987 16027 6832
17330 2620 20756
15985 10471 23302
593 6869 27185
22961 9129 25646
10702 12334 23959
6375 23299 26942
8029 4072 24051
15147 5113 14725
1451 27291 28731
18808 11561 249
28962 21405 18944
6889 3314 23457
27708 14530 8795
6185 28821 6550
2259 17627 701
20819 18831 20140
4991 11369 4282
13230 3413 27092
14556 5068 16209
4337 24652 498
715 28883 2285
16524 25513 26034
21067 15122 21667
27982 15280 3313
7563 22779 22453
4744 17277 27210
19170 10806 18815
26424 26442 7837
26264 28931 6020
4645 20678 13160
18111 28045 23883
5128 10876 3087
28551 26276 3541
20152 10181 28172
26430 14769 6809
4956 16130 11348
1691 10216 5743
7848 20236 2661
10660 8321 6155
2757 6963 2596
27791 6707 258
12785 21176 15450
7477 17274 25201
262 18996 15836
5287 11970 13365
3098 17823 10786
21831 14476 11447
1893 3625 25404
20880 21987 1228
20942 15045 21358
18237 28914 15673
24273 284 9803
13949 15670 16693
15553 27782 22644
27980 24820 27733
7015 20974 10016
26164 20314 25916
11489 13663 11777
18230 11483 5655
1618 19977 26521
25639 13184 28994
3821 18349 13846

TABLE 1g (Rate 26/45) ($n_{ldpc}$ = 64800)

12918 15296 894 10855 350 453 11966 1667 18720 12943 24437 8135 2834
11861 3827 15431 8827 8253 23393 15048 5554 16297 2994 6727 19453 2371
26414 3044 20240 18313 11618 3145 10976 5786 5609 16358 2547 11557 14755
26434 2510 26719 4420 6753 917 7821 26765 11684 9811 5420 6653 19554
11928 20579 17439 19103 21162 11235 19172 22254 3420 10558 3646 11858 24120
10189 8172 5004 26082 4345 5139 15135 26522 6172 17492 8462 4392 4546
27330 21498 13424 8077 10165 9739 482 23749 1515 12788 10464 9085 20875
12009 22276 18401 7541 5871 23053 16979 16300 13566 19424 5293 18290 23917
9613 24175 11374 11736 17676 13126 20931 20290 20659 2000 7969 9386
21507 24494 11822 21771 26776 21175 27354 15815 7598 19809 611 10144
195 14244 7229 13002 14328 17987 14595 6985 7642 9434 7079 5571 10013 3641 14064 11716 4620 18119 23365 26446 26273 25164 11262 26019
15166 19403 5606 20138 1893 645 5414 12097 18635 21648 12255 13269
1895 9969 8372 17737 21679 17061 20219 2513 27199 11242 17025 1261
12845 13086 16256 15177 20822 10862 18375 6751 17532 24725 6966 18489

TABLE 1g-continued (Rate 26/45) ($n_{ldpc}$ = 64800)

8373 25550 20688 16686 7894 24599 21578 12516 7115 4836 23473 25162
14375 9150 6606 21633 16224 23708 20350 4575 143 13356 10239 22868
10760 19807 7079 16382 26236 22606 16777 24312 16941 26684 8658 19279
15136 8603 332 2898 21821 23778 3232 12052 14336 7832 5600 27015
14392 26564 21616 8332 21750 10379 19730 7553 27352 2718 15202 25661
6891 13210 15284 21940 8742 10965 3176 25034 25137 25161 13267 7012
4993 9943 13260 20980 20224 20129 2120 23111 16640 23548 21445 10794
4846 2858 22663 12584 20448 4629 17825 22269 11278 26312 9463 21085
24282 18233 9220 14979 24106 14507 24838 19689 17589 7926 7893 21701
12253 26122 8035 20823 2584 4703 25178 5460 4190 7057 1144 8426
12354 7216 19484 4110 22105 1452 11457 12539 27106 14256 14113 20701
2547 26926 25933 11919 12026 24639 19741 15457 9239 26713 22838 6051
8782 14714 23363 450 19972 2622 19473 24182 2391 26205 10018 9202
15690 10472 20263 469 18876 23660 9005 12595 23818 26430 926 6156
5440 5209 14958 9882 18843 22063 12749 18473 22546 11768 4493 12833
18540 3544 9471 15893 14761 23479 22010 15491 19608 25035 9094 24836
15909 16594 23538 25136 25063 24995 5354 905 18580 15476 20710 7774
6088 17133 11498
4721 17594 18267
1645 23638 26645
14800 17920 22016
12927 350 19391
19447 19886 25992
26120 1747 11234
1588 23170 27232
2230 15468 18709
17410 11055 20645
3244 25815 14204
2858 7980 12780
3256 20418 24355
24260 16245 20948
11122 1503 15651
19272 24054 6075
4905 931 18884
23633 17244 6067
5568 26403 490
16113 16055 10524
23013 8138 12876
20699 20123 15435
27272 27296 22638
7658 17259 20553
14914 17891 12137
16323 1085 18895
21503 17141 2915
21979 23246 1271
14409 11303 12604
25591 12157 14704
18739 19265 8140
11244 5962 6647
3589 6029 6489
16416 185 9426
1267 14086 22473
17159 22404 23608
7230 22514 21605
7645 1239 10717
12028 13404 12140
14784 15425 14895
26165 18980 15386
14399 7725 14908
8463 22853 22095
5517 1854 8283
24381 260 12595
839 23743 22445
13473 8017 7716
8697 13050 16975
26656 16911 11972
26173 2504 15216
7493 6461 12840
4464 14912 3745
21461 9734 25841
4659 7599 9984
17519 7389 75
12589 9862 8680
23053 21981 25299
19246 3243 15916
21733 4467 26491
4959 10093 20074
9140 15000 12783
854 10701 25850
13624 7755 10789
3977 15812 10783
5830 6774 10151
21375 25110 5830
15985 18342 2623
4716 27211 18500
18370 12487 7335
4362 21569 16881
10421 15454 13015
5794 1239 9934

TABLE 1h (Rate 28/45) ($n_{ldpc}$ = 64800)

24402 4786 12678 6376 23965 10003 15376 15164 21366 24252 3353
8189 3297 18493 17994 16296 11970 16168 15911 20683 11930 3119
22463 11744 13833 8279 21652 14679 23663 4389 15110 17254 17498
13616 426 18060 598 19615 9494 3987 8014 13361 4131 13185
4176 17725 14717 3414 10033 17879 8079 12107 10852 1375 19459
1450 4123 2111 17490 13209 8048 15285 4422 11667 18290 19621
2067 15982 304 8658 19120 6746 13569 19253 2227 22778 23826
11667 11145 20469 17485 13697 3712 4258 16831 22634 18035 7275
23804 14496 17938 15883 14984 15944 2816 22406 22111 2319 14731
8541 12579 22121 8602 16755 6704 23740 16151 20297 9633 1100
19569 10549 19086 21110 11659 6901 21295 7637 11756 8293 9071
9527 9135 7181 19534 2157 788 13347 17355 17509 711 20116
21217 15801 12175 9604 17521 2127 21103 1346 8921 7976 3363
11036 5152 19173 8086 3571 1955 4146 13309 15934 19132 5510
12935 13966 15399 16179 8206 19233 16702 7127 12185 15420 1383
6222 6384 20549 18914 23658 11189 638 9297 17741 9747 13598
17209 11974 20776 2146 9023 3192 19646 3393 1727 15588 20185
5008 3885 5035 15852 5189 13877 15177 3049 22164 16540 21064
24004 10345 12255 36 24008 8764 13276 13131 2358 24010 16203
21121 21691 8555 11918 129 8860 23600 3042 3949 19554 12319
22514 11709 11874 11656 536 9142 3901 580 1547 10749 5529
3324 6251 1156 112 13086 5373 5119 132 18069 10482 19519
17279 2017 14846 21417 17154 21735 18788 11759 192 16027 6234
20417 3788 15159 22188 21251 16633 13579 8128 1841 23554 15056
12104 9182 6147 1553 12750 4071 6495
4961 18460 23266 10785 10973 4405 2707
7665 7043 1968 3589 15378 9642 21148
13073 13298 20040 13582 17124 348 12055
378 7476 9838
15454 5218 14834
17678 3445 18453
2767 388 12638
5688 56 6360
20009 872 16872
10206 5551 477
10662 23689 19768
8965 17535 4421
19397 18734 5422
10043 22104 21682
508 1588 23853
1092 7288 4358
2283 22298 10504
15022 8592 22291
11844 17038 2983
17404 14541 6446
20724 7498 2993

TABLE 1h-continued (Rate 28/45) (n$_{ldpc}$ = 64800)

14715 9410 6844
20213 14674 263
4822 20951 635
20651 23174 5057
22237 9229 4859
17280 9586 20334
19508 8068 11375
5776 21209 9418
6872 6349 20397
11165 19619 13108
13550 10715 5122
5655 10699 8415
9864 4985 7986
6436 3754 7690
4257 17119 5328
659 4687 6006
527 10824 8234
11291 1735 22513
7254 2617 1493
3015 7462 10953
15705 2181 11992
4628 19430 18223
9426 21808 13549
17008 3470 22568
13643 24195 21816
936 14226 22874
6156 19306 18215
23984 14714 12907
5139 18639 15609
11908 5446 8958
6315 16864 15814
10686 22570 16196
203 4208 13716
494 14172 11778
15112 14244 8417
21087 4602 15570
19758 4401 22270
8218 11940 5009
23833 13785 12569
1698 7113 18541
18711 19991 19673
8025 17107 14784
5954 6817 19810
24143 12236 18063
23748 23956 10369
7805 13982 13861
5198 10889 6787
10406 13918 3305
12219 6523 12999
9964 2004 17361
23759 21507 11984
4188 19754 13358
8027 3662 2411
19762 16017 9125
2393 4619 5452
24176 6586 10895
15872 1795 15801
6911 15300 14787
2584 4905 8833
1327 12862 9476
16768 12633 7400
11983 6276 18370
12939 12793 20048
20284 12949 21345
19545 4503 16017
1253 12068 18813

TABLE 1i (Rate 23/36) (n$_{ldpc}$ = 64800)

2475 3722 16456 6081 4483 19474 20555 10558 4351 4052 20066
1547 5612 22269 11685 23297 19891 18996 21694 7927 19412 15951
288 15139 7767 3059 1455 12056 12721 7938 19334 3233 5711
6664 7486 17133 2931 20176 20158 9634 20002 13129 10015 13595

TABLE 1i-continued (Rate 23/36) (n$_{ldpc}$ = 64800)

218 22642 9357 11999 22898 4446 8059 1913 22365 10039 15203
10305 22970 7928 16564 8402 9988 7039 10195 22389 5451 8731
19073 1005 18826 11109 13748 11891 21530 15924 21128 6841 11064
3240 11632 18386 22456 3963 14719 4244 4599 8098 7599 12862
5666 11543 9276 19923 19171 19591 6005 8623 22777 1255 20078
17064 13244 323 11349 6637 8611 6695 4750 20985 18144 5584
20309 6210 16745 10959 14284 2893 20916 10985 9664 9065 11703
17833 21598 22375 12890 10779 11241 13115 9222 21139 1217 15337
15514 12517 18953 11458 17296 8751 7213 12078 4994 4391 14976
3842 21548 10955 11679 16551 8514 17999 20557 16497 12122 23056
10551 20186 66 11038 22049 2130 1089 22093 9069 3470 8079
19208 22044 2732 1325 22309 967 22951 1366 11745 5556 6926
2805 18271 10046 4277 207 19518 17387 9701 8515 6813 10532
19714 21923 13493 1768 18819 6093 14086 13695 12781 9782 445
22160 15778 13629 10312 19769 8567 22096 15558 19730 11861 18492
10729 16847 273 4119 4392 11480 20396 3505 7220 390 5546
17277 8531 17390 22364 7167 2217
7325 3832 19899 21104 8400 3906
6218 20330 14943 14477 5614 1582
21534 14286 14624 14809 6775 22838
15786 6527 15848 5288 13523 9692
12696 15315 602
17081 6828 13578
3492 6510 20337
6113 5090 7290
20122 15539 19267
10412 19090 17863
2546 2295 19448
20296 2296 2627
6740 14224 10460
12878 6055 15452
15152 15699 563
15414 21900 19161
11126 15975 3733
4379 15742 6475
17203 5870 18537
4912 260 21115
23164 4273 1694
1082 5287 11152
14537 2277 19232
13414 15608 12926
17043 18241 18313
208 6118 20777
9140 19241 22845
18527 5035 4161
20867 22650 5585
7875 10358 1898
3563 14833 21329
14705 3359 13959
4507 11976 20017
22424 12925 8308
8739 15561 8010
6408 20723 20928
12337 7864 15777
12742 20430 17351
6259 1865 9808
8343 17441 2551
2167 3025 23181
22718 13243 4797
4223 4982 4395
1609 16748 17625
8463 15204 19632
6583 9112 20284
11334 19370 4763
746 18560 15222
8796 12725 15176
10245 15567 9991
17447 18373 21523
1473 5286 15793
17675 21170 6699
15515 15942 8733
7047 11348 14584
20435 19603 1961
18851 7069 11402
19180 6487 2979
2650 13282 9040
22613 23266 4786
20832 3001 23129

TABLE 1i-continued (Rate 23/36) ($n_{ldpc}$ = 64800)

3850 5255 6601
19827 15438 13956
15798 4430 11318
4724 8719 21209
18127 844 21379
7427 22987 10233
22949 8145 21778
7622 14471 18874
8566 14340 3381
3373 419 11514
15127 917 13136
19375 18740 4951
960 2856 17804
662 8107 10298
10993 11755 19142
11400 18818 521
7210 18658 8285
9496 20836 5655
14654 13694 12705
20381 16473 7271
12796 3280 23370
13893 7667 1736
5485 18321 7789
11242 18771 17282
817 21060 15985
666 20461 22464
7696 19774 4324
12239 14014 4759
5011 10472 4137
3047 2444 3818
1594 20382 538
7051 21874 1697
18539 26 21487

TABLE 1j (Rate 25/36) ($n_{ldpc}$ = 64800)

11863 9493 4143 12695 8706 170 4967 798 9856 6015 5125
12288 19567 18233 15430 1671 3787 10133 15709 7883 14260 17039
2066 12269 14620 7577 11525 19519 6181 3850 8893 272 12473
8857 12404 1136 19464 15113 12598 12147 4987 13843 12152 13241
1354 12339 4308 23 12677 11533 3187 11609 4740 14630 19630
14508 10946 3928 580 3526 17836 3786 15739 13991 1238 1071
6977 13222 13811 585 8154 2579 8314 12185 15876 7738 5691
12901 12576 11597 4893 17238 15556 8106 12472 10455 14530 17432
8373 12875 16582 14611 14267 15093 2405 9342 18326 12125 9257
5861 12284 2441 13280 2762 5076 17758 4359 6156 18961 13208
4400 8474 19629 19528 14125 12780 12740 19316 491 4761 1719
7270 6615 1175 15848 6943 18360 8905 13921 10807 19688 18757
8312 12234 17907 17254 7699 18399 5508 12215 4818 18107 2874
19496 13973 10432 13445 15320 13648 1501 10549 6710 8897 1998
1575 12713 10916 5316 13713 11318 4055 5782 5828 17981 3141
12177 10726 4244 3138 15996 6822 7495 5257 8909 6180 10680
6650 1909 19146 1038 17229 10050 3051 9793 10839 3532 14759
5337 8448 4939 14792 7585 17860 8612 2229 18965 1519 2031
13845 9320 579 15441 15050 752 8303 6989 13360 12927 15255
17286 3639 1733 16883 8457 9475 2939 3234 1993 8554 9939
6359 15474 12100 6992 13844 16988 7481 16977 9052 9262 15270
7181 3624 3814 16379 182 4338 17627 3315 5745 14093 15574
10709 18662 6909 11248 5268 412 5854 16782 16059 10498 5061
13321 617 6734 3718 15441 19241 17214 1682 18641 18646 6330
7377 16951 14477 6507 9922 11464 2563 5702 12691 10606 17874
7198 12571 17617 4862 18899 7100 8130 9665 10779
6789 11459 17651 3693 13332 3854 7737 12589 15189
16260 14569 9442 17890 18097 6845 6960 1376 8099
12719 14986 18999 14013 3449 13618 14807 265 1508
11231 966 15957 8315 3384 2570 5700 10911 17372
153 8445 19598
7841 14806 54
2492 14099 11718
18608 4278 333
59 3982 16986
3494 12496 2775
18320 10650 16234

TABLE 1j-continued (Rate 25/36) ($n_{ldpc}$ = 64800)

9739 16537 19706
7587 19072 18775
14133 12042 2922
229 17958 15889
5130 11029 271
5122 7021 7067
12258 16611 9245
15493 15347 15939
741 12055 2822
12804 3480 5690
18598 19273 16354
2569 16771 13693
15051 853 956
12256 2756 15137
15685 2802 16479
14687 12470 3583
15473 17781 867
4843 6765 13122
11287 3680 19101
4609 11385 13470
12353 6632 206
10984 3116 1263
9419 14455 19438
9528 1808 435
2238 12870 10119
10868 8402 11111
11081 7197 2667
13780 10759 19722
3768 3052 1836
446 1642 12388
16876 8398 14485
7301 14815 13811
5678 10419 14396
1877 14384 12817
19028 19589 6893
8725 6346 676
13611 12486 2054
11203 14908 14692
18139 5334 1253
16233 9749 16946
18885 4332 16306
3862 10395 13871
3747 8900 3381
13367 14132 7220
15095 4219 15869
13519 18079 17541
19012 13943 19471
2221 5710 13711
5185 3363 10195
9580 17331 15360
14387 7596 9614
17336 6371 6030
14629 10636 10159
2402 9170 4321
1040 5899 153
7710 7637 13966
10919 8535 3791
1968 2567 4986
4166 8744 17691
540 10695 10019
17710 1188 10821
5858 17012 17389
3083 17587 12682
5354 9537 6807
4964 15942 9653
9000 17053 13291
11685 8503 10777
13919 18155 9877
1625 15314 13879
18520 7074 17061
3748 2752 7298
493 19163 14139
2260 18339 10688
8928 17695 10276
7640 18547 3561
11275 5297 13167
19691 19542 15725
11837 7273 11297

TABLE 1j-continued (Rate 25/36) ($n_{ldpc}$ = 64800)

17873 7840 19563
8109 3811 18417
17759 17623 13175
10041 4152 2249
18452 1450 19309
9161 11651 4614
11547 14058 639
9384 3272 12368
5898 2578 14635
15963 6733 11048

TABLE 1k (Rate 13/18) ($n_{ldpc}$ = 64800)

2510 12817 11890 13009 5343 1775 10496 13302 13348 17880
6766 16330 2412 7944 2483 7602 12482 6942 3070 9231
16410 1766 1240 10046 12091 14475 7003 202 7733 11237
15562 4695 13931 17100 11102 770 3848 4216 7132 10929
16469 17153 8177 8723 12861 15948 2251 1500 11526 8590
14813 3505 12654 1079 11736 6290 2299 17073 6330 5997
390 16492 13989 1320 14600 7061 6583 458 894 1596
8625 7644 1322 16647 15763 10439 8740 5529 2969 13893
13425 13121 5344 8739 4953 7654 17848 9334 9533 2731
12506 10992 8762 5395 6424 11688 3193 17601 14679 8204
5466 15487 1642 6671 13557 4074 7182 4436 12398 12973
1958 13041 6579 15984 3762 16633 6113 11509 7227 28
17202 4813 14024 15099 2648 4476 2260 6507 9930 9232
14186 14510 6818 7665 12708 2645 16687 13255 8239 15884
1751 7847 17987 11410 3345 17133 17655 5027 1261 17191
8056 4264 13915 8217 6118 8072 6278 6835 5038 15008
13625 2999 5336 11687 13500 5723 13903 766 6293 155
12316 14093 7372 16846 15357 9865 17869 1429 16681 202
15062 1123 6454 17625 3213 39 1669 1770 13636 16555
13053 7597 11481 1336 3343 11387 5463 17830 13741 5976
1956 13509 1664 16867 8168 13421 17078 3285 17138 1572
16711 1499 4805 13584 14759 2844 13110 7356 5850 8330
6521 8528 14170 6681 16992 12867 14326 15227 4082 8595
16176 8184 8572 1923 935 8900 13020 6812 9778 3391
3946 4711 15314 15108 15634 4144 4372 9207 10715 1291
16601 5864 10968 4724 9235 6988 3307 6515 7004 16328
16217 4227 9735 15857 5003 2532 4451 8574 2149 6908
9506 8949 12035 9701 3124 14295 8567 13614 5159 16746
2418 8669 10921 5738 147 1004 2692 9065 12877 7559
16706 8511 10314 3118 1219 7071 12376 538 2389 3297
12492 10589 5791
13528 1653 6618
10485 1307 4102
347 13580 4039
523 10311 10540
4183 6192 17159
11458 6521 9632
11594 15791 10384
11654 126 11715
6265 34 5091
7271 13900 7588
3960 11297 1612
9857 4695 16399
6423 2197 15040
4219 5979 13959
2959 578 8404
4585 658 6474
15900 11357 5249
7414 8642 1151
4130 9064 14537
14517 1356 3748
13865 12085 17295
9530 5110 1570
10862 8458 15322
16355 1774 5270
1229 11587 1632
17039 787 4703
11423 15388 6136
8413 9703 13946
4678 4072 16702

TABLE 1k-continued (Rate 13/18) ($n_{ldpc}$ = 64800)

6244 4690 7164
7238 14169 5398
8679 122 11593
10954 15802 16427
9413 6717 16406
1027 17863 7836
655 8827 10286
4124 12599 12482
12955 3121 15318
8343 16634 6301
13568 5056 9920
1948 10 17395
8550 131 2151
15226 15994 13093
10966 15412 2781
13425 15831 5346
2261 1067 6346
6625 1966 13533
10575 4483 5761
14366 2019 14426
16746 1450 4830
13109 7358 7942
15376 7284 14035
14341 12625 3306
9375 7529 1537
13831 13447 4549
15658 15299 8238
4005 13264 9766
4715 6285 15383
1262 12883 15434
11123 14975 3434
5307 1112 16967
12163 12009 3681
9174 13153 10344
13456 13197 9562
1785 7549 15347
663 9748 9436
4961 11903 11574
16248 6238 666
11426 13748 14763
14431 1443 2069
2376 8154 14978
13140 1289 9046
1159 300 3319
11510 7769 15877
6430 14946 6856
8868 15622 12458
4867 6622 6850
14721 11241 12760
14233 9874 17682
16677 13195 15086
11155 7067 14160
12741 14379 8922
1930 17055 11752
12361 6523 9568
12165 5636 16011
11389 4754 9916
15903 15542 8301
12073 4918 9754
16544 17907 14814
10839 1401 5107
12320 1095 8592
15088 6521 12015
14802 3901 8920
17932 2990 1643
5102 3870 2045
540 2643 2287
5844 2482 9471
10428 637 3629
8814 7277 2678

TABLE 11

(Rate 7/9) ($n_{ldpc}$ = 64800)

13057 12620 2789 3553 6763 8329 3333 7822 10490 13943 4101 2556
658 11386 2242 7249 5935 2148 5291 11992 3222 2957 6454 3343
93 1205 12706 11406 9017 7834 5358 13700 14295 4152 6287 4249
6958 2768 8087 1759 11889 4474 3925 4004 14392 8923 6962 4822
6719 5436 1905 10228 5059 4892 12448 26 12891 10607 12210 10424
8368 10667 9045 7694 13097 3555 4831 411 8539 6527 12753 11530
4960 6647 13969 3556 9997 7898 2134 9931 3749 4305 11242 10410
9125 9075 9916 12370 8720 6056 8128 5425 979 3421 5660 9473
4348 11979 5985 395 11255 13878 7797 4962 13519 13323 7596 5520
2852 8519 3022 9432 3564 9467 8569 12235 11837 5031 4246 2
4081 3630 1619 2525 3773 11491 14076 9834 3618 2008 4694 6948
7684 9642 5970 1679 13207 12368 262 7401 11471 2861 5620 4754
7474 10418 1422 10960 13852 988 13465 6415 86 2432 7595 12239
8539 11749 8794 6350 1947 13325 13061 7385 13017 2536 13121 15
7944 13831 5126 9938 11758 335 980 9736 12143 5753 4533 10814
10706 12618 6949 2684 4107 14388 11372 6321 13832 9190 2838 13860
10830 1947 13803 3257 2677 406 8400 10536 12911 3629 251 9784
13343 13304 301 801 6456 6351 6155 6763 3812 11337 8446 9306
524 5573 503 10544 8990 673 2309 12376 466 11441 960 1557
4403 3564 1732 13453 12054 8941 1383 12424 4347 9830 3553 5158
2025 4282 4983 13553 10776
11833 13099 5078 4420 3527
1544 7474 2780 7749 4153
11189 520 8463 12230 7712
10409 13367 2604 2966 9248
1412 420 3507 9818 7955
1122 12483 9375 10232 9456
2799 7033 10404 4495 12059
2569 5970 6262 2199 8045
11724 511 12693 12855 9597
756 12900 13391 13623 10683
2095 13479 1488 9469 11142
13849 1356 10776 3530 9866
13449 14225 2072 12772 9461
6466 6181 6502 401 7439
4631 1086 3062 11789 11811
6788 14007 2270 14132 2764
4643 10272 11316 2608 8511
5221 9028 2736 7223 1051
1974 2737 6739 13904 6156
5 9082 3915
2400 7195 3413
606 221 8171
4548 1267 5310
12795 2160 8305
10563 3507 12190
6325 2499 9717
9251 6046 13308
11704 10834 11241
4777 3774 11533
12487 10365 6852
58 2650 2027
7248 13704 5573
12777 7834 8561
7906 8121 7774
554 3105 6000
11198 3586 10410
9002 4094 11297
12058 1037 13638
1258 12917 11078
2430 51 10276
7841 9451 10236
11045 1058 10352
9629 9428 86
8146 1255 3802
10820 6337 4199
9364 7723 1139
438 6445 583
2683 5358 10730
8471 3061 13380
3005 2840 4754
8210 1814 11502
8667 14258 5985
8407 13336 10970
6363 11715 5053
104 13618 13817
6562 4087 294
1742 10528 4626

TABLE 11-continued (Rate 7/9) ($n_{ldpc}$ = 64800)

6607 2692 1587
11097 8361 2788
13451 3541 823
4060 13604 9816
157 6106 1062
8853 5159 4270
9352 13164 2919
7526 5174 12501
12634 13077 5129
5750 1568 6281
269 5985 10973
8518 9415 1028
4722 13275 634
12113 7104 7436
12787 1032 5936
3425 11526 10797
784 9208 15
11223 12849 4913
10635 3553 8852
11749 10619 3532
4080 9831 9219
6560 6049 6111
1304 11770 12585
13209 8589 11287
2887 10699 14307
4752 456 4073
1175 13156 4894
12756 3237 6279
10125 7074 2344
7533 7103 5226
4000 4425 12173
10056 5312 1599
7445 8696 12533
11509 14050 2483
12405 2876 5033
4512 4955 5627
5572 5099 10987
10665 404 3082
2075 1583 13454
5666 7228 524
13290 7634 418
9006 7368 4181
9447 3674 8171
9355 10211 9342
12572 3681 3322
3295 186 7491
7926 212 5241
5479 1654 8097
5078 423 4817
1357 12780 3664
11900 402 13108
299 7166 12008
5750 3041 5618
8357 1229 8884
3713 8791 13375
4390 6302 568
1009 4440 10003
1209 11978 11711
1803 9838 13537
11318 9750 12421
2388 3021 7880
7220 1062 6871

TABLE 1m (Rate 31/36) ($n_{ldpc}$ = 64800)

8971 1759 4661 2344 8810 3677 5653 5575 7855 8916 1232
6045 3232 8535 7071 6764 5731 2016 8662 3813 223 4080
3502 3358 2640 7181 793 289 4907 6380 6437 261 7395
3264 6823 551 107 3672 245 2133 2328 2462 2349 1096
4755 5134 5661 5948 3017 7071 6140 2620 4479 5669 508
5209 2522 3677 7033 4553 4780 8149 6346 4190 5242 3118
8430 2284 8323 3944 7479 7765 7974 3145 4381 47 3257
584 8668 3622 7087 6946 4527 5274 6111 4151 1805 3370

TABLE 1m-continued (Rate 31/36) ($n_{ldpc}$ = 64800)

3713 3710 186 758 1606 8866 2975 3305 6548 2039 2197
4021 661 7382 3627 628 8334 4880 2742 5139 1910 5450
6338 8246 8710 8382 2952 3468 4905 3623 6578 2519 8966
1781 4964 623 4641 7520 6371 6835 1853 8584 3351 7486
7368 1500 5916 5328 2390 7684 8660 4286 7833 8517 3696
8199 4143 538 3959 8390 3414 8353 5244 5698 1645 3804
2158 1979 10 8920 6848 434 4640 3443 4662 3311 8682
4678 5773 8736 4743 7365 213 3257 1449 7394 7035 356
7916 2503 7790 8719 7879 4639 4251 1160 542 8333 3163
713 304 1515 3019 5747 7901 581 857 7416 6967 4325
1224 8200 817 7526 3694 1563 5341 4464 1668 4154 2731
5150 3051 3027 4312 8372 8168 2438 6549 1669 2508 792
5112 6776 1508
8775 1199 2766
456 4827 7450
6774 4851 6529
3650 1777 4738
4717 6245 427
5897 956 7912
829 3876 5237
7972 6664 7929
8937 8392 7322
6575 7176 1446
4850 5066 8804
8899 8400 3469
6998 3642 3011
7923 4486 1765
6452 3059 5714
788 2207 3170
7267 1301 4997
4439 5972 2812
1780 6970 1589
7959 8278 6071
4534 3352 97
8471 2786 2155
2310 981 4507
7595 8390 1576
903 4985 906
4329 6038 3816
6655 3181 8643
462 6342 369
7927 5468 4640
5158 5099 8728
1162 1013 1668
4991 10 4023
7683 2169 5932
4904 1508 8599
81 7255 1696
4953 2574 3819
8670 4354 5201
3245 8547 2582
8283 5948 112
0 3555 8320
7361 3833 6990
2073 8147 3267
443 5558 422
4028 6204 3714
3204 1319 5834
385 2462 1221
7359 5931 8590
8507 6028 1036
6649 411 8848
2741 8385 2
734 5600 5141
6463 8874 5635
7438 4542 4355
8441 7926 3737
106 6421 5843
4827 1068 8169
4377 6957 13
3539 1226 175
8814 7140 3442
5985 8721 8564
6126 3850 8168
7291 8950 3881
1495 7555 8118
5993 6269 2364
6839 185 4721
8226 3508 5415
7558 6282 5985
8472 2791 4386
6780 6798 2965
6375 8983 3049
7644 5774 6057
8856 1119 6354
8565 6181 1611
8078 3236 6834
5834 2671 1352
3780 2609 3762
2341 1778 6913
523 2420 1779
6462 8692 4898
3367 3526 2137
1829 1013 953
6042 4363 347
7052 5170 5807
5302 2622 4624
8309 4278 3905
7431 3576 391
6 2284 6866
624 7584 7746
3739 5085 2171
7148 1787 5217
7011 3901 8124
6487 2318 1527
8208 889 7568
4516 1340 1403
7681 680 8128
3502 8037 5595
6254 6343 455
3114 8126 6908
1370 3185 1047
4035 8017 2815
7533 1663 2346
4345 238 3292
527 7323 8811
7598 2211 5857
949 554 7169
8797 1600 869
1269 3815 4457
4850 3857 3079
4500 4413 7547
2532 250 46
3357 7128 442
1828 1156 566
7441 603 6927
7801 2986 3767
1008 5843 4822
979 1910 262
7958 721 2898
3835 1141 3693
1448 4271 394
4379 4286 422
2275 2026 4383
4840 7098 8809
742 129 7220
550 7440 6138
4257 7627 3234
8724 7147 631
2669 680 3924
6213 3684 935
2781 3219 8705
4977 2276 6690
8586 4945 8664
7205 5893 7264
6887 1064 6249
3962 7938 4495

TABLE 1n (Rate 2/9) ($n_{ldpc}$ = 16200)

1412 2138 8984 3438 2515 10585 11093 5801 2511 2287 10879
10470 10973 3691 11847 4141 479 7406 3228 8356 256 11769
2480 8892 9040 4517 2672 11159 7865 6415 2638 5399 7575
952 3128 12126 6408 60 10782 10254 11866 4473 10592 8736
3819 669 2091 5790 5040 6987 1353 2734 9859 3974 12568
5396 3717 6005 5830 9748 7221 8759 396 2259 11357 5702
7043 1281 6308 11899 7792 6476 3741 11099 6895 3224 1940
8224 8533 607 5065 9226 7677 389 7233 11605 7002 1302
10984 3435 9186 5964 7806 1613 11451 6020 5275 4965 6307
6942 1054 2451 5545 10447 6453 6583 6177 6284 11747 11323
2696 5058 3217 6755 1434 3691 8784 11507 1298 1233 7964
8103 6761 11865 1288 4258 7960 6753 4896 3722 3526 6795
4663 2198 9374 8700 9195 9272 7573 6956 3057 10801 574
9292 525 989 7701 3754 1110 330 3367 10472 6202 2627
1181 11223 3564 1628 8362 6419 7476 10074 1406 12509 9757
10380 9841 100 10177 8331 6788 8872 11167 2167 3646 2770
3111 8679 9590 9338 9119 8373 90 10418 12041 7718 3102
8551 6068 8424 10522 8595 6512 866 4591 3390 7496 172
1467 9023 9000 4113 9407 7168 29 11625 8584 8396 9683
1457 6097 9254 12476 1850 11664 11115 4278 11945 844 9302
7661 12225 1040
3671 5318 4875
3554 10478 10902
11739 3429 7114
5533 3709 689
2951 10126 10677
8709 9880 1112
681 6786 2945
8823 210 689
6648 509 2228
11109 10495 8746
8223 4337 6804
371 5245 7435
8110 6001 11003
5097 2116 3826
2054 5220 7231
3029 5134 8970
132 9603 1538
10743 262 11188
990 6782 3283

TABLE 1o (Rate 13/45) ($n_{ldpc}$ = 16200)

7200 3499 6246 3905 247 2945 6706 2366 4892 5254 3370 7202
8203 6971 5728 4002 9544 5247 5176 5021 6732 8016 5317 9111
11144 7046 7808 8792 9779 11402 10050 7970 2047 6746 746 11319
4085 9903 3751 10712 6662 10504 7149 8084 7417 4334 9448 10678
9739 3412 2152 1114 6077 1021 10761 5073 3458 10115 4722 2581
8860 1515 1997 8926 471 2708 1449 158 4140 10611 10740 9693
3165 10132 4839 4204 10917 2320 6112 867 4929 9201 1707 10355
10887 7531 1123 8118 8896 5168 2011 110 9188 8375 9421 1693
1252 5132 10342 3726 2094 761 7397 10962 1848 4584 7139 1858
10499 3638 4924 1466 4191 2999 7778 11389 1071 2537 9265 5340
11498 4140 6795 3575 7332 10491 1502 3493 2380 3962 5169 2719
6028 10291 3440 7669 10253 8175 9134 2374 10199 2229 1055 5597
6655 7533 1518 11299 3033 1083 2464 10032 10910 3439 11511 3763
1424 9362 3170 10113 5492 11354 3160 10592 10897 37 334 8974
8540 9590 4255 5342 6469 11153 2925 3384 8958 7809 8108 2721
388 280 3829 8071 7567 10280 8151 22 8789 256 6937 5050
10795 1844 7999 1047 8549 4046 1696 893 8952 9610 10014 6772
485 9159 11346 10133 4447 10089 9419 7756 2637 6446 11400 9357
9302 2726 1559 7231 9930 9385 7889 2356 11066 14 1180 8283
458 5862 5540 3284 7878 9379 4637 11123 7791 8965 10476 2620
2593 4749 1747 4818 10173 596 9833 4518 5205 2808 592 228
10538 5907 164 2111 6334 1930 7625 11378 1531 3798 8978 4224
10183 8729 2755 10694 4801 2302 2649 1977 10031 3495 4789 1102
760 9858 700 3625 8633 3152 6230 9510 6123 2053 10767 50
1777 10548 6803
3935 1861 220
3117 211 7402
7164 5909 10691
4175 4997 7823
830 6156 5451

TABLE 1o-continued (Rate 13/45) ($n_{ldpc}$ = 16200)

11467 1346 2838
5962 2858 10343
905 3219 1146
584 10896 5474
5315 3529 5378
4164 3155 9405
11386 10011 9288
7404 1200 8828
649 9557 9284
11419 7104 6268
918 3637 11395
5539 4612 4850
1965 8574 7497
8644 857 2038
10674 10465 886
10864 7119 353
9657 3090 7792
408 26 5892
4193 3663 10393
11181 5241 2721
10010 3240 7704
9370 8872 9280

TABLE 1p (Rate 11/20) ($n_{ldpc}$ = 16200)

4692 1824 629 6885 466 5885 1190 3308 7241 3690 4845 4383 7107
5761 3200 4648 2401 6747 4908 1777 796 6724 1310 2462 3313 5669
6966 7054 6004 4230 1509 1194 4523 4356 1438 7261 5516 3549 4934
4308 7052 3603 6516 945 3511 617 5820 4168 5622 4545 1242 4382
1781 3490 4461 2464 6762 4082 2975 6166 894 1316 5228 5057 4644
5319 784 7037 3831 3570 853 1703 5064 1011 1642 6895 863 4176
1115 5811 4326 4263 2325 2685 223 6496 669 571 5057 1096 3594
7208 3140 3336 992 3516 4296 4492 5796 1875 3068 4970 6802 2652
214 6831 3611 2470 846 640 2983 2208 5295 5924 5242 5747 3017
1208 974 4819 2163 1631 1198 4570 2983 3664 2253 6131 4672 4698
3272 3537 4532 346 4936 5696 1275 6386 2124 7138 1179 4236 5891
3688 3376 6079 2437 4585 6404 1101 2289 378 6773 2800 2195 5013
3121 6579 5086 4192 3925 6844 4327 6329 6075 2738 6941 4088 4631
5613 2332 1432 5655 2516 5657 5383 3494 1235 3237 3282 449 1982
4339 6071 3262 5233 7004 390 2526 4128 3762 1284 4669 5897 6506
5840 2240 5046 1769 2539 6637 5000 4013 2325 1798 4680 6318 6746
5262 215 6980 2436 6086 1764 4227 4273 3163 2663 2406 2037 2549
649 4346 2391 420 3069 4930 6338 1834 6713 7013 1483 1918 2122
4147 1365 240 6277 6965 2436 2263 1334 2766 3525 5125 5808 4540
270 479 6244 2162 1409 7159 621 1439 4703 6526 6147 2701 7284
5510 558 3472 4520 7268 6903 4942 2301 4603 3451 512 3982 1219
30 2433 3797 469 4999 1845 6340 2327 1127 4663 6218 2112 4826
4851 1442 312 4788 5715 2449 2205 5056 1293 3985 1505 5768 5534
2604 6887 1831 1693 3557 5558 4425 3317 908 6236 5087 2257 3043
7159 3988 4837 4823 2208 908 6145 7232 1654 5099 5820 154 5058
3816 5710 5209 4080 5824 3820 7136 7066 6226 4999 4818 3081 1008
2378 3443 4210 525 3330 6183 1159 5073 5340 5786 3287 325 590
4048 4667 2821
4634 4645 2287
6592 580 4814
4375 4460 1799
160 2686 372
2129 5124 2066
1088 5047 995
226 5085 6263
2380 6679 3460
3011 3728 368
2642 365 3253
3801 2032 824
3243 4488 7088
6069 1002 1830
5718 3944 5213
7126 4207 5638
5780 1663 1081
1969 7238 1671
188 6826 499
5878 4110 393
2845 3816 3302

TABLE 1p-continued (Rate 11/20) ($n_{ldpc}$ = 16200)

3755 2810 3055
5876 4890 3663
4288 2134 2926
2633 964 5454
2540 4811 2737
7149 2494 3042
7140 3546 376
4567 5871 4351
797 4245 7178
6811 6722 1351
5102 7241 6537
6828 1345 266
3094 2749 3658
5328 2573 1454
6444 5267 4847
1407 1305 6597
665 860 1934
6150 4115 3799
4362 4407 6956
6703 1355 2152
943 3688 6536
1737 1856 3374
6987 2896 3414
4897 1339 3530
6599 2011 6911
4907 4542 3723
4374 1444 3344
568 4887 4732
6402 1609 4422
2809 2306 570
3063 4645 2697
5994 505 5805
1353 74 6648
1738 725 4900
1614 5497 841
649 731 3474
4246 1530 6986
2023 4976 259
6173 987 5313
2276 3770 4029
5101 4900 3767
6863 3991 2090
6639 1708 6603
328 1674 1476
3494 1497 3083
5233 4103 6677
2522 6812 6404
25 1986 409
2739 1882 3534
1958 861 7072
1958 2364 5609

TABLE 1q (Rate 23/36) ($n_{ldpc}$ = 16200)

4626 1140 3468 5725 2133 2303 473 1009 822 4351 2620
4725 4712 5060 4753 2897 5002 147 236 1234 4181 103
3305 947 2893 3155 3944 5064 1931 2538 3341 4027 4268
5630 671 2963 4446 1161 4388 5381 4986 5105 5817 4928
4420 3543 3452 5455 4711 3255 1654 2549 2963 1256 2235
1127 171 2482 1282 75 1645 2833 5326 2386 4508 4547
3789 1497 5124 2650 2370 4577 1421 962 2986 1788 4993
5240 1659 1071 980 4674 2477 5373 5719 1828 3904 5050
2516 58 4982 5550 5600 3411 1568 3674 2916 4767 5114
3143 4289 2589 1305 4489 1050 5696 1860 2030 4584 1514
4425 3025 5051 5435 5675 2726 81 5031 193 4032 3282
228 392 4389 2396 5698 5563 4218 1740 4605 714 5520
3616 5534 1115 2065 1267 128 2019 5820 791 4558 5700
4883 2655 2903 2269 4669 367 3392 3845 1937 581 928
713 4773 2637 1195 2941 3974 2614 2251 2311 3724 357
5847 1614 543 1039 4426 2821 3108 2323 224 4424 622
4731 2476 5740 1002 5065 4869 1384 50 5035 825 1302
2500 214 5711 4191 4268 5218 3679 1327 4629 921 1368
2672 429 4639 1916 4278 3126 3440 50 3976 5237 4865

TABLE 1q-continued (Rate 23/36) ($n_{ldpc}$ = 16200)

2990 911 1768 4500 992 4704 5171 1737 4858 244 5647
4413 3838 930 1764 1832 4028
4958 4098 1522 1326 701 432
63 5603 3397 4963 3719 1757
545 3634 2417 51 476 3169
1744 2751 3068 2754 5788 435
502 3431 5141
217 5343 2096
1154 5301 5455
1306 5538 1821
3787 3714 805
967 4366 40
5228 624 3319
4013 4113 2110
1412 4137 2376
5135 3884 4890
512 5327 5807
2441 3652 5512
3623 1827 1019
1357 2629 2039
4047 4608 152
1129 634 4708
5165 4941 3432
1682 2583 437
4956 989 3149
2444 5476 5063
3147 93 2652
2694 3510 3484
5215 3576 5330
1214 1301 4752
2544 665 1669
3425 3851 917
1677 1696 4385
3184 5716 2684
416 1587 5466
5117 807 402
1819 684 2619
1271 5820 1818
1010 3901 2373
3739 4706 823
3718 3738 565
5476 4945 1396
4745 4776 2784
1079 918 677
3991 5626 3195
2401 1007 3257
1378 5770 2213
4972 2611 2515
4883 4015 4442
3965 5844 448
4852 2035 3579
1090 4495 2482
3385 2415 5603
3036 2307 2416
4994 4832 4212
380 38 2773
2057 1308 436
2291 924 3045
3575 3084 4507
4803 3768 1673
118 4804 3762
2931 4736 5619
1357 2531 3547
1153 343 2676
3784 1810 4515
2576 348 1551
2939 4088 834
5396 1260 3465
1734 803 907
2471 257 1523
1632 3775 2968
5100 166 4352
962 1869 5173
47 4415 5040
782 2449 1611
2239 4649 1664
4422 4211 4708
5777 5762 2579

TABLE 1q-continued (Rate 23/36) ($n_{ldpc}$ = 16200)

4418 609 3241
5088 3031 4033
5306 3404 2633
3330 4899 3679
2287 584 5181
4162 3310 1783
2487 2229 334
5507 508 5296
5348 4143 1902
4200 3938 2790
5150 5834 4250
4392 5223 5221
1662 2779 170
2942 116 2334
134 4175 1970
1114 4668 2250
3336 393 1764
3709 5156 3925

TABLE 1r (Rate 25/36) ($n_{ldpc}$ = 16200)

3717 2086 2490 983 835 4687 4347 4476 3404 1761 576
4145 578 368 2845 3005 909 364 3235 3961 4076 512
936 592 765 2964 746 1927 4924 2903 3317 3261 1270
4535 4082 4236 1298 2632 3931 2365 4093 4275 1695 2374
428 2881 2308 1623 277 3560 3583 2093 2563 3756 2174
186 101 1014 1629 496 1763 2714 3520 1193 243 2712
2503 1332 1039 3201 3305 4587 3408 433 267 4567 3310
3949 1938 280 3951 4404 4528 4292 2791 2944 1533 1437
274 1965 2557 4701 2488 858 3540 2134 342 4890 2891
1947 1353 2021 1422 388 3045 605 2847 4059 1204 3680
1505 2758 3764 1874 2296 4804 337 2581 1810 2235 3623
3387 484 262 177 3981 2578 3711 215 4569 3281 572
949 2395 1082 1689 2912 45 2900 4391 1219 3966 3939
1521 3156 557 2258 1247 4471 1347 349 1683 4762 2854
1469 1924 3164 1079 1270 4828 2363 2104 1792 22 3231
2775 2423 3177 2287 2571 2530 3480 374 4526 4713 4760
3606 1798 2371 2510 4392 2655 3731 635 1264 4808 586
1530 3539 4714 4507 3826 4767 4887 750 3153 2851 2381
3547 3114 4280 4442 4710 4773 3920 4356 2976 1155 1394
9 2545 879 4188 4150 69 1372 3483 1347 2676 698
2922 2547 4926 391 2998 2896 3684 92 470 884 3186
3751 999 2259 575 4155 2053 337 353 3449 65 2292
726 4700 4012 3049 3508 1443 2438 132 3100 4427 2810
2208 3640 1993 4029 3104 3956 3298 1291 9 2926 39
1053 3365 1223 344 4142 3983 1564 3438 271 3187 2143
1179 1422 4808 4103 4814 3081 1550 2594 679
3404 344 1749 1011 449 4522 3490 2052 757
2508 2035 3087 2578 2330 3765 883 3322 3949
2156 1486 1230 4166 4106 3157 3789 1804 4237
4644 4832 538 2571 1231 83 3391 968 620
3841 4072 430
3715 3034 3594
52 1688 1107
2451 2790 4493
3131 4635 3197
714 231 4226
2122 961 1094
1118 1540 1550
1283 940 3985
679 914 952
983 3030 868
353 562 4129
3178 1719 931
3248 659 378
122 3064 1132
446 86 2986
399 3004 1700
217 4511 4712
3852 3189 4715
3500 4823 2186
2221 1472 4220
4206 376 1077

TABLE 1r-continued (Rate 25/36) ($n_{ldpc}$ = 16200)

602 1281 4257
1385 4528 1354
2730 2701 738
2008 3989 3825
302 664 995
3473 4540 2668
1663 2271 2465
2334 3551 4028
799 3523 3877
3738 3999 2832
2187 4404 597
1291 2382 1411
3478 831 1080
1720 460 2630
548 1359 3736
943 1813 396
3447 1040 55
1438 3007 2305
99 4399 2097
672 127 1972
2670 3843 2060
4500 2824 1088
3904 1646 3473
920 1832 3307
1885 891 370
3530 3988 1530
1622 3751 2515
4840 4819 532
2263 4213 1894
3241 2172 1720
1298 3976 780
3088 1683 4340
3075 2980 316
2455 1701 1106
2560 2811 151
2481 3157 1670
552 1329 3876
3378 1137 4060
37 1087 4074
2256 787 1840
4448 2800 3711
744 3710 4914
58 2171 2569
2173 1552 3975
4486 1025 2337
3313 1972 3531
1465 1836 3509
452 2216 2993
3440 3921 3059
1143 2621 1196
3864 2468 3362
4556 3153 3242
825 53 4058
1046 3814 550
169 1123 533
2467 4843 1523
64 3493 3882
2708 1378 647
3834 4460 1989
3734 1011 4453
847 3376 3723
1065 1964 4882
2409 3797 651
3980 4069 4291
1004 4321 4214
2961 4944 2277
1984 4617 3331
1022 1204 1943
992 1609 2287
438 2425 1553
1922 2389 2119
3996 574 2810
3813 2944 4546

TABLE 1s (Rate 13/18) ($n_{ldpc}$ = 16200)

2192 1265 868 3272 569 2864 2608 666 2275 105
2140 2364 299 3944 3601 3720 588 2437 3256 823
1834 2010 1287 96 3400 491 1853 892 3359 202
1517 4347 1598 3895 686 2526 434 28 18 1702
582 3070 1123 1334 3288 1717 1954 3993 2483 2045
35 441 713 2921 3908 2027 3853 2180 1670 1473
2087 2054 3055 2764 1440 2563 1192 2573 3322 4436
4435 1417 1879 1661 1555 2334 1473 2207 4190 172
2640 4281 2091 3492 2509 339 3293 105 3822 445
1170 1350 1994 2696 3867 4048 3816 845 3661 1841
3485 3973 522 4150 3497 1752 284 387 2392 2776
1116 3378 1486 1249 4354 1539 2944 93 1914 1602
2903 3143 3574 179 1280 149 2558 2450 1120 4418
1355 3730 570 4107 4422 4406 1492 4313 4415 2767
1547 4305 1658 1693 289 654 3281 3159 1076 798
3801 1160 462 1419 3371 924 3575 2427 232 4083
1375 29 2364 2909 2843 3668 432 2488 183 4498
752 84 663 3968 1901 2766 2056 1497 1087 3498
4169 933 2713 3947 2418 1075 685 99 1010 1144
851 4150 2141 48 2111 4190 3875 1906 2883 794
2357 662 2065 971 3174 3127 3428 2481 3696 1816
3712 1751 3777 3381 3107 486 2649 3947 4335 1971
401 1539 3940 3111 3506 2088 1113 91 2769 1509
888 1769 960 2853 2485 433 2329 4489 3907 4394
2800 2226 3816 1352 4429 2481 1632 2459 3107 317
2662 1465 624 2078 980 2296 714 3758 838 4479
3212 3165 160 2037 3445 4296 626 2678 254 2577
1510 4195 2262 4158 3656 4026 2203 3427 199 3904
361 471 3274 930 1932 4386 2789 1078 475 2319
1903 1961 3515 1121 1374 3930 3231 1782 36 3846
3586 4292 1220
3459 1843 4285
2959 3197 737
1475 2767 3284
2071 4248 1601
1692 3935 783
1613 4030 3217
3574 4439 2783
1366 1849 1685
3923 2519 2224
559 1215 663
2654 2213 1720
2642 4206 253
3869 2100 1908
738 1269 2067
1314 3511 4104
251 3250 1429
1997 557 2622
2684 4196 3297
4162 1270 3774
4377 1188 1614
178 910 3254
1707 4401 684
1006 1808 933
160 73 4031
2416 131 3480
3545 661 3762
1057 3179 999
1545 4068 352
4394 2240 3846
794 4489 505
1749 781 1561
3982 1960 2888
3246 2468 1277
3752 2091 964
4143 1702 2300
2330 505 3566
4190 1808 2698
2173 4106 1144
1822 4295 462
3187 793 175
3276 415 3371
1725 4436 1079
3227 4428 2968
1471 1103 926
3455 2826 2803
2122 1078 3315
640 387 182

TABLE 1s-continued (Rate 13/18) ($n_{ldpc}$ = 16200)

3191 1486 4489
4282 2241 3748
589 4076 2164
567 677 490
3887 2508 1393
764 577 3086
2108 2784 1762
1281 601 460
3810 429 4396
3043 125 1429
1028 3836 2717
3938 279 2184
4248 466 1653
3827 2192 889
1522 2435 3058
3583 1619 2134
3857 3089 814
301 4380 320
1628 3244 3490
1838 2136 632
4093 3101 1319
3738 1154 1331
1965 2897 3650
4390 3487 1768
2578 1487 3465
665 4350 1083
2935 2974 1354
2782 1726 2041
292 2848 4068
118 2581 3525
1283 691 2946
2957 21 1450
3182 1709 2373
1320 2098 3911
1752 2805 2426
2356 2885 3662
175 1446 3774
709 2773 1345
1704 963 912
3353 4220 16
599 463 3105
3157 41 4244
3244 72 410
455 2849 1847
1197 174 4056
2745 1903 1271
171 3511 3072
395 4469 892
2567 2413 1956
2430 1349 4352
2561 1030 2
1809 3416 3973

TABLE 1t (Rate 19/36) ($n_{ldpc}$ = 16200)

1282 5463 2055 1492 6457 6767 3505 1482 1439 6574 60 2796
3840 1600 3301 4638 7064 6019 1981 620 1585 6357 6215 2923
5347 1877 1546 5034 3058 1839 4485 7647 5859 1883 424 2650
5559 1779 574 4934 42 765 2647 3586 4426 4731 1714 2322
3561 5920 4388 5319 217 1430 6897 3410 5416 6595 7285 130
2164 141 7069 6618 2274 2510 5625 1070 6638 6664 3156 6564
7425 3088 3992 7531 1469 2669 763 7347 3322 5053 4922 5014
3202 627 991 1165 3897 6116 7469 1315 4928 1483 1555 2699
2262 2815 2251 1615 6892 6023 1882 4243 3593 3012 3144 1914
6929 3722 3145 3032 3864 4084 1371 657 4019 4635 5898 1009
5077 1866 4950 3746 2553 5393 5486 5144 207 1921 5618 7390
7155 464 494 5977 144 4421 2752 5922 1530 481 3468 321
5883 199 3099 2896 3951 4141 6906 3162 3695 3899 2980 2973
4003 3742 3750 7130 6877 839 2928 2543 5169 5148 2056 41
2080 2599 2722 2416 3253 3228 5591 6946 2811 222 1503 1297
4977 2500 5383 1994 5541 298 3762 2433 1419 5906 237 494
6274 3527 2583 5711 4866 4231 3453 365 2829 5364 6965 3810
4376 885 826 4987 5634 3645 5630 3278 6526 7357 7587 5871

TABLE 1t-continued (Rate 19/36) (n$_{ldpc}$ = 16200)

163 4849 1441 4931 5085 1060 6817 906 3155 7471 7393 424
7341 4823 6053 991 7013 7624 2416 4062 3427 6316 7269 947
6047 326 2745 402 6140 4286 2383 6100 6343 5747 1647 5145
2211 3555 4423 5854 3333 6933 3469 594 1374 1127 5235 3114
3804 2214 6081 757 124 2885 2678 3407 2159 2007 5604 2084
2605 4435 3893 1119 5601 4518 1252 5314 7546 5244 2570 1794
6227 4193 3178 2890 4720 5205 2902 3488 5583 3873 5066 967
1809 3834 2284
2649 3798 1431
7547 4545 7423
3136 1389 3355
1919 879 7098
7396 3276 1101
5577 6466 243
6253 7271 1017
3678 2005 2227
1249 6514 7267
2076 4668 4521
7170 2955 1293
741 4839 5039
2957 2363 5604
3846 1306 753
604 2017 2464
6487 2840 7272
6063 7068 42
113 1406 1468
2423 181 1942
5402 4675 1733
1596 5823 3523
1958 994 3816
5818 1244 4898
6341 7032 5426
1432 326 5651
3397 5072 2443
2461 4560 2472
3758 3050 2297
5776 6071 1640
3546 4878 5368
2438 1294 6553
5618 5324 5595
4194 3383 5457
2707 1713 932
3538 1262 5996
6778 1405 6942
3091 4905 6802
3748 5126 4580
243 3252 5151
7106 3489 5405
5216 2129 5194
4300 5641 1046
6143 3885 2161
864 791 6392
1100 5526 2661
4948 6150 925
3893 3038 4340
7175 5967 7475
3905 7246 2988
5017 7236 2542
4959 4592 2020
4870 6237 5239
515 2569 6152
7596 1508 600
2636 5149 3379
969 5263 7120
6849 3730 1755
19 134 908
1085 820 2457
4609 1863 683
3633 1875 4627
122 877 2706
27 6193 2665
7028 1598 3375
6927 5785 1347
5121 3665 1560
2584 4965 1456
3102 5026 914
7416 6150 4030

TABLE 1u (Rate 26/45) (n$_{ldpc}$ = 16200)

3342 3896 286 2799 122 225 3074 527 4736 3291 6197 2055 782
2969 1015 3879 2215 2097 5913 3800 1450 4137 790 1711 4937 623
6654 764 5116 4633 2954 865 2768 1454 1505 4122 723 2893 3735
6674 686 6731 1152 1737 233 2045 6701 3020 2515 1392 1713 4962
3036 5227 4443 4815 5354 2875 4808 5610 912 2730 986 2966 6108
2589 2092 1356 6550 1153 1339 3811 6686 1612 4420 2154 1200 1202
46 5462 3392 2073 2641 2443 178 5965 451 3212 2712 2321 5295
3041 5632 4645 1917 1539 5801 4287 4140 3458 4908 1417 4610 6057
2469 6087 2938 2996 4452 3322 5275 5166 5231 556 2041 2394
5471 6178 3006 5507 6712 5367 70 3959 1974 4989 155 2620
119 3604 1833 3274 3612 4535 3651 1817 1942 2366 1835 1467
3842 4887 1502 5090 525 189 1386 3053 4727 5460 3135 3389
527 2521 2140 4513 5491 4293 5095 689 67 2882 4257 349
3269 3282 4172 3853 5318 2806 4695 1735 4460 6257 1798 4657
2292 2320 2999 4233 5016 3609 278 4528 6127 466 2331 926
6766 1132 3582 4533 678 1157 5108 3778 1832 4139 5790 5090
2141 6398 5184 4222 2042 6207 5466 3168 1871 1264 5917 6314
3659 2310 1742 5445 4140 6000 5150 1155 143 3400 2639 5768
2780 4987 1835 4146 6628 5734 4237 6148 4325 6696 2274 4915
3676 6728 5428 2176 5486 2627 4986 1929 68 742 3802 6509
1799 3406 3884 5524 2206 2757 896 6338 6365 6313 3387 1768
1345 2571 3380 5248 5100 5081 600 5783 4252 5992 5409 2738
1274 806 5715 3236 5172 1209 4525 5625 2842 6628 2395 5353
6118 4629 2380 3807 6094 3715 6294 4945 4441 1998 2041 5513
3323 4863 5342 1204 5258 5620 1792 4297 2964 3532 3457 2602
4708 960 2403 4037 3741 5923 5594 3939 4940 6339 2330 6292
4804 3631 6783 1879 2106 550 5910 2807 6503 4535 5812 4836
2742 35 5825 787 2097 3210 1116 2407 3792 903 5096 6116
4529 3796 2160 6276 3078 3567 3214 5177 3631 1224 285 4740
4420 1573 6196 5175 5035 3928 2295 4470 1737 5276 1239 6625
2942 4132 2375 1607 3463 5951 1281 82 1012 3477 1806 4920
1925 5574 5913 379 983 5057 6791 2752 1852 1132 3663 2878
2753 3655 1523
3624 6439 3113
6090 4755 4901
6589 2815 1145
2363 3350 5683
1992 1301 2028
1707 6200 5759
6062 6802 6165
4302 929 1545
6677 4104 109
3925 185 789
3408 6198 5102
459 2275 4508
5677 6836 4901
2072 6137 2648
2512 4391 5684
5406 2791 4801
2737 1955 3948
1201 3711 4746
1808 3060 3372
3310 555 188
133 3764 3949
2517 173 5046
3770 6557 4844
1249 2441 2706
5831 3683 2025
1935 2155 5753
3247 4264 5927
929 6555 4057
5649 1061 1378
2182 3482 1173
4857 2834 3977
4818 1849 516
3296 6744 4295
1249 2379 5218
386 1945 1673
3218 2083 4442
549 1634 2488
5987 1064 6001
2585 1821 5471
1009 6675 2846
4145 3467 3817
1096 6516 2071
2266 616 6128
6668 6004 5264
6787 5425 2438

TABLE 1u-continued (Rate 26/45) ($n_{ldpc}$ = 16200)

2641 5574 6634
3556 780 5997
2387 4854 911
2855 4426 5797
6375 2520 6703
4228 6706 154
3603 3039 900
6570 6006 1980
2520 4509 863
1048 5120 6272
2444 2648 3009
39 455 2371
3763 3299 1389
1369 1042 5140
1690 6798 5400
6540 121 3308
4059 3300 4207
713 2486 4294
5370 4587 4522
3069 4534 5502
1111 3750 6526
750 5578 2265
1483 5754 1394
2879 4317 4966
1429 1891 4930
4675 745 5615

TABLE 1v (Rate 28/45) ($n_{ldpc}$ = 16200)

2216 5353 6062 4045 2714 439 5415 1685 2362 1169 4069
4589 1144 2027 368 1630 3581 3086 1765 399 916 2662
4830 39 4003 2405 4737 4538 3125 2372 3690 4433 4812
3027 3019 5751 2219 883 2853 329 5644 2032 687 631
5202 3622 1372 4048 1947 4836 4630 5995 2000 933 917
1916 3151 4394 500 2889 2079 533 1817 6090 4829 5007
462 1363 4535 2260 2567 3541 3963 639 2123 3398 4196
1880 4933 3898 5325 3699 195 2509 6098 5401 2490 1934
4540 2715 2247 70 2526 5625 5855 3484 5293 3423 4853
2217 3597 5507 3633 5580 978 3900 479 5950 685 5778
186 1898 160 5418 197 2148 3231 3009 1214 2492 4687
3664 3441 4152 4621 3875 5621 2310 3414 3746 1618 1397
429 446 1402 5545 6016 218 255 4024 647 4204 3631
5470 173 871 5457 3157 619 2109 4665 5695 1996 2972
5885 3967 5368 2835 5308 1675 4930 633 3581 1814 3494
5422 5575 4330 1686 479 1866 2365 2688 4753 698 5772
5857 2196 895 1433 4470 3550 740 431 418 2955 45
5727 5395 2902 2394 2986 5308 4595 535 1194 1834 632
1280 501 5445 5943 21 6059 5488 5287 2276 985 1833
220 1823 4772 476 5431 1362 9 1039 5597 2429 638
1928 109 5380 3549 2870 2193 5084 1568 74 1281 5299
5525 4099 5879 1684 5362 3542 1402 5044 3685 2767 3204
99 4201 1599 3598 5362 5780 3135 2119 54 986 1831
1858 1152 123 3250 936 4422 1254 1437 1101 615 1899
86 239 3572 3224 5850 3362 4258
1598 2433 1343 4786 40 4646 2069
1058 1453 877 418 1551 3509 4693
1851 1040 3104 388 4688 2306 5765
5836 1650 1988
398 2185 6068
4904 3583 4510
6071 2846 2144
5664 44 3840
2468 2632 5795
2988 3769 515
164 4562 3784
144 6001 5591
6032 1728 3749
3265 2300 4986
3085 1052 5096
2078 4664 1088
1119 6053 5544
11 3944 5079
3955 3576 1087

TABLE 1v-continued (Rate 28/45) ($n_{ldpc}$ = 16200)

3175 457 492
5024 4484 174
572 2038 1979
4792 42 2230
587 3850 2663
2563 5654 1013
3026 465 4617
173 4316 1702
2914 5227 965
3472 5892 2667
256 5291 820
2850 1079 1882
4774 5825 5021
178 1791 3300
5047 6031 2350
5957 5190 4900
5174 1441 964
4274 599 1710
5031 2827 5490
3188 4508 628
5088 2262 3594
2622 954 499
76 4082 2678
4959 1174 5858
4221 2400 1477
3539 2175 2334
550 3994 639
5229 1628 4748
4845 157 1272
4726 1588 4984
3113 3011 5302
4257 4843 5548
1230 2197 2376
3119 3906 3481
475 2111 5481
5658 2372 5009
1651 12 2607
5285 5932 2683
1601 463 3431
5828 3783 4119
2358 3276 1966
1515 5809 1550
5938 3060 171
1727 2096 1254
5366 3267 1232
1867 4901 620
592 4316 5369
841 5451 1322
3247 2038 3029
823 4017 2171
408 788 4184
5128 2568 4318
5144 5968 5917
2086 5748 4216
322 5021 5857
1437 2016 2406
3114 1467 2221
3485 2093 2355
5344 3836 2942
3611 595 1241
3973 1357 1795
1685 5201 3401
79 1248 29
2269 2462 3871
4429 501 4446
4931 3977 4761
1207 3693 1461
4852 443 2989

TABLE 1w (Rate 31/36) ($n_{ldpc}$ = 16200)

1271 1259 112 172 1770 1792 355 58 2103 1704 151
1728 542 1193 1157 1387 388 576 252 159 325 2049

TABLE 1w-continued (Rate 31/36) ($n_{ldpc}$ = 16200)

1249 242 682 894 1040 1879 1088 233 597 1360 1189
761 1734 353 1039 817 1202 481 1401 855 1310 2033
1358 192 205 1906 860 1749 1216 1195 1550 484 1444
2004 589 1048 1927 883 2115 1203 705 1163 1482 531
2043 1375 504 682 1896 1312 984 845 928 1692 1139
2073 543 1326 219 970 1550 166 79 2110 1152 253
1651 1032 2079 493 764 266 848 1522 469 31 945
1553 564 1144 712 1499 1870 1747 688 1450 1821 58
2060 1607 1502 946 240 1559 668 1214 2213 1426 294
2033 1878 115 986 1285 609 572 257 2245 1605 2006
2152 685 1059 314 737 2055 467 1593 940 1432 1979
2140 1056 562 564 1749 1022 1835 626 1892 2155 266
232 788 222 1608 2062 1723 1480 1439 666 1715 76
325 354 1846 1328 1768 623 361 1766 1660 1351 2052
1977 1504 1224 157 1645 1512 298 1201 50 1606 1917
1846 619 2045 90 1503 1729 911 1252 497 1984 1917
798 1638 1309 1658 1436 1565 1260 1019 1568 1106 371
1361 1316 2074 2175 2146 1618 755 148 1783 1263 2231
918 2061 1546
1441 1356 927
1574 1021 1888
1737 1386 38
1665 1125 1069
744 1512 1136
336 1995 916
430 1673 1022
1799 2175 1391
472 273 1724
410 2180 2169
1411 2238 398
2105 812 1516
162 178 193
1116 1510 1261
1711 1619 1045
1912 451 415
1258 1141 1477
1001 377 1807
543 1352 438
1868 1658 929
2145 176 2042
1934 250 24
1874 825 1230
1170 2075 806
846 2082 2190
134 1471 479
2167 669 1857
590 1131 2078
73 1484 1108
2004 647 306
246 1492 1838
799 914 310
1489 722 1978
39 72 1748
1695 931 666
1559 1192 275
365 1229 1142
1738 1035 1955
1433 1573 1640
1152 1924 83
873 702 1020
1837 1776 2036
1782 441 1755
1498 1210 1513
1070 2193 296
313 300 2187
511 2243 1099
824 1456 1396
258 2243 607
287 1021 1782
1027 1611 1265
316 1153 704
814 1679 978
2192 709 1144
1253 856 64
1989 1251 1880
1434 172 944
1447 1200 776
1010 1844 747
655 582 1313
1664 2197 1385
2168 804 733
1711 981 273
367 161 1003
489 1422 1055
1710 1864 1729
1869 2240 891
567 649 475
952 1503 129
594 200 1215
1906 40 1952
1778 458 52
180 1098 1682
1757 2022 1487
1320 1148 1562
2006 2101 546
783 1711 1366
1141 85 1184
1376 268 1045
720 263 701
1844 1742 938
1909 2171 1093
74 421 1912
1675 309 974
1112 243 1691
139 2151 1557
2208 2057 2196
2135 1657 1026
852 1879 1397
381 2248 968
67 1315 1126
1909 258 955
1342 1238 1010
1499 511 1717
658 1841 831
1993 687 1484
631 2186 1496
625 1438 945
1210 675 1534
1394 1991 1771
1820 550 780
1537 61 1189
278 1672 2149
972 1289 1838
1330 819 348
2220 399 1644
1748 353 890
1477 904 1690
802 203 1529
1338 616 380
1246 806 1383
1237 1580 1651
1369 828 1964
1950 862 840
1356 2087 1674
1477 1996 1506
885 2093 179
282 189 42
992 1516 2005
576 225 470
1543 1320 402
2021 1020 694
2134 165 1499
1474 268 1082
1063 561 242
1111 554 1653
1416 401 19
1753 2064 1052
1447 2035 890
1260 963 1975
1536 1129 1158
984 373 1707
1697 623 1184
8 97 648.

2. The method of claim 1, wherein the LDPC code is of a structure that facilitates use of a plurality of parallel engines for decoding the coded signal.

3. The method of claim 1, wherein $n_{ldpc}$=64800 or $n_{ldpc}$=16200, and wherein
m=360 for $n_{ldpc}$=64800, and m=90 for $n_{ldpc}$=16200.

4. The method of claim 1, further comprising:
modulating the coded LDPC frames according to according to one of the following modulation types: BPSK (Binary Phase Shift Keying), π/2 BPSK, OQPSK (Offset Quadrature Phase Shift Keying), QPSK (Quadrature Phase Shift Keying), 8-PSK (Phase Shift Keying), 16-APSK (Amplitude Phase Shift Keying), 32-APSK, 64-APSK and 256-APSK.

5. The method of claim 1, wherein the source data sequence is segmented into a series of baseband frames, and the method further comprises:
encoding each baseband frame based on a t-error Bose Chaudhuri Hocquenghem (BCH) code, wherein the BCH encoding comprises an outer coding and the LDPC encoding comprises an inner coding.

6. The method of claim 5, further comprising:
interleaving each coded LDPC frame using a block interleaver, wherein the coded bits are written into an interleaver array on a column-by-column basis and read out on a row-by-row basis, and the output of the interleaving comprises coded FEC frames.

7. The method of claim 6, wherein the interleaver array comprises a number of rows and a number of columns, and the coded bits are read out of each row in a predetermined order, and wherein:
the number of columns in the interleaver array is based on a selected modulation scheme as specified in the following table:

| Modulation Scheme | # of Interleaver Array Columns |
|---|---|
| 8PSK | 3 |
| 16APSK | 4 |
| 32APSK | 5 |
| 64APSK | 6 |
| 256APSK | 8; | and
the order in which the coded bits are read out of each row of the interleaver array is based on the selected modulation scheme and a selected code rate as specified in the following table (where the numbers reflecting the bit interleaver patterns chronologically signify a respective column of the row being read out, with "0" signifying the leftmost column):

| Modulation: Code Rate | Bit Interleaver Pattern | Modulation: Code Rate | Bit Interleaver Pattern |
|---|---|---|---|
| 8PSK: 23/36 | 0-1-2 | 32APSK: 7/9 | 1-0-2-3-4 |
| 8PSK: 25/36 | 1-0-2 | 64APSK: 13/18 | 4-1-2-5-0-3 |
| 8PSK: 13/18 | 1-0-2 | 64APSK: 3/4 | 2-3-5-0-4-1 |
| 16APSK: 19/36 | 0-3-1-2 | 64APSK: 7/9 | 2-0-1-5-4-3 |
| 16APSK: 11/20 | 2-1-3-0 | 64APSK: 4/5 | 1-2-4-0-5-3 |
| 16APSK: 26/45 | 3-2-0-1 | 64APSK: 5/6 | 4-2-1-0-5-3 |
| 16APSK: 3/5 | 3-2-1-0 | 64APSK: 31/36 | 2-3-4-0-5-1 |
| 16APSK: 28/45 | 3-0-1-2 | 256APSK: 2/3 | 1-3-2-4-7-6-5-0 |
| 16APSK: 23/36 | 3-0-2-1 | 256APSK: 25/36 | 4-2-3-5-1-0-6-7 |
| 16APSK: 25/36 | 2-3-1-0 | 256APSK: 13/18 | 4-5-3-2-1-0-7-6 |
| 16APSK: 13/18 | 3-0-2-1 | 256APSK: 3/4 | 5-1-2-4-3-6-0-7 |
| 16APSK: 7/9 | 0-3-2-1 | 256APSK: 7/9 | 2-1-3-5-4-0-6-7 |
| 32APSK: 2/3 | 2-1-4-3-0 | 256APSK: 4/5 | 1-3-4-2-7-0-5-6 |
| 16APSK: 31/36 | 1-0-3-2 | 256APSK: 5/6 | 3-5-6-1-2-4-0-7 |
| 32APSK: 13/18 | 3-0-2-1-4 | 256APSK: 31/36 | 3-4-1-2-6-0-7-5. |

8. The method of claim 7, further comprising:
modulating the coded FEC frames according to the selected modulation scheme, wherein the selected modulation scheme comprises one of the following modulation types: BPSK (Binary Phase Shift Keying), π/2 BPSK, OQPSK (Offset Quadrature Phase Shift Keying), QPSK (Quadrature Phase Shift Keying), 8-PSK (Phase Shift Keying), 16-APSK (Amplitude Phase Shift Keying), 32-APSK, 64-APSK and 256-APSK;
wherein, in the case of BPSK, π/2 BPSK or QPSK, the coded FEC frames are not interleaved.

9. The method of claim 8, wherein the selected modulation scheme is a 256-APSK modulation based on a signal constellation of a 32+32+64+64+64 ring format, having bit labeling and [x, y] bit coordinate positions as follows (where $\epsilon_s$ represents average energy per symbol, $32*R1^2+32*R2^2+64*R3^2+64*R4^2+64*R5^2=256$, and R1 represents the radius of the inner-most ring, R2 represents the radius of the next outer ring, R3 represents the radius of the next outer ring, R4 represents the radius of the next outer ring, and R5 represents the radius of the outer-most ring):

| Bit Label | [x, y] Coordinates |
|---|---|
| 00000000 | [R2 * $\sqrt{\epsilon_s}$ * cos(π/32.0), R2 * $\sqrt{\epsilon_s}$ * sin(π/32.0)] |
| 00000001 | [R1 * $\sqrt{\epsilon_s}$ * cos(π/32.0), R1 * $\sqrt{\epsilon_s}$ * sin(π/32.0)] |
| 00000010 | [R2 * $\sqrt{\epsilon_s}$ * cos(3 * π/32.0), R2 * $\sqrt{\epsilon_s}$ * sin(3 * π/32.0)] |
| 00000011 | [R1 * $\sqrt{\epsilon_s}$ * cos(3 * π/32.0), R1 * $\sqrt{\epsilon_s}$ * sin(3 * π/32.0)] |
| 00000100 | [R2 * $\sqrt{\epsilon_s}$ * cos(7 * π/32.0), R2 * $\sqrt{\epsilon_s}$ * sin(7 * π/32.0)] |
| 00000101 | [R1 * $\sqrt{\epsilon_s}$ * cos(7 * π/32.0), R1 * $\sqrt{\epsilon_s}$ * sin(7 * π/32.0)] |
| 00000110 | [R2 * $\sqrt{\epsilon_s}$ * cos(5 * π/32.0), R2 * $\sqrt{\epsilon_s}$ * sin(5 * π/32.0)] |
| 00000111 | [R1 * $\sqrt{\epsilon_s}$ * cos(5 * π/32.0), R1 * $\sqrt{\epsilon_s}$ * sin(5 * π/32.0)] |
| 00001000 | [R2 * $\sqrt{\epsilon_s}$ * cos(15 * π/32.0), R2 * $\sqrt{\epsilon_s}$ * sin(15 * π/32.0)] |
| 00001001 | [R1 * $\sqrt{\epsilon_s}$ * cos(15 * π/32.0), R1 * $\sqrt{\epsilon_s}$ * sin(15 * π/32.0)] |
| 00001010 | [R2 * $\sqrt{\epsilon_s}$ * cos(13 * π/32.0), R2 * $\sqrt{\epsilon_s}$ * sin(13 * π/32.0)] |
| 00001011 | [R1 * $\sqrt{\epsilon_s}$ * cos(13 * π/32.0), R1 * $\sqrt{\epsilon_s}$ * sin(13 * π/32.0)] |
| 00001100 | [R2 * $\sqrt{\epsilon_s}$ * cos(9 * π/32.0), R2 * $\sqrt{\epsilon_s}$ * sin(9 * π/32.0)] |
| 00001101 | [R1 * $\sqrt{\epsilon_s}$ * cos(9 * π/32.0), R1 * $\sqrt{\epsilon_s}$ * sin(9 * π/32.0)] |
| 00001110 | [R2 * $\sqrt{\epsilon_s}$ * cos(11 * π/32.0), R2 * $\sqrt{\epsilon_s}$ * sin(11 * π/32.0)] |
| 00001111 | [R1 * $\sqrt{\epsilon_s}$ * cos(11 * π/32.0), R1 * $\sqrt{\epsilon_s}$ * sin(11 * π/32.0)] |
| 00010000 | [R3 * $\sqrt{\epsilon_s}$ * cos(π/64.0), R3 * $\sqrt{\epsilon_s}$ * sin(π/64.0)] |
| 00010001 | [R3 * $\sqrt{\epsilon_s}$ * cos(3 * π/64.0), R3 * $\sqrt{\epsilon_s}$ * sin(3 * π/64.0)] |
| 00010010 | [R3 * $\sqrt{\epsilon_s}$ * cos(7 * π/64.0), R3 * $\sqrt{\epsilon_s}$ * sin(7 * π/64.0)] |
| 00010011 | [R3 * $\sqrt{\epsilon_s}$ * cos(5 * π/64.0), R3 * $\sqrt{\epsilon_s}$ * sin(5 * π/64.0)] |
| 00010100 | [R3 * $\sqrt{\epsilon_s}$ * cos(15 * π/64.0), R3 * $\sqrt{\epsilon_s}$ * sin(15 * π/64.0)] |
| 00010101 | [R3 * $\sqrt{\epsilon_s}$ * cos(13 * π/64.0), R3 * $\sqrt{\epsilon_s}$ * sin(13 * π/64.0)] |
| 00010110 | [R3 * $\sqrt{\epsilon_s}$ * cos(9 * π/64.0), R3 * $\sqrt{\epsilon_s}$ * sin(9 * π/64.0)] |
| 00010111 | [R3 * $\sqrt{\epsilon_s}$ * cos(11 * π/64.0), R3 * $\sqrt{\epsilon_s}$ * sin(11 * π/64.0)] |
| 00011000 | [R3 * $\sqrt{\epsilon_s}$ * cos(31 * π/64.0), R3 * $\sqrt{\epsilon_s}$ * sin(31 * π/64.0)] |
| 00011001 | [R3 * $\sqrt{\epsilon_s}$ * cos(29 * π/64.0), R3 * $\sqrt{\epsilon_s}$ * sin(29 * π/64.0)] |
| 00011010 | [R3 * $\sqrt{\epsilon_s}$ * cos(25 * π/64.0), R3 * $\sqrt{\epsilon_s}$ * sin(25 * π/64.0)] |
| 00011011 | [R3 * $\sqrt{\epsilon_s}$ * cos(27 * π/64.0), R3 * $\sqrt{\epsilon_s}$ * sin(27 * π/64.0)] |
| 00011100 | [R3 * $\sqrt{\epsilon_s}$ * cos(17 * π/64.0), R3 * $\sqrt{\epsilon_s}$ * sin(17 * π/64.0)] |
| 00011101 | [R3 * $\sqrt{\epsilon_s}$ * cos(19 * π/64.0), R3 * $\sqrt{\epsilon_s}$ * sin(19 * π/64.0)] |
| 00011110 | [R3 * $\sqrt{\epsilon_s}$ * cos(23 * π/64.0), R3 * $\sqrt{\epsilon_s}$ * sin(23 * π/64.0)] |
| 00011111 | [R3 * $\sqrt{\epsilon_s}$ * cos(21 * π/64.0), R3 * $\sqrt{\epsilon_s}$ * sin(21 * π/64.0)] |
| 00100000 | [R5 * $\sqrt{\epsilon_s}$ * cos(π/64.0), R5 * $\sqrt{\epsilon_s}$ * sin(π/64.0)] |
| 00100001 | [R5 * $\sqrt{\epsilon_s}$ * cos(3 * π/64.0), R5 * $\sqrt{\epsilon_s}$ * sin(3 * π/64.0)] |
| 00100010 | [R5 * $\sqrt{\epsilon_s}$ * cos(7 * π/64.0), R5 * $\sqrt{\epsilon_s}$ * sin(7 * π/64.0)] |
| 00100011 | [R5 * $\sqrt{\epsilon_s}$ * cos(5 * π/64.0), R5 * $\sqrt{\epsilon_s}$ * sin(5 * π/64.0)] |
| 00100100 | [R5 * $\sqrt{\epsilon_s}$ * cos(15 * π/64.0), R5 * $\sqrt{\epsilon_s}$ * sin(15 * π/64.0)] |
| 00100101 | [R5 * $\sqrt{\epsilon_s}$ * cos(13 * π/64.0), R5 * $\sqrt{\epsilon_s}$ * sin(13 * π/64.0)] |
| 00100110 | [R5 * $\sqrt{\epsilon_s}$ * cos(9 * π/64.0), R5 * $\sqrt{\epsilon_s}$ * sin(9 * π/64.0)] |

| Bit Label | [x, y] Coordinates |
|---|---|
| 00100111 | [R5 * $\sqrt{\epsilon_s}$ * cos(11 * π/64.0), R5 * $\sqrt{\epsilon_s}$ * sin(11 * π/64.0)] |
| 00101000 | [R5 * $\sqrt{\epsilon_s}$ * cos(31 * π/64.0), R5 * $\sqrt{\epsilon_s}$ * sin(31 * π/64.0)] |
| 00101001 | [R5 * $\sqrt{\epsilon_s}$ * cos(29 * π/64.0), R5 * $\sqrt{\epsilon_s}$ * sin(29 * π/64.0)] |
| 00101010 | [R5 * $\sqrt{\epsilon_s}$ * cos(25 * π/64.0), R5 * $\sqrt{\epsilon_s}$ * sin(25 * π/64.0)] |
| 00101011 | [R5 * $\sqrt{\epsilon_s}$ * cos(27 * π/64.0), R5 * $\sqrt{\epsilon_s}$ * sin(27 * π/64.0)] |
| 00101100 | [R5 * $\sqrt{\epsilon_s}$ * cos(17 * π/64.0), R5 * $\sqrt{\epsilon_s}$ * sin(17 * π/64.0)] |
| 00101101 | [R5 * $\sqrt{\epsilon_s}$ * cos(19 * π/64.0), R5 * $\sqrt{\epsilon_s}$ * sin(19 * π/64.0)] |
| 00101110 | [R5 * $\sqrt{\epsilon_s}$ * cos(23 * π/64.0), R5 * $\sqrt{\epsilon_s}$ * sin(23 * π/64.0)] |
| 00101111 | [R5 * $\sqrt{\epsilon_s}$ * cos(21 * π/64.0), R5 * $\sqrt{\epsilon_s}$ * sin(21 * π/64.0)] |
| 00110000 | [R4 * $\sqrt{\epsilon_s}$ * cos(π/64.0), R4 * $\sqrt{\epsilon_s}$ * sin(π/64.0)] |
| 00110001 | [R4 * $\sqrt{\epsilon_s}$ * cos(3 * π/64.0), R4 * $\sqrt{\epsilon_s}$ * sin(3 * π/64.0)] |
| 00110010 | [R4 * $\sqrt{\epsilon_s}$ * cos(7 * π/64.0), R4 * $\sqrt{\epsilon_s}$ * sin(7 * π/64.0)] |
| 00110011 | [R4 * $\sqrt{\epsilon_s}$ * cos(5 * π/64.0), R4 * $\sqrt{\epsilon_s}$ * sin(5 * π/64.0)] |
| 00110100 | [R4 * $\sqrt{\epsilon_s}$ * cos(15 * π/64.0), R4 * $\sqrt{\epsilon_s}$ * sin(15 * π/64.0)] |
| 00110101 | [R4 * $\sqrt{\epsilon_s}$ * cos(13 * π/64.0), R4 * $\sqrt{\epsilon_s}$ * sin(13 * π/64.0)] |
| 00110110 | [R4 * $\sqrt{\epsilon_s}$ * cos(9 * π/64.0), R4 * $\sqrt{\epsilon_s}$ * sin(9 * π/64.0)] |
| 00110111 | [R4 * $\sqrt{\epsilon_s}$ * cos(11 * π/64.0), R4 * $\sqrt{\epsilon_s}$ * sin(11 * π/64.0)] |
| 00111000 | [R4 * $\sqrt{\epsilon_s}$ * cos(31 * π/64.0), R4 * $\sqrt{\epsilon_s}$ * sin(31 * π/64.0)] |
| 00111001 | [R4 * $\sqrt{\epsilon_s}$ * cos(29 * π/64.0), R4 * $\sqrt{\epsilon_s}$ * sin(29 * π/64.0)] |
| 00111010 | [R4 * $\sqrt{\epsilon_s}$ * cos(25 * π/64.0), R4 * $\sqrt{\epsilon_s}$ * sin(25 * π/64.0)] |
| 00111011 | [R4 * $\sqrt{\epsilon_s}$ * cos(27 * π/64.0), R4 * $\sqrt{\epsilon_s}$ * sin(27 * π/64.0)] |
| 00111100 | [R4 * $\sqrt{\epsilon_s}$ * cos(17 * π/64.0), R4 * $\sqrt{\epsilon_s}$ * sin(17 * π/64.0)] |
| 00111101 | [R4 * $\sqrt{\epsilon_s}$ * cos(19 * π/64.0), R4 * $\sqrt{\epsilon_s}$ * sin(19 * π/64.0)] |
| 00111110 | [R4 * $\sqrt{\epsilon_s}$ * cos(23 * π/64.0), R4 * $\sqrt{\epsilon_s}$ * sin(23 * π/64.0)] |
| 00111111 | [R4 * $\sqrt{\epsilon_s}$ * cos(21 * π/64.0), R4 * $\sqrt{\epsilon_s}$ * sin(21 * π/64.0)] |
| 01000000 | [R2 * $\sqrt{\epsilon_s}$ * cos(31 * π/32.0), R2 * $\sqrt{\epsilon_s}$ * sin(31 * π/32.0)] |
| 01000001 | [R1 * $\sqrt{\epsilon_s}$ * cos(31 * π/32.0), R1 * $\sqrt{\epsilon_s}$ * sin(31 * π/32.0)] |
| 01000010 | [R2 * $\sqrt{\epsilon_s}$ * cos(29 * π/32.0), R2 * $\sqrt{\epsilon_s}$ * sin(29 * π/32.0)] |
| 01000011 | [R1 * $\sqrt{\epsilon_s}$ * cos(29 * π/32.0), R1 * $\sqrt{\epsilon_s}$ * sin(29 * π/32.0)] |
| 01000100 | [R2 * $\sqrt{\epsilon_s}$ * cos(25 * π/32.0), R2 * $\sqrt{\epsilon_s}$ * sin(25 * π/32.0)] |
| 01000101 | [R1 * $\sqrt{\epsilon_s}$ * cos(25 * π/32.0), R1 * $\sqrt{\epsilon_s}$ * sin(25 * π/32.0)] |
| 01000110 | [R2 * $\sqrt{\epsilon_s}$ * cos(27 * π/32.0), R2 * $\sqrt{\epsilon_s}$ * sin(27 * π/32.0)] |
| 01000111 | [R1 * $\sqrt{\epsilon_s}$ * cos(27 * π/32.0), R1 * $\sqrt{\epsilon_s}$ * sin(27 * π/32.0)] |
| 01001000 | [R2 * $\sqrt{\epsilon_s}$ * cos(17 * π/32.0), R2 * $\sqrt{\epsilon_s}$ * sin(17 * π/32.0)] |
| 01001001 | [R1 * $\sqrt{\epsilon_s}$ * cos(17 * π/32.0), R1 * $\sqrt{\epsilon_s}$ * sin(17 * π/32.0)] |
| 01001010 | [R2 * $\sqrt{\epsilon_s}$ * cos(19 * π/32.0), R2 * $\sqrt{\epsilon_s}$ * sin(19 * π/32.0)] |
| 01001011 | [R1 * $\sqrt{\epsilon_s}$ * cos(19 * π/32.0), R1 * $\sqrt{\epsilon_s}$ * sin(19 * π/32.0)] |
| 01001100 | [R2 * $\sqrt{\epsilon_s}$ * cos(23 * π/32.0), R2 * $\sqrt{\epsilon_s}$ * sin(23 * π/32.0)] |
| 01001101 | [R1 * $\sqrt{\epsilon_s}$ * cos(23 * π/32.0), R1 * $\sqrt{\epsilon_s}$ * sin(23 * π/32.0)] |
| 01001110 | [R2 * $\sqrt{\epsilon_s}$ * cos(21 * π/32.0), R2 * $\sqrt{\epsilon_s}$ * sin(21 * π/32.0)] |
| 01001111 | [R1 * $\sqrt{\epsilon_s}$ * cos(21 * π/32.0), R1 * $\sqrt{\epsilon_s}$ * sin(21 * π/32.0)] |
| 01010000 | [R3 * $\sqrt{\epsilon_s}$ * cos(63 * π/64.0), R3 * $\sqrt{\epsilon_s}$ * sin(63 * π/64.0)] |
| 01010001 | [R3 * $\sqrt{\epsilon_s}$ * cos(61 * π/64.0), R3 * $\sqrt{\epsilon_s}$ * sin(61 * π/64.0)] |
| 01010010 | [R3 * $\sqrt{\epsilon_s}$ * cos(57 * π/64.0), R3 * $\sqrt{\epsilon_s}$ * sin(57 * π/64.0)] |
| 01010011 | [R3 * $\sqrt{\epsilon_s}$ * cos(59 * π/64.0), R3 * $\sqrt{\epsilon_s}$ * sin(59 * π/64.0)] |
| 01010100 | [R3 * $\sqrt{\epsilon_s}$ * cos(49 * π/64.0), R3 * $\sqrt{\epsilon_s}$ * sin(49 * π/64.0)] |
| 01010101 | [R3 * $\sqrt{\epsilon_s}$ * cos(51 * π/64.0), R3 * $\sqrt{\epsilon_s}$ * sin(51 * π/64.0)] |
| 01010110 | [R3 * $\sqrt{\epsilon_s}$ * cos(55 * π/64.0), R3 * $\sqrt{\epsilon_s}$ * sin(55 * π/64.0)] |
| 01010111 | [R3 * $\sqrt{\epsilon_s}$ * cos(53 * π/64.0), R3 * $\sqrt{\epsilon_s}$ * sin(53 * π/64.0)] |
| 01011000 | [R3 * $\sqrt{\epsilon_s}$ * cos(33 * π/64.0), R3 * $\sqrt{\epsilon_s}$ * sin(33 * π/64.0)] |
| 01011001 | [R3 * $\sqrt{\epsilon_s}$ * cos(35 * π/64.0), R3 * $\sqrt{\epsilon_s}$ * sin(35 * π/64.0)] |
| 01011010 | [R3 * $\sqrt{\epsilon_s}$ * cos(39 * π/64.0), R3 * $\sqrt{\epsilon_s}$ * sin(39 * π/64.0)] |
| 01011011 | [R3 * $\sqrt{\epsilon_s}$ * cos(37 * π/64.0), R3 * $\sqrt{\epsilon_s}$ * sin(37 * π/64.0)] |
| 01011100 | [R3 * $\sqrt{\epsilon_s}$ * cos(47 * π/64.0), R3 * $\sqrt{\epsilon_s}$ * sin(47 * π/64.0)] |
| 01011101 | [R3 * $\sqrt{\epsilon_s}$ * cos(45 * π/64.0), R3 * $\sqrt{\epsilon_s}$ * sin(45 * π/64.0)] |
| 01011110 | [R3 * $\sqrt{\epsilon_s}$ * cos(41 * π/64.0), R3 * $\sqrt{\epsilon_s}$ * sin(41 * π/64.0)] |
| 01011111 | [R3 * $\sqrt{\epsilon_s}$ * cos(43 * π/64.0), R3 * $\sqrt{\epsilon_s}$ * sin(43 * π/64.0)] |
| 01100000 | [R5 * $\sqrt{\epsilon_s}$ * cos(63 * π/64.0), R5 * $\sqrt{\epsilon_s}$ * sin(63 * π/64.0)] |
| 01100001 | [R5 * $\sqrt{\epsilon_s}$ * cos(61 * π/64.0), R5 * $\sqrt{\epsilon_s}$ * sin(61 * π/64.0)] |
| 01100010 | [R5 * $\sqrt{\epsilon_s}$ * cos(57 * π/64.0), R5 * $\sqrt{\epsilon_s}$ * sin(57 * π/64.0)] |
| 01100011 | [R5 * $\sqrt{\epsilon_s}$ * cos(59 * π/64.0), R5 * $\sqrt{\epsilon_s}$ * sin(59 * π/64.0)] |
| 01100100 | [R5 * $\sqrt{\epsilon_s}$ * cos(49 * π/64.0), R5 * $\sqrt{\epsilon_s}$ * sin(49 * π/64.0)] |
| 01100101 | [R5 * $\sqrt{\epsilon_s}$ * cos(51 * π/64.0), R5 * $\sqrt{\epsilon_s}$ * sin(51 * π/64.0)] |
| 01100110 | [R5 * $\sqrt{\epsilon_s}$ * cos(55 * π/64.0), R5 * $\sqrt{\epsilon_s}$ * sin(55 * π/64.0)] |
| 01100111 | [R5 * $\sqrt{\epsilon_s}$ * cos(53 * π/64.0), R5 * $\sqrt{\epsilon_s}$ * sin(53 * π/64.0)] |
| 01101000 | [R5 * $\sqrt{\epsilon_s}$ * cos(33 * π/64.0), R5 * $\sqrt{\epsilon_s}$ * sin(33 * π/64.0)] |
| 01101001 | [R5 * $\sqrt{\epsilon_s}$ * cos(35 * π/64.0), R5 * $\sqrt{\epsilon_s}$ * sin(35 * π/64.0)] |
| 01101010 | [R5 * $\sqrt{\epsilon_s}$ * cos(39 * π/64.0), R5 * $\sqrt{\epsilon_s}$ * sin(39 * π/64.0)] |
| 01101011 | [R5 * $\sqrt{\epsilon_s}$ * cos(37 * π/64.0), R5 * $\sqrt{\epsilon_s}$ * sin(37 * π/64.0)] |
| 01101100 | [R5 * $\sqrt{\epsilon_s}$ * cos(47 * π/64.0), R5 * $\sqrt{\epsilon_s}$ * sin(47 * π/64.0)] |
| 01101101 | [R5 * $\sqrt{\epsilon_s}$ * cos(45 * π/64.0), R5 * $\sqrt{\epsilon_s}$ * sin(45 * π/64.0)] |
| 01101110 | [R5 * $\sqrt{\epsilon_s}$ * cos(41 * π/64.0), R5 * $\sqrt{\epsilon_s}$ * sin(41 * π/64.0)] |
| 01101111 | [R5 * $\sqrt{\epsilon_s}$ * cos(43 * π/64.0), R5 * $\sqrt{\epsilon_s}$ * sin(43 * π/64.0)] |
| 01110000 | [R4 * $\sqrt{\epsilon_s}$ * cos(63 * π/64.0), R4 * $\sqrt{\epsilon_s}$ * sin(63 * π/64.0)] |
| 01110001 | [R4 * $\sqrt{\epsilon_s}$ * cos(61 * π/64.0), R4 * $\sqrt{\epsilon_s}$ * sin(61 * π/64.0)] |
| 01110010 | [R4 * $\sqrt{\epsilon_s}$ * cos(57 * π/64.0), R4 * $\sqrt{\epsilon_s}$ * sin(57 * π/64.0)] |
| 01110011 | [R4 * $\sqrt{\epsilon_s}$ * cos(59 * π/64.0), R4 * $\sqrt{\epsilon_s}$ * sin(59 * π/64.0)] |
| 01110100 | [R4 * $\sqrt{\epsilon_s}$ * cos(49 * π/64.0), R4 * $\sqrt{\epsilon_s}$ * sin(49 * π/64.0)] |
| 01110101 | [R4 * $\sqrt{\epsilon_s}$ * cos(51 * π/64.0), R4 * $\sqrt{\epsilon_s}$ * sin(51 * π/64.0)] |
| 01110110 | [R4 * $\sqrt{\epsilon_s}$ * cos(55 * π/64.0), R4 * $\sqrt{\epsilon_s}$ * sin(55 * π/64.0)] |
| 01110111 | [R4 * $\sqrt{\epsilon_s}$ * cos(53 * π/64.0), R4 * $\sqrt{\epsilon_s}$ * sin(53 * π/64.0)] |
| 01111000 | [R4 * $\sqrt{\epsilon_s}$ * cos(33 * π/64.0), R4 * $\sqrt{\epsilon_s}$ * sin(33 * π/64.0)] |
| 01111001 | [R4 * $\sqrt{\epsilon_s}$ * cos(35 * π/64.0), R4 * $\sqrt{\epsilon_s}$ * sin(35 * π/64.0)] |
| 01111010 | [R4 * $\sqrt{\epsilon_s}$ * cos(39 * π/64.0), R4 * $\sqrt{\epsilon_s}$ * sin(39 * π/64.0)] |
| 01111011 | [R4 * $\sqrt{\epsilon_s}$ * cos(37 * π/64.0), R4 * $\sqrt{\epsilon_s}$ * sin(37 * π/64.0)] |
| 01111100 | [R4 * $\sqrt{\epsilon_s}$ * cos(47 * π/64.0), R4 * $\sqrt{\epsilon_s}$ * sin(47 * π/64.0)] |
| 01111101 | [R4 * $\sqrt{\epsilon_s}$ * cos(45 * π/64.0), R4 * $\sqrt{\epsilon_s}$ * sin(45 * π/64.0)] |
| 01111110 | [R4 * $\sqrt{\epsilon_s}$ * cos(41 * π/64.0), R4 * $\sqrt{\epsilon_s}$ * sin(41 * π/64.0)] |
| 01111111 | [R4 * $\sqrt{\epsilon_s}$ * cos(43 * π/64.0), R4 * $\sqrt{\epsilon_s}$ * sin(43 * π/64.0)] |
| 10000000 | [R2 * $\sqrt{\epsilon_s}$ * cos(63 * π/32.0), R2 * $\sqrt{\epsilon_s}$ * sin(63 * π/32.0)] |
| 10000001 | [R1 * $\sqrt{\epsilon_s}$ * cos(63 * π/32.0), R1 * $\sqrt{\epsilon_s}$ * sin(63 * π/32.0)] |
| 10000010 | [R2 * $\sqrt{\epsilon_s}$ * cos(61 * π/32.0), R2 * $\sqrt{\epsilon_s}$ * sin(61 * π/32.0)] |
| 10000011 | [R1 * $\sqrt{\epsilon_s}$ * cos(61 * π/32.0), R1 * $\sqrt{\epsilon_s}$ * sin(61 * π/32.0)] |
| 10000100 | [R2 * $\sqrt{\epsilon_s}$ * cos(57 * π/32.0), R2 * $\sqrt{\epsilon_s}$ * sin(57 * π/32.0)] |
| 10000101 | [R1 * $\sqrt{\epsilon_s}$ * cos(57 * π/32.0), R1 * $\sqrt{\epsilon_s}$ * sin(57 * π/32.0)] |
| 10000110 | [R2 * $\sqrt{\epsilon_s}$ * cos(59 * π/32.0), R2 * $\sqrt{\epsilon_s}$ * sin(59 * π/32.0)] |
| 10000111 | [R1 * $\sqrt{\epsilon_s}$ * cos(59 * π/32.0), R1 * $\sqrt{\epsilon_s}$ * sin(59 * π/32.0)] |
| 10001000 | [R2 * $\sqrt{\epsilon_s}$ * cos(49 * π/32.0), R2 * $\sqrt{\epsilon_s}$ * sin(49 * π/32.0)] |
| 10001001 | [R1 * $\sqrt{\epsilon_s}$ * cos(49 * π/32.0), R1 * $\sqrt{\epsilon_s}$ * sin(49 * π/32.0)] |
| 10001010 | [R2 * $\sqrt{\epsilon_s}$ * cos(51 * π/32.0), R2 * $\sqrt{\epsilon_s}$ * sin(51 * π/32.0)] |
| 10001011 | [R1 * $\sqrt{\epsilon_s}$ * cos(51 * π/32.0), R1 * $\sqrt{\epsilon_s}$ * sin(51 * π/32.0)] |
| 10001100 | [R2 * $\sqrt{\epsilon_s}$ * cos(55 * π/32.0), R2 * $\sqrt{\epsilon_s}$ * sin(55 * π/32.0)] |
| 10001101 | [R1 * $\sqrt{\epsilon_s}$ * cos(55 * π/32.0), R1 * $\sqrt{\epsilon_s}$ * sin(55 * π/32.0)] |
| 10001110 | [R2 * $\sqrt{\epsilon_s}$ * cos(53 * π/32.0), R2 * $\sqrt{\epsilon_s}$ * sin(53 * π/32.0)] |
| 10001111 | [R1 * $\sqrt{\epsilon_s}$ * cos(53 * π/32.0), R1 * $\sqrt{\epsilon_s}$ * sin(53 * π/32.0)] |
| 10010000 | [R3 * $\sqrt{\epsilon_s}$ * cos(127 * π/64.0), R3 * $\sqrt{\epsilon_s}$ * sin(127 * π/64.0)] |
| 10010001 | [R3 * $\sqrt{\epsilon_s}$ * cos(125 * π/64.0), R3 * $\sqrt{\epsilon_s}$ * sin(125 * π/64.0)] |
| 10010010 | [R3 * $\sqrt{\epsilon_s}$ * cos(121 * π/64.0), R3 * $\sqrt{\epsilon_s}$ * sin(121 * π/64.0)] |
| 10010011 | [R3 * $\sqrt{\epsilon_s}$ * cos(123 * π/64.0), R3 * $\sqrt{\epsilon_s}$ * sin(123 * π/64.0)] |
| 10010100 | [R3 * $\sqrt{\epsilon_s}$ * cos(113 * π/64.0), R3 * $\sqrt{\epsilon_s}$ * sin(113 * π/64.0)] |
| 10010101 | [R3 * $\sqrt{\epsilon_s}$ * cos(115 * π/64.0), R3 * $\sqrt{\epsilon_s}$ * sin(115 * π/64.0)] |
| 10010110 | [R3 * $\sqrt{\epsilon_s}$ * cos(119 * π/64.0), R3 * $\sqrt{\epsilon_s}$ * sin(119 * π/64.0)] |
| 10010111 | [R3 * $\sqrt{\epsilon_s}$ * cos(117 * π/64.0), R3 * $\sqrt{\epsilon_s}$ * sin(117 * π/64.0)] |
| 10011000 | [R3 * $\sqrt{\epsilon_s}$ * cos(97 * π/64.0), R3 * $\sqrt{\epsilon_s}$ * sin(97 * π/64.0)] |
| 10011001 | [R3 * $\sqrt{\epsilon_s}$ * cos(99 * π/64.0), R3 * $\sqrt{\epsilon_s}$ * sin(99 * π/64.0)] |
| 10011010 | [R3 * $\sqrt{\epsilon_s}$ * cos(103 * π/64.0), R3 * $\sqrt{\epsilon_s}$ * sin(103 * π/64.0)] |
| 10011011 | [R3 * $\sqrt{\epsilon_s}$ * cos(101 * π/64.0), R3 * $\sqrt{\epsilon_s}$ * sin(101 * π/64.0)] |
| 10011100 | [R3 * $\sqrt{\epsilon_s}$ * cos(111 * π/64.0), R3 * $\sqrt{\epsilon_s}$ * sin(111 * π/64.0)] |
| 10011101 | [R3 * $\sqrt{\epsilon_s}$ * cos(109 * π/64.0), R3 * $\sqrt{\epsilon_s}$ * sin(109 * π/64.0)] |
| 10011110 | [R3 * $\sqrt{\epsilon_s}$ * cos(105 * π/64.0), R3 * $\sqrt{\epsilon_s}$ * sin(105 * π/64.0)] |
| 10011111 | [R3 * $\sqrt{\epsilon_s}$ * cos(107 * π/64.0), R3 * $\sqrt{\epsilon_s}$ * sin(107 * π/64.0)] |
| 10100000 | [R5 * $\sqrt{\epsilon_s}$ * cos(127 * π/64.0), R5 * $\sqrt{\epsilon_s}$ * sin(127 * π/64.0)] |
| 10100001 | [R5 * $\sqrt{\epsilon_s}$ * cos(125 * π/64.0), R5 * $\sqrt{\epsilon_s}$ * sin(125 * π/64.0)] |
| 10100010 | [R5 * $\sqrt{\epsilon_s}$ * cos(121 * π/64.0), R5 * $\sqrt{\epsilon_s}$ * sin(121 * π/64.0)] |
| 10100011 | [R5 * $\sqrt{\epsilon_s}$ * cos(123 * π/64.0), R5 * $\sqrt{\epsilon_s}$ * sin(123 * π/64.0)] |
| 10100100 | [R5 * $\sqrt{\epsilon_s}$ * cos(113 * π/64.0), R5 * $\sqrt{\epsilon_s}$ * sin(113 * π/64.0)] |
| 10100101 | [R5 * $\sqrt{\epsilon_s}$ * cos(115 * π/64.0), R5 * $\sqrt{\epsilon_s}$ * sin(115 * π/64.0)] |
| 10100110 | [R5 * $\sqrt{\epsilon_s}$ * cos(119 * π/64.0), R5 * $\sqrt{\epsilon_s}$ * sin(119 * π/64.0)] |
| 10100111 | [R5 * $\sqrt{\epsilon_s}$ * cos(117 * π/64.0), R5 * $\sqrt{\epsilon_s}$ * sin(117 * π/64.0)] |
| 10101000 | [R5 * $\sqrt{\epsilon_s}$ * cos(97 * π/64.0), R5 * $\sqrt{\epsilon_s}$ * sin(97 * π/64.0)] |
| 10101001 | [R5 * $\sqrt{\epsilon_s}$ * cos(99 * π/64.0), R5 * $\sqrt{\epsilon_s}$ * sin(99 * π/64.0)] |
| 10101010 | [R5 * $\sqrt{\epsilon_s}$ * cos(103 * π/64.0), R5 * $\sqrt{\epsilon_s}$ * sin(103 * π/64.0)] |
| 10101011 | [R5 * $\sqrt{\epsilon_s}$ * cos(101 * π/64.0), R5 * $\sqrt{\epsilon_s}$ * sin(101 * π/64.0)] |
| 10101100 | [R5 * $\sqrt{\epsilon_s}$ * cos(111 * π/64.0), R5 * $\sqrt{\epsilon_s}$ * sin(111 * π/64.0)] |
| 10101101 | [R5 * $\sqrt{\epsilon_s}$ * cos(109 * π/64.0), R5 * $\sqrt{\epsilon_s}$ * sin(109 * π/64.0)] |
| 10101110 | [R5 * $\sqrt{\epsilon_s}$ * cos(105 * π/64.0), R5 * $\sqrt{\epsilon_s}$ * sin(105 * π/64.0)] |
| 10101111 | [R5 * $\sqrt{\epsilon_s}$ * cos(107 * π/64.0), R5 * $\sqrt{\epsilon_s}$ * sin(107 * π/64.0)] |
| 10110000 | [R4 * $\sqrt{\epsilon_s}$ * cos(127 * π/64.0), R4 * $\sqrt{\epsilon_s}$ * sin(127 * π/64.0)] |
| 10110001 | [R4 * $\sqrt{\epsilon_s}$ * cos(125 * π/64.0), R4 * $\sqrt{\epsilon_s}$ * sin(125 * π/64.0)] |
| 10110010 | [R4 * $\sqrt{\epsilon_s}$ * cos(121 * π/64.0), R4 * $\sqrt{\epsilon_s}$ * sin(121 * π/64.0)] |
| 10110011 | [R4 * $\sqrt{\epsilon_s}$ * cos(123 * π/64.0), R4 * $\sqrt{\epsilon_s}$ * sin(123 * π/64.0)] |
| 10110100 | [R4 * $\sqrt{\epsilon_s}$ * cos(113 * π/64.0), R4 * $\sqrt{\epsilon_s}$ * sin(113 * π/64.0)] |
| 10110101 | [R4 * $\sqrt{\epsilon_s}$ * cos(115 * π/64.0), R4 * $\sqrt{\epsilon_s}$ * sin(115 * π/64.0)] |
| 10110110 | [R4 * $\sqrt{\epsilon_s}$ * cos(119 * π/64.0), R4 * $\sqrt{\epsilon_s}$ * sin(119 * π/64.0)] |
| 10110111 | [R4 * $\sqrt{\epsilon_s}$ * cos(117 * π/64.0), R4 * $\sqrt{\epsilon_s}$ * sin(117 * π/64.0)] |
| 10111000 | [R4 * $\sqrt{\epsilon_s}$ * cos(97 * π/64.0), R4 * $\sqrt{\epsilon_s}$ * sin(97 * π/64.0)] |
| 10111001 | [R4 * $\sqrt{\epsilon_s}$ * cos(99 * π/64.0), R4 * $\sqrt{\epsilon_s}$ * sin(99 * π/64.0)] |
| 10111010 | [R4 * $\sqrt{\epsilon_s}$ * cos(103 * π/64.0), R4 * $\sqrt{\epsilon_s}$ * sin(103 * π/64.0)] |
| 10111011 | [R4 * $\sqrt{\epsilon_s}$ * cos(101 * π/64.0), R4 * $\sqrt{\epsilon_s}$ * sin(101 * π/64.0)] |
| 10111100 | [R4 * $\sqrt{\epsilon_s}$ * cos(111 * π/64.0), R4 * $\sqrt{\epsilon_s}$ * sin(111 * π/64.0)] |
| 10111101 | [R4 * $\sqrt{\epsilon_s}$ * cos(109 * π/64.0), R4 * $\sqrt{\epsilon_s}$ * sin(109 * π/64.0)] |
| 10111110 | [R4 * $\sqrt{\epsilon_s}$ * cos(105 * π/64.0), R4 * $\sqrt{\epsilon_s}$ * sin(105 * π/64.0)] |
| 10111111 | [R4 * $\sqrt{\epsilon_s}$ * cos(107 * π/64.0), R4 * $\sqrt{\epsilon_s}$ * sin(107 * π/64.0)] |
| 11000000 | [R2 * $\sqrt{\epsilon_s}$ * cos(33 * π/32.0), R2 * $\sqrt{\epsilon_s}$ * sin(33 * π/32.0)] |

-continued

| Bit Label | [x, y] Coordinates |
|---|---|
| 11000001 | [R1 * $\sqrt{\epsilon_s}$ * cos(33 * π/32.0), R1 * $\sqrt{\epsilon_s}$ * sin(33 * π/32.0)] |
| 11000010 | [R2 * $\sqrt{\epsilon_s}$ * cos(35 * π/32.0), R2 * $\sqrt{\epsilon_s}$ * sin(35 * π/32.0)] |
| 11000011 | [R1 * $\sqrt{\epsilon_s}$ * cos(35 * π/32.0), R1 * $\sqrt{\epsilon_s}$ * sin(35 * π/32.0)] |
| 11000100 | [R2 * $\sqrt{\epsilon_s}$ * cos(39 * π/32.0), R2 * $\sqrt{\epsilon_s}$ * sin(39 * π/32.0)] |
| 11000101 | [R1 * $\sqrt{\epsilon_s}$ * cos(39 * π/32.0), R1 * $\sqrt{\epsilon_s}$ * sin(39 * π/32.0)] |
| 11000110 | [R2 * $\sqrt{\epsilon_s}$ * cos(37 * π/32.0), R2 * $\sqrt{\epsilon_s}$ * sin(37 * π/32.0)] |
| 11000111 | [R1 * $\sqrt{\epsilon_s}$ * cos(37 * π/32.0), R1 * $\sqrt{\epsilon_s}$ * sin(37 * π/32.0)] |
| 11001000 | [R2 * $\sqrt{\epsilon_s}$ * cos(47 * π/32.0), R2 * $\sqrt{\epsilon_s}$ * sin(47 * π/32.0)] |
| 11001001 | [R1 * $\sqrt{\epsilon_s}$ * cos(47 * π/32.0), R1 * $\sqrt{\epsilon_s}$ * sin(47 * π/32.0)] |
| 11001010 | [R2 * $\sqrt{\epsilon_s}$ * cos(45 * π/32.0), R2 * $\sqrt{\epsilon_s}$ * sin(45 * π/32.0)] |
| 11001011 | [R1 * $\sqrt{\epsilon_s}$ * cos(45 * π/32.0), R1 * $\sqrt{\epsilon_s}$ * sin(45 * π/32.0)] |
| 11001100 | [R2 * $\sqrt{\epsilon_s}$ * cos(41 * π/32.0), R2 * $\sqrt{\epsilon_s}$ * sin(41 * π/32.0)] |
| 11001101 | [R1 * $\sqrt{\epsilon_s}$ * cos(41 * π/32.0), R1 * $\sqrt{\epsilon_s}$ * sin(41 * π/32.0)] |
| 11001110 | [R2 * $\sqrt{\epsilon_s}$ * cos(43 * π/32.0), R2 * $\sqrt{\epsilon_s}$ * sin(43 * π/32.0)] |
| 11001111 | [R1 * $\sqrt{\epsilon_s}$ * cos(43 * π/32.0), R1 * $\sqrt{\epsilon_s}$ * sin(43 * π/32.0)] |
| 11010000 | [R3 * $\sqrt{\epsilon_s}$ * cos(65 * π/64.0), R3 * $\sqrt{\epsilon_s}$ * sin(65 * π/64.0)] |
| 11010001 | [R3 * $\sqrt{\epsilon_s}$ * cos(67 * π/64.0), R3 * $\sqrt{\epsilon_s}$ * sin(67 * π/64.0)] |
| 11010010 | [R3 * $\sqrt{\epsilon_s}$ * cos(71 * π/64.0), R3 * $\sqrt{\epsilon_s}$ * sin(71 * π/64.0)] |
| 11010011 | [R3 * $\sqrt{\epsilon_s}$ * cos(69 * π/64.0), R3 * $\sqrt{\epsilon_s}$ * sin(69 * π/64.0)] |
| 11010100 | [R3 * $\sqrt{\epsilon_s}$ * cos(79 * π/64.0), R3 * $\sqrt{\epsilon_s}$ * sin(79 * π/64.0)] |
| 11010101 | [R3 * $\sqrt{\epsilon_s}$ * cos(77 * π/64.0), R3 * $\sqrt{\epsilon_s}$ * sin(77 * π/64.0)] |
| 11010110 | [R3 * $\sqrt{\epsilon_s}$ * cos(73 * π/64.0), R3 * $\sqrt{\epsilon_s}$ * sin(73 * π/64.0)] |
| 11010111 | [R3 * $\sqrt{\epsilon_s}$ * cos(75 * π/64.0), R3 * $\sqrt{\epsilon_s}$ * sin(75 * π/64.0)] |
| 11011000 | [R3 * $\sqrt{\epsilon_s}$ * cos(95 * π/64.0), R3 * $\sqrt{\epsilon_s}$ * sin(95 * π/64.0)] |
| 11011001 | [R3 * $\sqrt{\epsilon_s}$ * cos(93 * π/64.0), R3 * $\sqrt{\epsilon_s}$ * sin(93 * π/64.0)] |
| 11011010 | [R3 * $\sqrt{\epsilon_s}$ * cos(89 * π/64.0), R3 * $\sqrt{\epsilon_s}$ * sin(89 * π/64.0)] |
| 11011011 | [R3 * $\sqrt{\epsilon_s}$ * cos(91 * π/64.0), R3 * $\sqrt{\epsilon_s}$ * sin(91 * π/64.0)] |
| 11011100 | [R3 * $\sqrt{\epsilon_s}$ * cos(81 * π/64.0), R3 * $\sqrt{\epsilon_s}$ * sin(81 * π/64.0)] |
| 11011101 | [R3 * $\sqrt{\epsilon_s}$ * cos(83 * π/64.0), R3 * $\sqrt{\epsilon_s}$ * sin(83 * π/64.0)] |
| 11011110 | [R3 * $\sqrt{\epsilon_s}$ * cos(87 * π/64.0), R3 * $\sqrt{\epsilon_s}$ * sin(87 * π/64.0)] |
| 11011111 | [R3 * $\sqrt{\epsilon_s}$ * cos(85 * π/64.0), R3 * $\sqrt{\epsilon_s}$ * sin(85 * π/64.0)] |
| 11100000 | [R5 * $\sqrt{\epsilon_s}$ * cos(65 * π/64.0), R5 * $\sqrt{\epsilon_s}$ * sin(65 * π/64.0)] |
| 11100001 | [R5 * $\sqrt{\epsilon_s}$ * cos(67 * π/64.0), R5 * $\sqrt{\epsilon_s}$ * sin(67 * π/64.0)] |
| 11100010 | [R5 * $\sqrt{\epsilon_s}$ * cos(71 * π/64.0), R5 * $\sqrt{\epsilon_s}$ * sin(71 * π/64.0)] |
| 11100011 | [R5 * $\sqrt{\epsilon_s}$ * cos(69 * π/64.0), R5 * $\sqrt{\epsilon_s}$ * sin(69 * π/64.0)] |
| 11100100 | [R5 * $\sqrt{\epsilon_s}$ * cos(79 * π/64.0), R5 * $\sqrt{\epsilon_s}$ * sin(79 * π/64.0)] |
| 11100101 | [R5 * $\sqrt{\epsilon_s}$ * cos(77 * π/64.0), R5 * $\sqrt{\epsilon_s}$ * sin(77 * π/64.0)] |
| 11100110 | [R5 * $\sqrt{\epsilon_s}$ * cos(73 * π/64.0), R5 * $\sqrt{\epsilon_s}$ * sin(73 * π/64.0)] |
| 11100111 | [R5 * $\sqrt{\epsilon_s}$ * cos(75 * π/64.0), R5 * $\sqrt{\epsilon_s}$ * sin(75 * π/64.0)] |
| 11101000 | [R5 * $\sqrt{\epsilon_s}$ * cos(95 * π/64.0), R5 * $\sqrt{\epsilon_s}$ * sin(95 * π/64.0)] |
| 11101001 | [R5 * $\sqrt{\epsilon_s}$ * cos(93 * π/64.0), R5 * $\sqrt{\epsilon_s}$ * sin(93 * π/64.0)] |
| 11101010 | [R5 * $\sqrt{\epsilon_s}$ * cos(89 * π/64.0), R5 * $\sqrt{\epsilon_s}$ * sin(89 * π/64.0)] |
| 11101011 | [R5 * $\sqrt{\epsilon_s}$ * cos(91 * π/64.0), R5 * $\sqrt{\epsilon_s}$ * sin(91 * π/64.0)] |
| 11101100 | [R5 * $\sqrt{\epsilon_s}$ * cos(81 * π/64.0), R5 * $\sqrt{\epsilon_s}$ * sin(81 * π/64.0)] |
| 11101101 | [R5 * $\sqrt{\epsilon_s}$ * cos(83 * π/64.0), R5 * $\sqrt{\epsilon_s}$ * sin(83 * π/64.0)] |
| 11101110 | [R5 * $\sqrt{\epsilon_s}$ * cos(87 * π/64.0), R5 * $\sqrt{\epsilon_s}$ * sin(87 * π/64.0)] |
| 11101111 | [R5 * $\sqrt{\epsilon_s}$ * cos(85 * π/64.0), R5 * $\sqrt{\epsilon_s}$ * sin(85 * π/64.0)] |
| 11110000 | [R4 * $\sqrt{\epsilon_s}$ * cos(65 * π/64.0), R4 * $\sqrt{\epsilon_s}$ * sin(65 * π/64.0)] |
| 11110001 | [R4 * $\sqrt{\epsilon_s}$ * cos(67 * π/64.0), R4 * $\sqrt{\epsilon_s}$ * sin(67 * π/64.0)] |
| 11110010 | [R4 * $\sqrt{\epsilon_s}$ * cos(71 * π/64.0), R4 * $\sqrt{\epsilon_s}$ * sin(71 * π/64.0)] |
| 11110011 | [R4 * $\sqrt{\epsilon_s}$ * cos(69 * π/64.0), R4 * $\sqrt{\epsilon_s}$ * sin(69 * π/64.0)] |
| 11110100 | [R4 * $\sqrt{\epsilon_s}$ * cos(79 * π/64.0), R4 * $\sqrt{\epsilon_s}$ * sin(79 * π/64.0)] |
| 11110101 | [R4 * $\sqrt{\epsilon_s}$ * cos(77 * π/64.0), R4 * $\sqrt{\epsilon_s}$ * sin(77 * π/64.0)] |
| 11110110 | [R4 * $\sqrt{\epsilon_s}$ * cos(73 * π/64.0), R4 * $\sqrt{\epsilon_s}$ * sin(73 * π/64.0)] |
| 11110111 | [R4 * $\sqrt{\epsilon_s}$ * cos(75 * π/64.0), R4 * $\sqrt{\epsilon_s}$ * sin(75 * π/64.0)] |
| 11111000 | [R4 * $\sqrt{\epsilon_s}$ * cos(95 * π/64.0), R4 * $\sqrt{\epsilon_s}$ * sin(95 * π/64.0)] |
| 11111001 | [R4 * $\sqrt{\epsilon_s}$ * cos(93 * π/64.0), R4 * $\sqrt{\epsilon_s}$ * sin(93 * π/64.0)] |
| 11111010 | [R4 * $\sqrt{\epsilon_s}$ * cos(89 * π/64.0), R4 * $\sqrt{\epsilon_s}$ * sin(89 * π/64.0)] |
| 11111011 | [R4 * $\sqrt{\epsilon_s}$ * cos(91 * π/64.0), R4 * $\sqrt{\epsilon_s}$ * sin(91 * π/64.0)] |
| 11111100 | [R4 * $\sqrt{\epsilon_s}$ * cos(81 * π/64.0), R4 * $\sqrt{\epsilon_s}$ * sin(81 * π/64.0)] |
| 11111101 | [R4 * $\sqrt{\epsilon_s}$ * cos(83 * π/64.0), R4 * $\sqrt{\epsilon_s}$ * sin(83 * π/64.0)] |
| 11111110 | [R4 * $\sqrt{\epsilon_s}$ * cos(87 * π/64.0), R4 * $\sqrt{\epsilon_s}$ * sin(87 * π/64.0)] |
| 11111111 | [R4 * $\sqrt{\epsilon_s}$ * cos(85 * π/64.0), R4 * $\sqrt{\epsilon_s}$ * sin(85 * π/64.0)]. |

10. A method, comprising:

modulating a signal, via a modulation device, in accordance with a 256-APSK modulation based on a signal constellation of a 32+32+64+64+64 ring format, having bit labeling and [x, y] bit coordinate positions as follows (where $\epsilon_s$ represents average energy per symbol, $32*R1^2+32*R2^2+64*R3^2+64*R4^2+64*R5^2=256$, and R1 represents the radius of the inner-most ring, R2 represents the radius of the next outer ring, R3 represents the radius of the next outer ring, R4 represents the radius of the next outer ring, and R5 represents the radius of the outer-most ring):

| Bit Label | [x, y] Coordinates |
|---|---|
| 00000000 | [R2 * $\sqrt{\epsilon_s}$ * cos(π/32.0), R2 * $\sqrt{\epsilon_s}$ * sin(π/32.0)] |
| 00000001 | [R1 * $\sqrt{\epsilon_s}$ * cos(π/32.0), R1 * $\sqrt{\epsilon_s}$ * sin(π/32.0)] |
| 00000010 | [R2 * $\sqrt{\epsilon_s}$ * cos(3 * π/32.0), R2 * $\sqrt{\epsilon_s}$ * sin(3 * π/32.0)] |
| 00000011 | [R1 * $\sqrt{\epsilon_s}$ * cos(3 * π/32.0), R1 * $\sqrt{\epsilon_s}$ * sin(3 * π/32.0)] |
| 00000100 | [R2 * $\sqrt{\epsilon_s}$ * cos(7 * π/32.0), R2 * $\sqrt{\epsilon_s}$ * sin(7 * π/32.0)] |
| 00000101 | [R1 * $\sqrt{\epsilon_s}$ * cos(7 * π/32.0), R1 * $\sqrt{\epsilon_s}$ * sin(7 * π/32.0)] |
| 00000110 | [R2 * $\sqrt{\epsilon_s}$ * cos(5 * π/32.0), R2 * $\sqrt{\epsilon_s}$ * sin(5 * π/32.0)] |
| 00000111 | [R1 * $\sqrt{\epsilon_s}$ * cos(5 * π/32.0), R1 * $\sqrt{\epsilon_s}$ * sin(5 * π/32.0)] |
| 00001000 | [R2 * $\sqrt{\epsilon_s}$ * cos(15 * π/32.0), R2 * $\sqrt{\epsilon_s}$ * sin(15 * π/32.0)] |
| 00001001 | [R1 * $\sqrt{\epsilon_s}$ * cos(15 * π/32.0), R1 * $\sqrt{\epsilon_s}$ * sin(15 * π/32.0)] |
| 00001010 | [R2 * $\sqrt{\epsilon_s}$ * cos(13 * π/32.0), R2 * $\sqrt{\epsilon_s}$ * sin(13 * π/32.0)] |
| 00001011 | [R1 * $\sqrt{\epsilon_s}$ * cos(13 * π/32.0), R1 * $\sqrt{\epsilon_s}$ * sin(13 * π/32.0)] |
| 00001100 | [R2 * $\sqrt{\epsilon_s}$ * cos(9 * π/32.0), R2 * $\sqrt{\epsilon_s}$ * sin(9 * π/32.0)] |
| 00001101 | [R1 * $\sqrt{\epsilon_s}$ * cos(9 * π/32.0), R1 * $\sqrt{\epsilon_s}$ * sin(9 * π/32.0)] |
| 00001110 | [R2 * $\sqrt{\epsilon_s}$ * cos(11 * π/32.0), R2 * $\sqrt{\epsilon_s}$ * sin(11 * π/32.0)] |
| 00001111 | [R1 * $\sqrt{\epsilon_s}$ * cos(11 * π/32.0), R1 * $\sqrt{\epsilon_s}$ * sin(11 * π/32.0)] |
| 00010000 | [R3 * $\sqrt{\epsilon_s}$ * cos(π/64.0), R3 * $\sqrt{\epsilon_s}$ * sin(π/64.0)] |
| 00010001 | [R3 * $\sqrt{\epsilon_s}$ * cos(3 * π/64.0), R3 * $\sqrt{\epsilon_s}$ * sin(3 * π/64.0)] |
| 00010010 | [R3 * $\sqrt{\epsilon_s}$ * cos(7 * π/64.0), R3 * $\sqrt{\epsilon_s}$ * sin(7 * π/64.0)] |
| 00010011 | [R3 * $\sqrt{\epsilon_s}$ * cos(5 * π/64.0), R3 * $\sqrt{\epsilon_s}$ * sin(5 * π/64.0)] |
| 00010100 | [R3 * $\sqrt{\epsilon_s}$ * cos(15 * π/64.0), R3 * $\sqrt{\epsilon_s}$ * sin(15 * π/64.0)] |
| 00010101 | [R3 * $\sqrt{\epsilon_s}$ * cos(13 * π/64.0), R3 * $\sqrt{\epsilon_s}$ * sin(13 * π/64.0)] |
| 00010110 | [R3 * $\sqrt{\epsilon_s}$ * cos(9 * π/64.0), R3 * $\sqrt{\epsilon_s}$ * sin(9 * π/64.0)] |
| 00010111 | [R3 * $\sqrt{\epsilon_s}$ * cos(11 * π/64.0), R3 * $\sqrt{\epsilon_s}$ * sin(11 * π/64.0)] |
| 00011000 | [R3 * $\sqrt{\epsilon_s}$ * cos(31 * π/64.0), R3 * $\sqrt{\epsilon_s}$ * sin(31 * π/64.0)] |
| 00011001 | [R3 * $\sqrt{\epsilon_s}$ * cos(29 * π/64.0), R3 * $\sqrt{\epsilon_s}$ * sin(29 * π/64.0)] |
| 00011010 | [R3 * $\sqrt{\epsilon_s}$ * cos(25 * π/64.0), R3 * $\sqrt{\epsilon_s}$ * sin(25 * π/64.0)] |
| 00011011 | [R3 * $\sqrt{\epsilon_s}$ * cos(27 * π/64.0), R3 * $\sqrt{\epsilon_s}$ * sin(27 * π/64.0)] |
| 00011100 | [R3 * $\sqrt{\epsilon_s}$ * cos(17 * π/64.0), R3 * $\sqrt{\epsilon_s}$ * sin(17 * π/64.0)] |
| 00011101 | [R3 * $\sqrt{\epsilon_s}$ * cos(19 * π/64.0), R3 * $\sqrt{\epsilon_s}$ * sin(19 * π/64.0)] |
| 00011110 | [R3 * $\sqrt{\epsilon_s}$ * cos(23 * π/64.0), R3 * $\sqrt{\epsilon_s}$ * sin(23 * π/64.0)] |
| 00011111 | [R3 * $\sqrt{\epsilon_s}$ * cos(21 * π/64.0), R3 * $\sqrt{\epsilon_s}$ * sin(21 * π/64.0)] |
| 00100000 | [R5 * $\sqrt{\epsilon_s}$ * cos(π/64.0), R5 * $\sqrt{\epsilon_s}$ * sin(π/64.0)] |
| 00100001 | [R5 * $\sqrt{\epsilon_s}$ * cos(3 * π/64.0), R5 * $\sqrt{\epsilon_s}$ * sin(3 * π/64.0)] |
| 00100010 | [R5 * $\sqrt{\epsilon_s}$ * cos(7 * π/64.0), R5 * $\sqrt{\epsilon_s}$ * sin(7 * π/64.0)] |
| 00100011 | [R5 * $\sqrt{\epsilon_s}$ * cos(5 * π/64.0), R5 * $\sqrt{\epsilon_s}$ * sin(5 * π/64.0)] |
| 00100100 | [R5 * $\sqrt{\epsilon_s}$ * cos(15 * π/64.0), R5 * $\sqrt{\epsilon_s}$ * sin(15 * π/64.0)] |
| 00100101 | [R5 * $\sqrt{\epsilon_s}$ * cos(13 * π/64.0), R5 * $\sqrt{\epsilon_s}$ * sin(13 * π/64.0)] |
| 00100110 | [R5 * $\sqrt{\epsilon_s}$ * cos(9 * π/64.0), R5 * $\sqrt{\epsilon_s}$ * sin(9 * π/64.0)] |
| 00100111 | [R5 * $\sqrt{\epsilon_s}$ * cos(11 * π/64.0), R5 * $\sqrt{\epsilon_s}$ * sin(11 * π/64.0)] |
| 00101000 | [R5 * $\sqrt{\epsilon_s}$ * cos(31 * π/64.0), R5 * $\sqrt{\epsilon_s}$ * sin(31 * π/64.0)] |
| 00101001 | [R5 * $\sqrt{\epsilon_s}$ * cos(29 * π/64.0), R5 * $\sqrt{\epsilon_s}$ * sin(29 * π/64.0)] |
| 00101010 | [R5 * $\sqrt{\epsilon_s}$ * cos(25 * π/64.0), R5 * $\sqrt{\epsilon_s}$ * sin(25 * π/64.0)] |
| 00101011 | [R5 * $\sqrt{\epsilon_s}$ * cos(27 * π/64.0), R5 * $\sqrt{\epsilon_s}$ * sin(27 * π/64.0)] |
| 00101100 | [R5 * $\sqrt{\epsilon_s}$ * cos(17 * π/64.0), R5 * $\sqrt{\epsilon_s}$ * sin(17 * π/64.0)] |
| 00101101 | [R5 * $\sqrt{\epsilon_s}$ * cos(19 * π/64.0), R5 * $\sqrt{\epsilon_s}$ * sin(19 * π/64.0)] |
| 00101110 | [R5 * $\sqrt{\epsilon_s}$ * cos(23 * π/64.0), R5 * $\sqrt{\epsilon_s}$ * sin(23 * π/64.0)] |
| 00101111 | [R5 * $\sqrt{\epsilon_s}$ * cos(21 * π/64.0), R5 * $\sqrt{\epsilon_s}$ * sin(21 * π/64.0)] |
| 00110000 | [R4 * $\sqrt{\epsilon_s}$ * cos(π/64.0), R4 * $\sqrt{\epsilon_s}$ * sin(π/64.0)] |
| 00110001 | [R4 * $\sqrt{\epsilon_s}$ * cos(3 * π/64.0), R4 * $\sqrt{\epsilon_s}$ * sin(3 * π/64.0)] |
| 00110010 | [R4 * $\sqrt{\epsilon_s}$ * cos(7 * π/64.0), R4 * $\sqrt{\epsilon_s}$ * sin(7 * π/64.0)] |
| 00110011 | [R4 * $\sqrt{\epsilon_s}$ * cos(5 * π/64.0), R4 * $\sqrt{\epsilon_s}$ * sin(5 * π/64.0)] |
| 00110100 | [R4 * $\sqrt{\epsilon_s}$ * cos(15 * π/64.0), R4 * $\sqrt{\epsilon_s}$ * sin(15 * π/64.0)] |
| 00110101 | [R4 * $\sqrt{\epsilon_s}$ * cos(13 * π/64.0), R4 * $\sqrt{\epsilon_s}$ * sin(13 * π/64.0)] |
| 00110110 | [R4 * $\sqrt{\epsilon_s}$ * cos(9 * π/64.0), R4 * $\sqrt{\epsilon_s}$ * sin(9 * π/64.0)] |
| 00110111 | [R4 * $\sqrt{\epsilon_s}$ * cos(11 * π/64.0), R4 * $\sqrt{\epsilon_s}$ * sin(11 * π/64.0)] |
| 00111000 | [R4 * $\sqrt{\epsilon_s}$ * cos(31 * π/64.0), R4 * $\sqrt{\epsilon_s}$ * sin(31 * π/64.0)] |
| 00111001 | [R4 * $\sqrt{\epsilon_s}$ * cos(29 * π/64.0), R4 * $\sqrt{\epsilon_s}$ * sin(29 * π/64.0)] |
| 00111010 | [R4 * $\sqrt{\epsilon_s}$ * cos(25 * π/64.0), R4 * $\sqrt{\epsilon_s}$ * sin(25 * π/64.0)] |
| 00111011 | [R4 * $\sqrt{\epsilon_s}$ * cos(27 * π/64.0), R4 * $\sqrt{\epsilon_s}$ * sin(27 * π/64.0)] |
| 00111100 | [R4 * $\sqrt{\epsilon_s}$ * cos(17 * π/64.0), R4 * $\sqrt{\epsilon_s}$ * sin(17 * π/64.0)] |
| 00111101 | [R4 * $\sqrt{\epsilon_s}$ * cos(19 * π/64.0), R4 * $\sqrt{\epsilon_s}$ * sin(19 * π/64.0)] |
| 00111110 | [R4 * $\sqrt{\epsilon_s}$ * cos(23 * π/64.0), R4 * $\sqrt{\epsilon_s}$ * sin(23 * π/64.0)] |
| 00111111 | [R4 * $\sqrt{\epsilon_s}$ * cos(21 * π/64.0), R4 * $\sqrt{\epsilon_s}$ * sin(21 * π/64.0)] |
| 01000000 | [R2 * $\sqrt{\epsilon_s}$ * cos(31 * π/32.0), R2 * $\sqrt{\epsilon_s}$ * sin(31 * π/32.0)] |
| 01000001 | [R1 * $\sqrt{\epsilon_s}$ * cos(31 * π/32.0), R1 * $\sqrt{\epsilon_s}$ * sin(31 * π/32.0)] |
| 01000010 | [R2 * $\sqrt{\epsilon_s}$ * cos(29 * π/32.0), R2 * $\sqrt{\epsilon_s}$ * sin(29 * π/32.0)] |
| 01000011 | [R1 * $\sqrt{\epsilon_s}$ * cos(29 * π/32.0), R1 * $\sqrt{\epsilon_s}$ * sin(29 * π/32.0)] |
| 01000100 | [R2 * $\sqrt{\epsilon_s}$ * cos(25 * π/32.0), R2 * $\sqrt{\epsilon_s}$ * sin(25 * π/32.0)] |
| 01000101 | [R1 * $\sqrt{\epsilon_s}$ * cos(25 * π/32.0), R1 * $\sqrt{\epsilon_s}$ * sin(25 * π/32.0)] |
| 01000110 | [R2 * $\sqrt{\epsilon_s}$ * cos(27 * π/32.0), R2 * $\sqrt{\epsilon_s}$ * sin(27 * π/32.0)] |
| 01000111 | [R1 * $\sqrt{\epsilon_s}$ * cos(27 * π/32.0), R1 * $\sqrt{\epsilon_s}$ * sin(27 * π/32.0)] |
| 01001000 | [R2 * $\sqrt{\epsilon_s}$ * cos(17 * π/32.0), R2 * $\sqrt{\epsilon_s}$ * sin(17 * π/32.0)] |
| 01001001 | [R1 * $\sqrt{\epsilon_s}$ * cos(17 * π/32.0), R1 * $\sqrt{\epsilon_s}$ * sin(17 * π/32.0)] |
| 01001010 | [R2 * $\sqrt{\epsilon_s}$ * cos(19 * π/32.0), R2 * $\sqrt{\epsilon_s}$ * sin(19 * π/32.0)] |
| 01001011 | [R1 * $\sqrt{\epsilon_s}$ * cos(19 * π/32.0), R1 * $\sqrt{\epsilon_s}$ * sin(19 * π/32.0)] |
| 01001100 | [R2 * $\sqrt{\epsilon_s}$ * cos(23 * π/32.0), R2 * $\sqrt{\epsilon_s}$ * sin(23 * π/32.0)] |
| 01001101 | [R1 * $\sqrt{\epsilon_s}$ * cos(23 * π/32.0), R1 * $\sqrt{\epsilon_s}$ * sin(23 * π/32.0)] |
| 01001110 | [R2 * $\sqrt{\epsilon_s}$ * cos(21 * π/32.0), R2 * $\sqrt{\epsilon_s}$ * sin(21 * π/32.0)] |

| Bit Label | [x, y] Coordinates |
|---|---|
| 01001111 | [R1 * $\sqrt{\epsilon_s}$ * cos(21 * π/32.0), R1 * $\sqrt{\epsilon_s}$ * sin(21 * π/32.0)] |
| 01010000 | [R3 * $\sqrt{\epsilon_s}$ * cos(63 * π/64.0), R3 * $\sqrt{\epsilon_s}$ * sin(63 * π/64.0)] |
| 01010001 | [R3 * $\sqrt{\epsilon_s}$ * cos(61 * π/64.0), R3 * $\sqrt{\epsilon_s}$ * sin(61 * π/64.0)] |
| 01010010 | [R3 * $\sqrt{\epsilon_s}$ * cos(57 * π/64.0), R3 * $\sqrt{\epsilon_s}$ * sin(57 * π/64.0)] |
| 01010011 | [R3 * $\sqrt{\epsilon_s}$ * cos(59 * π/64.0), R3 * $\sqrt{\epsilon_s}$ * sin(59 * π/64.0)] |
| 01010100 | [R3 * $\sqrt{\epsilon_s}$ * cos(49 * π/64.0), R3 * $\sqrt{\epsilon_s}$ * sin(49 * π/64.0)] |
| 01010101 | [R3 * $\sqrt{\epsilon_s}$ * cos(51 * π/64.0), R3 * $\sqrt{\epsilon_s}$ * sin(51 * π/64.0)] |
| 01010110 | [R3 * $\sqrt{\epsilon_s}$ * cos(55 * π/64.0), R3 * $\sqrt{\epsilon_s}$ * sin(55 * π/64.0)] |
| 01010111 | [R3 * $\sqrt{\epsilon_s}$ * cos(53 * π/64.0), R3 * $\sqrt{\epsilon_s}$ * sin(53 * π/64.0)] |
| 01011000 | [R3 * $\sqrt{\epsilon_s}$ * cos(33 * π/64.0), R3 * $\sqrt{\epsilon_s}$ * sin(33 * π/64.0)] |
| 01011001 | [R3 * $\sqrt{\epsilon_s}$ * cos(35 * π/64.0), R3 * $\sqrt{\epsilon_s}$ * sin(35 * π/64.0)] |
| 01011010 | [R3 * $\sqrt{\epsilon_s}$ * cos(39 * π/64.0), R3 * $\sqrt{\epsilon_s}$ * sin(39 * π/64.0)] |
| 01011011 | [R3 * $\sqrt{\epsilon_s}$ * cos(37 * π/64.0), R3 * $\sqrt{\epsilon_s}$ * sin(37 * π/64.0)] |
| 01011100 | [R3 * $\sqrt{\epsilon_s}$ * cos(47 * π/64.0), R3 * $\sqrt{\epsilon_s}$ * sin(47 * π/64.0)] |
| 01011101 | [R3 * $\sqrt{\epsilon_s}$ * cos(45 * π/64.0), R3 * $\sqrt{\epsilon_s}$ * sin(45 * π/64.0)] |
| 01011110 | [R3 * $\sqrt{\epsilon_s}$ * cos(41 * π/64.0), R3 * $\sqrt{\epsilon_s}$ * sin(41 * π/64.0)] |
| 01011111 | [R3 * $\sqrt{\epsilon_s}$ * cos(43 * π/64.0), R3 * $\sqrt{\epsilon_s}$ * sin(43 * π/64.0)] |
| 01100000 | [R5 * $\sqrt{\epsilon_s}$ * cos(63 * π/64.0), R5 * $\sqrt{\epsilon_s}$ * sin(63 * π/64.0)] |
| 01100001 | [R5 * $\sqrt{\epsilon_s}$ * cos(61 * π/64.0), R5 * $\sqrt{\epsilon_s}$ * sin(61 * π/64.0)] |
| 01100010 | [R5 * $\sqrt{\epsilon_s}$ * cos(57 * π/64.0), R5 * $\sqrt{\epsilon_s}$ * sin(57 * π/64.0)] |
| 01100011 | [R5 * $\sqrt{\epsilon_s}$ * cos(59 * π/64.0), R5 * $\sqrt{\epsilon_s}$ * sin(59 * π/64.0)] |
| 01100100 | [R5 * $\sqrt{\epsilon_s}$ * cos(49 * π/64.0), R5 * $\sqrt{\epsilon_s}$ * sin(49 * π/64.0)] |
| 01100101 | [R5 * $\sqrt{\epsilon_s}$ * cos(51 * π/64.0), R5 * $\sqrt{\epsilon_s}$ * sin(51 * π/64.0)] |
| 01100110 | [R5 * $\sqrt{\epsilon_s}$ * cos(55 * π/64.0), R5 * $\sqrt{\epsilon_s}$ * sin(55 * π/64.0)] |
| 01100111 | [R5 * $\sqrt{\epsilon_s}$ * cos(53 * π/64.0), R5 * $\sqrt{\epsilon_s}$ * sin(53 * π/64.0)] |
| 01101000 | [R5 * $\sqrt{\epsilon_s}$ * cos(33 * π/64.0), R5 * $\sqrt{\epsilon_s}$ * sin(33 * π/64.0)] |
| 01101001 | [R5 * $\sqrt{\epsilon_s}$ * cos(35 * π/64.0), R5 * $\sqrt{\epsilon_s}$ * sin(35 * π/64.0)] |
| 01101010 | [R5 * $\sqrt{\epsilon_s}$ * cos(39 * π/64.0), R5 * $\sqrt{\epsilon_s}$ * sin(39 * π/64.0)] |
| 01101011 | [R5 * $\sqrt{\epsilon_s}$ * cos(37 * π/64.0), R5 * $\sqrt{\epsilon_s}$ * sin(37 * π/64.0)] |
| 01101100 | [R5 * $\sqrt{\epsilon_s}$ * cos(47 * π/64.0), R5 * $\sqrt{\epsilon_s}$ * sin(47 * π/64.0)] |
| 01101101 | [R5 * $\sqrt{\epsilon_s}$ * cos(45 * π/64.0), R5 * $\sqrt{\epsilon_s}$ * sin(45 * π/64.0)] |
| 01101110 | [R5 * $\sqrt{\epsilon_s}$ * cos(41 * π/64.0), R5 * $\sqrt{\epsilon_s}$ * sin(41 * π/64.0)] |
| 01101111 | [R5 * $\sqrt{\epsilon_s}$ * cos(43 * π/64.0), R5 * $\sqrt{\epsilon_s}$ * sin(43 * π/64.0)] |
| 01110000 | [R4 * $\sqrt{\epsilon_s}$ * cos(63 * π/64.0), R4 * $\sqrt{\epsilon_s}$ * sin(63 * π/64.0)] |
| 01110001 | [R4 * $\sqrt{\epsilon_s}$ * cos(61 * π/64.0), R4 * $\sqrt{\epsilon_s}$ * sin(61 * π/64.0)] |
| 01110010 | [R4 * $\sqrt{\epsilon_s}$ * cos(57 * π/64.0), R4 * $\sqrt{\epsilon_s}$ * sin(57 * π/64.0)] |
| 01110011 | [R4 * $\sqrt{\epsilon_s}$ * cos(59 * π/64.0), R4 * $\sqrt{\epsilon_s}$ * sin(59 * π/64.0)] |
| 01110100 | [R4 * $\sqrt{\epsilon_s}$ * cos(49 * π/64.0), R4 * $\sqrt{\epsilon_s}$ * sin(49 * π/64.0)] |
| 01110101 | [R4 * $\sqrt{\epsilon_s}$ * cos(51 * π/64.0), R4 * $\sqrt{\epsilon_s}$ * sin(51 * π/64.0)] |
| 01110110 | [R4 * $\sqrt{\epsilon_s}$ * cos(55 * π/64.0), R4 * $\sqrt{\epsilon_s}$ * sin(55 * π/64.0)] |
| 01110111 | [R4 * $\sqrt{\epsilon_s}$ * cos(53 * π/64.0), R4 * $\sqrt{\epsilon_s}$ * sin(53 * π/64.0)] |
| 01111000 | [R4 * $\sqrt{\epsilon_s}$ * cos(33 * π/64.0), R4 * $\sqrt{\epsilon_s}$ * sin(33 * π/64.0)] |
| 01111001 | [R4 * $\sqrt{\epsilon_s}$ * cos(35 * π/64.0), R4 * $\sqrt{\epsilon_s}$ * sin(35 * π/64.0)] |
| 01111010 | [R4 * $\sqrt{\epsilon_s}$ * cos(39 * π/64.0), R4 * $\sqrt{\epsilon_s}$ * sin(39 * π/64.0)] |
| 01111011 | [R4 * $\sqrt{\epsilon_s}$ * cos(37 * π/64.0), R4 * $\sqrt{\epsilon_s}$ * sin(37 * π/64.0)] |
| 01111100 | [R4 * $\sqrt{\epsilon_s}$ * cos(47 * π/64.0), R4 * $\sqrt{\epsilon_s}$ * sin(47 * π/64.0)] |
| 01111101 | [R4 * $\sqrt{\epsilon_s}$ * cos(45 * π/64.0), R4 * $\sqrt{\epsilon_s}$ * sin(45 * π/64.0)] |
| 01111110 | [R4 * $\sqrt{\epsilon_s}$ * cos(41 * π/64.0), R4 * $\sqrt{\epsilon_s}$ * sin(41 * π/64.0)] |
| 01111111 | [R4 * $\sqrt{\epsilon_s}$ * cos(43 * π/64.0), R4 * $\sqrt{\epsilon_s}$ * sin(43 * π/64.0)] |
| 10000000 | [R2 * $\sqrt{\epsilon_s}$ * cos(63 * π/32.0), R2 * $\sqrt{\epsilon_s}$ * sin(63 * π/32.0)] |
| 10000001 | [R1 * $\sqrt{\epsilon_s}$ * cos(63 * π/32.0), R1 * $\sqrt{\epsilon_s}$ * sin(63 * π/32.0)] |
| 10000010 | [R2 * $\sqrt{\epsilon_s}$ * cos(61 * π/32.0), R2 * $\sqrt{\epsilon_s}$ * sin(61 * π/32.0)] |
| 10000011 | [R1 * $\sqrt{\epsilon_s}$ * cos(61 * π/32.0), R1 * $\sqrt{\epsilon_s}$ * sin(61 * π/32.0)] |
| 10000100 | [R2 * $\sqrt{\epsilon_s}$ * cos(57 * π/32.0), R2 * $\sqrt{\epsilon_s}$ * sin(57 * π/32.0)] |
| 10000101 | [R1 * $\sqrt{\epsilon_s}$ * cos(57 * π/32.0), R1 * $\sqrt{\epsilon_s}$ * sin(57 * π/32.0)] |
| 10000110 | [R2 * $\sqrt{\epsilon_s}$ * cos(59 * π/32.0), R2 * $\sqrt{\epsilon_s}$ * sin(59 * π/32.0)] |
| 10000111 | [R1 * $\sqrt{\epsilon_s}$ * cos(59 * π/32.0), R1 * $\sqrt{\epsilon_s}$ * sin(59 * π/32.0)] |
| 10001000 | [R2 * $\sqrt{\epsilon_s}$ * cos(49 * π/32.0), R2 * $\sqrt{\epsilon_s}$ * sin(49 * π/32.0)] |
| 10001001 | [R1 * $\sqrt{\epsilon_s}$ * cos(49 * π/32.0), R1 * $\sqrt{\epsilon_s}$ * sin(49 * π/32.0)] |
| 10001010 | [R2 * $\sqrt{\epsilon_s}$ * cos(51 * π/32.0), R2 * $\sqrt{\epsilon_s}$ * sin(51 * π/32.0)] |
| 10001011 | [R1 * $\sqrt{\epsilon_s}$ * cos(51 * π/32.0), R1 * $\sqrt{\epsilon_s}$ * sin(51 * π/32.0)] |
| 10001100 | [R2 * $\sqrt{\epsilon_s}$ * cos(55 * π/32.0), R2 * $\sqrt{\epsilon_s}$ * sin(55 * π/32.0)] |
| 10001101 | [R1 * $\sqrt{\epsilon_s}$ * cos(55 * π/32.0), R1 * $\sqrt{\epsilon_s}$ * sin(55 * π/32.0)] |
| 10001110 | [R2 * $\sqrt{\epsilon_s}$ * cos(53 * π/32.0), R2 * $\sqrt{\epsilon_s}$ * sin(53 * π/32.0)] |
| 10001111 | [R1 * $\sqrt{\epsilon_s}$ * cos(53 * π/32.0), R1 * $\sqrt{\epsilon_s}$ * sin(53 * π/32.0)] |
| 10010000 | [R3 * $\sqrt{\epsilon_s}$ * cos(127 * π/64.0), R3 * $\sqrt{\epsilon_s}$ * sin(127 * π/64.0)] |
| 10010001 | [R3 * $\sqrt{\epsilon_s}$ * cos(125 * π/64.0), R3 * $\sqrt{\epsilon_s}$ * sin(125 * π/64.0)] |
| 10010010 | [R3 * $\sqrt{\epsilon_s}$ * cos(121 * π/64.0), R3 * $\sqrt{\epsilon_s}$ * sin(121 * π/64.0)] |
| 10010011 | [R3 * $\sqrt{\epsilon_s}$ * cos(123 * π/64.0), R3 * $\sqrt{\epsilon_s}$ * sin(123 * π/64.0)] |
| 10010100 | [R3 * $\sqrt{\epsilon_s}$ * cos(113 * π/64.0), R3 * $\sqrt{\epsilon_s}$ * sin(113 * π/64.0)] |
| 10010101 | [R3 * $\sqrt{\epsilon_s}$ * cos(115 * π/64.0), R3 * $\sqrt{\epsilon_s}$ * sin(115 * π/64.0)] |
| 10010110 | [R3 * $\sqrt{\epsilon_s}$ * cos(119 * π/64.0), R3 * $\sqrt{\epsilon_s}$ * sin(119 * π/64.0)] |
| 10010111 | [R3 * $\sqrt{\epsilon_s}$ * cos(117 * π/64.0), R3 * $\sqrt{\epsilon_s}$ * sin(117 * π/64.0)] |
| 10011000 | [R3 * $\sqrt{\epsilon_s}$ * cos(97 * π/64.0), R3 * $\sqrt{\epsilon_s}$ * sin(97 * π/64.0)] |
| 10011001 | [R3 * $\sqrt{\epsilon_s}$ * cos(99 * π/64.0), R3 * $\sqrt{\epsilon_s}$ * sin(99 * π/64.0)] |
| 10011010 | [R3 * $\sqrt{\epsilon_s}$ * cos(103 * π/64.0), R3 * $\sqrt{\epsilon_s}$ * sin(103 * π/64.0)] |
| 10011011 | [R3 * $\sqrt{\epsilon_s}$ * cos(101 * π/64.0), R3 * $\sqrt{\epsilon_s}$ * sin(101 * π/64.0)] |
| 10011100 | [R3 * $\sqrt{\epsilon_s}$ * cos(111 * π/64.0), R3 * $\sqrt{\epsilon_s}$ * sin(111 * π/64.0)] |
| 10011101 | [R3 * $\sqrt{\epsilon_s}$ * cos(109 * π/64.0), R3 * $\sqrt{\epsilon_s}$ * sin(109 * π/64.0)] |
| 10011110 | [R3 * $\sqrt{\epsilon_s}$ * cos(105 * π/64.0), R3 * $\sqrt{\epsilon_s}$ * sin(105 * π/64.0)] |
| 10011111 | [R3 * $\sqrt{\epsilon_s}$ * cos(107 * π/64.0), R3 * $\sqrt{\epsilon_s}$ * sin(107 * π/64.0)] |
| 10100000 | [R5 * $\sqrt{\epsilon_s}$ * cos(127 * π/64.0), R5 * $\sqrt{\epsilon_s}$ * sin(127 * π/64.0)] |
| 10100001 | [R5 * $\sqrt{\epsilon_s}$ * cos(125 * π/64.0), R5 * $\sqrt{\epsilon_s}$ * sin(125 * π/64.0)] |
| 10100010 | [R5 * $\sqrt{\epsilon_s}$ * cos(121 * π/64.0), R5 * $\sqrt{\epsilon_s}$ * sin(121 * π/64.0)] |
| 10100011 | [R5 * $\sqrt{\epsilon_s}$ * cos(123 * π/64.0), R5 * $\sqrt{\epsilon_s}$ * sin(123 * π/64.0)] |
| 10100100 | [R5 * $\sqrt{\epsilon_s}$ * cos(113 * π/64.0), R5 * $\sqrt{\epsilon_s}$ * sin(113 * π/64.0)] |
| 10100101 | [R5 * $\sqrt{\epsilon_s}$ * cos(115 * π/64.0), R5 * $\sqrt{\epsilon_s}$ * sin(115 * π/64.0)] |
| 10100110 | [R5 * $\sqrt{\epsilon_s}$ * cos(119 * π/64.0), R5 * $\sqrt{\epsilon_s}$ * sin(119 * π/64.0)] |
| 10100111 | [R5 * $\sqrt{\epsilon_s}$ * cos(117 * π/64.0), R5 * $\sqrt{\epsilon_s}$ * sin(117 * π/64.0)] |
| 10101000 | [R5 * $\sqrt{\epsilon_s}$ * cos(97 * π/64.0), R5 * $\sqrt{\epsilon_s}$ * sin(97 * π/64.0)] |
| 10101001 | [R5 * $\sqrt{\epsilon_s}$ * cos(99 * π/64.0), R5 * $\sqrt{\epsilon_s}$ * sin(99 * π/64.0)] |
| 10101010 | [R5 * $\sqrt{\epsilon_s}$ * cos(103 * π/64.0), R5 * $\sqrt{\epsilon_s}$ * sin(103 * π/64.0)] |
| 10101011 | [R5 * $\sqrt{\epsilon_s}$ * cos(101 * π/64.0), R5 * $\sqrt{\epsilon_s}$ * sin(101 * π/64.0)] |
| 10101100 | [R5 * $\sqrt{\epsilon_s}$ * cos(111 * π/64.0), R5 * $\sqrt{\epsilon_s}$ * sin(111 * π/64.0)] |
| 10101101 | [R5 * $\sqrt{\epsilon_s}$ * cos(109 * π/64.0), R5 * $\sqrt{\epsilon_s}$ * sin(109 * π/64.0)] |
| 10101110 | [R5 * $\sqrt{\epsilon_s}$ * cos(105 * π/64.0), R5 * $\sqrt{\epsilon_s}$ * sin(105 * π/64.0)] |
| 10101111 | [R5 * $\sqrt{\epsilon_s}$ * cos(107 * π/64.0), R5 * $\sqrt{\epsilon_s}$ * sin(107 * π/64.0)] |
| 10110000 | [R4 * $\sqrt{\epsilon_s}$ * cos(127 * π/64.0), R4 * $\sqrt{\epsilon_s}$ * sin(127 * π/64.0)] |
| 10110001 | [R4 * $\sqrt{\epsilon_s}$ * cos(125 * π/64.0), R4 * $\sqrt{\epsilon_s}$ * sin(125 * π/64.0)] |
| 10110010 | [R4 * $\sqrt{\epsilon_s}$ * cos(121 * π/64.0), R4 * $\sqrt{\epsilon_s}$ * sin(121 * π/64.0)] |
| 10110011 | [R4 * $\sqrt{\epsilon_s}$ * cos(123 * π/64.0), R4 * $\sqrt{\epsilon_s}$ * sin(123 * π/64.0)] |
| 10110100 | [R4 * $\sqrt{\epsilon_s}$ * cos(113 * π/64.0), R4 * $\sqrt{\epsilon_s}$ * sin(113 * π/64.0)] |
| 10110101 | [R4 * $\sqrt{\epsilon_s}$ * cos(115 * π/64.0), R4 * $\sqrt{\epsilon_s}$ * sin(115 * π/64.0)] |
| 10110110 | [R4 * $\sqrt{\epsilon_s}$ * cos(119 * π/64.0), R4 * $\sqrt{\epsilon_s}$ * sin(119 * π/64.0)] |
| 10110111 | [R4 * $\sqrt{\epsilon_s}$ * cos(117 * π/64.0), R4 * $\sqrt{\epsilon_s}$ * sin(117 * π/64.0)] |
| 10111000 | [R4 * $\sqrt{\epsilon_s}$ * cos(97 * π/64.0), R4 * $\sqrt{\epsilon_s}$ * sin(97 * π/64.0)] |
| 10111001 | [R4 * $\sqrt{\epsilon_s}$ * cos(99 * π/64.0), R4 * $\sqrt{\epsilon_s}$ * sin(99 * π/64.0)] |
| 10111010 | [R4 * $\sqrt{\epsilon_s}$ * cos(103 * π/64.0), R4 * $\sqrt{\epsilon_s}$ * sin(103 * π/64.0)] |
| 10111011 | [R4 * $\sqrt{\epsilon_s}$ * cos(101 * π/64.0), R4 * $\sqrt{\epsilon_s}$ * sin(101 * π/64.0)] |
| 10111100 | [R4 * $\sqrt{\epsilon_s}$ * cos(111 * π/64.0), R4 * $\sqrt{\epsilon_s}$ * sin(111 * π/64.0)] |
| 10111101 | [R4 * $\sqrt{\epsilon_s}$ * cos(109 * π/64.0), R4 * $\sqrt{\epsilon_s}$ * sin(109 * π/64.0)] |
| 10111110 | [R4 * $\sqrt{\epsilon_s}$ * cos(105 * π/64.0), R4 * $\sqrt{\epsilon_s}$ * sin(105 * π/64.0)] |
| 10111111 | [R4 * $\sqrt{\epsilon_s}$ * cos(107 * π/64.0), R4 * $\sqrt{\epsilon_s}$ * sin(107 * π/64.0)] |
| 11000000 | [R2 * $\sqrt{\epsilon_s}$ * cos(33 * π/32.0), R2 * $\sqrt{\epsilon_s}$ * sin(33 * π/32.0)] |
| 11000001 | [R1 * $\sqrt{\epsilon_s}$ * cos(33 * π/32.0), R1 * $\sqrt{\epsilon_s}$ * sin(33 * π/32.0)] |
| 11000010 | [R2 * $\sqrt{\epsilon_s}$ * cos(35 * π/32.0), R2 * $\sqrt{\epsilon_s}$ * sin(35 * π/32.0)] |
| 11000011 | [R1 * $\sqrt{\epsilon_s}$ * cos(35 * π/32.0), R1 * $\sqrt{\epsilon_s}$ * sin(35 * π/32.0)] |
| 11000100 | [R2 * $\sqrt{\epsilon_s}$ * cos(39 * π/32.0), R2 * $\sqrt{\epsilon_s}$ * sin(39 * π/32.0)] |
| 11000101 | [R1 * $\sqrt{\epsilon_s}$ * cos(39 * π/32.0), R1 * $\sqrt{\epsilon_s}$ * sin(39 * π/32.0)] |
| 11000110 | [R2 * $\sqrt{\epsilon_s}$ * cos(37 * π/32.0), R2 * $\sqrt{\epsilon_s}$ * sin(37 * π/32.0)] |
| 11000111 | [R1 * $\sqrt{\epsilon_s}$ * cos(37 * π/32.0), R1 * $\sqrt{\epsilon_s}$ * sin(37 * π/32.0)] |
| 11001000 | [R2 * $\sqrt{\epsilon_s}$ * cos(47 * π/32.0), R2 * $\sqrt{\epsilon_s}$ * sin(47 * π/32.0)] |
| 11001001 | [R1 * $\sqrt{\epsilon_s}$ * cos(47 * π/32.0), R1 * $\sqrt{\epsilon_s}$ * sin(47 * π/32.0)] |
| 11001010 | [R2 * $\sqrt{\epsilon_s}$ * cos(45 * π/32.0), R2 * $\sqrt{\epsilon_s}$ * sin(45 * π/32.0)] |
| 11001011 | [R1 * $\sqrt{\epsilon_s}$ * cos(45 * π/32.0), R1 * $\sqrt{\epsilon_s}$ * sin(45 * π/32.0)] |
| 11001100 | [R2 * $\sqrt{\epsilon_s}$ * cos(41 * π/32.0), R2 * $\sqrt{\epsilon_s}$ * sin(41 * π/32.0)] |
| 11001101 | [R1 * $\sqrt{\epsilon_s}$ * cos(41 * π/32.0), R1 * $\sqrt{\epsilon_s}$ * sin(41 * π/32.0)] |
| 11001110 | [R2 * $\sqrt{\epsilon_s}$ * cos(43 * π/32.0), R2 * $\sqrt{\epsilon_s}$ * sin(43 * π/32.0)] |
| 11001111 | [R1 * $\sqrt{\epsilon_s}$ * cos(43 * π/32.0), R1 * $\sqrt{\epsilon_s}$ * sin(43 * π/32.0)] |
| 11010000 | [R3 * $\sqrt{\epsilon_s}$ * cos(65 * π/64.0), R3 * $\sqrt{\epsilon_s}$ * sin(65 * π/64.0)] |
| 11010001 | [R3 * $\sqrt{\epsilon_s}$ * cos(67 * π/64.0), R3 * $\sqrt{\epsilon_s}$ * sin(67 * π/64.0)] |
| 11010010 | [R3 * $\sqrt{\epsilon_s}$ * cos(71 * π/64.0), R3 * $\sqrt{\epsilon_s}$ * sin(71 * π/64.0)] |
| 11010011 | [R3 * $\sqrt{\epsilon_s}$ * cos(69 * π/64.0), R3 * $\sqrt{\epsilon_s}$ * sin(69 * π/64.0)] |
| 11010100 | [R3 * $\sqrt{\epsilon_s}$ * cos(79 * π/64.0), R3 * $\sqrt{\epsilon_s}$ * sin(79 * π/64.0)] |
| 11010101 | [R3 * $\sqrt{\epsilon_s}$ * cos(77 * π/64.0), R3 * $\sqrt{\epsilon_s}$ * sin(77 * π/64.0)] |
| 11010110 | [R3 * $\sqrt{\epsilon_s}$ * cos(73 * π/64.0), R3 * $\sqrt{\epsilon_s}$ * sin(73 * π/64.0)] |
| 11010111 | [R3 * $\sqrt{\epsilon_s}$ * cos(75 * π/64.0), R3 * $\sqrt{\epsilon_s}$ * sin(75 * π/64.0)] |
| 11011000 | [R3 * $\sqrt{\epsilon_s}$ * cos(95 * π/64.0), R3 * $\sqrt{\epsilon_s}$ * sin(95 * π/64.0)] |
| 11011001 | [R3 * $\sqrt{\epsilon_s}$ * cos(93 * π/64.0), R3 * $\sqrt{\epsilon_s}$ * sin(93 * π/64.0)] |
| 11011010 | [R3 * $\sqrt{\epsilon_s}$ * cos(89 * π/64.0), R3 * $\sqrt{\epsilon_s}$ * sin(89 * π/64.0)] |
| 11011011 | [R3 * $\sqrt{\epsilon_s}$ * cos(91 * π/64.0), R3 * $\sqrt{\epsilon_s}$ * sin(91 * π/64.0)] |
| 11011100 | [R3 * $\sqrt{\epsilon_s}$ * cos(81 * π/64.0), R3 * $\sqrt{\epsilon_s}$ * sin(81 * π/64.0)] |
| 11011101 | [R3 * $\sqrt{\epsilon_s}$ * cos(83 * π/64.0), R3 * $\sqrt{\epsilon_s}$ * sin(83 * π/64.0)] |
| 11011110 | [R3 * $\sqrt{\epsilon_s}$ * cos(87 * π/64.0), R3 * $\sqrt{\epsilon_s}$ * sin(87 * π/64.0)] |
| 11011111 | [R3 * $\sqrt{\epsilon_s}$ * cos(85 * π/64.0), R3 * $\sqrt{\epsilon_s}$ * sin(85 * π/64.0)] |
| 11100000 | [R5 * $\sqrt{\epsilon_s}$ * cos(65 * π/64.0), R5 * $\sqrt{\epsilon_s}$ * sin(65 * π/64.0)] |
| 11100001 | [R5 * $\sqrt{\epsilon_s}$ * cos(67 * π/64.0), R5 * $\sqrt{\epsilon_s}$ * sin(67 * π/64.0)] |
| 11100010 | [R5 * $\sqrt{\epsilon_s}$ * cos(71 * π/64.0), R5 * $\sqrt{\epsilon_s}$ * sin(71 * π/64.0)] |
| 11100011 | [R5 * $\sqrt{\epsilon_s}$ * cos(69 * π/64.0), R5 * $\sqrt{\epsilon_s}$ * sin(69 * π/64.0)] |
| 11100100 | [R5 * $\sqrt{\epsilon_s}$ * cos(79 * π/64.0), R5 * $\sqrt{\epsilon_s}$ * sin(79 * π/64.0)] |
| 11100101 | [R5 * $\sqrt{\epsilon_s}$ * cos(77 * π/64.0), R5 * $\sqrt{\epsilon_s}$ * sin(77 * π/64.0)] |
| 11100110 | [R5 * $\sqrt{\epsilon_s}$ * cos(73 * π/64.0), R5 * $\sqrt{\epsilon_s}$ * sin(73 * π/64.0)] |
| 11100111 | [R5 * $\sqrt{\epsilon_s}$ * cos(75 * π/64.0), R5 * $\sqrt{\epsilon_s}$ * sin(75 * π/64.0)] |
| 11101000 | [R5 * $\sqrt{\epsilon_s}$ * cos(95 * π/64.0), R5 * $\sqrt{\epsilon_s}$ * sin(95 * π/64.0)] |

-continued

| Bit Label | [x, y] Coordinates |
|---|---|
| 11101001 | [R5 * $\sqrt{\epsilon_s}$ * cos(93 * π/64.0), R5 * $\sqrt{\epsilon_s}$ * sin(93 * π/64.0)] |
| 11101010 | [R5 * $\sqrt{\epsilon_s}$ * cos(89 * π/64.0), R5 * $\sqrt{\epsilon_s}$ * sin(89 * π/64.0)] |
| 11101011 | [R5 * $\sqrt{\epsilon_s}$ * cos(91 * π/64.0), R5 * $\sqrt{\epsilon_s}$ * sin(91 * π/64.0)] |
| 11101100 | [R5 * $\sqrt{\epsilon_s}$ * cos(81 * π/64.0), R5 * $\sqrt{\epsilon_s}$ * sin(81 * π/64.0)] |
| 11101101 | [R5 * $\sqrt{\epsilon_s}$ * cos(83 * π/64.0), R5 * $\sqrt{\epsilon_s}$ * sin(83 * π/64.0)] |
| 11101110 | [R5 * $\sqrt{\epsilon_s}$ * cos(87 * π/64.0), R5 * $\sqrt{\epsilon_s}$ * sin(87 * π/64.0)] |
| 11101111 | [R5 * $\sqrt{\epsilon_s}$ * cos(85 * π/64.0), R5 * $\sqrt{\epsilon_s}$ * sin(85 * π/64.0)] |
| 11110000 | [R4 * $\sqrt{\epsilon_s}$ * cos(65 * π/64.0), R4 * $\sqrt{\epsilon_s}$ * sin(65 * π/64.0)] |
| 11110001 | [R4 * $\sqrt{\epsilon_s}$ * cos(67 * π/64.0), R4 * $\sqrt{\epsilon_s}$ * sin(67 * π/64.0)] |
| 11110010 | [R4 * $\sqrt{\epsilon_s}$ * cos(71 * π/64.0), R4 * $\sqrt{\epsilon_s}$ * sin(71 * π/64.0)] |
| 11110011 | [R4 * $\sqrt{\epsilon_s}$ * cos(69 * π/64.0), R4 * $\sqrt{\epsilon_s}$ * sin(69 * π/64.0)] |
| 11110100 | [R4 * $\sqrt{\epsilon_s}$ * cos(79 * π/64.0), R4 * $\sqrt{\epsilon_s}$ * sin(79 * π/64.0)] |
| 11110101 | [R4 * $\sqrt{\epsilon_s}$ * cos(77 * π/64.0), R4 * $\sqrt{\epsilon_s}$ * sin(77 * π/64.0)] |
| 11110110 | [R4 * $\sqrt{\epsilon_s}$ * cos(73 * π/64.0), R4 * $\sqrt{\epsilon_s}$ * sin(73 * π/64.0)] |
| 11110111 | [R4 * $\sqrt{\epsilon_s}$ * cos(75 * π/64.0), R4 * $\sqrt{\epsilon_s}$ * sin(75 * π/64.0)] |
| 11111000 | [R4 * $\sqrt{\epsilon_s}$ * cos(95 * π/64.0), R4 * $\sqrt{\epsilon_s}$ * sin(95 * π/64.0)] |
| 11111001 | [R4 * $\sqrt{\epsilon_s}$ * cos(93 * π/64.0), R4 * $\sqrt{\epsilon_s}$ * sin(93 * π/64.0)] |
| 11111010 | [R4 * $\sqrt{\epsilon_s}$ * cos(89 * π/64.0), R4 * $\sqrt{\epsilon_s}$ * sin(89 * π/64.0)] |
| 11111011 | [R4 * $\sqrt{\epsilon_s}$ * cos(91 * π/64.0), R4 * $\sqrt{\epsilon_s}$ * sin(91 * π/64.0)] |
| 11111100 | [R4 * $\sqrt{\epsilon_s}$ * cos(81 * π/64.0), R4 * $\sqrt{\epsilon_s}$ * sin(81 * π/64.0)] |
| 11111101 | [R4 * $\sqrt{\epsilon_s}$ * cos(83 * π/64.0), R4 * $\sqrt{\epsilon_s}$ * sin(83 * π/64.0)] |
| 11111110 | [R4 * $\sqrt{\epsilon_s}$ * cos(87 * π/64.0), R4 * $\sqrt{\epsilon_s}$ * sin(87 * π/64.0)] |
| 11111111 | [R4 * $\sqrt{\epsilon_s}$ * cos(85 * π/64.0), R4 * $\sqrt{\epsilon_s}$ * sin(85 * π/64.0)]. |

11. The method of claim 10, wherein each of the [x, y] bit coordinate positions is rotated by a same rotation factor (from 1 to 359°, inclusive), and/or each bit label is altered by interchanging the 0's and 1's, and/or a uniform swapping of bit positions is applied within each bit label.

12. An apparatus, comprising:
at least one processor; and
at least one memory including computer program code for one or more programs,
the at least one memory and the computer program code configured to, with the at least one processor, cause the apparatus to perform at least the following:
encoding, by a processor of a device, a source data sequence of information bits based on a predetermined structured parity check matrix of a Low Density Parity Check (LDPC) code, wherein the encoding is performed based on frames of the source data sequence, each frame being of a length of $k_{ldpc}$ information bits ($i_0, i_1, \ldots, i_{k_{ldpc}-1}$), and the output of the encoding comprises coded LDPC frames each being $n_{ldpc}$ coded bits in length, and wherein the structured parity check matrix is represented by tabular information of a format wherein each row represents occurrences of one values within a respective column of the parity check matrix, and the columns of the parity check matrix are derived according to a predetermined operation based on the respective rows of the tabular information, and wherein the tabular information comprises a one of Tables 1a through 1w (below);
wherein the encoding comprises generating $n_{ldpc}-k_{ldpc}$ parity bits ($p_0, p_1, \ldots, p_{n_{ldpc}-k_{ldpc}-1}$) for each frame of the source data sequence, wherein the generation of the parity bits comprises:
initializing parity bit accumulators for $p_0, p_1, \ldots, p_{n_{ldpc}-k_{ldpc}-1}$ to zero;
accumulating information bit $i_0$ at parity bit accumulator addresses specified in the first row of the table;
for the next group of m−1 information bits, $i_y$ (y=1, 2, . . . , m−1), accumulating each information bit at parity bit accumulator addresses {x+(y mod m)*q} mod ($n_{ldpc}-k_{ldpc}$), wherein x denotes an address of a parity bit accumulator corresponding to the information bit $i_0$, and q is a code-rate dependent constant (q=($n_{ldpc}-k$)/m), and wherein m is a code-dependent constant and k=R*n (where R is the code rate);
accumulating $i_m$ at parity bit accumulator addresses specified in the second row of the table, and, in a similar manner as for the group of m−1 information bits (above), accumulating each information bit of the next group of m−1 information bits $i_z$, z=(m+1, m+2, . . . , 2m) at {x+(z mod m)*q} mod ($n_{ldpc}-k_{ldpc}$), wherein x denotes the address of the parity bit accumulator corresponding to the information bit (the entries of the second row of the table);
in a similar manner, for each subsequent group of m information bits, accumulating the information bits at parity bit addresses based on a next row of the table; and
after all of the information bits of the frame are accumulated, performing operations according to $p_i = p_i \oplus p_{i-1}$, wherein for i=1, 2, . . . , ($n_{ldpc}-k_{ldpc}-1$), each $p_i$ resulting from the operation for a given i is equal to the parity bit $p_i$;

TABLE 1a (Rate 1/5) ($n_{ldpc}$ = 64800)

30434 15118 35871 1042 34043 34085 42341 18485 44500 24268 28843 51748 21972
30300 24347 46808 8416 11111 41481 32215 4130 867 22576 9928 23980 15170
43863 15038 42905 19719 398 39956 47109 48347 26991 18214 24206 47552 15884
49234 51671 11523 41411 21249 16660 17729 852 21114 22858 19843 10501 37683
33159 15595 43687 9791 41121 30595 50762 36562 30611 6196 16501 1860 19594
45948 42827 9110 2671 44915 51640 33959 16649 37658 45143 11861 37 13823
3703 41861 6198 39321 37404 36745 7515 37433 17583 30253 42537 16920 44989
37745 27350 9903 13623 50660 35965 29455 36432 49774 8755 33362 12907 10543
34407 13960 9808 41065 17820 41780 13846 25968 45228 51694 1005 14230 7622
34849 38545 36256 10235 39642 27136 13787 42968 28454 9406 5612 9674 15364
45347 13550 44977 39547 37964 33817 48680 49571 37335 47548 45117 26148 17828
50113 9061 27964 47828 8518 12777 9523 45788 14839 30154 35408 42366 48162
32305 18501 34537 3974 41796 46590 39195 43248 28063 25179 21119 42374 46860
12591 49973 16248 31005 46401 45858 18919 39056 2622 31398 7488 40408 21230
7021 46583 18669 3999 46160 17929 25853 46018 16689 33374 14070 31593 44601
49986 25832 37105 12112 33290 8907 41215 28842 38633 191 17402 29860 28641
12889 28172 1706 23997 18785 3728 43051 43506 28074 20093 25247 4390 3534
35866 5423 48667 31399 44664 42319 17038 19121 2653 3699 43234 5448 2965
5554 6606 46032
10606 34309 48885
30552 28313 15011
35464 35537 42531

TABLE 1a-continued (Rate 1/5) ($n_{ldpc}$ = 64800)

47350 49896 34368
50709 33315 29146
27506 37421 7219
5613 19620 22073
21932 40199 36978
30032 22322 39521
22458 18157 28917
42547 10696 22422
42365 45341 34234
4869 37037 6282
42657 1832 25254
24440 13374 34902
36356 9003 17404
29739 5586 29932

TABLE 1b (Rate 2/9) ($n_{ldpc}$ = 64800)

5332 8018 35444 13098 9655 41945 44273 22741 9371 8727 43219
41410 43593 14611 46707 16041 1459 29246 12748 32996 676 46909
9340 35072 35640 17537 10512 44339 30965 25175 9918 21079 29835
3332 12088 47966 25168 50180 42842 40914 46726 17073 41812 34356
15159 2209 7971 22590 20020 27567 4853 10294 38839 15314 49808
20936 14497 23365 22630 38728 28361 34659 956 8559 44957 22222
28043 4641 25208 47039 30612 25796 14661 44139 27335 12884 6980
32584 33453 1867 20185 36106 30357 809 28513 46045 27862 4802
43744 13375 36066 23604 30766 6233 45051 23660 20815 19525 25207
27522 3854 9311 21925 41107 25773 26323 24237 24344 46187 44503
10256 20038 12177 26635 5214 14191 34404 45807 4938 4173 31344
32043 26501 46725 4648 16718 31060 26633 19036 14222 13886 26535
18103 8498 36814 34600 36495 36712 29833 27396 11877 42861 1834
36592 1645 3649 30521 14674 3630 890 13307 41412 24682 9907
4401 44543 13784 5828 32862 25179 29736 39614 5186 49749 38317
41460 39101 50080 40137 32691 26528 35332 44067 8467 14286 10470
12211 34019 37870 36918 36419 33153 50070 41498 47741 30538 12342
33751 23988 33624 41882 34075 25552 3106 17611 13190 29336 312
5667 35483 35460 16153 37267 28308 50009 46345 34204 32756 38243
5657 24157 36834 6890 49576 46244 43875 16738 47225 2944 36882
30341 48485 3700
14451 20438 18875
13634 41138 42962
46459 13369 27974
21493 14629 2369
11351 40226 42457
34749 39000 3912
18128 46776 47055
2221 26806 11345
35143 630 2229
44009 41295 34646
32163 16657 26544
31770 23641 43623
45826 10902 39490
7514 20480 28511
11429 19834 35430
50112 38163 5738
16191 16862 6783
6085 39149 34988
41497 32023 28688

TABLE 1c

(Rate 13/45) ($n_{ldpc}$ = 64800)

15210 4519 18217 34427 18474 16813 28246 17687 44527 31465 13004 43601
28576 13611 24294 15041 503 11393 26290 9278 19484 20742 13226 28322
32651 27323 22368 15522 37576 20607 20152 19741 26700 31696 21061 35991
44168 27910 31104 34776 38835 45450 40002 31522 7807 26330 2410 44983
15861 39215 14631 42584 26502 41864 27885 32276 29049 16878 37480 42550
38795 13012 7912 4058 23869 3325 42889 19921 13826 40323 18162 10005
35100 5483 7629 35166 1239 10772 5289 286 16172 41843 42612 38493
11997 40340 19047 16236 43557 9104 24032 2915 19265 36209 6443 40947
43527 29675 4195 31926 35392 20400 7515 45806 36068 33079 37325 6301
4580 20492 40934 14478 8238 2425 28901 43602 7224 17640 28259 6850
41859 14006 19132 5690 16223 11575 30562 44797 3759 9833 36529 21084
45546 16044 26763 13559 29092 41595 5726 13733 9164 15354 20145 10655
24076 40883 13424 30325 40589 32367 36270 9286 40151 8501 3871 22109
26239 29805 5358 44835 11609 3899 9760 39600 43422 13295 45431 14515
5392 37010 12386 40193 21492 45146 12376 41952 43153 45733 718 35726
33884 38006 16927 20958 25413 44561 11245 12984 35198 30977 31916 10657
1412 1048 14965 31879 29967 41000 32087 22 34773 768 27289 19898
43051 6964 31807 4119 33509 15950 6304 2813 35192 38282 39710 26356
9889 18957 6355 18770 40381 1876 38889 17958 20309 10744 1744 228
41543 36505 32795 12454 8520 4916 22313 1363 13010 8770 17057 8694
22987 29564 13804 3110 1382 33844 15117 42314 36045 25295 28421 22044
15951 42952 17458 6926 21257 41243 8662 17046 15054 15302 16964 40079
13359 45754 16715 9586 10960 25406 14675 8880 5087 12303 28993 13571
24824 31012 4121 808 30962 28736 11013 20488 7715 7637 6217 25114
23615 5760 5554
18072 21605 39242
24190 6592 12281
44681 6563 7001
18291 19605 33476
2884 30927 18430
23674 36414 30649
15364 22089 19757
41162 14454 17627
16676 28573 22163
8851 36803 27589
40049 476 1413
41013 34505 33296
29782 38018 42124
22625 7485 11772
2052 37567 14082
30106 43203 20858
7399 3796 22396
38745 792 44483
28268 33355 41030
30098 37269 12871
35769 33119 16738
3307 43434 13244
17852 9133 23190
35184 20115 24202
14760 43026 19425
26414 16821 6625
30362 35769 42608

TABLE 1d

(Rate 9/20) ($n_{ldpc}$ = 64800)

30649 35117 23181 15492 2367 31230 9368 13541 6608 23384 18300 5905
1961 8950 20589 17688 9641 1877 4937 15293 24864 14876 6516 10165
4229 26034 28862 8265 27847 3 22728 13946 27162 26003 17696 13261
31719 25669 17149 17377 33106 12630 4814 16334 1480 32952 11187 3849
30186 20938 7946 23283 11042 28080 26642 34560 11302 4991 5121 6879
13445 22794 18048 15116 5657 9853 15581 34960 13240 11176 17937 25081
4868 28235 30286 29706 7073 6773 10390 27002 13015 7388 14772 19581
11765 16642 11431 19588 20154 8027 29758 5501 6398 4268 21337 21136
2275 7899 25943 12939 14478 20369 22877 3591 12217 19130 24252 32444
24599 21382 4689 3524 11304 20423 13677 19639 10577 28279 22330 30722
21622 26233 3921 17722 6843 5999 8186 2355 33632 34632 30285 9616
19909 30417 19587 27853 13896 3689 155 20457 33362 21739 22779 33862
3713 32975 9403 2836 23109 11099 3505 14562 17309 26470 4843 12279
24216 26340 22073 32570 12936 19797 21801 8918 7999 24408 5783 25190
8817 29367 17017 6208 21402 2280 2110 7975 32039 34605 1235 912
23116 33017 31405 638 4707 31760 18043 3507 11989 26632 32829 11262
9274 2553 10697 13507 15323 27080 3752 33191 12363 24664 14068 1416
21670 26696 18570 25197 1517 7765 32686 6572 30901 28242 17802 24056

TABLE 1d-continued (Rate 9/20) ($n_{ldpc}$ = 64800)

35388 26895 8023 31249 29290 13440 7156 17367 21472 27219 14447 9655
11100 27918 2900 33262 15301 4664 15728 1185 24818 32995 31108 16368
34978 31690 30464 13044 5492 10047 2768 14336 30880 32780 10993 24750
7022 19718 26036 19145 21177 33949 17135 5193 33718 2539 13920 25537
918 18514 14530 13699 11902 22721 8335 35346 24655 3332 14708 20822
11191 24064 32825 12321 11771 23299 31325 25526 16785 22212 34075 9066
31209 27819 5974 19918 26831 33338 26647 9480 28489 7827 18562 2401
17395 23192 10277 28458 23028 18793 10463 10740 616 24647 4153 10128
2873 22381 8132 18239 31614 4193 32313 7575 25801 27591 19872 17992
4609 9114 14764 13516
19192 9882 13112 16075
12510 28902 8784 32679
4578 34533 30609 25543
13739 3465 5330 999
33254 13085 5001 29061
28369 79 17750 13399
24851 9524 30966 10422
18251 34810 12259 25103
25193 16945 1059
11266 13612 30508
24778 25364 1322
14492 11111 13693
15125 8205 1749
8494 9902 9395
23936 3981 22799
28448 28076 26544
19652 13424 8915
2885 11356 3241
1609 10284 24350
2462 19358 15717
29327 15960 14743
5388 32927 1288
19074 6322 32214
34208 30535 35462
23415 20836 21819
17986 12196 30030
8422 2647 5710
3200 23132 23337
22307 29841 4813
15309 26942 29970
23288 7493 3005
20661 34283 33192
23033 9541 6424
22003 24665 5534
4684 1411 33340
26042 6426 3808
285 21942 14302
16023 6825 20084
34878 12295 32028
2591 178 24107
16379 2912 9912
15375 16120 28375
20170 726 11291
8185 13471 8448
23205 14239 17896
17950 19308 1591
3170 23836 18879
12853 10678 18431
21157 31624 3153
27682 12433 3458
312 4844 13138
17715 35138 15456
30507 33307 30783

TABLE 1e (Rate 19/36) ($n_{ldpc}$ = 64800)

4852 21528 7920 5827 25497 26912 13790 5647 5349 26209 30575 10701
15230 6020 12821 18153 28229 23784 7846 2405 6175 25057 24745 11338
20902 7232 5966 20079 11898 7024 17575 30172 23114 7408 1444 10470
21964 6794 1849 19639 42 2805 10297 14296 17686 18756 6814 9207
13761 23515 17223 21044 557 5255 27297 13440 21226 26060 28875 300
8454 396 27979 25998 8734 9820 22370 3875 26358 26384 12591 26114
29610 12183 15722 29971 5804 10489 2548 29277 13097 19843 19372 19804

TABLE 1e-continued (Rate 19/36) ($n_{ldpc}$ = 64800)

12467 2412 3711 4225 15202 24051 29399 5140 19293 5563 5975 10604
8722 11230 8796 6205 27377 23788 7237 16738 14133 11767 12239 7354
27329 14432 12580 11872 15339 16324 5281 2272 15919 18405 23238 3644
20037 7221 19740 14881 9948 21458 21721 20274 632 7531 22448 29320
28575 1484 1684 23572 314 17511 10742 23432 6120 1756 13668 831
23308 709 12194 11481 15426 16126 27391 12597 14490 15204 11820 11558
15988 14707 14715 28040 27022 2964 11343 9853 20469 20448 7921 30386
8030 10079 10797 9471 12773 12408 22081 27431 11141 647 5583 4867
19597 9640 21448 7774 22031 978 14982 9318 5329 23331 747 1599
24719 13982 10148 22796 19316 16641 13398 1385 11074 21429 27365 15030
17211 3435 3121 19692 22379 14270 22290 12713 25821 29202 30112 23466
418 19299 5266 19721 19875 4120 27217 3456 12505 29571 29323 1359
29271 18848 23988 3711 27838 30064 9471 15792 13372 25101 28859 3582
24067 921 10735 1252 24500 16866 9523 24035 25043 22577 6407 20445
8841 13840 17428 23024 13023 27418 13669 2039 5284 4272 20790 12124
14854 8589 24186 2542 124 11300 10583 13607 8364 7702 22179 8034
18294 25817 9609 29141 26471 28410 0 28693 25766 12550 25246 15174
21691 27153 3960 7108 15248 8867 8637 7526 25098 25457 9549 4919
29817 17975 29608
12231 5214 13215
7529 3174 28008
29496 12796 3906
11660 28238 4295
24868 28946 3822
14643 7700 8772
4564 25809 28687
16723 12784 545
1026 24533 10526
2781 18949 19829
11457 8993 22179
15321 4961 2623
2304 7882 9519
1755 19477 14008
20611 17807 13434
20328 25809 15475
20333 14032 22015
9478 521 7297
11756 11083 30411
6101 23078 13808
7653 3799 14951
12091 8232 4961
10525 4842 4867
13342 20032 9328
14808 11890 9097
1406 17654 21576
13916 19328 21178
9578 4949 26018
16604 13328 21777
18932 7321 2070
7697 14266 9879
12271 19185 26947
14798 20341 18010
753 12687 20366
16795 22301 4021
24333 15105 8536
13240 28609 17761
5504 518 17937
3329 3001 25432
26541 3002 3436
16197 9838 15328
16775 26537 2795
25184 7045 17243
22843 12232 10984
15198 11963 17345
12186 18466 29254
26266 21216 1565
17729 29158 7355
4837 1356 28911
6749 26024 20177
19405 24682 20539
23639 23171 19707
1278 1465 17435
10327 16584 14678
15700 28585 6210
24813 1477 19918
7305 17774 20937
30288 20203 23788
21655 16483 18985

TABLE 1e-continued (Rate 19/36) ($n_{ldpc}$ = 64800)

17501 28765 13494
25663 1925 12695
7109 16881 2053
12382 4765 11370
13410 10697 9692
29500 21773 16350
12204 23752 14420
29567 3862 8483
5243 12830 24323
27405 20033 30085

TABLE 1f (Rate 11/20) ($n_{ldpc}$ = 64800)

20834 22335 21330 11913 6036 15830 11069 10539 4244 15068 7113 2704 16224
2010 5628 27960 11690 22545 24432 4986 21083 17529 4104 11941 21239 9602
689 13248 1777 4876 2537 20869 15718 9575 18164 5294 13914 21711 23374
9675 21239 13600 24710 10613 14804 19412 23270 26741 10503 25258 17816 25210
12518 8680 6422 22715 25097 26959 3913 26493 7797 25977 4896 27063 20781
21715 12850 7963 4027 4295 14931 18158 616 20570 8720 16487 19050 23925
7939 21089 15170 24325 6651 22352 5633 27903 2685 1310 5594 9296 25670
25121 13906 8217 25390 9112 13945 9826 10844 11418 10724 11518 9280 9576
25979 23644 16073 27407 3476 28057 4003 2279 17490 7558 9538 22115 20439
20708 22572 14997 15780 5159 11356 10931 8514 23275 2560 912 15935 20703
26467 17173 21964 15469 21967 10380 16222 15106 16786 19542 28560 18387 27909
14897 6167 24295 1266 16902 9546 11628 12048 24495 3706 22629 14165 2333
19403 18738 28140 13141 6151 22785 9620 4290 2342 4902 15856 19033 22820
15761 1985 9160 4435 11164 5442 23572 6951 19077 15406 16658 18324 19229
16997 10094 19982 22821 7810 19660 1182 21968 16564 17453 10780 17034 16405
11 28611 10411 15799 15705 2773 28601 19333 19447 16790 4618 15841 23854
24686 4131 1013 2141 6052 11896 18719 16813 22420 23406 21052 4333 17754
16425 17614 26883 12101 8224 13979 6869 25215 25991 28968 19337 25361 20513
1671 14990 20692 24951 19446 7163 4959 13197 19201 3883 22532 15468 11856
22758 23586 16985 18396 7434 11817 363 11824 285 20897 16646 16095 17011
25144 14916 6302 20972 25439 6156 21776 19701 27803 9695 12941 23541 27425
6979 27910 7378 8983 6280 4134 28860 8079 20892 28776 7899 23399 87
18045 23929 25876 15560 23629 18376 4053 14655 2450 11907 19535 28543 3513
4704 16512 16554 14062 2596 10357 17316 1011 22090 11353 20300 15300 18536
14293 4746 28831 20028 16742 16835 28405 11245 10802 20242 17737 9590 20693
26547 22557 22517 6285 5336 3998 2351 6628 22949 1517 4712 1770 9207
28522 14116 5455 13105 18709 3030 4217 6306 27448 1943 23866 20212 18857
14794 21425 15659
4446 21140 13454
21115 3271 1443
2153 12424 6159
23559 22473 26065
15914 22980 12766
3482 16233 5719
27020 12322 24014
25438 26499 26506
21987 16027 6832
17330 2620 20756
15985 10471 23302
593 6869 27185
22961 9129 25646
10702 12334 23959
6375 23299 26942
8029 4072 24051
15147 5113 14725
1451 27291 28731
18808 11561 249
28962 21405 18944
6889 3314 23457
27708 14530 8795
6185 28821 6550
2259 17627 701
20819 18831 20140
4991 11369 4282
13230 3413 27092
14556 5068 16209
4337 24652 498
715 28883 2285
16524 25513 26034
21067 15122 21667

TABLE 1f-continued (Rate 11/20) ($n_{ldpc}$ = 64800)

27982 15280 3313
7563 22779 22453
4744 17277 27210
19170 10806 18815
26424 26442 7837
26264 28931 6020
4645 20678 13160
18111 28045 23883
5128 10876 3087
28551 26276 3541
20152 10181 28172
26430 14769 6809
4956 16130 11348
1691 10216 5743
7848 20236 2661
10660 8321 6155
2757 6963 2596
27791 6707 258
12785 21176 15450
7477 17274 25201
262 18996 15836
5287 11970 13365
3098 17823 10786
21831 14476 11447
1893 3625 25404
20880 21987 1228
20942 15045 21358
18237 28914 15673
24273 284 9803
13949 15670 16693
15553 27782 22644
27980 24820 27733
7015 20974 10016
26164 20314 25916
11489 13663 11777
18230 11483 5655
1618 19977 26521
25639 13184 28994
3821 18349 13846

TABLE 1g (Rate 26/45) ($n_{ldpc}$ = 64800)

12918 15296 894 10855 350 453 11966 1667 18720 12943 24437 8135 2834
11861 3827 15431 8827 8253 23393 15048 5554 16297 2994 6727 19453 2371
26414 3044 20240 18313 11618 3145 10976 5786 5609 16358 2547 11557 14755
26434 2510 26719 4420 6753 917 7821 26765 11684 9811 5420 6653 19554
11928 20579 17439 19103 21162 11235 19172 22254 3420 10558 3646 11858 24120
10189 8172 5004 26082 4345 5139 15135 26522 6172 17492 8462 4392 4546
27330 21498 13424 8077 10165 9739 482 23749 1515 12788 10464 9085 20875
12009 22276 18401 7541 5871 23053 16979 16300 13566 19424 5293 18290 23917
9613 24175 11374 11736 17676 13126 20931 20290 20659 2000 7969 9386
21507 24494 11822 21771 26776 21175 27354 15815 7598 19809 611 10144
195 14244 7229 13002 14328 17987 14595 6985 7642 9434 7079 5571
10013 3641 14064 11716 4620 18119 23365 26446 26273 25164 11262 26019
15166 19403 5606 20138 1893 645 5414 12097 18635 21648 12255 13269
1895 9969 8372 17737 21679 17061 20219 2513 27199 11242 17025 1261
12845 13086 16256 15177 20822 10862 18375 6751 17532 24725 6966 18489
8373 25550 20688 16686 7894 24599 21578 12516 7115 4836 23473 25162
14375 9150 6606 21633 16224 23708 20350 4575 143 13356 10239 22868
10760 19807 7079 16382 26236 22606 16777 24312 16941 26684 8658 19279
15136 8603 332 2898 21821 23778 3232 12052 14336 7832 5600 27015
14392 26564 21616 8332 21750 10379 19730 7553 27352 2718 15202 25661
6891 13210 15284 21940 8742 10965 3176 25034 25137 25161 13267 7012
4993 9943 13260 20980 20224 20129 2120 23111 16640 23548 21445 10794
4846 2858 22663 12584 20448 4629 17825 22269 11278 26312 9463 21085
24282 18233 9220 14979 24106 14507 24838 19689 17589 7926 7893 21701
12253 26122 8035 20823 2584 4703 25178 5460 4190 7057 1144 8426
12354 7216 19484 4110 22105 1452 11457 12539 27106 14256 14113 20701
2547 26926 25933 11919 12026 24639 19741 15457 9239 26713 22838 6051
8782 14714 23363 450 19972 2622 19473 24182 2391 26205 10018 9202
15690 10472 20263 469 18876 23660 9005 12595 23818 26430 926 6156
5440 5209 14958 9882 18843 22063 12749 18473 22546 11768 4493 12833
18540 3544 9471 15893 14761 23479 22010 15491 19608 25035 9094 24836

TABLE 1g-continued (Rate 26/45) ($n_{ldpc}$ = 64800)

15909 16594 23538 25136 25063 24995 5354 905 18580 15476 20710 7774
6088 17133 11498
4721 17594 18267
1645 23638 26645
14800 17920 22016
12927 350 19391
19447 19886 25992
26120 1747 11234
1588 23170 27232
2230 15468 18709
17410 11055 20645
3244 25815 14204
2858 7980 12780
3256 20418 24355
24260 16245 20948
11122 1503 15651
19272 24054 6075
4905 931 18884
23633 17244 6067
5568 26403 490
16113 16055 10524
23013 8138 12876
20699 20123 15435
27272 27296 22638
7658 17259 20553
14914 17891 12137
16323 1085 18895
21503 17141 2915
21979 23246 1271
14409 11303 12604
25591 12157 14704
18739 19265 8140
11244 5962 6647
3589 6029 6489
16416 185 9426
1267 14086 22473
17159 22404 23608
7230 22514 21605
7645 1239 10717
12028 13404 12140
14784 15425 14895
26165 18980 15386
14399 7725 14908
8463 22853 22095
5517 1854 8283
24381 260 12595
839 23743 22445
13473 8017 7716
8697 13050 16975
26656 16911 11972
26173 2504 15216
7493 6461 12840
4464 14912 3745
21461 9734 25841
4659 7599 9984
17519 7389 75
12589 9862 8680
23053 21981 25299
19246 3243 15916
21733 4467 26491
4959 10093 20074
9140 15000 12783
854 10701 25850
13624 7755 10789
3977 15812 10783
5830 6774 10151
21375 25110 5830
15985 18342 2623
4716 27211 18500
18370 12487 7335
4362 21569 16881
10421 15454 13015
5794 1239 9934

TABLE 1h (Rate 28/45) ($n_{ldpc}$ = 64800)

24402 4786 12678 6376 23965 10003 15376 15164 21366 24252 3353
8189 3297 18493 17994 16296 11970 16168 15911 20683 11930 3119
22463 11744 13833 8279 21652 14679 23663 4389 15110 17254 17498
13616 426 18060 598 19615 9494 3987 8014 13361 4131 13185
4176 17725 14717 3414 10033 17879 8079 12107 10852 1375 19459
1450 4123 2111 17490 13209 8048 15285 4422 11667 18290 19621
2067 15982 304 8658 19120 6746 13569 19253 2227 22778 23826
11667 11145 20469 17485 13697 3712 4258 16831 22634 18035 7275
23804 14496 17938 15883 14984 15944 2816 22406 22111 2319 14731
8541 12579 22121 8602 16755 6704 23740 16151 20297 9633 1100
19569 10549 19086 21110 11659 6901 21295 7637 11756 8293 9071
9527 9135 7181 19534 2157 788 13347 17355 17509 711 20116
21217 15801 12175 9604 17521 2127 21103 1346 8921 7976 3363
11036 5152 19173 8086 3571 1955 4146 13309 15934 19132 5510
12935 13966 15399 16179 8206 19233 16702 7127 12185 15420 1383
6222 6384 20549 18914 23658 11189 638 9297 17741 9747 13598
17209 11974 20776 2146 9023 3192 19646 3393 1727 15588 20185
5008 3885 5035 15852 5189 13877 15177 3049 22164 16540 21064
24004 10345 12255 36 24008 8764 13276 13131 2358 24017 11984
21121 21691 8555 11918 129 8860 23600 3042 3949 19554 12319
22514 11709 11874 11656 536 9142 3901 580 1547 10749 5529
3324 6251 1156 112 13086 5373 5119 132 18069 10482 19519
17279 2017 14846 21417 17154 21735 18788 11759 192 16027 6234
20417 3788 15159 22188 21251 16633 13579 8128 1841 23554 15056
12104 9182 6147 1553 12750 4071 6495
4961 18460 23266 10785 10973 4405 2707
7665 7043 1968 3589 15378 9642 21148
13073 13298 20040 13582 17124 348 12055
378 7476 9838
15454 5218 14834
17678 3445 18453
2767 388 12638
5688 56 6360
20009 872 16872
10206 5551 477
10662 23689 19768
8965 17535 4421
19397 18734 5422
10043 22104 21682
508 1588 23853
1092 7288 4358
2283 22298 10504
15022 8592 22291
11844 17038 2983
17404 14541 6446
20724 7498 2993
14715 9410 6844
20213 14674263
4822 20951 635
20651 23174 5057
22237 9229 4859
17280 9586 20334
19508 8068 11375
5776 21209 9418
6872 6349 20397
11165 19619 13108
13550 10715 5122
5655 10699 8415
9864 4985 7986
6436 3754 7690
4257 17119 5328
659 4687 6006
527 10824 8234
11291 1735 22513
7254 2617 1493
3015 7462 10953
15705 2181 11992
4628 19430 18223
9426 21808 13549
17008 3470 22568
13643 24195 21816
936 14226 22874
6156 19306 18215
23984 14714 12907
5139 18639 15609
11908 5446 8958
6315 16864 15814
10686 22570 16196

TABLE 1h-continued (Rate 28/45) ($n_{ldpc}$ = 64800)

203 4208 13716
494 14172 11778
15112 14244 8417
21087 4602 15570
19758 4401 22270
8218 11940 5009
23833 13785 12569
1698 7113 18541
18711 19991 19673
8025 17107 14784
5954 6817 19810
24143 12236 18063
23748 23956 10369
7805 13982 13861
5198 10889 6787
10406 13918 3305
12219 6523 12999
9964 2004 17361
23759 21507 11984
4188 19754 13358
8027 3662 2411
19762 16017 9125
2393 4619 5452
24176 6586 10895
15872 1795 15801
6911 15300 14787
2584 4905 8833
1327 12862 9476
16768 12633 7400
11983 6276 18370
12939 12793 20048
20284 12949 21345
19545 4503 16017
1253 12068 18813

TABLE 1i (Rate 23/36) ($n_{ldpc}$ = 64800)

2475 3722 16456 6081 4483 19474 20555 10558 4351 4052 20066
1547 5612 22269 11685 23297 19891 18996 21694 7927 19412 15951
288 15139 7767 3059 1455 12056 12721 7938 19334 3233 5711
6664 7486 17133 2931 20176 20158 9634 20002 13129 10015 13595
218 22642 9357 11999 22898 4446 8059 1913 22365 10039 15203
10305 22970 7928 16564 8402 9988 7039 10195 22389 5451 8731
19073 1005 18826 11109 13748 11891 21530 15924 21128 6841 11064
3240 11632 18386 22456 3963 14719 4244 4599 8098 7599 12862
5666 11543 9276 19923 19171 19591 6005 8623 22777 1255 20078
17064 13244 323 11349 6637 8611 6695 4750 20985 18144 5584
20309 6210 16745 10959 14284 2893 20916 10985 9664 9065 11703
17833 21598 22375 12890 10779 11241 13115 9222 21139 1217 15337
15514 12517 18953 11458 17296 8751 7213 12078 4994 4391 14976
3842 21548 10955 11679 16551 8514 17999 20557 16497 12122 23056
10551 20186 66 11038 22049 2130 1089 22093 9069 3470 8079
19208 22044 2732 1325 22309 967 22951 1366 11745 5556 6926
2805 18271 10046 4277 207 19518 17387 9701 8515 6813 10532
19714 21923 13493 1768 18819 6093 14086 13695 12781 9782 445
22160 15778 13629 10312 19769 8567 22096 15558 19730 11861 18492
10729 16847 273 4119 4392 11480 20396 3505 7220 390 5546
17277 8531 17390 22364 7167 2217
7325 3832 19899 21104 8400 3906
6218 20330 14943 14477 5614 1582
21534 14286 14624 14809 6775 22838
15786 6527 15848 5288 13523 9692
12696 15315 602
17081 6828 13578
3492 6510 20337
6113 5090 7290
20122 15539 19267
10412 19090 17863
2546 2295 19448
20296 2296 2627
6740 14224 10460
12878 6055 15452
15152 15699 563

TABLE 1i-continued (Rate 23/36) ($n_{ldpc}$ = 64800)

15414 21900 19161
11126 15975 3733
4379 15742 6475
17203 5870 18537
4912 260 21115
23164 4273 1694
1082 5287 11152
14537 2277 19232
13414 15608 12926
17043 18241 18313
208 6118 20777
9140 19241 22845
18527 5035 4161
20867 22650 5585
7875 10358 1898
3563 14833 21329
14705 3359 13959
4507 11976 20017
22424 12925 8308
8739 15561 8010
6408 20723 20928
12337 7864 15777
12742 20430 17351
6259 1865 9808
8343 17441 2551
2167 3025 23181
22718 13243 4797
4223 4982 4395
1609 16748 17625
8463 15204 19632
6583 9112 20284
11334 19370 4763
746 18560 15222
8796 12725 15176
10245 15567 9991
17447 18373 21523
1473 5286 15793
17675 21170 6699
15515 15942 8733
7047 11348 14584
20435 19603 1961
18851 7069 11402
19180 6487 2979
2650 13282 9040
22613 23266 4786
20832 3001 23129
3850 5255 6601
19827 15438 13956
15798 4430 11318
4724 8719 21209
18127 844 21379
7427 22987 10233
22949 8145 21778
7622 14471 18874
8566 14340 3381
3373 419 11514
15127 917 13136
19375 18740 4951
960 2856 17804
662 8107 10298
10993 11755 19142
11400 18818 521
7210 18658 8285
9496 20836 5655
14654 13694 12705
20381 16473 7271
12796 3280 23370
13893 7667 1736
5485 18321 7789
11242 18771 17282
817 21060 15985
666 20461 22464
7696 19774 4324
12239 14014 4759
5011 10472 4137
3047 2444 3818
1594 20382 538

TABLE 1i-continued (Rate 23/36) ($n_{ldpc}$ = 64800)

7051 21874 1697
18539 26 21487

TABLE 1j (Rate 25/36) ($n_{ldpc}$ = 64800)

11863 9493 4143 12695 8706 170 4967 798 9856 6015 5125
12288 19567 18233 15430 1671 3787 10133 15709 7883 14260 17039
2066 12269 14620 7577 11525 19519 6181 3850 8893 272 12473
8857 12404 1136 19464 15113 12598 12147 4987 13843 12152 13241
1354 12339 4308 23 12677 11533 3187 11609 4740 14630 19630
14508 10946 3928 580 3526 17836 3786 15739 13991 1238 1071
6977 13222 13811 585 8154 2579 8314 12185 15876 7738 5691
12901 12576 11597 4893 17238 15556 8106 12472 10455 14530 17432
8373 12875 16582 14611 14267 15093 2405 9342 18326 12125 9257
5861 12284 2441 13280 2762 5076 17758 4359 6156 18961 13208
4400 8474 19629 19528 14125 12780 12740 19316 491 4761 1719
7270 6615 1175 15848 6943 18360 8905 13921 10807 19688 18757
8312 12234 17907 17254 7699 18399 5508 12215 4818 18107 2874
19496 13973 10432 13445 15320 13648 1501 10549 6710 8897 1998
1575 12713 10916 5316 13713 11318 4055 5782 5828 17981 3141
12177 10726 4244 3138 15996 6822 7495 5257 8909 6180 10680
6650 1909 19146 19189 17229 10050 3051 9793 10839 3532 14759
5337 8448 4939 14792 7585 17860 8612 2229 18965 1519 2031
13845 9320 579 15441 15050 752 8303 6989 13360 12927 15255
17286 3639 1733 16883 8457 9475 2939 3234 1993 8554 9939
6359 15474 12100 6992 13844 16988 7481 16977 9052 9262 15270
7181 3624 3814 16379 182 4338 17627 3315 5745 14093 15574
10709 18662 6909 11248 5268 412 5854 16782 16059 10498 5061
13321 617 6734 3718 15441 19241 17214 1682 18641 18646 6330
7377 16951 14477 6507 9922 11464 2563 5702 12691 10606 17874
7198 12571 17617 4862 18899 7100 8130 9665 10779
6789 11459 17651 3693 13332 3854 7737 12589 15189
16260 14569 9442 17890 18097 6845 6960 1376 8099
12719 14986 18999 14013 3449 13618 14807 265 1508
11231 966 15957 8315 3384 2570 5700 10911 17372
153 8445 19598
7841 14806 54
2492 14099 11718
18608 4278 333
59 3982 16986
3494 12496 2775
18320 10650 16234
9739 16537 19706
7587 19072 18775
14133 12042 2922
229 17958 15889
5130 11029 271
5122 7021 7067
12258 16611 9245
15493 15347 15939
741 12055 2822
12804 3480 5690
18598 19273 16354
2569 16771 13693
15051 853 956
12256 2756 15137
15685 2802 16479
14687 12470 3583
15473 17781 867
4843 6765 13122
11287 3680 19101
4609 11385 13470
12353 6632 206
10984 3116 1263
9419 14455 19438
9528 1808 435
2238 12870 10119
10868 8402 11111
11081 7197 2667
13780 10759 19722
3768 3052 1836
446 1642 12388
16876 8398 14485

TABLE 1j-continued (Rate 25/36) ($n_{ldpc}$ = 64800)

7301 14815 13811
5678 10419 14396
1877 14384 12817
19028 19589 6893
8725 6346 676
13611 12486 2054
11203 14908 14692
18139 5334 1253
16233 9749 16946
18885 4332 16306
3862 10395 13871
3747 8900 3381
13367 14132 7220
15095 4219 15869
13519 18079 17541
19012 13943 19471
2221 5710 13711
5185 3363 10195
9580 17331 15360
14387 7596 9614
17336 6371 6030
14629 10636 10159
2402 9170 4321
1040 5899 153
7710 7637 13966
10919 8535 3791
1968 2567 4986
4166 8744 17691
540 10695 10019
17710 1188 10821
5858 17012 17389
3083 17587 12682
5354 9537 6807
4964 15942 9653
9000 17053 13291
11685 8503 10777
13919 18155 9877
1625 15314 13879
18520 7074 17061
3748 2752 7298
493 19163 14139
2260 18339 10688
8928 17695 10276
7640 18547 3561
11275 5297 13167
19691 19542 15725
11837 7273 11297
17873 7840 19563
8109 3811 18417
17759 17623 13175
10041 4152 2249
18452 1450 19309
9161 11651 4614
11547 14058 639
9384 3272 12368
5898 2578 14635
15963 6733 11048

TABLE 1k (Rate 13/18) ($n_{ldpc}$ = 64800)

2510 12817 11890 13009 5343 1775 10496 13302 13348 17880
6766 16330 2412 7944 2483 7602 12482 6942 3070 9231
16410 1766 1240 10046 12091 14475 7003 202 7733 11237
15562 4695 13931 17100 11102 770 3848 4216 7132 10929
16469 17153 8177 8723 12861 15948 2251 1500 11526 8590
14813 3505 12654 1079 11736 6290 2299 17073 6330 5997
390 16492 13989 1320 14600 7061 6583 458 894 1596
8625 7644 1322 16647 15763 10439 8740 5529 2969 13893
13425 13121 5344 8739 4953 7654 17848 9334 9533 2731
12506 10992 8762 5395 6424 11688 3193 17601 14679 8204
5466 15487 1642 6671 13557 4074 7182 4436 12398 12973
1958 13041 6579 15984 3762 16633 6113 11509 7227 28
17202 4813 14024 15099 2648 4476 2260 6507 9930 9232

TABLE 1k-continued (Rate 13/18) ($n_{ldpc}$ = 64800)

14186 14510 6818 7665 12708 2645 16687 13255 8239 15884
1751 7847 17987 11410 3345 17133 17655 5027 1261 17191
8056 4264 13915 8217 6118 8072 6278 6835 5038 15008
13625 2999 5336 11687 13500 5723 13903 766 6293 155
12316 14093 7372 16846 15357 9865 17869 1429 16681 202
15062 1123 6454 17625 3213 39 1669 1770 13636 16555
13053 7597 11481 1336 3343 11387 5463 17830 13741 5976
1956 13509 1664 16867 8168 13421 17078 3285 17138 1572
16711 1499 4805 13584 14759 2844 13110 7356 5850 8330
6521 8528 14170 6681 16992 12867 14326 15227 4082 8595
16176 8184 8572 1923 935 8900 13020 6812 9778 3391
3946 4711 15314 15108 15634 4144 4372 9207 10715 1291
16601 5864 10968 4724 9235 6988 3307 6515 7004 16328
16217 4227 9735 15857 5003 2532 4451 8574 2149 6908
9506 8949 12035 9701 3124 14295 8567 13614 5159 16746
2418 8669 10921 5738 147 1004 2692 9065 12877 7559
16706 8511 10314 3118 1219 7071 12376 538 2389 3297
12492 10589 5791
13528 1653 6618
10485 1307 4102
347 13580 4039
523 10311 10540
4183 6192 17159
11458 6521 9632
11594 15791 10384
11654 126 11715
6265 34 5091
7271 13900 7588
3960 11297 1612
9857 4695 16399
6423 2197 15040
4219 5979 13959
2959 578 8404
4585 658 6474
15900 11357 5249
7414 8642 1151
4130 9064 14537
14517 1356 3748
13865 12085 17295
9530 5110 1570
10862 8458 15322
16355 1774 5270
1229 11587 1632
17039 787 4703
11423 15388 6136
8413 9703 13946
4678 4072 16702
6244 4690 7164
7238 14169 5398
8679 122 11593
10954 15802 16427
9413 6717 16406
1027 17863 7836
655 8827 10286
4124 12599 12482
12955 3121 15318
8343 16634 6301
13568 5056 9920
1948 10 17395
8550 131 2151
15226 15994 13093
10966 15412 2781
13425 15831 5346
2261 1067 6346
6625 1966 13533
10575 4483 5761
14366 2019 14426
16746 1450 4830
13109 7358 7942
15376 7284 14035
14341 12625 3306
9375 7529 1537
13831 13447 4549
15658 15299 8238
4005 13264 9766
4715 6285 15383
1262 12883 15434
11123 14975 3434

TABLE 1k-continued (Rate 13/18) ($n_{ldpc}$ = 64800)

5307 1112 16967
12163 12009 3681
9174 13153 10344
13456 13197 9562
1785 7549 15347
663 9748 9436
4961 11903 11574
16248 6238 666
11426 13748 14763
14431 1443 2069
2376 8154 14978
13140 1289 9046
1159 300 3319
11510 7769 15877
6430 14946 6856
8868 15622 12458
4867 6622 6850
14721 11241 12760
14233 9874 17682
16677 13195 15086
11155 7067 14160
12741 14379 8922
1930 17055 11752
12361 6523 9568
12165 5636 16011
11389 4754 9916
15903 15542 8301
12073 4918 9754
16544 17907 14814
10839 1401 5107
12320 1095 8592
15088 6521 12015
14802 3901 8920
17932 2990 1643
5102 3870 2045
540 2643 2287
5844 2482 9471
10428 637 3629
8814 7277 2678

TABLE 1l (Rate 7/9) ($n_{ldpc}$ = 64800)

13057 12620 2789 3553 6763 8329 3333 7822 10490 13943 4101 2556
658 11386 2242 7249 5935 2148 5291 11992 3222 2957 6454 3343
93 1205 12706 11406 9017 7834 5358 13700 14295 4152 6287 4249
6958 2768 8087 1759 11889 4474 3925 4004 14392 8923 6962 4822
6719 5436 1905 10228 5059 4892 12448 26 12891 10607 12210 10424
8368 10667 9045 7694 13097 3555 4831 411 8539 6527 12753 11530
4960 6647 13969 3556 9997 7898 2134 9931 3749 4305 11242 10410
9125 9075 9916 12370 8720 6056 8128 5425 979 3421 5660 9473
4348 11979 5985 395 11255 13878 7797 4962 13519 13323 7596 5520
2852 8519 3022 9432 3564 9467 8569 12235 11837 5031 4246 2
4081 3630 1619 2525 3773 11491 14076 9834 3618 2008 4694 6948
7684 9642 5970 1679 13207 12368 262 7401 11471 2861 5620 4754
7474 10418 1422 10960 13852 988 13465 6415 86 2432 7595 12239
8539 11749 8794 6350 1947 13325 13061 7385 13017 2536 13121 15
7944 13831 5126 9938 11758 335 980 9736 12143 5753 4533 10814
10706 12618 6949 2684 4107 14388 11372 6321 13832 9190 2838 13860
10830 1947 13803 3257 2677 406 8400 10536 12911 3629 251 9784
13343 13304 301 801 6456 6351 6155 6763 3812 11337 8446 9306
524 5573 503 10544 8990 673 2309 12376 466 11441 960 1557
4403 3564 1732 13453 12054 8941 1383 12424 4347 9830 3553 5158
2025 4282 4983 13553 10776
11833 13099 5078 4420 3527
1544 7474 2780 7749 4153
11189 520 8463 12230 7712
10409 13367 2604 2966 9248
1412 420 3507 9818 7955
1122 12483 9375 10232 9456
2799 7033 10404 4495 12059
2569 5970 6262 2199 8045
11724 511 12693 12855 9597
756 12900 13391 13623 10683

TABLE 1l-continued (Rate 7/9) ($n_{ldpc}$ = 64800)

2095 13479 1488 9469 11142
13849 1356 10776 3530 9866
13449 14225 2072 12772 9461
6466 6181 6502 401 7439
4631 1086 3062 11789 11811
6788 14007 2270 14132 2764
4643 10272 11316 2608 8511
5221 9028 2736 7223 1051
1974 2737 6739 13904 6156
5 9082 3915
2400 7195 3413
606 221 8171
4548 1267 5310
12795 2160 8305
10563 3507 12190
6325 2499 9717
9251 6046 13308
11704 10834 11241
4777 3774 11533
12487 10365 6852
58 2650 2027
7248 13704 5573
12777 7834 8561
7906 8121 7774
554 3105 6000
11198 3586 10410
9002 4094 11297
12058 1037 13638
1258 12917 11078
2430 51 10276
7841 9451 10236
11045 1058 10352
9629 9428 86
8146 1255 3802
10820 6337 4199
9364 7723 1139
438 6445 583
2683 5358 10730
8471 3061 13380
3005 2840 4754
8210 1814 11502
8667 14258 5985
8407 13336 10970
6363 11715 5053
104 13618 13817
6562 4087 294
1742 10528 4626
6607 2692 1587
11097 8361 2788
13451 3541 823
4060 13604 9816
157 6106 1062
8853 5159 4270
9352 13164 2919
7526 5174 12501
12634 13077 5129
5750 1568 6281
269 5985 10973
8518 9415 1028
4722 13275 634
12113 7104 7436
12787 1032 5936
3425 11526 10797
784 9208 15
11223 12849 4913
10635 3553 8852
11749 10619 3532
4080 9831 9219
6560 6049 6111
1304 11770 12585
13209 8589 11287
2887 10699 14307
4752 456 4073
1175 13156 4894
12756 3237 6279
10125 7074 2344
7533 7103 5226
4000 4425 12173

TABLE 1l-continued (Rate 7/9) (n$_{ldpc}$ = 64800)

10056 5312 1599
7445 8696 12533
11509 14050 2483
12405 2876 5033
4512 4955 5627
5572 5099 10987
10665 404 3082
2075 1583 13454
5666 7228 524
13290 7634 418
9006 7368 4181
9447 3674 8171
9355 10211 9342
12572 3681 3322
3295 186 7491
7926 212 5241
5479 1654 8097
5078 423 4817
1357 12780 3664
11900 402 13108
299 7166 12008
5750 3041 5618
8357 1229 8884
3713 8791 13375
4390 6302 568
1009 4440 10003
1209 11978 11711
1803 9838 13537
11318 9750 12421
2388 3021 7880
7220 1062 6871

TABLE 1m (Rate 31/36) (n$_{ldpc}$ = 64800)

8971 1759 4661 2344 8810 3677 5653 5575 7855 8916 1232
6045 3232 8535 7071 6764 5731 2016 8662 3813 223 4080
3502 3358 2640 7181 793 289 4907 6380 6437 261 7395
3264 6823 551 107 3672 245 2133 2328 2462 2349 1096
4755 5134 5661 5948 3017 7071 6140 2620 4479 5669 508
5209 2522 3677 7033 4553 4780 8149 6346 4190 5242 3118
8430 2284 8323 3944 7479 7765 7974 3145 4381 47 3257
584 8668 3622 7087 6946 4527 5274 6111 4151 1805 3370
3713 3710 186 758 1606 8866 2975 3305 6548 2039 2197
4021 661 7382 3627 628 8334 4880 2742 5139 1910 5450
6338 8246 8710 8382 2952 3468 4905 3623 6578 2519 8966
1781 4964 623 4641 7520 6371 6835 1853 8584 3351 7486
7368 1500 5916 5328 2390 7684 8660 4286 7833 8517 3696
8199 4143 538 3959 8390 3414 8353 5244 5698 1645 3804
2158 1979 10 8920 6848 434 4640 3443 4662 3311 8682
4678 5773 8736 4743 7365 213 3257 1449 7394 7035 356
7916 2503 7790 8719 7879 4639 4251 1160 542 8333 3163
713 304 1515 3019 5747 7901 581 857 7416 6967 4325
1224 8200 817 7526 3694 1563 5341 4464 1668 4154 2731
5150 3051 3027 4312 8372 8168 2438 6549 1669 2508 792
5112 6776 1508
8775 1199 2766
456 4827 7450
6774 4851 6529
3650 1777 4738
4717 6245 427
5897 956 7912
829 3876 5237
7972 6664 7929
8937 8392 7322
6575 7176 1446
4850 5066 8804
8899 8400 3469
6998 3642 3011
7923 4486 1765
6452 3059 5714
788 2207 3170
7267 1301 4997
4439 5972 2812

TABLE 1m-continued (Rate 31/36) (n$_{ldpc}$ = 64800)

1780 6970 1589
7959 8278 6071
4534 3352 97
8471 2786 2155
2310 981 4507
7595 8390 1576
903 4985 906
4329 6038 3816
6655 3181 8643
462 6342 369
7927 5468 4640
5158 5099 8728
1162 1013 1668
4991 10 4023
7683 2169 5932
4904 1508 8599
81 7255 1696
4953 2574 3819
8670 4354 5201
3245 8547 2582
8283 5948 112
0 3555 8320
7361 3833 6990
2073 8147 3267
443 5558 422
4028 6204 3714
3204 1319 5834
385 2462 1221
7359 5931 8590
8507 6028 1036
6649 411 8848
2741 8385 2
734 5600 5141
6463 8874 5635
7438 4542 4355
8441 7926 3737
106 6421 5843
4827 1068 8169
4377 6957 13
3539 1226 175
8814 7140 3442
5985 8721 8564
6126 3850 8168
7291 8950 3881
1495 7555 8118
5993 6269 2364
6839 185 4721
8226 3508 5415
7558 6282 5985
8472 2791 4386
6780 6798 2965
6375 8983 3049
7644 5774 6057
8856 1119 6354
8565 6181 1611
8078 3236 6834
5834 2671 1352
3780 2609 3762
2341 1778 6913
523 2420 1779
6462 8692 4898
3367 3526 2137
1829 1013 953
6042 4363 347
7052 5170 5807
5302 2622 4624
8309 4278 3905
7431 3576 391
6 2284 6866
624 7584 7746
3739 5085 2171
7148 1787 5217
7011 3901 8124
6487 2318 1527
8208 889 7568
4516 1340 1403
7681 680 8128
3502 8037 5595

TABLE 1m-continued (Rate 31/36) ($n_{ldpc}$ = 64800)

6254 6343 455
3114 8126 6908
1370 3185 1047
4035 8017 2815
7533 1663 2346
4345 238 3292
527 7323 8811
7598 2211 5857
949 554 7169
8797 1600 869
1269 3815 4457
4850 3857 3079
4500 4413 7547
2532 250 46
3357 7128 442
1828 1156 566
7441 603 6927
7801 2986 3767
1008 5843 4822
979 1910 262
7958 721 2898
3835 1141 3693
1448 4271 394
4379 4286 422
2275 2026 4383
4840 7098 8809
742 129 7220
550 7440 6138
4257 7627 3234
8724 7147 631
2669 680 3924
6213 3684 935
2781 3219 8705
4977 2276 6690
8586 4945 8664
7205 5893 7264
6887 1064 6249
3962 7938 4495

TABLE 1n (Rate 2/9) ($n_{ldpc}$ = 16200)

1412 2138 8984 3438 2515 10585 11093 5801 2511 2287 10879
10470 10973 3691 11847 4141 479 7406 3228 8356 256 11769
2480 8892 9040 4517 2672 11159 7865 6415 2638 5399 7575
952 3128 12126 6408 60 10782 10254 11866 4473 10592 8736
3819 669 2091 5790 5040 6987 1353 2734 9859 3974 12568
5396 3717 6005 5830 9748 7221 8759 396 2259 11357 5702
7043 1281 6308 11899 7792 6476 3741 11099 6895 3224 1940
8224 8533 607 5065 9226 7677 389 7233 11605 7002 1302
10984 3435 9186 5964 7806 1613 11451 6020 5275 4965 6307
6942 1054 2451 5545 10447 6453 6583 6177 6284 11747 11323
2696 5058 3217 6755 1434 3691 8784 11507 1298 1233 7964
8103 6761 11865 1288 4258 7960 6753 4896 3722 3526 6795
4663 2198 9374 8700 9195 9272 7573 6956 3057 10801 574
9292 525 989 7701 3754 1110 330 3367 10472 6202 2627
1181 11223 3564 1628 8362 6419 7476 10074 1406 12509 9757
10380 9841 100 10177 8331 6788 8872 11167 2167 3646 2770
3111 8679 9590 9338 9119 8373 90 10418 12041 7718 3102
8551 6068 8424 10522 8595 6512 866 4591 3390 7496 172
1467 9023 9000 4113 9407 7168 29 11625 8584 8396 9683
1457 6097 9254 1850 12476 11664 11115 4278 11945 844 9302
7661 12225 1040
3671 5318 4875
3554 10478 10902
11739 3429 7114
5533 3709 689
2951 10126 10677
8709 9880 1112
681 6786 2945
8823 210 689
6648 509 2228
11109 10495 8746
8223 4337 6804

TABLE 1n-continued (Rate 2/9) ($n_{ldpc}$ = 16200)

371 5245 7435
8110 6001 11003
5097 2116 3826
2054 5220 7231
3029 5134 8970
132 9603 1538
10743 262 11188
990 6782 3283

TABLE 1o (Rate 13/45) ($n_{ldpc}$ = 16200)

7200 3499 6246 3905 247 2945 6706 2366 4892 5254 3370 7202
8203 6971 5728 4002 9544 5247 5176 5021 6732 8016 5317 9111
11144 7046 7808 8792 9779 11402 10050 7970 2047 6746 746 11319
4085 9903 3751 10712 6662 10504 7149 8084 7417 4334 9448 10678
9739 3412 2152 1114 6077 1021 10761 5073 3458 10115 4722 2581
8860 1515 1997 8926 471 2708 1449 158 4140 10611 10740 9693
3165 10132 4839 4204 10917 2320 6112 867 4929 9201 1707 10355
10887 7531 1123 8118 8896 5168 2011 110 9188 8375 9421 1693
1252 5132 10342 3726 2094 761 7397 10962 1848 4584 7139 1858
10499 3638 4924 1466 4191 2999 7778 11389 1071 2537 9265 5340
11498 4140 6795 3575 7332 10491 1502 3493 2380 3962 5169 2719
6028 10291 3440 7669 10253 8175 9134 2374 10199 2229 1055 5597
6655 7533 1518 11299 3033 1083 2464 10032 10910 3439 11511 3763
1424 9362 3170 10113 5492 11354 3160 10592 10897 37 334 8974
8540 9590 4255 5342 6469 11153 2925 3384 8958 7809 8108 2721
388 280 3829 8071 7567 10280 8151 22 8789 256 6937 5050
10795 1844 7999 1047 8549 4046 1696 893 8952 9610 10014 6772
485 9159 11346 10133 4447 10089 9419 7756 2637 6446 11400 9357
9302 2726 1559 7231 9930 9385 7889 2356 11066 14 1180 8283
458 5862 5540 3284 7878 9379 4637 11123 7791 8965 10476 2620
2593 4749 1747 4818 10173 596 9833 4518 5205 2808 592 228
10538 5907 164 2111 6334 1930 7625 11378 1531 3798 8978 4224
10183 8729 2755 10694 4801 2302 2649 1977 10031 3495 4789 1102
760 9858 700 3625 8633 3152 6230 9510 6123 2053 10767 50
1777 10548 6803
3935 1861 220
3117 211 7402
7164 5909 10691
4175 4997 7823
830 6156 5451
11467 1346 2838
5962 2858 10343
905 3219 1146
584 10896 5474
5315 3529 5378
4164 3155 9405
11386 10011 9288
7404 1200 8828
649 9557 9284
11419 7104 6268
918 3637 11395
5539 4612 4850
1965 8574 7497
8644 857 2038
10674 10465 886
10864 7119 353
9657 3090 7792
408 26 5892
4193 3663 10393
11181 5241 2721
10010 3240 7704
9370 8872 9280

TABLE 1p (Rate 11/20) ($n_{ldpc}$ = 16200)

4692 1824 629 6885 466 5885 1190 3308 7241 3690 4845 4383 7107
5761 3200 4648 2401 6747 4908 1777 796 6724 1310 2462 3313 5669
6966 7054 6004 4230 1509 1194 4523 4356 1438 7261 5516 3549 4934

TABLE 1p-continued (Rate 11/20) ($n_{ldpc}$ = 16200)

4308 7052 3603 6516 945 3511 617 5820 4168 5622 4545 1242 4382
1781 3490 4461 2464 6762 4082 2975 6166 894 1316 5228 5057 4644
5319 784 7037 3831 3570 853 1703 5064 1011 1642 6895 863 4176
1115 5811 4326 4263 2325 2685 223 6496 669 571 5057 1096 3594
7208 3140 3336 992 3516 4296 4492 5796 1875 3068 4970 6802 2652
214 6831 3611 2470 846 640 2983 2208 5295 5924 5242 5747 3017
1208 974 4819 2163 1631 1198 4570 2983 3664 2253 6131 4672 4698
3272 3537 4532 346 4936 5696 1275 6386 2124 7138 1179 4236 5891
3688 3376 6079 2437 4585 6404 1101 2289 378 6773 2800 2195 5013
3121 6579 5086 4192 3925 6844 4327 6329 6075 2738 6941 4088 4631
5613 2332 1432 5655 2516 5657 5383 3494 1235 3237 3282 449 1982
4339 6071 3262 5233 7004 390 2526 4128 3762 1284 4669 5897 6506
5840 2240 5046 1769 2539 6637 5000 4013 2325 1798 4680 6318 6746
5262 215 6980 2436 6086 1764 4227 4273 3163 2663 2406 2037 2549
649 4346 2391 420 3069 4930 6338 1834 6713 7013 1483 1918 2122
4147 1365 240 6277 6965 2436 2263 1334 2766 3525 5125 5808 4540
270 479 6244 2162 1409 7159 621 1439 4703 6526 6147 2701 7284
5510 558 3472 4520 7268 6903 4942 2301 4603 3451 512 3982 1219
30 2433 3797 469 4999 1845 6340 2327 1127 4663 6218 2112 4826
4851 1442 312 4788 5715 2449 2205 5056 1293 3985 1505 5768 5534
2604 6887 1831 1693 3557 5558 4425 3317 908 6236 5087 2257 3043
7159 3988 4837 4823 2208 908 6145 7232 1654 5099 5820 154 5058
3816 5710 5209 4080 5824 3820 7136 7066 6226 4999 4818 3081 1008
2378 3443 4210 525 3330 6183 1159 5073 5340 5786 3287 325 590
4048 4667 2821
4634 4645 2287
6592 580 4814
4375 4460 1799
160 2686 372
2129 5124 2066
1088 5047 995
226 5085 6263
2380 6679 3460
3011 3728 368
2642 365 3253
3801 2032 824
3243 4488 7088
6069 1002 1830
5718 3944 5213
7126 4207 5638
5780 1663 1081
1969 7238 1671
188 6826 499
5878 4110 393
2845 3816 3302
3755 2810 3055
5876 4890 3663
4288 2134 2926
2633 964 5454
2540 4811 2737
7149 2494 3042
7140 3546 376
4567 5871 4351
797 4245 7178
6811 6722 1351
5102 7241 6537
6828 1345 266
3094 2749 3658
5328 2573 1454
6444 5267 4847
1407 1305 6597
665 860 1934
6150 4115 3799
4362 4407 6956
6703 1355 2152
943 3688 6536
1737 1856 3374
6987 2896 3414
4897 1339 3530
6599 2011 6911
4907 4542 3723
4374 1444 3344
568 4887 4732
6402 1609 4422
2809 2306 570
3063 4645 2697
5994 505 5805
1353 74 6648

TABLE 1p-continued (Rate 11/20) ($n_{ldpc}$ = 16200)

1738 725 4900
1614 5497 841
649 731 3474
4246 1530 6986
2023 4976 259
6173 987 5313
2276 3770 4029
5101 4900 3767
6863 3991 2090
6639 1708 6603
328 1674 1476
3494 1497 3083
5233 4103 6677
2522 6812 6404
25 1986 409
2739 1882 3534
1958 861 7072
1958 2364 5609

TABLE 1q (Rate 23/36) ($n_{ldpc}$ = 16200)

4626 1140 3468 5725 2133 2303 473 1009 822 4351 2620
4725 4712 5060 4753 2897 5002 147 236 1234 4181 103
3305 947 2893 3155 3944 5064 1931 2538 3341 4027 4268
5630 671 2963 4446 1161 4388 5381 4986 5105 5817 4928
4420 3543 3452 5455 4711 3255 1654 2549 2963 1256 2235
1127 171 2482 1282 75 1645 2833 5326 2386 4508 4547
3789 1497 5124 2650 2370 4577 1421 962 2986 1788 4993
5240 1659 1071 980 4674 2477 5373 5719 1828 3904 5050
2516 58 4982 5550 5600 3411 1568 3674 2916 4767 5114
3143 4289 2589 1305 4489 1050 5696 1860 2030 4584 1514
4425 3025 5051 5435 5675 2726 81 5031 193 4032 3282
228 392 4389 2396 5698 5563 4218 1740 4605 714 5520
3616 5534 1115 2065 1267 128 2019 5820 791 4558 5700
4883 2655 2903 2269 4669 367 3392 3845 1937 581 928
713 4773 2637 1195 2941 3974 2614 2251 2311 3724 357
5847 1614 543 1039 4426 2821 3108 2323 224 4424 622
4731 2476 5740 1002 5065 4869 1384 50 5035 825 1302
2500 214 5711 4191 4268 5218 3679 1327 4629 921 1368
2672 429 4639 1916 4278 3126 3440 50 3976 5237 4865
2990 911 1768 4500 992 4704 5171 1737 4858 244 5647
4413 3838 930 1764 1832 4028
4958 4098 1522 1326 701 432
63 5603 3397 4963 3719 1757
545 3634 2417 51 476 3169
1744 2751 3068 2754 5788 435
502 3431 5141
217 5343 2096
1154 5301 5455
1306 5538 1821
3787 3714 805
967 4366 40
5228 624 3319
4013 4113 2110
1412 4137 2376
5135 3884 4890
512 5327 5807
2441 3652 5512
3623 1827 1019
1357 2629 2039
4047 4608 152
1129 634 4708
5165 4941 3432
1682 2583 437
4956 989 3149
2444 5476 5063
3147 93 2652
2694 3510 3484
5215 3576 5330
1214 1301 4752
2544 665 1669
3425 3851 917
1677 1696 4385

TABLE 1q-continued (Rate 23/36) ($n_{ldpc}$ = 16200)

3184 5716 2684
416 1587 5466
5117 807 402
1819 684 2619
1271 5820 1818
1010 3901 2373
3739 4706 823
3718 3738 565
5476 4945 1396
4745 4776 2784
1079 918 677
3991 5626 3195
2401 1007 3257
1378 5770 2213
4972 2611 2515
4883 4015 4442
3965 5844 448
4852 2035 3579
1090 4495 2482
3385 2415 5603
3036 2307 2416
4994 4832 4212
380 38 2773
2057 1308 436
2291 924 3045
3575 3084 4507
4803 3768 1673
118 4804 3762
2931 4736 5619
1357 2531 3547
1153 343 2676
3784 1810 4515
2576 348 1551
2939 4088 834
5396 1260 3465
1734 803 907
2471 257 1523
1632 3775 2968
5100 166 4352
962 1869 5173
47 4415 5040
782 2449 1611
2239 4649 1664
4422 4211 4708
5777 5762 2579
4418 609 3241
5088 3031 4033
5306 3404 2633
3330 4899 3679
2287 584 5181
4162 3310 1783
2487 2229 334
5507 508 5296
5348 4143 1902
4200 3938 2790
5150 5834 4250
4392 5223 5221
1662 2779 170
2942 116 2334
134 4175 1970
1114 4668 2250
3336 393 1764
3709 5156 3925

TABLE 1r (Rate 25/36) ($n_{ldpc}$ = 16200)

3717 2086 2490 983 835 4687 4347 4476 3404 1761 576
4145 578 368 2845 3005 909 364 3235 3961 4076 512
936 592 765 2964 746 1927 4924 2903 3317 3261 1270
4535 4082 4236 1298 2632 3931 2365 4093 4275 1695 2374
428 2881 2308 1623 277 3560 3583 2093 2563 3756 2174
186 101 1014 1629 496 1763 2714 3520 1193 243 2712
2503 1332 1039 3201 3305 4587 3408 433 267 4567 3310

TABLE 1r-continued (Rate 25/36) ($n_{ldpc}$ = 16200)

3949 1938 280 3951 4404 4528 4292 2791 2944 1533 1437
274 1965 2557 4701 2488 858 3540 2134 342 4890 2891
1947 1353 2021 1422 388 3045 605 2847 4059 1204 3680
1505 2758 3764 1874 2296 4804 337 2581 1810 2235 3623
3387 484 262 177 3981 2578 3711 215 4569 3281 572
949 2395 1082 1689 2912 45 2900 4391 1219 3966 3939
1521 3156 557 2258 1247 4471 1347 349 1683 4762 2854
1469 1924 3164 1079 1270 4828 2363 2104 1792 22 3231
2775 2423 3177 2287 2571 2530 3480 374 4526 4713 4760
3606 1798 2371 2510 4392 2655 3731 635 1264 4808 586
1530 3539 4714 4507 3826 4767 4887 750 3153 2851 2381
3547 3114 4280 4442 4710 4773 3920 4356 2976 1155 1394
9 2545 879 4188 4150 69 1372 3483 1347 2676 698
2922 2547 4926 391 2998 2896 3684 92 470 884 3186
3751 999 2259 575 4155 2053 337 353 3449 65 2292
726 4700 4012 3049 3508 1443 2438 132 3100 4427 2810
2208 3640 1993 4029 3104 3956 3298 1291 9 2926 39
1053 3365 1223 344 4142 3983 1564 3438 271 3187 2143
1179 1422 4808 4103 4814 3081 1550 2594 679
3404 344 1749 1011 449 4522 3490 2052 757
2508 2035 3087 2578 2330 3765 883 3322 3949
2156 1486 1230 4166 4106 3157 3789 1804 4237
4644 4832 538 2571 1231 83 3391 968 620
3841 4072 430
3715 3034 3594
52 1688 1107
2451 2790 4493
3131 4635 3197
714 231 4226
2122 961 1094
1118 1540 1550
1283 940 3985
679 914 952
983 3030 868
353 562 4129
3178 1719 931
3248 659 378
122 3064 1132
446 86 2986
399 3004 1700
217 4511 4712
3852 3189 4715
3500 4823 2186
2221 1472 4220
4206 376 1077
602 1281 4257
1385 4528 1354
2730 2701 738
2008 3989 3825
302 664 995
3473 4540 2668
1663 2271 2465
2334 3551 4028
799 3523 3877
3738 3999 2832
2187 4404 597
1291 2382 1411
3478 831 1080
1720 460 2630
548 1359 3736
943 1813 396
3447 1040 55
1438 3007 2305
99 4399 2097
672 127 1972
2670 3843 2060
4500 2824 1088
3904 1646 3473
920 1832 3307
1885 891 370
3530 3988 1530
1622 3751 2515
4840 4819 532
2263 4213 1894
3241 2172 1720
1298 3976 780
3088 1683 4340
3075 2980 316

TABLE 1r-continued (Rate 25/36) ($n_{ldpc}$ = 16200)

2455 1701 1106
2560 2811 151
2481 3157 1670
552 1329 3876
3378 1137 4060
37 1087 4074
2256 787 1840
4448 2800 3711
744 3710 4914
58 2171 2569
2173 1552 3975
4486 1025 2337
3313 1972 3531
1465 1836 3509
452 2216 2993
3440 3921 3059
1143 2621 1196
3864 2468 3362
4556 3153 3242
825 53 4058
1046 3814 550
169 1123 533
2467 4843 1523
64 3493 3882
2708 1378 647
3834 4460 1989
3734 1011 4453
847 3376 3723
1065 1964 4882
2409 3797 651
3980 4069 4291
1004 4321 4214
2961 4944 2277
1984 4617 3331
1022 1204 1943
992 1609 2287
438 2425 1553
1922 2389 2119
3996 574 2810
3813 2944 4546

TABLE 1s (Rate 13/18) ($n_{ldpc}$ = 16200)

2192 1265 868 3272 569 2864 2608 666 2275 105
2140 2364 299 3944 3601 3720 588 2437 3256 823
1834 2010 1287 96 3400 491 1853 892 3359 202
1517 4347 1598 3895 686 2526 434 28 18 1702
582 3070 1123 1334 3288 1717 1954 3993 2483 2045
35 441 713 2921 3908 2027 3853 2180 1670 1473
2087 2054 3055 2764 1440 2563 1192 2573 3322 4436
4435 1417 1879 1661 1555 2334 1473 2207 4190 172
2640 4281 2091 3492 2509 339 3293 105 3822 445
1170 1350 1994 2696 3867 4048 3816 845 3661 1841
3485 3973 522 4150 3497 1752 284 387 2392 2776
1116 3378 1486 1249 4354 1539 2944 93 1914 1602
2903 3143 3574 179 1280 149 2558 2450 1120 4418
1355 3730 570 4107 4422 4406 1492 4313 4415 2767
1547 4305 1658 1693 289 654 3281 3159 1076 798
3801 1160 462 1419 3371 924 3575 2427 232 4083
1375 29 2364 2909 2843 3668 432 2488 183 4498
752 84 663 3968 1901 2766 2056 1497 1087 3498
4169 933 2713 3947 2418 1075 685 99 1010 1144
851 4150 2141 48 2111 4190 3875 1906 2883 794
2357 662 2065 971 3174 3127 3428 2481 3696 1816
3712 1751 3777 3381 3107 486 2649 3947 4335 1971
401 1539 3940 3111 3506 2088 1113 91 2769 1509
888 1769 960 2853 2485 433 2329 4489 3907 4394
2800 2226 3816 1352 4429 2481 1632 2459 3107 317
2662 1465 624 2078 980 2296 714 3758 838 4479
3212 3165 160 2037 3445 4296 626 2678 254 2577
1510 4195 2262 4158 3656 4026 2203 3427 199 3904
361 471 3274 930 1932 4386 2789 1078 475 2319
1903 1961 3515 1121 1374 3930 3231 1782 36 3846

TABLE 1s-continued (Rate 13/18) ($n_{ldpc}$ = 16200)

3586 4292 1220
3459 1843 4285
2959 3197 737
1475 2767 3284
2071 4248 1601
1692 3935 783
1613 4030 3217
3574 4439 2783
1366 1849 1685
3923 2519 2224
559 1215 663
2654 2213 1720
2642 4206 253
3869 2100 1908
738 1269 2067
1314 3511 4104
251 3250 1429
1997 557 2622
2684 4196 3297
4162 1270 3774
4377 1188 1614
178 910 3254
1707 4401 684
1006 1808 933
160 73 4031
2416 131 3480
3545 661 3762
1057 3179 999
1545 4068 352
4394 2240 3846
794 4489 505
1749 781 1561
3982 1960 2888
3246 2468 1277
3752 2091 964
4143 1702 2300
2330 505 3566
4190 1808 2698
2173 4106 1144
1822 4295 462
3187 793 175
3276 415 3371
1725 4436 1079
3227 4428 2968
1471 1103 926
3455 2826 2803
2122 1078 3315
640 387 182
3191 1486 4489
4282 2241 3748
589 4076 2164
567 677 490
3887 2508 1393
764 577 3086
2108 2784 1762
1281 601 460
3810 429 4396
3043 125 1429
1028 3836 2717
3938 279 2184
4248 466 1653
3827 2192 889
1522 2435 3058
3583 1619 2134
3857 3089 814
301 4380 320
1628 3244 3490
1838 2136 632
4093 3101 1319
3738 1154 1331
1965 2897 3650
4390 3487 1768
2578 1487 3465
665 4350 1083
2935 2974 1354
2782 1726 2041
292 2848 4068
118 2581 3525

TABLE 1s-continued (Rate 13/18) ($n_{ldpc}$ = 16200)

1283 691 2946
2957 21 1450
3182 1709 2373
1320 2098 3911
1752 2805 2426
2356 2885 3662
175 1446 3774
709 2773 1345
1704 963 912
3353 4220 16
599 463 3105
3157 41 4244
3244 72 410
455 2849 1847
1197 174 4056
2745 1903 1271
171 3511 3072
395 4469 892
2567 2413 1956
2430 1349 4352
2561 1030 2
1809 3416 3973

TABLE 1t (Rate 19/36) ($n_{ldpc}$ = 16200)

1282 5463 2055 1492 6457 6767 3505 1482 1439 6574 60 2796
3840 1600 3301 4638 7064 6019 1981 620 1585 6357 6215 2923
5347 1877 1546 5034 3058 1839 4485 7647 5859 1883 424 2650
5559 1779 574 4934 42 765 2647 3586 4426 4731 1714 2322
3561 5920 4388 5319 217 1430 6897 3410 5416 6595 7285 130
2164 141 7069 6618 2274 2510 5625 1070 6638 6664 3156 6564
7425 3088 3992 7531 1469 2669 763 7347 3322 5053 4922 5014
3202 627 991 1165 3897 6116 7469 1315 4928 1483 1555 2699
2262 2815 2251 1615 6892 6023 1882 4243 3593 3012 3144 1914
6929 3722 3145 3032 3864 4084 1371 657 4019 4635 5898 1009
5077 1866 4950 3746 2553 5393 5486 5144 207 1921 5618 7390
7155 464 494 5977 144 4421 2752 5922 1530 481 3468 321
5883 199 3099 2896 3951 4141 6906 3162 3695 3899 2980 2973
4003 3742 3750 7130 6877 839 2928 2543 5169 5148 2056 41
2080 2599 2722 2416 3253 3228 5591 6946 2811 222 1503 1297
4977 2500 5383 1994 5541 298 3762 2433 1419 5906 237 494
6274 3527 2583 5711 4866 4231 3453 365 2829 5364 6965 3810
4376 885 826 4987 5634 3645 5630 3278 6526 7357 7587 5871
163 4849 1441 4931 5085 1060 6817 906 3155 7471 7393 424
7341 4823 6053 991 7013 7624 2416 4062 3427 6316 7269 947
6047 326 2745 402 6140 4286 2383 6100 6343 5747 1647 5145
2211 3555 4423 5854 3333 6933 3469 594 1374 1127 5235 3114
3804 2214 6081 757 124 2885 2678 3407 2159 2007 5604 2084
2605 4435 3893 1119 5601 4518 1252 5314 7546 5244 2570 1794
6227 4193 3178 2890 4720 5205 2902 3488 5583 3873 5066 967
1809 3834 2284
2649 3798 1431
7547 4545 7423
3136 1389 3355
1919 879 7098
7396 3276 1101
5577 6466 243
6253 7271 1017
3678 2005 2227
1249 6514 7267
2076 4668 4521
7170 2955 1293
741 4839 5039
2957 2363 5604
3846 1306 753
604 2017 2464
6487 2840 7272
6063 7068 42
113 1406 1468
2423 181 1942
5402 4675 1733
1596 5823 3523
1958 994 3816

TABLE 1t-continued (Rate 19/36) ($n_{ldpc}$ = 16200)

5818 1244 4898
6341 7032 5426
1432 326 5651
3397 5072 2443
2461 4560 2472
3758 3050 2297
5776 6071 1640
3546 4878 5368
2438 1294 6553
5618 5324 5595
4194 3383 5457
2707 1713 932
3538 1262 5996
6778 1405 6942
3091 4905 6802
3748 5126 4580
243 3252 5151
7106 3489 5405
5216 2129 5194
4300 5641 1046
6143 3885 2161
864 791 6392
1100 5526 2661
4948 6150 925
3893 3038 4340
7175 5967 7475
3905 7246 2988
5017 7236 2542
4959 4592 2020
4870 6237 5239
515 2569 6152
7596 1508 600
2636 5149 3379
969 5263 7120
6849 3730 1755
19 134 908
1085 820 2457
4609 1863 683
3633 1875 4627
122 877 2706
27 6193 2665
7028 1598 3375
6927 5785 1347
5121 3665 1560
2584 4965 1456
3102 5026 914
7416 6150 4030

TABLE 1u (Rate 26/45) ($n_{ldpc}$ = 16200)

3342 3896 286 2799 122 225 3074 527 4736 3291 6197 2055 782
2969 1015 3879 2215 2097 5913 3800 1450 4137 790 1711 4937 623
6654 764 5116 4633 2954 865 2768 1454 1505 4122 723 2893 3735
6674 686 6731 1152 1737 233 2045 6701 3020 2515 1392 1713 4962
3036 5227 4443 4815 5354 2875 4808 5610 912 2730 986 2966 6108
2589 2092 1356 6550 1153 1339 3811 6686 1612 4420 2154 1200 1202
46 5462 3392 2073 2641 2443 178 5965 451 3212 2712 2321 5295
3041 5632 4645 1917 1539 5801 4287 4140 3458 4908 1417 4610 6057
2469 6087 2938 2996 4452 3322 5275 5166 5231 556 2041 2394
5471 6178 3006 5507 6712 5367 70 3959 1974 4989 155 2620
119 3604 1833 3274 3612 4535 3651 1817 1942 2366 1835 1467
3842 4887 1502 5090 525 189 1386 3053 4727 5460 3135 3389
527 2521 2140 4513 5491 4293 5095 689 67 2882 4257 349
3269 3282 4172 3853 5318 2806 4695 1735 4460 6257 1798 4657
2292 2320 2999 4233 5016 3609 278 4528 6127 466 2331 926
6766 1132 3582 4533 678 1157 5108 3778 1832 4139 5790 5090
2141 6398 5184 4222 2042 6207 5466 3168 1871 1264 5917 6314
3659 2310 1742 5445 4140 6000 5150 1155 143 3400 2639 5768
2780 4987 1835 4146 6628 5734 4237 6148 4325 6696 2274 4915
3676 6728 5428 2176 5486 2627 4986 1929 68 742 3802 6509
1799 3406 3884 5524 2206 2757 896 6338 6365 6313 3387 1768
1345 2571 3380 5248 5100 5081 600 5783 4252 5992 5409 2738
1274 806 5715 3236 5172 1209 4525 5625 2842 6628 2395 5353

TABLE 1u-continued (Rate 26/45) ($n_{ldpc}$ = 16200)

6118 4629 2380 3807 6094 3715 6294 4945 4441 1998 2041 5513
3323 4863 5342 1204 5258 5620 1792 4297 2964 3532 3457 2602
4708 960 2403 4037 3741 5923 5594 3939 4940 6339 2330 6292
4804 3631 6783 1879 2106 550 5910 2807 6503 4535 5812 4836
2742 35 5825 787 2097 3210 1116 2407 3792 903 5096 6116
4529 3796 2160 6276 3078 3567 3214 5177 3631 1224 285 4740
4420 1573 6196 5175 5035 3928 2295 4470 1737 5276 1239 6625
2942 4132 2375 1607 3463 5951 1281 82 1012 3477 1806 4920
1925 5574 5913 379 983 5057 6791 2752 1852 1132 3663 2878
2753 3655 1523
3624 6439 3113
6090 4755 4901
6589 2815 1145
2363 3350 5683
1992 1301 2028
1707 6200 5759
6062 6802 6165
4302 929 1545
6677 4104 109
3925 185 789
3408 6198 5102
459 2275 4508
5677 6836 4901
2072 6137 2648
2512 4391 5684
5406 2791 4801
2737 1955 3948
1201 3711 4746
1808 3060 3372
3310 555 188
133 3764 3949
2517 173 5046
3770 6557 4844
1249 2441 2706
5831 3683 2025
1935 2155 5753
3247 4264 5927
929 6555 4057
5649 1061 1378
2182 3482 1173
4857 2834 3977
4818 1849 516
3296 6744 4295
1249 2379 5218
386 1945 1673
3218 2083 4442
549 1634 2488
5987 1064 6001
2585 1821 5471
1009 6675 2846
4145 3467 3817
1096 6516 2071
2266 616 6128
6668 6004 5264
6787 5425 2438
2641 5574 6634
3556 780 5997
2387 4854 911
2855 4426 5797
6375 2520 6703
4228 6706 154
3603 3039 900
6570 6006 1980
2520 4509 863
1048 5120 6272
2444 2648 3009
39 455 2371
3763 3299 1389
1369 1042 5140
1690 6798 5400
6540 121 3308
4059 3300 4207
713 2486 4294
5370 4587 4522
3069 4534 5502
1111 3750 6526
750 5578 2265
1483 5754 1394

TABLE 1u-continued (Rate 26/45) ($n_{ldpc}$ = 16200)

2879 4317 4966
1429 1891 4930
4675 745 5615

TABLE 1v (Rate 28/45) ($n_{ldpc}$ = 16200)

2216 5353 6062 4045 2714 439 5415 1685 2362 1169 4069
4589 1144 2027 368 1630 3581 3086 1765 399 916 2662
4830 39 4003 2405 4737 4538 3125 2372 3690 4433 4812
3027 3019 5751 2219 883 2853 329 5644 2032 687 631
5202 3622 1372 4048 1947 4836 4630 5995 2000 933 917
1916 3151 4394 500 2889 2079 533 1817 6090 4829 5007
462 1363 4535 2260 2567 3541 3963 639 2123 3398 4196
1880 4933 3898 5325 3699 195 2509 6098 5401 2490 1934
4540 2715 2247 70 2526 5625 5855 3484 5293 3423 4853
2217 3597 5507 3633 5580 978 3900 479 5950 685 5778
186 1898 160 5418 197 2148 3231 3009 1214 2492 4687
3664 3441 4152 4621 3875 5621 2310 3414 3746 1618 1397
429 446 1402 5545 6016 218 255 4024 647 4204 3631
5470 173 871 5457 3157 619 2109 4665 5695 1996 277
5885 3967 5368 2835 5308 1675 4930 633 3581 1814 3494
5422 5575 4330 1686 479 1866 2365 2688 4753 698 5772
5857 2196 895 1433 4470 3550 740 431 418 2955 45
5727 5395 2902 2394 2986 5308 4595 535 1194 1834 632
1280 501 5445 5943 21 6059 5488 5287 2276 985 1833
220 1823 4772 476 5431 1362 9 1039 5597 2429 638
1928 109 5380 3549 2870 2193 5084 1568 74 1281 5299
5525 4099 5879 1684 5362 3542 1402 5044 3685 2767 3204
99 4201 1599 3598 5362 5780 3135 2119 54 986 1831
1858 1152 123 3250 936 4422 1254 1437 1101 615 1899
86 239 3572 3224 5850 3362 4258
1598 2433 1343 4786 40 4646 2069
1058 1453 877 418 1551 3509 4693
1851 1040 3104 388 4688 2306 5765
5836 1650 1988
398 2185 6068
4904 3583 4510
6071 2846 2144
5664 44 3840
2468 2632 5795
2988 3769 515
164 4562 3784
144 6001 5591
6032 1728 3749
3265 2300 4986
3085 1052 5096
2078 4664 1088
1119 6053 5544
11 3944 5079
3955 3576 1087
3175 457 492
5024 4484 174
572 2038 1979
4792 42 2230
587 3850 2663
2563 5654 1013
3026 465 4617
173 4316 1702
2914 5227 965
3472 5892 2667
256 5291 820
2850 1079 1882
4774 5825 5021
178 1791 3300
5047 6031 2350
5957 5190 4900
5174 1441 964
4274 599 1710
5031 2827 5490
3188 4508 628
5088 2262 3594
2622 954 499
76 4082 2678

TABLE 1v-continued (Rate 28/45) ($n_{ldpc}$ = 16200)

4959 1174 5858
4221 2400 1477
3539 2175 2334
550 3994 639
5229 1628 4748
4845 157 1272
4726 1588 4984
3113 3011 5302
4257 4843 5548
1230 2197 2376
3119 3906 3481
475 2111 5481
5658 2372 5009
1651 12 2607
5285 5932 2683
1601 463 3431
5828 3783 4119
2358 3276 1966
1515 5809 1550
5938 3060 171
1727 2096 1254
5366 3267 1232
1867 4901 620
592 4316 5369
841 5451 1322
3247 2038 3029
823 4017 2171
408 788 4184
5128 2568 4318
5144 5968 5917
2086 5748 4216
322 5021 5857
1437 2016 2406
3114 1467 2221
3485 2093 2355
5344 3836 2942
3611 595 1241
3973 1357 1795
1685 5201 3401
79 1248 29
2269 2462 3871
4429 501 4446
4931 3977 4761
1207 3693 1461
4852 443 2989

TABLE 1w (Rate 31/36) ($n_{ldpc}$ = 16200)

1271 1259 112 172 1770 1792 355 58 2103 1704 151
1728 542 1193 1157 1387 388 576 252 159 325 2049
1249 242 682 894 1040 1879 1088 233 597 1360 1189
761 1734 353 1039 817 1202 481 1401 855 1310 2033
1358 192 205 1906 860 1749 1216 1195 1550 484 1444
2004 589 1048 1927 883 2115 1203 705 1163 1482 531
2043 1375 504 682 1896 1312 984 845 928 1692 1139
2073 543 1326 219 970 1550 166 79 2110 1152 253
1651 1032 2079 493 764 266 848 1522 469 31 945
1553 564 1144 712 1499 1870 1747 688 1450 1821 58
2060 1607 1502 946 240 1559 668 1214 2213 1426 294
2033 1878 115 986 1285 609 572 257 2245 1605 2006
2152 685 1059 314 737 2055 467 1593 940 1432 1979
2140 1056 562 564 1749 1022 1835 626 1892 2155 266
232 788 222 1608 2062 1723 1480 1439 666 1715 76
325 354 1846 1328 1768 623 361 1766 1660 1351 2052
1977 1504 1224 157 1645 1512 298 1201 50 1606 1917
1846 619 2045 90 1503 1729 911 1252 497 1984 1917
798 1638 1309 1658 1436 1565 1260 1019 1568 1106 371
1361 1316 2074 2175 2146 1618 755 148 1783 1263 2231
918 2061 1546
1441 1356 927
1574 1021 1888
1737 1386 38
1665 1125 1069

TABLE 1w-continued (Rate 31/36) ($n_{ldpc}$ = 16200)

744 1512 1136
336 1995 916
430 1673 1022
1799 2175 1391
472 273 1724
410 2180 2169
1411 2238 398
2105 812 1516
162 178 193
1116 1510 1261
1711 1619 1045
1912 451 415
1258 1141 1477
1001 377 1807
543 1352 438
1868 1658 929
2145 176 2042
1934 250 24
1874 825 1230
1170 2075 806
846 2082 2190
134 1471 479
2167 669 1857
590 1131 2078
73 1484 1108
2004 647 306
246 1492 1838
799 914 310
1489 722 1978
39 72 1748
1695 931 666
1559 1192 275
365 1229 1142
1738 1035 1955
1433 1573 1640
1152 1924 83
873 702 1020
1837 1776 2036
1782 441 1755
1498 1210 1513
1070 2193 296
313 300 2187
511 2243 1099
824 1456 1396
258 2243 607
287 1021 1782
1027 1611 1265
316 1153 704
814 1679 978
2192 709 1144
1253 856 64
1989 1251 1880
1434 172 944
1447 1200 776
1010 1844 747
655 582 1313
1664 2197 1385
2168 804 733
1711 981 273
367 161 1003
489 1422 1055
1710 1864 1729
1869 2240 891
567 649 475
952 1503 129
594 200 1215
1906 40 1952
1778 458 52
180 1098 1682
1757 2022 1487
1320 1148 1562
2006 2101 546
783 1711 1366
1141 85 1184
1376 268 1045
720 263 701
1844 1742 938
1909 2171 1093

TABLE 1w-continued (Rate 31/36) ($n_{ldpc}$ = 16200)

74 421 1912
1675 309 974
1112 243 1691
139 2151 1557
2208 2057 2196
2135 1657 1026
852 1879 1397
381 2248 968
67 1315 1126
1909 258 955
1342 1238 1010
1499 511 1717
658 1841 831
1993 687 1484
631 2186 1496
625 1438 945
1210 675 1534
1394 1991 1771
1820 550 780
1537 61 1189
278 1672 2149
972 1289 1838
1330 819 348
2220 399 1644
1748 353 890
1477 904 1690
802 203 1529
1338 616 380
1246 806 1383
1237 1580 1651
1369 828 1964
1950 862 840
1356 2087 1674
1477 1996 1506
885 2093 179
282 189 42
992 1516 2005
576 225 470
1543 1320 402
2021 1020 694
2134 165 1499
1474 268 1082
1063 561 242
1111 554 1653
1416 401 19
1753 2064 1052
1447 2035 890
1260 963 1975
1536 1129 1158
984 373 1707
1697 623 1184
8 97 648.

13. The apparatus of claim 12, wherein the LDPC code is of a structure that facilitates use of a plurality of parallel engines for decoding the coded signal.

14. The apparatus of claim 12, wherein $n_{ldpc}$=64800 or $n_{ldpc}$=16200, and wherein m=360 for $n_{ldpc}$=64800, and m=90 for $n_{ldpc}$=16200.

15. The apparatus of claim 12, wherein the apparatus is caused to further perform the following:
modulating the coded LDPC frames according to according to one of the following modulation types: BPSK (Binary Phase Shift Keying), π/2 BPSK, OQPSK (Offset Quadrature Phase Shift Keying), QPSK (Quadrature Phase Shift Keying), 8-PSK (Phase Shift Keying), 16-APSK (Amplitude Phase Shift Keying), 32-APSK, 64-APSK and 256-APSK.

16. The apparatus of claim 12, wherein the source data sequence is segmented into a series of baseband frames, and wherein the apparatus is caused to further perform the following:
encoding each baseband frame based on a t-error Bose Chaudhuri Hocquenghem (BCH) code, wherein the BCH encoding comprises an outer coding and the LDPC encoding comprises an inner coding.

17. The apparatus of claim 16, wherein the apparatus is caused to further perform the following:
interleaving each coded LDPC frame using a block interleaver, wherein the coded bits are written into an interleaver array on a column-by-column basis and read out on a row-by-row basis, and the output of the interleaving comprises coded FEC frames.

18. The apparatus of claim 17, wherein the interleaver array comprises a number of rows and a number of columns, and the coded bits are read out of each row in a predetermined order, and wherein:
the number of columns in the interleaver array is based on a selected modulation scheme as specified in the following table:

| Modulation Scheme | # of Interleaver Array Columns |
|---|---|
| 8PSK | 3 |
| 16APSK | 4 |
| 32APSK | 5 |
| 64APSK | 6 |
| 256APSK | 8; | and
the order in which the coded bits are read out of each row of the interleaver array is based on the selected modulation scheme and a selected code rate as specified in the following table (where the numbers reflecting the bit interleaver patterns chronologically signify a respective column of the row being read out, with "0" signifying the leftmost column):

| Modulation: Code Rate | Bit Interleaver Pattern | Modulation: Code Rate | Bit Interleaver Pattern |
|---|---|---|---|
| 8PSK: 23/36 | 0-1-2 | 32APSK: 7/9 | 1-0-2-3-4 |
| 8PSK: 25/36 | 1-0-2 | 64APSK: 13/18 | 4-1-2-5-0-3 |
| 8PSK: 13/18 | 1-0-2 | 64APSK: 3/4 | 2-3-5-0-4-1 |
| 16APSK: 19/36 | 0-3-1-2 | 64APSK: 7/9 | 2-0-1-5-4-3 |
| 16APSK: 11/20 | 2-1-3-0 | 64APSK: 4/5 | 1-2-4-0-5-3 |
| 16APSK: 26/45 | 3-2-0-1 | 64APSK: 5/6 | 4-2-1-0-5-3 |
| 16APSK: 3/5 | 3-2-1-0 | 64APSK: 31/36 | 2-3-4-0-5-1 |
| 16APSK: 28/45 | 3-0-1-2 | 256APSK: 2/3 | 1-3-2-4-7-6-5-0 |
| 16APSK: 23/36 | 3-0-2-1 | 256APSK: 25/36 | 4-2-3-5-1-0-6-7 |
| 16APSK: 25/36 | 2-3-1-0 | 256APSK: 13/18 | 4-5-3-2-1-0-7-6 |
| 16APSK: 13/18 | 3-0-2-1 | 256APSK: 3/4 | 5-1-2-4-3-6-0-7 |
| 16APSK: 7/9 | 0-3-2-1 | 256APSK: 7/9 | 2-1-3-5-4-0-6-7 |
| 32APSK: 2/3 | 2-1-4-3-0 | 256APSK: 4/5 | 1-3-4-2-7-0-5-6 |
| 16APSK: 31/36 | 1-0-3-2 | 256APSK: 5/6 | 3-5-6-1-2-4-0-7 |
| 32APSK: 13/18 | 3-0-2-1-4 | 256APSK: 31/36 | 3-4-1-2-6-0-7-5 |

19. The apparatus of claim 18, wherein the apparatus is caused to further perform the following:
modulating the coded FEC frames according to the selected modulation scheme, wherein the selected modulation scheme comprises one of the following modulation types: BPSK (Binary Phase Shift Keying), π/2 BPSK, OQPSK (Offset Quadrature Phase Shift Keying), QPSK (Quadrature Phase Shift Keying), 8-PSK (Phase Shift Keying), 16-APSK (Amplitude Phase Shift Keying), 32-APSK, 64-APSK and 256-APSK;
wherein, in the case of BPSK, π/2 BPSK or QPSK, the coded FEC frames are not interleaved.

20. The apparatus of claim 19, wherein the selected modulation scheme is a 256-APSK modulation based on a signal constellation of a 32+32+64+64+64 ring format, having bit labeling and [x, y] bit coordinate positions as follows (where $\epsilon_s$ represents average energy per symbol, $32*R1^2+32*R2^2+64*R3^2+64*R4^2+64*R5^2=256$, and R1 represents the radius of the inner-most ring, R2 represents the radius of the next outer ring, R3 represents the radius of the next outer ring, R4 represents the radius of the next outer ring, and R5 represents the radius of the outer-most ring):

| Bit Label | [x, y] Coordinates |
|---|---|
| 00000000 | [R2 * $\sqrt{\epsilon_s}$ * cos(π/32.0), R2 * $\sqrt{\epsilon_s}$ * sin(π/32.0)] |
| 00000001 | [R1 * $\sqrt{\epsilon_s}$ * cos(π/32.0), R1 * $\sqrt{\epsilon_s}$ * sin(π/32.0)] |
| 00000010 | [R2 * $\sqrt{\epsilon_s}$ * cos(3 * π/32.0), R2 * $\sqrt{\epsilon_s}$ * sin(3 * π/32.0)] |
| 00000011 | [R1 * $\sqrt{\epsilon_s}$ * cos(3 * π/32.0), R1 * $\sqrt{\epsilon_s}$ * sin(3 * π/32.0)] |
| 00000100 | [R2 * $\sqrt{\epsilon_s}$ * cos(7 * π/32.0), R2 * $\sqrt{\epsilon_s}$ * sin(7 * π/32.0)] |
| 00000101 | [R1 * $\sqrt{\epsilon_s}$ * cos(7 * π/32.0), R1 * $\sqrt{\epsilon_s}$ * sin(7 * π/32.0)] |
| 00000110 | [R2 * $\sqrt{\epsilon_s}$ * cos(5 * π/32.0), R2 * $\sqrt{\epsilon_s}$ * sin(5 * π/32.0)] |
| 00000111 | [R1 * $\sqrt{\epsilon_s}$ * cos(5 * π/32.0), R1 * $\sqrt{\epsilon_s}$ * sin(5 * π/32.0)] |
| 00001000 | [R2 * $\sqrt{\epsilon_s}$ * cos(15 * π/32.0), R2 * $\sqrt{\epsilon_s}$ * sin(15 * π/32.0)] |
| 00001001 | [R1 * $\sqrt{\epsilon_s}$ * cos(15 * π/32.0), R1 * $\sqrt{\epsilon_s}$ * sin(15 * π/32.0)] |
| 00001010 | [R2 * $\sqrt{\epsilon_s}$ * cos(13 * π/32.0), R2 * $\sqrt{\epsilon_s}$ * sin(13 * π/32.0)] |
| 00001011 | [R1 * $\sqrt{\epsilon_s}$ * cos(13 * π/32.0), R1 * $\sqrt{\epsilon_s}$ * sin(13 * π/32.0)] |
| 00001100 | [R2 * $\sqrt{\epsilon_s}$ * cos(9 * π/32.0), R2 * $\sqrt{\epsilon_s}$ * sin(9 * π/32.0)] |
| 00001101 | [R1 * $\sqrt{\epsilon_s}$ * cos(9 * π/32.0), R1 * $\sqrt{\epsilon_s}$ * sin(9 * π/32.0)] |
| 00001110 | [R2 * $\sqrt{\epsilon_s}$ * cos(11 * π/32.0), R2 * $\sqrt{\epsilon_s}$ * sin(11 * π/32.0)] |
| 00001111 | [R1 * $\sqrt{\epsilon_s}$ * cos(11 * π/32.0), R1 * $\sqrt{\epsilon_s}$ * sin(11 * π/32.0)] |
| 00010000 | [R3 * $\sqrt{\epsilon_s}$ * cos(π/64.0), R3 * $\sqrt{\epsilon_s}$ * sin(π/64.0)] |
| 00010001 | [R3 * $\sqrt{\epsilon_s}$ * cos(3 * π/64.0), R3 * $\sqrt{\epsilon_s}$ * sin(3 * π/64.0)] |
| 00010010 | [R3 * $\sqrt{\epsilon_s}$ * cos(7 * π/64.0), R3 * $\sqrt{\epsilon_s}$ * sin(7 * π/64.0)] |
| 00010011 | [R3 * $\sqrt{\epsilon_s}$ * cos(5 * π/64.0), R3 * $\sqrt{\epsilon_s}$ * sin(5 * π/64.0)] |
| 00010100 | [R3 * $\sqrt{\epsilon_s}$ * cos(15 * π/64.0), R3 * $\sqrt{\epsilon_s}$ * sin(15 * π/64.0)] |
| 00010101 | [R3 * $\sqrt{\epsilon_s}$ * cos(13 * π/64.0), R3 * $\sqrt{\epsilon_s}$ * sin(13 * π/64.0)] |
| 00010110 | [R3 * $\sqrt{\epsilon_s}$ * cos(9 * π/64.0), R3 * $\sqrt{\epsilon_s}$ * sin(9 * π/64.0)] |
| 00010111 | [R3 * $\sqrt{\epsilon_s}$ * cos(11 * π/64.0), R3 * $\sqrt{\epsilon_s}$ * sin(11 * π/64.0)] |
| 00011000 | [R3 * $\sqrt{\epsilon_s}$ * cos(31 * π/64.0), R3 * $\sqrt{\epsilon_s}$ * sin(31 * π/64.0)] |
| 00011001 | [R3 * $\sqrt{\epsilon_s}$ * cos(29 * π/64.0), R3 * $\sqrt{\epsilon_s}$ * sin(29 * π/64.0)] |
| 00011010 | [R3 * $\sqrt{\epsilon_s}$ * cos(25 * π/64.0), R3 * $\sqrt{\epsilon_s}$ * sin(25 * π/64.0)] |
| 00011011 | [R3 * $\sqrt{\epsilon_s}$ * cos(27 * π/64.0), R3 * $\sqrt{\epsilon_s}$ * sin(27 * π/64.0)] |
| 00011100 | [R3 * $\sqrt{\epsilon_s}$ * cos(17 * π/64.0), R3 * $\sqrt{\epsilon_s}$ * sin(17 * π/64.0)] |
| 00011101 | [R3 * $\sqrt{\epsilon_s}$ * cos(19 * π/64.0), R3 * $\sqrt{\epsilon_s}$ * sin(19 * π/64.0)] |
| 00011110 | [R3 * $\sqrt{\epsilon_s}$ * cos(23 * π/64.0), R3 * $\sqrt{\epsilon_s}$ * sin(23 * π/64.0)] |
| 00011111 | [R3 * $\sqrt{\epsilon_s}$ * cos(21 * π/64.0), R3 * $\sqrt{\epsilon_s}$ * sin(21 * π/64.0)] |
| 00100000 | [R5 * $\sqrt{\epsilon_s}$ * cos(π/64.0), R5 * $\sqrt{\epsilon_s}$ * sin(π/64.0)] |
| 00100001 | [R5 * $\sqrt{\epsilon_s}$ * cos(3 * π/64.0), R5 * $\sqrt{\epsilon_s}$ * sin(3 * π/64.0)] |
| 00100010 | [R5 * $\sqrt{\epsilon_s}$ * cos(7 * π/64.0), R5 * $\sqrt{\epsilon_s}$ * sin(7 * π/64.0)] |
| 00100011 | [R5 * $\sqrt{\epsilon_s}$ * cos(5 * π/64.0), R5 * $\sqrt{\epsilon_s}$ * sin(5 * π/64.0)] |
| 00100100 | [R5 * $\sqrt{\epsilon_s}$ * cos(15 * π/64.0), R5 * $\sqrt{\epsilon_s}$ * sin(15 * π/64.0)] |
| 00100101 | [R5 * $\sqrt{\epsilon_s}$ * cos(13 * π/64.0), R5 * $\sqrt{\epsilon_s}$ * sin(13 * π/64.0)] |
| 00100110 | [R5 * $\sqrt{\epsilon_s}$ * cos(9 * π/64.0), R5 * $\sqrt{\epsilon_s}$ * sin(9 * π/64.0)] |
| 00100111 | [R5 * $\sqrt{\epsilon_s}$ * cos(11 * π/64.0), R5 * $\sqrt{\epsilon_s}$ * sin(11 * π/64.0)] |
| 00101000 | [R5 * $\sqrt{\epsilon_s}$ * cos(31 * π/64.0), R5 * $\sqrt{\epsilon_s}$ * sin(31 * π/64.0)] |
| 00101001 | [R5 * $\sqrt{\epsilon_s}$ * cos(29 * π/64.0), R5 * $\sqrt{\epsilon_s}$ * sin(29 * π/64.0)] |
| 00101010 | [R5 * $\sqrt{\epsilon_s}$ * cos(25 * π/64.0), R5 * $\sqrt{\epsilon_s}$ * sin(25 * π/64.0)] |
| 00101011 | [R5 * $\sqrt{\epsilon_s}$ * cos(27 * π/64.0), R5 * $\sqrt{\epsilon_s}$ * sin(27 * π/64.0)] |
| 00101100 | [R5 * $\sqrt{\epsilon_s}$ * cos(17 * π/64.0), R5 * $\sqrt{\epsilon_s}$ * sin(17 * π/64.0)] |
| 00101101 | [R5 * $\sqrt{\epsilon_s}$ * cos(19 * π/64.0), R5 * $\sqrt{\epsilon_s}$ * sin(19 * π/64.0)] |
| 00101110 | [R5 * $\sqrt{\epsilon_s}$ * cos(23 * π/64.0), R5 * $\sqrt{\epsilon_s}$ * sin(23 * π/64.0)] |
| 00101111 | [R5 * $\sqrt{\epsilon_s}$ * cos(21 * π/64.0), R5 * $\sqrt{\epsilon_s}$ * sin(21 * π/64.0)] |
| 00110000 | [R4 * $\sqrt{\epsilon_s}$ * cos(π/64.0), R4 * $\sqrt{\epsilon_s}$ * sin(π/64.0)] |
| 00110001 | [R4 * $\sqrt{\epsilon_s}$ * cos(3 * π/64.0), R4 * $\sqrt{\epsilon_s}$ * sin(3 * π/64.0)] |
| 00110010 | [R4 * $\sqrt{\epsilon_s}$ * cos(7 * π/64.0), R4 * $\sqrt{\epsilon_s}$ * sin(7 * π/64.0)] |
| 00110011 | [R4 * $\sqrt{\epsilon_s}$ * cos(5 * π/64.0), R4 * $\sqrt{\epsilon_s}$ * sin(5 * π/64.0)] |
| 00110100 | [R4 * $\sqrt{\epsilon_s}$ * cos(15 * π/64.0), R4 * $\sqrt{\epsilon_s}$ * sin(15 * π/64.0)] |
| 00110101 | [R4 * $\sqrt{\epsilon_s}$ * cos(13 * π/64.0), R4 * $\sqrt{\epsilon_s}$ * sin(13 * π/64.0)] |
| 00110110 | [R4 * $\sqrt{\epsilon_s}$ * cos(9 * π/64.0), R4 * $\sqrt{\epsilon_s}$ * sin(9 * π/64.0)] |
| 00110111 | [R4 * $\sqrt{\epsilon_s}$ * cos(11 * π/64.0), R4 * $\sqrt{\epsilon_s}$ * sin(11 * π/64.0)] |
| 00111000 | [R4 * $\sqrt{\epsilon_s}$ * cos(31 * π/64.0), R4 * $\sqrt{\epsilon_s}$ * sin(31 * π/64.0)] |
| 00111001 | [R4 * $\sqrt{\epsilon_s}$ * cos(29 * π/64.0), R4 * $\sqrt{\epsilon_s}$ * sin(29 * π/64.0)] |
| 00111010 | [R4 * $\sqrt{\epsilon_s}$ * cos(25 * π/64.0), R4 * $\sqrt{\epsilon_s}$ * sin(25 * π/64.0)] |
| 00111011 | [R4 * $\sqrt{\epsilon_s}$ * cos(27 * π/64.0), R4 * $\sqrt{\epsilon_s}$ * sin(27 * π/64.0)] |
| 00111100 | [R4 * $\sqrt{\epsilon_s}$ * cos(17 * π/64.0), R4 * $\sqrt{\epsilon_s}$ * sin(17 * π/64.0)] |
| 00111101 | [R4 * $\sqrt{\epsilon_s}$ * cos(19 * π/64.0), R4 * $\sqrt{\epsilon_s}$ * sin(19 * π/64.0)] |
| 00111110 | [R4 * $\sqrt{\epsilon_s}$ * cos(23 * π/64.0), R4 * $\sqrt{\epsilon_s}$ * sin(23 * π/64.0)] |
| 00111111 | [R4 * $\sqrt{\epsilon_s}$ * cos(21 * π/64.0), R4 * $\sqrt{\epsilon_s}$ * sin(21 * π/64.0)] |
| 01000000 | [R2 * $\sqrt{\epsilon_s}$ * cos(31 * π/32.0), R2 * $\sqrt{\epsilon_s}$ * sin(31 * π/32.0)] |
| 01000001 | [R1 * $\sqrt{\epsilon_s}$ * cos(31 * π/32.0), R1 * $\sqrt{\epsilon_s}$ * sin(31 * π/32.0)] |
| 01000010 | [R2 * $\sqrt{\epsilon_s}$ * cos(29 * π/32.0), R2 * $\sqrt{\epsilon_s}$ * sin(29 * π/32.0)] |
| 01000011 | [R1 * $\sqrt{\epsilon_s}$ * cos(29 * π/32.0), R1 * $\sqrt{\epsilon_s}$ * sin(29 * π/32.0)] |
| 01000100 | [R2 * $\sqrt{\epsilon_s}$ * cos(25 * π/32.0), R2 * $\sqrt{\epsilon_s}$ * sin(25 * π/32.0)] |
| 01000101 | [R1 * $\sqrt{\epsilon_s}$ * cos(25 * π/32.0), R1 * $\sqrt{\epsilon_s}$ * sin(25 * π/32.0)] |
| 01000110 | [R2 * $\sqrt{\epsilon_s}$ * cos(27 * π/32.0), R2 * $\sqrt{\epsilon_s}$ * sin(27 * π/32.0)] |
| 01000111 | [R1 * $\sqrt{\epsilon_s}$ * cos(27 * π/32.0), R1 * $\sqrt{\epsilon_s}$ * sin(27 * π/32.0)] |
| 01001000 | [R2 * $\sqrt{\epsilon_s}$ * cos(17 * π/32.0), R2 * $\sqrt{\epsilon_s}$ * sin(17 * π/32.0)] |
| 01001001 | [R1 * $\sqrt{\epsilon_s}$ * cos(17 * π/32.0), R1 * $\sqrt{\epsilon_s}$ * sin(17 * π/32.0)] |
| 01001010 | [R2 * $\sqrt{\epsilon_s}$ * cos(19 * π/32.0), R2 * $\sqrt{\epsilon_s}$ * sin(19 * π/32.0)] |
| 01001011 | [R1 * $\sqrt{\epsilon_s}$ * cos(19 * π/32.0), R1 * $\sqrt{\epsilon_s}$ * sin(19 * π/32.0)] |
| 01001100 | [R2 * $\sqrt{\epsilon_s}$ * cos(23 * π/32.0), R2 * $\sqrt{\epsilon_s}$ * sin(23 * π/32.0)] |
| 01001101 | [R1 * $\sqrt{\epsilon_s}$ * cos(23 * π/32.0), R1 * $\sqrt{\epsilon_s}$ * sin(23 * π/32.0)] |
| 01001110 | [R2 * $\sqrt{\epsilon_s}$ * cos(21 * π/32.0), R2 * $\sqrt{\epsilon_s}$ * sin(21 * π/32.0)] |
| 01001111 | [R1 * $\sqrt{\epsilon_s}$ * cos(21 * π/32.0), R1 * $\sqrt{\epsilon_s}$ * sin(21 * π/32.0)] |
| 01010000 | [R3 * $\sqrt{\epsilon_s}$ * cos(63 * π/64.0), R3 * $\sqrt{\epsilon_s}$ * sin(63 * π/64.0)] |
| 01010001 | [R3 * $\sqrt{\epsilon_s}$ * cos(61 * π/64.0), R3 * $\sqrt{\epsilon_s}$ * sin(61 * π/64.0)] |
| 01010010 | [R3 * $\sqrt{\epsilon_s}$ * cos(57 * π/64.0), R3 * $\sqrt{\epsilon_s}$ * sin(57 * π/64.0)] |
| 01010011 | [R3 * $\sqrt{\epsilon_s}$ * cos(59 * π/64.0), R3 * $\sqrt{\epsilon_s}$ * sin(59 * π/64.0)] |
| 01010100 | [R3 * $\sqrt{\epsilon_s}$ * cos(49 * π/64.0), R3 * $\sqrt{\epsilon_s}$ * sin(49 * π/64.0)] |
| 01010101 | [R3 * $\sqrt{\epsilon_s}$ * cos(51 * π/64.0), R3 * $\sqrt{\epsilon_s}$ * sin(51 * π/64.0)] |
| 01010110 | [R3 * $\sqrt{\epsilon_s}$ * cos(55 * π/64.0), R3 * $\sqrt{\epsilon_s}$ * sin(55 * π/64.0)] |
| 01010111 | [R3 * $\sqrt{\epsilon_s}$ * cos(53 * π/64.0), R3 * $\sqrt{\epsilon_s}$ * sin(53 * π/64.0)] |
| 01011000 | [R3 * $\sqrt{\epsilon_s}$ * cos(33 * π/64.0), R3 * $\sqrt{\epsilon_s}$ * sin(33 * π/64.0)] |
| 01011001 | [R3 * $\sqrt{\epsilon_s}$ * cos(35 * π/64.0), R3 * $\sqrt{\epsilon_s}$ * sin(35 * π/64.0)] |
| 01011010 | [R3 * $\sqrt{\epsilon_s}$ * cos(39 * π/64.0), R3 * $\sqrt{\epsilon_s}$ * sin(39 * π/64.0)] |
| 01011011 | [R3 * $\sqrt{\epsilon_s}$ * cos(37 * π/64.0), R3 * $\sqrt{\epsilon_s}$ * sin(37 * π/64.0)] |
| 01011100 | [R3 * $\sqrt{\epsilon_s}$ * cos(47 * π/64.0), R3 * $\sqrt{\epsilon_s}$ * sin(47 * π/64.0)] |
| 01011101 | [R3 * $\sqrt{\epsilon_s}$ * cos(45 * π/64.0), R3 * $\sqrt{\epsilon_s}$ * sin(45 * π/64.0)] |
| 01011110 | [R3 * $\sqrt{\epsilon_s}$ * cos(41 * π/64.0), R3 * $\sqrt{\epsilon_s}$ * sin(41 * π/64.0)] |
| 01011111 | [R3 * $\sqrt{\epsilon_s}$ * cos(43 * π/64.0), R3 * $\sqrt{\epsilon_s}$ * sin(43 * π/64.0)] |
| 01100000 | [R5 * $\sqrt{\epsilon_s}$ * cos(63 * π/64.0), R5 * $\sqrt{\epsilon_s}$ * sin(63 * π/64.0)] |
| 01100001 | [R5 * $\sqrt{\epsilon_s}$ * cos(61 * π/64.0), R5 * $\sqrt{\epsilon_s}$ * sin(61 * π/64.0)] |
| 01100010 | [R5 * $\sqrt{\epsilon_s}$ * cos(57 * π/64.0), R5 * $\sqrt{\epsilon_s}$ * sin(57 * π/64.0)] |
| 01100011 | [R5 * $\sqrt{\epsilon_s}$ * cos(59 * π/64.0), R5 * $\sqrt{\epsilon_s}$ * sin(59 * π/64.0)] |
| 01100100 | [R5 * $\sqrt{\epsilon_s}$ * cos(49 * π/64.0), R5 * $\sqrt{\epsilon_s}$ * sin(49 * π/64.0)] |
| 01100101 | [R5 * $\sqrt{\epsilon_s}$ * cos(51 * π/64.0), R5 * $\sqrt{\epsilon_s}$ * sin(51 * π/64.0)] |
| 01100110 | [R5 * $\sqrt{\epsilon_s}$ * cos(55 * π/64.0), R5 * $\sqrt{\epsilon_s}$ * sin(55 * π/64.0)] |
| 01100111 | [R5 * $\sqrt{\epsilon_s}$ * cos(53 * π/64.0), R5 * $\sqrt{\epsilon_s}$ * sin(53 * π/64.0)] |
| 01101000 | [R5 * $\sqrt{\epsilon_s}$ * cos(33 * π/64.0), R5 * $\sqrt{\epsilon_s}$ * sin(33 * π/64.0)] |
| 01101001 | [R5 * $\sqrt{\epsilon_s}$ * cos(35 * π/64.0), R5 * $\sqrt{\epsilon_s}$ * sin(35 * π/64.0)] |
| 01101010 | [R5 * $\sqrt{\epsilon_s}$ * cos(39 * π/64.0), R5 * $\sqrt{\epsilon_s}$ * sin(39 * π/64.0)] |
| 01101011 | [R5 * $\sqrt{\epsilon_s}$ * cos(37 * π/64.0), R5 * $\sqrt{\epsilon_s}$ * sin(37 * π/64.0)] |
| 01101100 | [R5 * $\sqrt{\epsilon_s}$ * cos(47 * π/64.0), R5 * $\sqrt{\epsilon_s}$ * sin(47 * π/64.0)] |
| 01101101 | [R5 * $\sqrt{\epsilon_s}$ * cos(45 * π/64.0), R5 * $\sqrt{\epsilon_s}$ * sin(45 * π/64.0)] |
| 01101110 | [R5 * $\sqrt{\epsilon_s}$ * cos(41 * π/64.0), R5 * $\sqrt{\epsilon_s}$ * sin(41 * π/64.0)] |
| 01101111 | [R5 * $\sqrt{\epsilon_s}$ * cos(43 * π/64.0), R5 * $\sqrt{\epsilon_s}$ * sin(43 * π/64.0)] |
| 01110000 | [R4 * $\sqrt{\epsilon_s}$ * cos(63 * π/64.0), R4 * $\sqrt{\epsilon_s}$ * sin(63 * π/64.0)] |
| 01110001 | [R4 * $\sqrt{\epsilon_s}$ * cos(61 * π/64.0), R4 * $\sqrt{\epsilon_s}$ * sin(61 * π/64.0)] |
| 01110010 | [R4 * $\sqrt{\epsilon_s}$ * cos(57 * π/64.0), R4 * $\sqrt{\epsilon_s}$ * sin(57 * π/64.0)] |
| 01110011 | [R4 * $\sqrt{\epsilon_s}$ * cos(59 * π/64.0), R4 * $\sqrt{\epsilon_s}$ * sin(59 * π/64.0)] |
| 01110100 | [R4 * $\sqrt{\epsilon_s}$ * cos(49 * π/64.0), R4 * $\sqrt{\epsilon_s}$ * sin(49 * π/64.0)] |
| 01110101 | [R4 * $\sqrt{\epsilon_s}$ * cos(51 * π/64.0), R4 * $\sqrt{\epsilon_s}$ * sin(51 * π/64.0)] |
| 01110110 | [R4 * $\sqrt{\epsilon_s}$ * cos(55 * π/64.0), R4 * $\sqrt{\epsilon_s}$ * sin(55 * π/64.0)] |
| 01110111 | [R4 * $\sqrt{\epsilon_s}$ * cos(53 * π/64.0), R4 * $\sqrt{\epsilon_s}$ * sin(53 * π/64.0)] |
| 01111000 | [R4 * $\sqrt{\epsilon_s}$ * cos(33 * π/64.0), R4 * $\sqrt{\epsilon_s}$ * sin(33 * π/64.0)] |
| 01111001 | [R4 * $\sqrt{\epsilon_s}$ * cos(35 * π/64.0), R4 * $\sqrt{\epsilon_s}$ * sin(35 * π/64.0)] |
| 01111010 | [R4 * $\sqrt{\epsilon_s}$ * cos(39 * π/64.0), R4 * $\sqrt{\epsilon_s}$ * sin(39 * π/64.0)] |
| 01111011 | [R4 * $\sqrt{\epsilon_s}$ * cos(37 * π/64.0), R4 * $\sqrt{\epsilon_s}$ * sin(37 * π/64.0)] |
| 01111100 | [R4 * $\sqrt{\epsilon_s}$ * cos(47 * π/64.0), R4 * $\sqrt{\epsilon_s}$ * sin(47 * π/64.0)] |
| 01111101 | [R4 * $\sqrt{\epsilon_s}$ * cos(45 * π/64.0), R4 * $\sqrt{\epsilon_s}$ * sin(45 * π/64.0)] |
| 01111110 | [R4 * $\sqrt{\epsilon_s}$ * cos(41 * π/64.0), R4 * $\sqrt{\epsilon_s}$ * sin(41 * π/64.0)] |
| 01111111 | [R4 * $\sqrt{\epsilon_s}$ * cos(43 * π/64.0), R4 * $\sqrt{\epsilon_s}$ * sin(43 * π/64.0)] |
| 10000000 | [R2 * $\sqrt{\epsilon_s}$ * cos(63 * π/32.0), R2 * $\sqrt{\epsilon_s}$ * sin(63 * π/32.0)] |
| 10000001 | [R1 * $\sqrt{\epsilon_s}$ * cos(63 * π/32.0), R1 * $\sqrt{\epsilon_s}$ * sin(63 * π/32.0)] |
| 10000010 | [R2 * $\sqrt{\epsilon_s}$ * cos(61 * π/32.0), R2 * $\sqrt{\epsilon_s}$ * sin(61 * π/32.0)] |
| 10000011 | [R1 * $\sqrt{\epsilon_s}$ * cos(61 * π/32.0), R1 * $\sqrt{\epsilon_s}$ * sin(61 * π/32.0)] |
| 10000100 | [R2 * $\sqrt{\epsilon_s}$ * cos(57 * π/32.0), R2 * $\sqrt{\epsilon_s}$ * sin(57 * π/32.0)] |
| 10000101 | [R1 * $\sqrt{\epsilon_s}$ * cos(57 * π/32.0), R1 * $\sqrt{\epsilon_s}$ * sin(57 * π/32.0)] |
| 10000110 | [R2 * $\sqrt{\epsilon_s}$ * cos(59 * π/32.0), R2 * $\sqrt{\epsilon_s}$ * sin(59 * π/32.0)] |
| 10000111 | [R1 * $\sqrt{\epsilon_s}$ * cos(59 * π/32.0), R1 * $\sqrt{\epsilon_s}$ * sin(59 * π/32.0)] |
| 10001000 | [R2 * $\sqrt{\epsilon_s}$ * cos(49 * π/32.0), R2 * $\sqrt{\epsilon_s}$ * sin(49 * π/32.0)] |
| 10001001 | [R1 * $\sqrt{\epsilon_s}$ * cos(49 * π/32.0), R1 * $\sqrt{\epsilon_s}$ * sin(49 * π/32.0)] |
| 10001010 | [R2 * $\sqrt{\epsilon_s}$ * cos(51 * π/32.0), R2 * $\sqrt{\epsilon_s}$ * sin(51 * π/32.0)] |
| 10001011 | [R1 * $\sqrt{\epsilon_s}$ * cos(51 * π/32.0), R1 * $\sqrt{\epsilon_s}$ * sin(51 * π/32.0)] |
| 10001100 | [R2 * $\sqrt{\epsilon_s}$ * cos(55 * π/32.0), R2 * $\sqrt{\epsilon_s}$ * sin(55 * π/32.0)] |
| 10001101 | [R1 * $\sqrt{\epsilon_s}$ * cos(55 * π/32.0), R1 * $\sqrt{\epsilon_s}$ * sin(55 * π/32.0)] |
| 10001110 | [R2 * $\sqrt{\epsilon_s}$ * cos(53 * π/32.0), R2 * $\sqrt{\epsilon_s}$ * sin(53 * π/32.0)] |
| 10001111 | [R1 * $\sqrt{\epsilon_s}$ * cos(53 * π/32.0), R1 * $\sqrt{\epsilon_s}$ * sin(53 * π/32.0)] |
| 10010000 | [R3 * $\sqrt{\epsilon_s}$ * cos(127 * π/64.0), R3 * $\sqrt{\epsilon_s}$ * sin(127 * π/64.0)] |

| Bit Label | [x, y] Coordinates |
|---|---|
| 10010001 | [R3 * $\sqrt{\epsilon_s}$ * cos(125 * π/64.0), R3 * $\sqrt{\epsilon_s}$ * sin(125 * π/64.0)] |
| 10010010 | [R3 * $\sqrt{\epsilon_s}$ * cos(121 * π/64.0), R3 * $\sqrt{\epsilon_s}$ * sin(121 * π/64.0)] |
| 10010011 | [R3 * $\sqrt{\epsilon_s}$ * cos(123 * π/64.0), R3 * $\sqrt{\epsilon_s}$ * sin(123 * π/64.0)] |
| 10010100 | [R3 * $\sqrt{\epsilon_s}$ * cos(113 * π/64.0), R3 * $\sqrt{\epsilon_s}$ * sin(113 * π/64.0)] |
| 10010101 | [R3 * $\sqrt{\epsilon_s}$ * cos(115 * π/64.0), R3 * $\sqrt{\epsilon_s}$ * sin(115 * π/64.0)] |
| 10010110 | [R3 * $\sqrt{\epsilon_s}$ * cos(119 * π/64.0), R3 * $\sqrt{\epsilon_s}$ * sin(119 * π/64.0)] |
| 10010111 | [R3 * $\sqrt{\epsilon_s}$ * cos(117 * π/64.0), R3 * $\sqrt{\epsilon_s}$ * sin(117 * π/64.0)] |
| 10011000 | [R3 * $\sqrt{\epsilon_s}$ * cos(97 * π/64.0), R3 * $\sqrt{\epsilon_s}$ * sin(97 * π/64.0)] |
| 10011001 | [R3 * $\sqrt{\epsilon_s}$ * cos(99 * π/64.0), R3 * $\sqrt{\epsilon_s}$ * sin(99 * π/64.0)] |
| 10011010 | [R3 * $\sqrt{\epsilon_s}$ * cos(103 * π/64.0), R3 * $\sqrt{\epsilon_s}$ * sin(103 * π/64.0)] |
| 10011011 | [R3 * $\sqrt{\epsilon_s}$ * cos(101 * π/64.0), R3 * $\sqrt{\epsilon_s}$ * sin(101 * π/64.0)] |
| 10011100 | [R3 * $\sqrt{\epsilon_s}$ * cos(111 * π/64.0), R3 * $\sqrt{\epsilon_s}$ * sin(111 * π/64.0)] |
| 10011101 | [R3 * $\sqrt{\epsilon_s}$ * cos(109 * π/64.0), R3 * $\sqrt{\epsilon_s}$ * sin(109 * π/64.0)] |
| 10011110 | [R3 * $\sqrt{\epsilon_s}$ * cos(105 * π/64.0), R3 * $\sqrt{\epsilon_s}$ * sin(105 * π/64.0)] |
| 10011111 | [R3 * $\sqrt{\epsilon_s}$ * cos(107 * π/64.0), R3 * $\sqrt{\epsilon_s}$ * sin(107 * π/64.0)] |
| 10100000 | [R5 * $\sqrt{\epsilon_s}$ * cos(127 * π/64.0), R5 * $\sqrt{\epsilon_s}$ * sin(127 * π/64.0)] |
| 10100001 | [R5 * $\sqrt{\epsilon_s}$ * cos(125 * π/64.0), R5 * $\sqrt{\epsilon_s}$ * sin(125 * π/64.0)] |
| 10100010 | [R5 * $\sqrt{\epsilon_s}$ * cos(121 * π/64.0), R5 * $\sqrt{\epsilon_s}$ * sin(121 * π/64.0)] |
| 10100011 | [R5 * $\sqrt{\epsilon_s}$ * cos(123 * π/64.0), R5 * $\sqrt{\epsilon_s}$ * sin(123 * π/64.0)] |
| 10100100 | [R5 * $\sqrt{\epsilon_s}$ * cos(113 * π/64.0), R5 * $\sqrt{\epsilon_s}$ * sin(113 * π/64.0)] |
| 10100101 | [R5 * $\sqrt{\epsilon_s}$ * cos(115 * π/64.0), R5 * $\sqrt{\epsilon_s}$ * sin(115 * π/64.0)] |
| 10100110 | [R5 * $\sqrt{\epsilon_s}$ * cos(119 * π/64.0), R5 * $\sqrt{\epsilon_s}$ * sin(119 * π/64.0)] |
| 10100111 | [R5 * $\sqrt{\epsilon_s}$ * cos(117 * π/64.0), R5 * $\sqrt{\epsilon_s}$ * sin(117 * π/64.0)] |
| 10101000 | [R5 * $\sqrt{\epsilon_s}$ * cos(97 * π/64.0), R5 * $\sqrt{\epsilon_s}$ * sin(97 * π/64.0)] |
| 10101001 | [R5 * $\sqrt{\epsilon_s}$ * cos(99 * π/64.0), R5 * $\sqrt{\epsilon_s}$ * sin(99 * π/64.0)] |
| 10101010 | [R5 * $\sqrt{\epsilon_s}$ * cos(103 * π/64.0), R5 * $\sqrt{\epsilon_s}$ * sin(103 * π/64.0)] |
| 10101011 | [R5 * $\sqrt{\epsilon_s}$ * cos(101 * π/64.0), R5 * $\sqrt{\epsilon_s}$ * sin(101 * π/64.0)] |
| 10101100 | [R5 * $\sqrt{\epsilon_s}$ * cos(111 * π/64.0), R5 * $\sqrt{\epsilon_s}$ * sin(111 * π/64.0)] |
| 10101101 | [R5 * $\sqrt{\epsilon_s}$ * cos(109 * π/64.0), R5 * $\sqrt{\epsilon_s}$ * sin(109 * π/64.0)] |
| 10101110 | [R5 * $\sqrt{\epsilon_s}$ * cos(105 * π/64.0), R5 * $\sqrt{\epsilon_s}$ * sin(105 * π/64.0)] |
| 10101111 | [R5 * $\sqrt{\epsilon_s}$ * cos(107 * π/64.0), R5 * $\sqrt{\epsilon_s}$ * sin(107 * π/64.0)] |
| 10110000 | [R4 * $\sqrt{\epsilon_s}$ * cos(127 * π/64.0), R4 * $\sqrt{\epsilon_s}$ * sin(127 * π/64.0)] |
| 10110001 | [R4 * $\sqrt{\epsilon_s}$ * cos(125 * π/64.0), R4 * $\sqrt{\epsilon_s}$ * sin(125 * π/64.0)] |
| 10110010 | [R4 * $\sqrt{\epsilon_s}$ * cos(121 * π/64.0), R4 * $\sqrt{\epsilon_s}$ * sin(121 * π/64.0)] |
| 10110011 | [R4 * $\sqrt{\epsilon_s}$ * cos(123 * π/64.0), R4 * $\sqrt{\epsilon_s}$ * sin(123 * π/64.0)] |
| 10110100 | [R4 * $\sqrt{\epsilon_s}$ * cos(113 * π/64.0), R4 * $\sqrt{\epsilon_s}$ * sin(113 * π/64.0)] |
| 10110101 | [R4 * $\sqrt{\epsilon_s}$ * cos(115 * π/64.0), R4 * $\sqrt{\epsilon_s}$ * sin(115 * π/64.0)] |
| 10110110 | [R4 * $\sqrt{\epsilon_s}$ * cos(119 * π/64.0), R4 * $\sqrt{\epsilon_s}$ * sin(119 * π/64.0)] |
| 10110111 | [R4 * $\sqrt{\epsilon_s}$ * cos(117 * π/64.0), R4 * $\sqrt{\epsilon_s}$ * sin(117 * π/64.0)] |
| 10111000 | [R4 * $\sqrt{\epsilon_s}$ * cos(97 * π/64.0), R4 * $\sqrt{\epsilon_s}$ * sin(97 * π/64.0)] |
| 10111001 | [R4 * $\sqrt{\epsilon_s}$ * cos(99 * π/64.0), R4 * $\sqrt{\epsilon_s}$ * sin(99 * π/64.0)] |
| 10111010 | [R4 * $\sqrt{\epsilon_s}$ * cos(103 * π/64.0), R4 * $\sqrt{\epsilon_s}$ * sin(103 * π/64.0)] |
| 10111011 | [R4 * $\sqrt{\epsilon_s}$ * cos(101 * π/64.0), R4 * $\sqrt{\epsilon_s}$ * sin(101 * π/64.0)] |
| 10111100 | [R4 * $\sqrt{\epsilon_s}$ * cos(111 * π/64.0), R4 * $\sqrt{\epsilon_s}$ * sin(111 * π/64.0)] |
| 10111101 | [R4 * $\sqrt{\epsilon_s}$ * cos(109 * π/64.0), R4 * $\sqrt{\epsilon_s}$ * sin(109 * π/64.0)] |
| 10111110 | [R4 * $\sqrt{\epsilon_s}$ * cos(105 * π/64.0), R4 * $\sqrt{\epsilon_s}$ * sin(105 * π/64.0)] |
| 10111111 | [R4 * $\sqrt{\epsilon_s}$ * cos(107 * π/64.0), R4 * $\sqrt{\epsilon_s}$ * sin(107 * π/64.0)] |
| 11000000 | [R2 * $\sqrt{\epsilon_s}$ * cos(33 * π/32.0), R2 * $\sqrt{\epsilon_s}$ * sin(33 * π/32.0)] |
| 11000001 | [R1 * $\sqrt{\epsilon_s}$ * cos(33 * π/32.0), R1 * $\sqrt{\epsilon_s}$ * sin(33 * π/32.0)] |
| 11000010 | [R2 * $\sqrt{\epsilon_s}$ * cos(35 * π/32.0), R2 * $\sqrt{\epsilon_s}$ * sin(35 * π/32.0)] |
| 11000011 | [R1 * $\sqrt{\epsilon_s}$ * cos(35 * π/32.0), R1 * $\sqrt{\epsilon_s}$ * sin(35 * π/32.0)] |
| 11000100 | [R2 * $\sqrt{\epsilon_s}$ * cos(39 * π/32.0), R2 * $\sqrt{\epsilon_s}$ * sin(39 * π/32.0)] |
| 11000101 | [R1 * $\sqrt{\epsilon_s}$ * cos(39 * π/32.0), R1 * $\sqrt{\epsilon_s}$ * sin(39 * π/32.0)] |
| 11000110 | [R2 * $\sqrt{\epsilon_s}$ * cos(37 * π/32.0), R2 * $\sqrt{\epsilon_s}$ * sin(37 * π/32.0)] |
| 11000111 | [R1 * $\sqrt{\epsilon_s}$ * cos(37 * π/32.0), R1 * $\sqrt{\epsilon_s}$ * sin(37 * π/32.0)] |
| 11001000 | [R2 * $\sqrt{\epsilon_s}$ * cos(47 * π/32.0), R2 * $\sqrt{\epsilon_s}$ * sin(47 * π/32.0)] |
| 11001001 | [R1 * $\sqrt{\epsilon_s}$ * cos(47 * π/32.0), R1 * $\sqrt{\epsilon_s}$ * sin(47 * π/32.0)] |
| 11001010 | [R2 * $\sqrt{\epsilon_s}$ * cos(45 * π/32.0), R2 * $\sqrt{\epsilon_s}$ * sin(45 * π/32.0)] |
| 11001011 | [R1 * $\sqrt{\epsilon_s}$ * cos(45 * π/32.0), R1 * $\sqrt{\epsilon_s}$ * sin(45 * π/32.0)] |
| 11001100 | [R2 * $\sqrt{\epsilon_s}$ * cos(41 * π/32.0), R2 * $\sqrt{\epsilon_s}$ * sin(41 * π/32.0)] |
| 11001101 | [R1 * $\sqrt{\epsilon_s}$ * cos(41 * π/32.0), R1 * $\sqrt{\epsilon_s}$ * sin(41 * π/32.0)] |
| 11001110 | [R2 * $\sqrt{\epsilon_s}$ * cos(43 * π/32.0), R2 * $\sqrt{\epsilon_s}$ * sin(43 * π/32.0)] |
| 11001111 | [R1 * $\sqrt{\epsilon_s}$ * cos(43 * π/32.0), R1 * $\sqrt{\epsilon_s}$ * sin(43 * π/32.0)] |
| 11010000 | [R3 * $\sqrt{\epsilon_s}$ * cos(65 * π/64.0), R3 * $\sqrt{\epsilon_s}$ * sin(65 * π/64.0)] |
| 11010001 | [R3 * $\sqrt{\epsilon_s}$ * cos(67 * π/64.0), R3 * $\sqrt{\epsilon_s}$ * sin(67 * π/64.0)] |
| 11010010 | [R3 * $\sqrt{\epsilon_s}$ * cos(71 * π/64.0), R3 * $\sqrt{\epsilon_s}$ * sin(71 * π/64.0)] |
| 11010011 | [R3 * $\sqrt{\epsilon_s}$ * cos(69 * π/64.0), R3 * $\sqrt{\epsilon_s}$ * sin(69 * π/64.0)] |
| 11010100 | [R3 * $\sqrt{\epsilon_s}$ * cos(79 * π/64.0), R3 * $\sqrt{\epsilon_s}$ * sin(79 * π/64.0)] |
| 11010101 | [R3 * $\sqrt{\epsilon_s}$ * cos(77 * π/64.0), R3 * $\sqrt{\epsilon_s}$ * sin(77 * π/64.0)] |
| 11010110 | [R3 * $\sqrt{\epsilon_s}$ * cos(73 * π/64.0), R3 * $\sqrt{\epsilon_s}$ * sin(73 * π/64.0)] |
| 11010111 | [R3 * $\sqrt{\epsilon_s}$ * cos(75 * π/64.0), R3 * $\sqrt{\epsilon_s}$ * sin(75 * π/64.0)] |
| 11011000 | [R3 * $\sqrt{\epsilon_s}$ * cos(95 * π/64.0), R3 * $\sqrt{\epsilon_s}$ * sin(95 * π/64.0)] |
| 11011001 | [R3 * $\sqrt{\epsilon_s}$ * cos(93 * π/64.0), R3 * $\sqrt{\epsilon_s}$ * sin(93 * π/64.0)] |
| 11011010 | [R3 * $\sqrt{\epsilon_s}$ * cos(89 * π/64.0), R3 * $\sqrt{\epsilon_s}$ * sin(89 * π/64.0)] |
| 11011011 | [R3 * $\sqrt{\epsilon_s}$ * cos(91 * π/64.0), R3 * $\sqrt{\epsilon_s}$ * sin(91 * π/64.0)] |
| 11011100 | [R3 * $\sqrt{\epsilon_s}$ * cos(81 * π/64.0), R3 * $\sqrt{\epsilon_s}$ * sin(81 * π/64.0)] |
| 11011101 | [R3 * $\sqrt{\epsilon_s}$ * cos(83 * π/64.0), R3 * $\sqrt{\epsilon_s}$ * sin(83 * π/64.0)] |
| 11011110 | [R3 * $\sqrt{\epsilon_s}$ * cos(87 * π/64.0), R3 * $\sqrt{\epsilon_s}$ * sin(87 * π/64.0)] |
| 11011111 | [R3 * $\sqrt{\epsilon_s}$ * cos(85 * π/64.0), R3 * $\sqrt{\epsilon_s}$ * sin(85 * π/64.0)] |
| 11100000 | [R5 * $\sqrt{\epsilon_s}$ * cos(65 * π/64.0), R5 * $\sqrt{\epsilon_s}$ * sin(65 * π/64.0)] |
| 11100001 | [R5 * $\sqrt{\epsilon_s}$ * cos(67 * π/64.0), R5 * $\sqrt{\epsilon_s}$ * sin(67 * π/64.0)] |
| 11100010 | [R5 * $\sqrt{\epsilon_s}$ * cos(71 * π/64.0), R5 * $\sqrt{\epsilon_s}$ * sin(71 * π/64.0)] |
| 11100011 | [R5 * $\sqrt{\epsilon_s}$ * cos(69 * π/64.0), R5 * $\sqrt{\epsilon_s}$ * sin(69 * π/64.0)] |
| 11100100 | [R5 * $\sqrt{\epsilon_s}$ * cos(79 * π/64.0), R5 * $\sqrt{\epsilon_s}$ * sin(79 * π/64.0)] |
| 11100101 | [R5 * $\sqrt{\epsilon_s}$ * cos(77 * π/64.0), R5 * $\sqrt{\epsilon_s}$ * sin(77 * π/64.0)] |
| 11100110 | [R5 * $\sqrt{\epsilon_s}$ * cos(73 * π/64.0), R5 * $\sqrt{\epsilon_s}$ * sin(73 * π/64.0)] |
| 11100111 | [R5 * $\sqrt{\epsilon_s}$ * cos(75 * π/64.0), R5 * $\sqrt{\epsilon_s}$ * sin(75 * π/64.0)] |
| 11101000 | [R5 * $\sqrt{\epsilon_s}$ * cos(95 * π/64.0), R5 * $\sqrt{\epsilon_s}$ * sin(95 * π/64.0)] |
| 11101001 | [R5 * $\sqrt{\epsilon_s}$ * cos(93 * π/64.0), R5 * $\sqrt{\epsilon_s}$ * sin(93 * π/64.0)] |
| 11101010 | [R5 * $\sqrt{\epsilon_s}$ * cos(89 * π/64.0), R5 * $\sqrt{\epsilon_s}$ * sin(89 * π/64.0)] |
| 11101011 | [R5 * $\sqrt{\epsilon_s}$ * cos(91 * π/64.0), R5 * $\sqrt{\epsilon_s}$ * sin(91 * π/64.0)] |
| 11101100 | [R5 * $\sqrt{\epsilon_s}$ * cos(81 * π/64.0), R5 * $\sqrt{\epsilon_s}$ * sin(81 * π/64.0)] |
| 11101101 | [R5 * $\sqrt{\epsilon_s}$ * cos(83 * π/64.0), R5 * $\sqrt{\epsilon_s}$ * sin(83 * π/64.0)] |
| 11101110 | [R5 * $\sqrt{\epsilon_s}$ * cos(87 * π/64.0), R5 * $\sqrt{\epsilon_s}$ * sin(87 * π/64.0)] |
| 11101111 | [R5 * $\sqrt{\epsilon_s}$ * cos(85 * π/64.0), R5 * $\sqrt{\epsilon_s}$ * sin(85 * π/64.0)] |
| 11110000 | [R4 * $\sqrt{\epsilon_s}$ * cos(65 * π/64.0), R4 * $\sqrt{\epsilon_s}$ * sin(65 * π/64.0)] |
| 11110001 | [R4 * $\sqrt{\epsilon_s}$ * cos(67 * π/64.0), R4 * $\sqrt{\epsilon_s}$ * sin(67 * π/64.0)] |
| 11110010 | [R4 * $\sqrt{\epsilon_s}$ * cos(71 * π/64.0), R4 * $\sqrt{\epsilon_s}$ * sin(71 * π/64.0)] |
| 11110011 | [R4 * $\sqrt{\epsilon_s}$ * cos(69 * π/64.0), R4 * $\sqrt{\epsilon_s}$ * sin(69 * π/64.0)] |
| 11110100 | [R4 * $\sqrt{\epsilon_s}$ * cos(79 * π/64.0), R4 * $\sqrt{\epsilon_s}$ * sin(79 * π/64.0)] |
| 11110101 | [R4 * $\sqrt{\epsilon_s}$ * cos(77 * π/64.0), R4 * $\sqrt{\epsilon_s}$ * sin(77 * π/64.0)] |
| 11110110 | [R4 * $\sqrt{\epsilon_s}$ * cos(73 * π/64.0), R4 * $\sqrt{\epsilon_s}$ * sin(73 * π/64.0)] |
| 11110111 | [R4 * $\sqrt{\epsilon_s}$ * cos(75 * π/64.0), R4 * $\sqrt{\epsilon_s}$ * sin(75 * π/64.0)] |
| 11111000 | [R4 * $\sqrt{\epsilon_s}$ * cos(95 * π/64.0), R4 * $\sqrt{\epsilon_s}$ * sin(95 * π/64.0)] |
| 11111001 | [R4 * $\sqrt{\epsilon_s}$ * cos(93 * π/64.0), R4 * $\sqrt{\epsilon_s}$ * sin(93 * π/64.0)] |
| 11111010 | [R4 * $\sqrt{\epsilon_s}$ * cos(89 * π/64.0), R4 * $\sqrt{\epsilon_s}$ * sin(89 * π/64.0)] |
| 11111011 | [R4 * $\sqrt{\epsilon_s}$ * cos(91 * π/64.0), R4 * $\sqrt{\epsilon_s}$ * sin(91 * π/64.0)] |
| 11111100 | [R4 * $\sqrt{\epsilon_s}$ * cos(81 * π/64.0), R4 * $\sqrt{\epsilon_s}$ * sin(81 * π/64.0)] |
| 11111101 | [R4 * $\sqrt{\epsilon_s}$ * cos(83 * π/64.0), R4 * $\sqrt{\epsilon_s}$ * sin(83 * π/64.0)] |
| 11111110 | [R4 * $\sqrt{\epsilon_s}$ * cos(87 * π/64.0), R4 * $\sqrt{\epsilon_s}$ * sin(87 * π/64.0)] |
| 11111111 | [R4 * $\sqrt{\epsilon_s}$ * cos(85 * π/64.0), R4 * $\sqrt{\epsilon_s}$ * sin(85 * π/64.0)]. |

21. An apparatus, comprising:

at least one processor; and at least one memory including computer program code for one or more programs, the at least one memory and the computer program code configured to, with the at least one processor, cause the apparatus to perform at least the following:

modulating a signal, via a modulation device, in accordance with a 256-APSK modulation based on a signal constellation of a 32+32+64+64+64 ring format, having bit labeling and [x, y] bit coordinate positions as follows (where $\epsilon_s$ represents average energy per symbol, $32*R1^2+32*R2^2+64*R3^2+64*R4^2+64*R5^2=256$, and R1 represents the radius of the inner-most ring, R2 represents the radius of the next outer ring, R3 represents the radius of the next outer ring, R4 represents the radius of the next outer ring, and R5 represents the radius of the outer-most ring):

| Bit Label | [x, y] Coordinates |
|---|---|
| 00000000 | [R2 * $\sqrt{\epsilon_s}$ * cos(π/32.0), R2 * $\sqrt{\epsilon_s}$ * sin(π/32.0)] |
| 00000001 | [R1 * $\sqrt{\epsilon_s}$ * cos(π/32.0), R1 * $\sqrt{\epsilon_s}$ * sin(π/32.0)] |
| 00000010 | [R2 * $\sqrt{\epsilon_s}$ * cos(3 * π/32.0), R2 * $\sqrt{\epsilon_s}$ * sin(3 * π/32.0)] |
| 00000011 | [R1 * $\sqrt{\epsilon_s}$ * cos(3 * π/32.0), R1 * $\sqrt{\epsilon_s}$ * sin(3 * π/32.0)] |
| 00000100 | [R2 * $\sqrt{\epsilon_s}$ * cos(7 * π/32.0), R2 * $\sqrt{\epsilon_s}$ * sin(7 * π/32.0)] |
| 00000101 | [R1 * $\sqrt{\epsilon_s}$ * cos(7 * π/32.0), R1 * $\sqrt{\epsilon_s}$ * sin(7 * π/32.0)] |
| 00000110 | [R2 * $\sqrt{\epsilon_s}$ * cos(5 * π/32.0), R2 * $\sqrt{\epsilon_s}$ * sin(5 * π/32.0)] |
| 00000111 | [R1 * $\sqrt{\epsilon_s}$ * cos(5 * π/32.0), R1 * $\sqrt{\epsilon_s}$ * sin(5 * π/32.0)] |
| 00001000 | [R2 * $\sqrt{\epsilon_s}$ * cos(15 * π/32.0), R2 * $\sqrt{\epsilon_s}$ * sin(15 * π/32.0)] |
| 00001001 | [R1 * $\sqrt{\epsilon_s}$ * cos(15 * π/32.0), R1 * $\sqrt{\epsilon_s}$ * sin(15 * π/32.0)] |
| 00001010 | [R2 * $\sqrt{\epsilon_s}$ * cos(13 * π/32.0), R2 * $\sqrt{\epsilon_s}$ * sin(13 * π/32.0)] |
| 00001011 | [R1 * $\sqrt{\epsilon_s}$ * cos(13 * π/32.0), R1 * $\sqrt{\epsilon_s}$ * sin(13 * π/32.0)] |
| 00001100 | [R2 * $\sqrt{\epsilon_s}$ * cos(9 * π/32.0), R2 * $\sqrt{\epsilon_s}$ * sin(9 * π/32.0)] |
| 00001101 | [R1 * $\sqrt{\epsilon_s}$ * cos(9 * π/32.0), R1 * $\sqrt{\epsilon_s}$ * sin(9 * π/32.0)] |
| 00001110 | [R2 * $\sqrt{\epsilon_s}$ * cos(11 * π/32.0), R2 * $\sqrt{\epsilon_s}$ * sin(11 * π/32.0)] |

| Bit Label | [x, y] Coordinates |
|---|---|
| 00001111 | [R1 * $\sqrt{\epsilon_s}$ * cos(11 * π/32.0), R1 * $\sqrt{\epsilon_s}$ * sin(11 * π/32.0)] |
| 00010000 | [R3 * $\sqrt{\epsilon_s}$ * cos(π/64.0), R3 * $\sqrt{\epsilon_s}$ * sin(π/64.0)] |
| 00010001 | [R3 * $\sqrt{\epsilon_s}$ * cos(3 * π/64.0), R3 * $\sqrt{\epsilon_s}$ * sin(3 * π/64.0)] |
| 00010010 | [R3 * $\sqrt{\epsilon_s}$ * cos(7 * π/64.0), R3 * $\sqrt{\epsilon_s}$ * sin(7 * π/64.0)] |
| 00010011 | [R3 * $\sqrt{\epsilon_s}$ * cos(5 * π/64.0), R3 * $\sqrt{\epsilon_s}$ * sin(5 * π/64.0)] |
| 00010100 | [R3 * $\sqrt{\epsilon_s}$ * cos(15 * π/64.0), R3 * $\sqrt{\epsilon_s}$ * sin(15 * π/64.0)] |
| 00010101 | [R3 * $\sqrt{\epsilon_s}$ * cos(13 * π/64.0), R3 * $\sqrt{\epsilon_s}$ * sin(13 * π/64.0)] |
| 00010110 | [R3 * $\sqrt{\epsilon_s}$ * cos(9 * π/64.0), R3 * $\sqrt{\epsilon_s}$ * sin(9 * π/64.0)] |
| 00010111 | [R3 * $\sqrt{\epsilon_s}$ * cos(11 * π/64.0), R3 * $\sqrt{\epsilon_s}$ * sin(11 * π/64.0)] |
| 00011000 | [R3 * $\sqrt{\epsilon_s}$ * cos(31 * π/64.0), R3 * $\sqrt{\epsilon_s}$ * sin(31 * π/64.0)] |
| 00011001 | [R3 * $\sqrt{\epsilon_s}$ * cos(29 * π/64.0), R3 * $\sqrt{\epsilon_s}$ * sin(29 * π/64.0)] |
| 00011010 | [R3 * $\sqrt{\epsilon_s}$ * cos(25 * π/64.0), R3 * $\sqrt{\epsilon_s}$ * sin(25 * π/64.0)] |
| 00011011 | [R3 * $\sqrt{\epsilon_s}$ * cos(27 * π/64.0), R3 * $\sqrt{\epsilon_s}$ * sin(27 * π/64.0)] |
| 00011100 | [R3 * $\sqrt{\epsilon_s}$ * cos(17 * π/64.0), R3 * $\sqrt{\epsilon_s}$ * sin(17 * π/64.0)] |
| 00011101 | [R3 * $\sqrt{\epsilon_s}$ * cos(19 * π/64.0), R3 * $\sqrt{\epsilon_s}$ * sin(19 * π/64.0)] |
| 00011110 | [R3 * $\sqrt{\epsilon_s}$ * cos(23 * π/64.0), R3 * $\sqrt{\epsilon_s}$ * sin(23 * π/64.0)] |
| 00011111 | [R3 * $\sqrt{\epsilon_s}$ * cos(21 * π/64.0), R3 * $\sqrt{\epsilon_s}$ * sin(21 * π/64.0)] |
| 00100000 | [R5 * $\sqrt{\epsilon_s}$ * cos(π/64.0), R5 * $\sqrt{\epsilon_s}$ * sin(π/64.0)] |
| 00100001 | [R5 * $\sqrt{\epsilon_s}$ * cos(3 * π/64.0), R5 * $\sqrt{\epsilon_s}$ * sin(3 * π/64.0)] |
| 00100010 | [R5 * $\sqrt{\epsilon_s}$ * cos(7 * π/64.0), R5 * $\sqrt{\epsilon_s}$ * sin(7 * π/64.0)] |
| 00100011 | [R5 * $\sqrt{\epsilon_s}$ * cos(5 * π/64.0), R5 * $\sqrt{\epsilon_s}$ * sin(5 * π/64.0)] |
| 00100100 | [R5 * $\sqrt{\epsilon_s}$ * cos(15 * π/64.0), R5 * $\sqrt{\epsilon_s}$ * sin(15 * π/64.0)] |
| 00100101 | [R5 * $\sqrt{\epsilon_s}$ * cos(13 * π/64.0), R5 * $\sqrt{\epsilon_s}$ * sin(13 * π/64.0)] |
| 00100110 | [R5 * $\sqrt{\epsilon_s}$ * cos(9 * π/64.0), R5 * $\sqrt{\epsilon_s}$ * sin(9 * π/64.0)] |
| 00100111 | [R5 * $\sqrt{\epsilon_s}$ * cos(11 * π/64.0), R5 * $\sqrt{\epsilon_s}$ * sin(11 * π/64.0)] |
| 00101000 | [R5 * $\sqrt{\epsilon_s}$ * cos(31 * π/64.0), R5 * $\sqrt{\epsilon_s}$ * sin(31 * π/64.0)] |
| 00101001 | [R5 * $\sqrt{\epsilon_s}$ * cos(29 * π/64.0), R5 * $\sqrt{\epsilon_s}$ * sin(29 * π/64.0)] |
| 00101010 | [R5 * $\sqrt{\epsilon_s}$ * cos(25 * π/64.0), R5 * $\sqrt{\epsilon_s}$ * sin(25 * π/64.0)] |
| 00101011 | [R5 * $\sqrt{\epsilon_s}$ * cos(27 * π/64.0), R5 * $\sqrt{\epsilon_s}$ * sin(27 * π/64.0)] |
| 00101100 | [R5 * $\sqrt{\epsilon_s}$ * cos(17 * π/64.0), R5 * $\sqrt{\epsilon_s}$ * sin(17 * π/64.0)] |
| 00101101 | [R5 * $\sqrt{\epsilon_s}$ * cos(19 * π/64.0), R5 * $\sqrt{\epsilon_s}$ * sin(19 * π/64.0)] |
| 00101110 | [R5 * $\sqrt{\epsilon_s}$ * cos(23 * π/64.0), R5 * $\sqrt{\epsilon_s}$ * sin(23 * π/64.0)] |
| 00101111 | [R5 * $\sqrt{\epsilon_s}$ * cos(21 * π/64.0), R5 * $\sqrt{\epsilon_s}$ * sin(21 * π/64.0)] |
| 00110000 | [R4 * $\sqrt{\epsilon_s}$ * cos(π/64.0), R4 * $\sqrt{\epsilon_s}$ * sin(π/64.0)] |
| 00110001 | [R4 * $\sqrt{\epsilon_s}$ * cos(3 * π/64.0), R4 * $\sqrt{\epsilon_s}$ * sin(3 * π/64.0)] |
| 00110010 | [R4 * $\sqrt{\epsilon_s}$ * cos(7 * π/64.0), R4 * $\sqrt{\epsilon_s}$ * sin(7 * π/64.0)] |
| 00110011 | [R4 * $\sqrt{\epsilon_s}$ * cos(5 * π/64.0), R4 * $\sqrt{\epsilon_s}$ * sin(5 * π/64.0)] |
| 00110100 | [R4 * $\sqrt{\epsilon_s}$ * cos(15 * π/64.0), R4 * $\sqrt{\epsilon_s}$ * sin(15 * π/64.0)] |
| 00110101 | [R4 * $\sqrt{\epsilon_s}$ * cos(13 * π/64.0), R4 * $\sqrt{\epsilon_s}$ * sin(13 * π/64.0)] |
| 00110110 | [R4 * $\sqrt{\epsilon_s}$ * cos(9 * π/64.0), R4 * $\sqrt{\epsilon_s}$ * sin(9 * π/64.0)] |
| 00110111 | [R4 * $\sqrt{\epsilon_s}$ * cos(11 * π/64.0), R4 * $\sqrt{\epsilon_s}$ * sin(11 * π/64.0)] |
| 00111000 | [R4 * $\sqrt{\epsilon_s}$ * cos(31 * π/64.0), R4 * $\sqrt{\epsilon_s}$ * sin(31 * π/64.0)] |
| 00111001 | [R4 * $\sqrt{\epsilon_s}$ * cos(29 * π/64.0), R4 * $\sqrt{\epsilon_s}$ * sin(29 * π/64.0)] |
| 00111010 | [R4 * $\sqrt{\epsilon_s}$ * cos(25 * π/64.0), R4 * $\sqrt{\epsilon_s}$ * sin(25 * π/64.0)] |
| 00111011 | [R4 * $\sqrt{\epsilon_s}$ * cos(27 * π/64.0), R4 * $\sqrt{\epsilon_s}$ * sin(27 * π/64.0)] |
| 00111100 | [R4 * $\sqrt{\epsilon_s}$ * cos(17 * π/64.0), R4 * $\sqrt{\epsilon_s}$ * sin(17 * π/64.0)] |
| 00111101 | [R4 * $\sqrt{\epsilon_s}$ * cos(19 * π/64.0), R4 * $\sqrt{\epsilon_s}$ * sin(19 * π/64.0)] |
| 00111110 | [R4 * $\sqrt{\epsilon_s}$ * cos(23 * π/64.0), R4 * $\sqrt{\epsilon_s}$ * sin(23 * π/64.0)] |
| 00111111 | [R4 * $\sqrt{\epsilon_s}$ * cos(21 * π/64.0), R4 * $\sqrt{\epsilon_s}$ * sin(21 * π/64.0)] |
| 01000000 | [R2 * $\sqrt{\epsilon_s}$ * cos(31 * π/32.0), R2 * $\sqrt{\epsilon_s}$ * sin(31 * π/32.0)] |
| 01000001 | [R1 * $\sqrt{\epsilon_s}$ * cos(31 * π/32.0), R1 * $\sqrt{\epsilon_s}$ * sin(31 * π/32.0)] |
| 01000010 | [R2 * $\sqrt{\epsilon_s}$ * cos(29 * π/32.0), R2 * $\sqrt{\epsilon_s}$ * sin(29 * π/32.0)] |
| 01000011 | [R1 * $\sqrt{\epsilon_s}$ * cos(29 * π/32.0), R1 * $\sqrt{\epsilon_s}$ * sin(29 * π/32.0)] |
| 01000100 | [R2 * $\sqrt{\epsilon_s}$ * cos(25 * π/32.0), R2 * $\sqrt{\epsilon_s}$ * sin(25 * π/32.0)] |
| 01000101 | [R1 * $\sqrt{\epsilon_s}$ * cos(25 * π/32.0), R1 * $\sqrt{\epsilon_s}$ * sin(25 * π/32.0)] |
| 01000110 | [R2 * $\sqrt{\epsilon_s}$ * cos(27 * π/32.0), R2 * $\sqrt{\epsilon_s}$ * sin(27 * π/32.0)] |
| 01000111 | [R1 * $\sqrt{\epsilon_s}$ * cos(27 * π/32.0), R1 * $\sqrt{\epsilon_s}$ * sin(27 * π/32.0)] |
| 01001000 | [R2 * $\sqrt{\epsilon_s}$ * cos(17 * π/32.0), R2 * $\sqrt{\epsilon_s}$ * sin(17 * π/32.0)] |
| 01001001 | [R1 * $\sqrt{\epsilon_s}$ * cos(17 * π/32.0), R1 * $\sqrt{\epsilon_s}$ * sin(17 * π/32.0)] |
| 01001010 | [R2 * $\sqrt{\epsilon_s}$ * cos(19 * π/32.0), R2 * $\sqrt{\epsilon_s}$ * sin(19 * π/32.0)] |
| 01001011 | [R1 * $\sqrt{\epsilon_s}$ * cos(19 * π/32.0), R1 * $\sqrt{\epsilon_s}$ * sin(19 * π/32.0)] |
| 01001100 | [R2 * $\sqrt{\epsilon_s}$ * cos(23 * π/32.0), R2 * $\sqrt{\epsilon_s}$ * sin(23 * π/32.0)] |
| 01001101 | [R1 * $\sqrt{\epsilon_s}$ * cos(23 * π/32.0), R1 * $\sqrt{\epsilon_s}$ * sin(23 * π/32.0)] |
| 01001110 | [R2 * $\sqrt{\epsilon_s}$ * cos(21 * π/32.0), R2 * $\sqrt{\epsilon_s}$ * sin(21 * π/32.0)] |
| 01001111 | [R1 * $\sqrt{\epsilon_s}$ * cos(21 * π/32.0), R1 * $\sqrt{\epsilon_s}$ * sin(21 * π/32.0)] |
| 01010000 | [R3 * $\sqrt{\epsilon_s}$ * cos(63 * π/64.0), R3 * $\sqrt{\epsilon_s}$ * sin(63 * π/64.0)] |
| 01010001 | [R3 * $\sqrt{\epsilon_s}$ * cos(61 * π/64.0), R3 * $\sqrt{\epsilon_s}$ * sin(61 * π/64.0)] |
| 01010010 | [R3 * $\sqrt{\epsilon_s}$ * cos(57 * π/64.0), R3 * $\sqrt{\epsilon_s}$ * sin(57 * π/64.0)] |
| 01010011 | [R3 * $\sqrt{\epsilon_s}$ * cos(59 * π/64.0), R3 * $\sqrt{\epsilon_s}$ * sin(59 * π/64.0)] |
| 01010100 | [R3 * $\sqrt{\epsilon_s}$ * cos(49 * π/64.0), R3 * $\sqrt{\epsilon_s}$ * sin(49 * π/64.0)] |
| 01010101 | [R3 * $\sqrt{\epsilon_s}$ * cos(51 * π/64.0), R3 * $\sqrt{\epsilon_s}$ * sin(51 * π/64.0)] |
| 01010110 | [R3 * $\sqrt{\epsilon_s}$ * cos(55 * π/64.0), R3 * $\sqrt{\epsilon_s}$ * sin(55 * π/64.0)] |
| 01010111 | [R3 * $\sqrt{\epsilon_s}$ * cos(53 * π/64.0), R3 * $\sqrt{\epsilon_s}$ * sin(53 * π/64.0)] |
| 01011000 | [R3 * $\sqrt{\epsilon_s}$ * cos(33 * π/64.0), R3 * $\sqrt{\epsilon_s}$ * sin(33 * π/64.0)] |
| 01011001 | [R3 * $\sqrt{\epsilon_s}$ * cos(35 * π/64.0), R3 * $\sqrt{\epsilon_s}$ * sin(35 * π/64.0)] |
| 01011010 | [R3 * $\sqrt{\epsilon_s}$ * cos(39 * π/64.0), R3 * $\sqrt{\epsilon_s}$ * sin(39 * π/64.0)] |
| 01011011 | [R3 * $\sqrt{\epsilon_s}$ * cos(37 * π/64.0), R3 * $\sqrt{\epsilon_s}$ * sin(37 * π/64.0)] |
| 01011100 | [R3 * $\sqrt{\epsilon_s}$ * cos(47 * π/64.0), R3 * $\sqrt{\epsilon_s}$ * sin(47 * π/64.0)] |
| 01011101 | [R3 * $\sqrt{\epsilon_s}$ * cos(45 * π/64.0), R3 * $\sqrt{\epsilon_s}$ * sin(45 * π/64.0)] |
| 01011110 | [R3 * $\sqrt{\epsilon_s}$ * cos(41 * π/64.0), R3 * $\sqrt{\epsilon_s}$ * sin(41 * π/64.0)] |
| 01011111 | [R3 * $\sqrt{\epsilon_s}$ * cos(43 * π/64.0), R3 * $\sqrt{\epsilon_s}$ * sin(43 * π/64.0)] |
| 01100000 | [R5 * $\sqrt{\epsilon_s}$ * cos(63 * π/64.0), R5 * $\sqrt{\epsilon_s}$ * sin(63 * π/64.0)] |
| 01100001 | [R5 * $\sqrt{\epsilon_s}$ * cos(61 * π/64.0), R5 * $\sqrt{\epsilon_s}$ * sin(61 * π/64.0)] |
| 01100010 | [R5 * $\sqrt{\epsilon_s}$ * cos(57 * π/64.0), R5 * $\sqrt{\epsilon_s}$ * sin(57 * π/64.0)] |
| 01100011 | [R5 * $\sqrt{\epsilon_s}$ * cos(59 * π/64.0), R5 * $\sqrt{\epsilon_s}$ * sin(59 * π/64.0)] |
| 01100100 | [R5 * $\sqrt{\epsilon_s}$ * cos(49 * π/64.0), R5 * $\sqrt{\epsilon_s}$ * sin(49 * π/64.0)] |
| 01100101 | [R5 * $\sqrt{\epsilon_s}$ * cos(51 * π/64.0), R5 * $sqrt{\epsilon_s}$ * sin(51 * π/64.0)] |
| 01100110 | [R5 * $\sqrt{\epsilon_s}$ * cos(55 * π/64.0), R5 * $\sqrt{\epsilon_s}$ * sin(55 * π/64.0)] |
| 01100111 | [R5 * $\sqrt{\epsilon_s}$ * cos(53 * π/64.0), R5 * $\sqrt{\epsilon_s}$ * sin(53 * π/64.0)] |
| 01101000 | [R5 * $\sqrt{\epsilon_s}$ * cos(33 * π/64.0), R5 * $\sqrt{\epsilon_s}$ * sin(33 * π/64.0)] |
| 01101001 | [R5 * $\sqrt{\epsilon_s}$ * cos(35 * π/64.0), R5 * $\sqrt{\epsilon_s}$ * sin(35 * π/64.0)] |
| 01101010 | [R5 * $\sqrt{\epsilon_s}$ * cos(39 * π/64.0), R5 * $\sqrt{\epsilon_s}$ * sin(39 * π/64.0)] |
| 01101011 | [R5 * $\sqrt{\epsilon_s}$ * cos(37 * π/64.0), R5 * $\sqrt{\epsilon_s}$ * sin(37 * π/64.0)] |
| 01101100 | [R5 * $\sqrt{\epsilon_s}$ * cos(47 * π/64.0), R5 * $\sqrt{\epsilon_s}$ * sin(47 * π/64.0)] |
| 01101101 | [R5 * $\sqrt{\epsilon_s}$ * cos(45 * π/64.0), R5 * $\sqrt{\epsilon_s}$ * sin(45 * π/64.0)] |
| 01101110 | [R5 * $\sqrt{\epsilon_s}$ * cos(41 * π/64.0), R5 * $\sqrt{\epsilon_s}$ * sin(41 * π/64.0)] |
| 01101111 | [R5 * $\sqrt{\epsilon_s}$ * cos(43 * π/64.0), R5 * $\sqrt{\epsilon_s}$ * sin(43 * π/64.0)] |
| 01110000 | [R4 * $\sqrt{\epsilon_s}$ * cos(63 * π/64.0), R4 * $\sqrt{\epsilon_s}$ * sin(63 * π/64.0)] |
| 01110001 | [R4 * $\sqrt{\epsilon_s}$ * cos(61 * π/64.0), R4 * $\sqrt{\epsilon_s}$ * sin(61 * π/64.0)] |
| 01110010 | [R4 * $\sqrt{\epsilon_s}$ * cos(57 * π/64.0), R4 * $\sqrt{\epsilon_s}$ * sin(57 * π/64.0)] |
| 01110011 | [R4 * $\sqrt{\epsilon_s}$ * cos(59 * π/64.0), R4 * $\sqrt{\epsilon_s}$ * sin(59 * π/64.0)] |
| 01110100 | [R4 * $\sqrt{\epsilon_s}$ * cos(49 * π/64.0), R4 * $\sqrt{\epsilon_s}$ * sin(49 * π/64.0)] |
| 01110101 | [R4 * $\sqrt{\epsilon_s}$ * cos(51 * π/64.0), R4 * $\sqrt{\epsilon_s}$ * sin(51 * π/64.0)] |
| 01110110 | [R4 * $\sqrt{\epsilon_s}$ * cos(55 * π/64.0), R4 * $\sqrt{\epsilon_s}$ * sin(55 * π/64.0)] |
| 01110111 | [R4 * $\sqrt{\epsilon_s}$ * cos(53 * π/64.0), R4 * $\sqrt{\epsilon_s}$ * sin(53 * π/64.0)] |
| 01111000 | [R4 * $\sqrt{\epsilon_s}$ * cos(33 * π/64.0), R4 * $\sqrt{\epsilon_s}$ * sin(33 * π/64.0)] |
| 01111001 | [R4 * $\sqrt{\epsilon_s}$ * cos(35 * π/64.0), R4 * $\sqrt{\epsilon_s}$ * sin(35 * π/64.0)] |
| 01111010 | [R4 * $\sqrt{\epsilon_s}$ * cos(39 * π/64.0), R4 * $\sqrt{\epsilon_s}$ * sin(39 * π/64.0)] |
| 01111011 | [R4 * $\sqrt{\epsilon_s}$ * cos(37 * π/64.0), R4 * $\sqrt{\epsilon_s}$ * sin(37 * π/64.0)] |
| 01111100 | [R4 * $\sqrt{\epsilon_s}$ * cos(47 * π/64.0), R4 * $\sqrt{\epsilon_s}$ * sin(47 * π/64.0)] |
| 01111101 | [R4 * $\sqrt{\epsilon_s}$ * cos(45 * π/64.0), R4 * $\sqrt{\epsilon_s}$ * sin(45 * π/64.0)] |
| 01111110 | [R4 * $\sqrt{\epsilon_s}$ * cos(41 * π/64.0), R4 * $\sqrt{\epsilon_s}$ * sin(41 * π/64.0)] |
| 01111111 | [R4 * $\sqrt{\epsilon_s}$ * cos(43 * π/64.0), R4 * $\sqrt{\epsilon_s}$ * sin(43 * π/64.0)] |
| 10000000 | [R2 * $\sqrt{\epsilon_s}$ * cos(63 * π/32.0), R2 * $\sqrt{\epsilon_s}$ * sin(63 * π/32.0)] |
| 10000001 | [R1 * $\sqrt{\epsilon_s}$ * cos(63 * π/32.0), R1 * $\sqrt{\epsilon_s}$ * sin(63 * π/32.0)] |
| 10000010 | [R2 * $\sqrt{\epsilon_s}$ * cos(61 * π/32.0), R2 * $\sqrt{\epsilon_s}$ * sin(61 * π/32.0)] |
| 10000011 | [R1 * $\sqrt{\epsilon_s}$ * cos(61 * π/32.0), R1 * $\sqrt{\epsilon_s}$ * sin(61 * π/32.0)] |
| 10000100 | [R2 * $\sqrt{\epsilon_s}$ * cos(57 * π/32.0), R2 * $\sqrt{\epsilon_s}$ * sin(57 * π/32.0)] |
| 10000101 | [R1 * $\sqrt{\epsilon_s}$ * cos(57 * π/32.0), R1 * $\sqrt{\epsilon_s}$ * sin(57 * π/32.0)] |
| 10000110 | [R2 * $\sqrt{\epsilon_s}$ * cos(59 * π/32.0), R2 * $\sqrt{\epsilon_s}$ * sin(59 * π/32.0)] |
| 10000111 | [R1 * $\sqrt{\epsilon_s}$ * cos(59 * π/32.0), R1 * $\sqrt{\epsilon_s}$ * sin(59 * π/32.0)] |
| 10001000 | [R2 * $\sqrt{\epsilon_s}$ * cos(49 * π/32.0), R2 * $\sqrt{\epsilon_s}$ * sin(49 * π/32.0)] |
| 10001001 | [R1 * $\sqrt{\epsilon_s}$ * cos(49 * π/32.0), R1 * $\sqrt{\epsilon_s}$ * sin(49 * π/32.0)] |
| 10001010 | [R2 * $\sqrt{\epsilon_s}$ * cos(51 * π/32.0), R2 * $\sqrt{\epsilon_s}$ * sin(51 * π/32.0)] |
| 10001011 | [R1 * $\sqrt{\epsilon_s}$ * cos(51 * π/32.0), R1 * $\sqrt{\epsilon_s}$ * sin(51 * π/32.0)] |
| 10001100 | [R2 * $\sqrt{\epsilon_s}$ * cos(55 * π/32.0), R2 * $\sqrt{\epsilon_s}$ * sin(55 * π/32.0)] |
| 10001101 | [R1 * $\sqrt{\epsilon_s}$ * cos(55 * π/32.0), R1 * $\sqrt{\epsilon_s}$ * sin(55 * π/32.0)] |
| 10001110 | [R2 * $\sqrt{\epsilon_s}$ * cos(53 * π/32.0), R2 * $\sqrt{\epsilon_s}$ * sin(53 * π/32.0)] |
| 10001111 | [R1 * $\sqrt{\epsilon_s}$ * cos(53 * π/32.0), R1 * $\sqrt{\epsilon_s}$ * sin(53 * π/32.0)] |
| 10010000 | [R3 * $\sqrt{\epsilon_s}$ * cos(127 * π/64.0), R3 * $\sqrt{\epsilon_s}$ * sin(127 * π/64.0)] |
| 10010001 | [R3 * $\sqrt{\epsilon_s}$ * cos(125 * π/64.0), R3 * $\sqrt{\epsilon_s}$ * sin(125 * π/64.0)] |
| 10010010 | [R3 * $\sqrt{\epsilon_s}$ * cos(121 * π/64.0), R3 * $\sqrt{\epsilon_s}$ * sin(121 * π/64.0)] |
| 10010011 | [R3 * $\sqrt{\epsilon_s}$ * cos(123 * π/64.0), R3 * $\sqrt{\epsilon_s}$ * sin(123 * π/64.0)] |
| 10010100 | [R3 * $\sqrt{\epsilon_s}$ * cos(113 * π/64.0), R3 * $\sqrt{\epsilon_s}$ * sin(113 * π/64.0)] |
| 10010101 | [R3 * $\sqrt{\epsilon_s}$ * cos(115 * π/64.0), R3 * $\sqrt{\epsilon_s}$ * sin(115 * π/64.0)] |
| 10010110 | [R3 * $\sqrt{\epsilon_s}$ * cos(119 * π/64.0), R3 * $\sqrt{\epsilon_s}$ * sin(119 * π/64.0)] |
| 10010111 | [R3 * $\sqrt{\epsilon_s}$ * cos(117 * π/64.0), R3 * $\sqrt{\epsilon_s}$ * sin(117 * π/64.0)] |
| 10011000 | [R3 * $\sqrt{\epsilon_s}$ * cos(97 * π/64.0), R3 * $\sqrt{\epsilon_s}$ * sin(97 * π/64.0)] |
| 10011001 | [R3 * $\sqrt{\epsilon_s}$ * cos(99 * π/64.0), R3 * $\sqrt{\epsilon_s}$ * sin(99 * π/64.0)] |
| 10011010 | [R3 * $\sqrt{\epsilon_s}$ * cos(103 * π/64.0), R3 * $\sqrt{\epsilon_s}$ * sin(103 * π/64.0)] |
| 10011011 | [R3 * $\sqrt{\epsilon_s}$ * cos(101 * π/64.0), R3 * $\sqrt{\epsilon_s}$ * sin(101 * π/64.0)] |
| 10011100 | [R3 * $\sqrt{\epsilon_s}$ * cos(111 * π/64.0), R3 * $\sqrt{\epsilon_s}$ * sin(111 * π/64.0)] |
| 10011101 | [R3 * $\sqrt{\epsilon_s}$ * cos(109 * π/64.0), R3 * $\sqrt{\epsilon_s}$ * sin(109 * π/64.0)] |
| 10011110 | [R3 * $\sqrt{\epsilon_s}$ * cos(105 * π/64.0), R3 * $\sqrt{\epsilon_s}$ * sin(105 * π/64.0)] |
| 10011111 | [R3 * $\sqrt{\epsilon_s}$ * cos(107 * π/64.0), R3 * $\sqrt{\epsilon_s}$ * sin(107 * π/64.0)] |
| 10100000 | [R5 * $\sqrt{\epsilon_s}$ * cos(127 * π/64.0), R5 * $\sqrt{\epsilon_s}$ * sin(127 * π/64.0)] |
| 10100001 | [R5 * $\sqrt{\epsilon_s}$ * cos(125 * π/64.0), R5 * $\sqrt{\epsilon_s}$ * sin(125 * π/64.0)] |
| 10100010 | [R5 * $\sqrt{\epsilon_s}$ * cos(121 * π/64.0), R5 * $\sqrt{\epsilon_s}$ * sin(121 * π/64.0)] |
| 10100011 | [R5 * $\sqrt{\epsilon_s}$ * cos(123 * π/64.0), R5 * $\sqrt{\epsilon_s}$ * sin(123 * π/64.0)] |
| 10100100 | [R5 * $\sqrt{\epsilon_s}$ * cos(113 * π/64.0), R5 * $\sqrt{\epsilon_s}$ * sin(113 * π/64.0)] |
| 10100101 | [R5 * $\sqrt{\epsilon_s}$ * cos(115 * π/64.0), R5 * $\sqrt{\epsilon_s}$ * sin(115 * π/64.0)] |
| 10100110 | [R5 * $\sqrt{\epsilon_s}$ * cos(119 * π/64.0), R5 * $\sqrt{\epsilon_s}$ * sin(119 * π/64.0)] |
| 10100111 | [R5 * $\sqrt{\epsilon_s}$ * cos(117 * π/64.0), R5 * $\sqrt{\epsilon_s}$ * sin(117 * π/64.0)] |
| 10101000 | [R5 * $\sqrt{\epsilon_s}$ * cos(97 * π/64.0), R5 * $\sqrt{\epsilon_s}$ * sin(97 * π/64.0)] |

| Bit Label | [x, y] Coordinates |
|---|---|
| 10101001 | [R5 * $\sqrt{\epsilon_s}$ * cos(99 * π/64.0), R5 * $\sqrt{\epsilon_s}$ * sin(99 * π/64.0)] |
| 10101010 | [R5 * $\sqrt{\epsilon_s}$ * cos(103 * π/64.0), R5 * $\sqrt{\epsilon_s}$ * sin(103 * π/64.0)] |
| 10101011 | [R5 * $\sqrt{\epsilon_s}$ * cos(101 * π/64.0), R5 * $\sqrt{\epsilon_s}$ * sin(101 * π/64.0)] |
| 10101100 | [R5 * $\sqrt{\epsilon_s}$ * cos(111 * π/64.0), R5 * $\sqrt{\epsilon_s}$ * sin(111 * π/64.0)] |
| 10101101 | [R5 * $\sqrt{\epsilon_s}$ * cos(109 * π/64.0), R5 * $\sqrt{\epsilon_s}$ * sin(109 * π/64.0)] |
| 10101110 | [R5 * $\sqrt{\epsilon_s}$ * cos(105 * π/64.0), R5 * $\sqrt{\epsilon_s}$ * sin(105 * π/64.0)] |
| 10101111 | [R5 * $\sqrt{\epsilon_s}$ * cos(107 * π/64.0), R5 * $\sqrt{\epsilon_s}$ * sin(107 * π/64.0)] |
| 10110000 | [R4 * $\sqrt{\epsilon_s}$ * cos(127 * π/64.0), R4 * $\sqrt{\epsilon_s}$ * sin(127 * π/64.0)] |
| 10110001 | [R4 * $\sqrt{\epsilon_s}$ * cos(125 * π/64.0), R4 * $\sqrt{\epsilon_s}$ * sin(125 * π/64.0)] |
| 10110010 | [R4 * $\sqrt{\epsilon_s}$ * cos(121 * π/64.0), R4 * $\sqrt{\epsilon_s}$ * sin(121 * π/64.0)] |
| 10110011 | [R4 * $\sqrt{\epsilon_s}$ * cos(123 * π/64.0), R4 * $\sqrt{\epsilon_s}$ * sin(123 * π/64.0)] |
| 10110100 | [R4 * $\sqrt{\epsilon_s}$ * cos(113 * π/64.0), R4 * $\sqrt{\epsilon_s}$ * sin(113 * π/64.0)] |
| 10110101 | [R4 * $\sqrt{\epsilon_s}$ * cos(115 * π/64.0), R4 * $\sqrt{\epsilon_s}$ * sin(115 * π/64.0)] |
| 10110110 | [R4 * $\sqrt{\epsilon_s}$ * cos(119 * π/64.0), R4 * $\sqrt{\epsilon_s}$ * sin(119 * π/64.0)] |
| 10110111 | [R4 * $\sqrt{\epsilon_s}$ * cos(117 * π/64.0), R4 * $\sqrt{\epsilon_s}$ * sin(117 * π/64.0)] |
| 10111000 | [R4 * $\sqrt{\epsilon_s}$ * cos(97 * π/64.0), R4 * $\sqrt{\epsilon_s}$ * sin(97 * π/64.0)] |
| 10111001 | [R4 * $\sqrt{\epsilon_s}$ * cos(99 * π/64.0), R4 * $\sqrt{\epsilon_s}$ * sin(99 * π/64.0)] |
| 10111010 | [R4 * $\sqrt{\epsilon_s}$ * cos(103 * π/64.0), R4 * $\sqrt{\epsilon_s}$ * sin(103 * π/64.0)] |
| 10111011 | [R4 * $\sqrt{\epsilon_s}$ * cos(101 * π/64.0), R4 * $\sqrt{\epsilon_s}$ * sin(101 * π/64.0)] |
| 10111100 | [R4 * $\sqrt{\epsilon_s}$ * cos(111 * π/64.0), R4 * $\sqrt{\epsilon_s}$ * sin(111 * π/64.0)] |
| 10111101 | [R4 * $\sqrt{\epsilon_s}$ * cos(109 * π/64.0), R4 * $\sqrt{\epsilon_s}$ * sin(109 * π/64.0)] |
| 10111110 | [R4 * $\sqrt{\epsilon_s}$ * cos(105 * π/64.0), R4 * $\sqrt{\epsilon_s}$ * sin(105 * π/64.0)] |
| 10111111 | [R4 * $\sqrt{\epsilon_s}$ * cos(107 * π/64.0), R4 * $\sqrt{\epsilon_s}$ * sin(107 * π/64.0)] |
| 11000000 | [R2 * $\sqrt{\epsilon_s}$ * cos(33 * π/32.0), R2 * $\sqrt{\epsilon_s}$ * sin(33 * π/32.0)] |
| 11000001 | [R1 * $\sqrt{\epsilon_s}$ * cos(33 * π/32.0), R1 * $\sqrt{\epsilon_s}$ * sin(33 * π/32.0)] |
| 11000010 | [R2 * $\sqrt{\epsilon_s}$ * cos(35 * π/32.0), R2 * $\sqrt{\epsilon_s}$ * sin(35 * π/32.0)] |
| 11000011 | [R1 * $\sqrt{\epsilon_s}$ * cos(35 * π/32.0), R1 * $\sqrt{\epsilon_s}$ * sin(35 * π/32.0)] |
| 11000100 | [R2 * $\sqrt{\epsilon_s}$ * cos(39 * π/32.0), R2 * $\sqrt{\epsilon_s}$ * sin(39 * π/32.0)] |
| 11000101 | [R1 * $\sqrt{\epsilon_s}$ * cos(39 * π/32.0), R1 * $\sqrt{\epsilon_s}$ * sin(39 * π/32.0)] |
| 11000110 | [R2 * $\sqrt{\epsilon_s}$ * cos(37 * π/32.0), R2 * $\sqrt{\epsilon_s}$ * sin(37 * π/32.0)] |
| 11000111 | [R1 * $\sqrt{\epsilon_s}$ * cos(37 * π/32.0), R1 * $\sqrt{\epsilon_s}$ * sin(37 * π/32.0)] |
| 11001000 | [R2 * $\sqrt{\epsilon_s}$ * cos(47 * π/32.0), R2 * $\sqrt{\epsilon_s}$ * sin(47 * π/32.0)] |
| 11001001 | [R1 * $\sqrt{\epsilon_s}$ * cos(47 * π/32.0), R1 * $\sqrt{\epsilon_s}$ * sin(47 * π/32.0)] |
| 11001010 | [R2 * $\sqrt{\epsilon_s}$ * cos(45 * π/32.0), R2 * $\sqrt{\epsilon_s}$ * sin(45 * π/32.0)] |
| 11001011 | [R1 * $\sqrt{\epsilon_s}$ * cos(45 * π/32.0), R1 * $\sqrt{\epsilon_s}$ * sin(45 * π/32.0)] |
| 11001100 | [R2 * $\sqrt{\epsilon_s}$ * cos(41 * π/32.0), R2 * $\sqrt{\epsilon_s}$ * sin(41 * π/32.0)] |
| 11001101 | [R1 * $\sqrt{\epsilon_s}$ * cos(41 * π/32.0), R1 * $\sqrt{\epsilon_s}$ * sin(41 * π/32.0)] |
| 11001110 | [R2 * $\sqrt{\epsilon_s}$ * cos(43 * π/32.0), R2 * $\sqrt{\epsilon_s}$ * sin(43 * π/32.0)] |
| 11001111 | [R1 * $\sqrt{\epsilon_s}$ * cos(43 * π/32.0), R1 * $\sqrt{\epsilon_s}$ * sin(43 * π/32.0)] |
| 11010000 | [R3 * $\sqrt{\epsilon_s}$ * cos(65 * π/64.0), R3 * $\sqrt{\epsilon_s}$ * sin(65 * π/64.0)] |
| 11010001 | [R3 * $\sqrt{\epsilon_s}$ * cos(67 * π/64.0), R3 * $\sqrt{\epsilon_s}$ * sin(67 * π/64.0)] |
| 11010010 | [R3 * $\sqrt{\epsilon_s}$ * cos(71 * π/64.0), R3 * $\sqrt{\epsilon_s}$ * sin(71 * π/64.0)] |
| 11010011 | [R3 * $\sqrt{\epsilon_s}$ * cos(69 * π/64.0), R3 * $\sqrt{\epsilon_s}$ * sin(69 * π/64.0)] |
| 11010100 | [R3 * $\sqrt{\epsilon_s}$ * cos(79 * π/64.0), R3 * $\sqrt{\epsilon_s}$ * sin(79 * π/64.0)] |
| 11010101 | [R3 * $\sqrt{\epsilon_s}$ * cos(77 * π/64.0), R3 * $\sqrt{\epsilon_s}$ * sin(77 * π/64.0)] |
| 11010110 | [R3 * $\sqrt{\epsilon_s}$ * cos(73 * π/64.0), R3 * $\sqrt{\epsilon_s}$ * sin(73 * π/64.0)] |
| 11010111 | [R3 * $\sqrt{\epsilon_s}$ * cos(75 * π/64.0), R3 * $\sqrt{\epsilon_s}$ * sin(75 * π/64.0)] |
| 11011000 | [R3 * $\sqrt{\epsilon_s}$ * cos(95 * π/64.0), R3 * $\sqrt{\epsilon_s}$ * sin(95 * π/64.0)] |
| 11011001 | [R3 * $\sqrt{\epsilon_s}$ * cos(93 * π/64.0), R3 * $\sqrt{\epsilon_s}$ * sin(93 * π/64.0)] |
| 11011010 | [R3 * $\sqrt{\epsilon_s}$ * cos(89 * π/64.0), R3 * $\sqrt{\epsilon_s}$ * sin(89 * π/64.0)] |
| 11011011 | [R3 * $\sqrt{\epsilon_s}$ * cos(91 * π/64.0), R3 * $\sqrt{\epsilon_s}$ * sin(91 * π/64.0)] |
| 11011100 | [R3 * $\sqrt{\epsilon_s}$ * cos(81 * π/64.0), R3 * $\sqrt{\epsilon_s}$ * sin(81 * π/64.0)] |
| 11011101 | [R3 * $\sqrt{\epsilon_s}$ * cos(83 * π/64.0), R3 * $\sqrt{\epsilon_s}$ * sin(83 * π/64.0)] |
| 11011110 | [R3 * $\sqrt{\epsilon_s}$ * cos(87 * π/64.0), R3 * $\sqrt{\epsilon_s}$ * sin(87 * π/64.0)] |
| 11011111 | [R3 * $\sqrt{\epsilon_s}$ * cos(85 * π/64.0), R3 * $\sqrt{\epsilon_s}$ * sin(85 * π/64.0)] |
| 11100000 | [R5 * $\sqrt{\epsilon_s}$ * cos(65 * π/64.0), R5 * $\sqrt{\epsilon_s}$ * sin(65 * π/64.0)] |
| 11100001 | [R5 * $\sqrt{\epsilon_s}$ * cos(67 * π/64.0), R5 * $\sqrt{\epsilon_s}$ * sin(67 * π/64.0)] |
| 11100010 | [R5 * $\sqrt{\epsilon_s}$ * cos(71 * π/64.0), R5 * $\sqrt{\epsilon_s}$ * sin(71 * π/64.0)] |
| 11100011 | [R5 * $\sqrt{\epsilon_s}$ * cos(69 * π/64.0), R5 * $\sqrt{\epsilon_s}$ * sin(69 * π/64.0)] |
| 11100100 | [R5 * $\sqrt{\epsilon_s}$ * cos(79 * π/64.0), R5 * $\sqrt{\epsilon_s}$ * sin(79 * π/64.0)] |
| 11100101 | [R5 * $\sqrt{\epsilon_s}$ * cos(77 * π/64.0), R5 * $\sqrt{\epsilon_s}$ * sin(77 * π/64.0)] |
| 11100110 | [R5 * $\sqrt{\epsilon_s}$ * cos(73 * π/64.0), R5 * $\sqrt{\epsilon_s}$ * sin(73 * π/64.0)] |
| 11100111 | [R5 * $\sqrt{\epsilon_s}$ * cos(75 * π/64.0), R5 * $\sqrt{\epsilon_s}$ * sin(75 * π/64.0)] |
| 11101000 | [R5 * $\sqrt{\epsilon_s}$ * cos(95 * π/64.0), R5 * $\sqrt{\epsilon_s}$ * sin(95 * π/64.0)] |
| 11101001 | [R5 * $\sqrt{\epsilon_s}$ * cos(93 * π/64.0), R5 * $\sqrt{\epsilon_s}$ * sin(93 * π/64.0)] |
| 11101010 | [R5 * $\sqrt{\epsilon_s}$ * cos(89 * π/64.0), R5 * $\sqrt{\epsilon_s}$ * sin(89 * π/64.0)] |
| 11101011 | [R5 * $\sqrt{\epsilon_s}$ * cos(91 * π/64.0), R5 * $\sqrt{\epsilon_s}$ * sin(91 * π/64.0)] |
| 11101100 | [R5 * $\sqrt{\epsilon_s}$ * cos(81 * π/64.0), R5 * $\sqrt{\epsilon_s}$ * sin(81 * π/64.0)] |
| 11101101 | [R5 * $\sqrt{\epsilon_s}$ * cos(83 * π/64.0), R5 * $\sqrt{\epsilon_s}$ * sin(83 * π/64.0)] |
| 11101110 | [R5 * $\sqrt{\epsilon_s}$ * cos(87 * π/64.0), R5 * $\sqrt{\epsilon_s}$ * sin(87 * π/64.0)] |
| 11101111 | [R5 * $\sqrt{\epsilon_s}$ * cos(85 * π/64.0), R5 * $\sqrt{\epsilon_s}$ * sin(85 * π/64.0)] |
| 11110000 | [R4 * $\sqrt{\epsilon_s}$ * cos(65 * π/64.0), R4 * $\sqrt{\epsilon_s}$ * sin(65 * π/64.0)] |
| 11110001 | [R4 * $\sqrt{\epsilon_s}$ * cos(67 * π/64.0), R4 * $\sqrt{\epsilon_s}$ * sin(67 * π/64.0)] |
| 11110010 | [R4 * $\sqrt{\epsilon_s}$ * cos(71 * π/64.0), R4 * $\sqrt{\epsilon_s}$ * sin(71 * π/64.0)] |
| 11110011 | [R4 * $\sqrt{\epsilon_s}$ * cos(69 * π/64.0), R4 * $\sqrt{\epsilon_s}$ * sin(69 * π/64.0)] |
| 11110100 | [R4 * $\sqrt{\epsilon_s}$ * cos(79 * π/64.0), R4 * $\sqrt{\epsilon_s}$ * sin(79 * π/64.0)] |
| 11110101 | [R4 * $\sqrt{\epsilon_s}$ * cos(77 * π/64.0), R4 * $\sqrt{\epsilon_s}$ * sin(77 * π/64.0)] |
| 11110110 | [R4 * $\sqrt{\epsilon_s}$ * cos(73 * π/64.0), R4 * $\sqrt{\epsilon_s}$ * sin(73 * π/64.0)] |
| 11110111 | [R4 * $\sqrt{\epsilon_s}$ * cos(75 * π/64.0), R4 * $\sqrt{\epsilon_s}$ * sin(75 * π/64.0)] |
| 11111000 | [R4 * $\sqrt{\epsilon_s}$ * cos(95 * π/64.0), R4 * $\sqrt{\epsilon_s}$ * sin(95 * π/64.0)] |
| 11111001 | [R4 * $\sqrt{\epsilon_s}$ * cos(93 * π/64.0), R4 * $\sqrt{\epsilon_s}$ * sin(93 * π/64.0)] |
| 11111010 | [R4 * $\sqrt{\epsilon_s}$ * cos(89 * π/64.0), R4 * $\sqrt{\epsilon_s}$ * sin(89 * π/64.0)] |
| 11111011 | [R4 * $\sqrt{\epsilon_s}$ * cos(91 * π/64.0), R4 * $\sqrt{\epsilon_s}$ * sin(91 * π/64.0)] |
| 11111100 | [R4 * $\sqrt{\epsilon_s}$ * cos(81 * π/64.0), R4 * $\sqrt{\epsilon_s}$ * sin(81 * π/64.0)] |
| 11111101 | [R4 * $\sqrt{\epsilon_s}$ * cos(83 * π/64.0), R4 * $\sqrt{\epsilon_s}$ * sin(83 * π/64.0)] |
| 11111110 | [R4 * $\sqrt{\epsilon_s}$ * cos(87 * π/64.0), R4 * $\sqrt{\epsilon_s}$ * sin(87 * π/64.0)] |
| 11111111 | [R4 * $\sqrt{\epsilon_s}$ * cos(85 * π/64.0), R4 * $\sqrt{\epsilon_s}$ * sin(85 * π/64.0)]. |

22. The apparatus of claim 21, wherein each of the [x, y] bit coordinate positions is rotated by a same rotation factor (from 1 to 359°, inclusive), and/or each bit label is altered by interchanging the 0's and 1's, and/or a uniform swapping of bit positions is applied within each bit label.

* * * * *